US009986629B2

(12) United States Patent
Suzuki et al.

(10) Patent No.: US 9,986,629 B2
(45) Date of Patent: May 29, 2018

(54) EXTREME ULTRAVIOLET LIGHT GENERATION APPARATUS

(71) Applicant: Gigaphoton Inc., Tochigi-ken (JP)

(72) Inventors: Toru Suzuki, Oyama (JP); Tamotsu Abe, Oyama (JP); Osamu Wakabayashi, Oyama (JP); Tatsuya Yanagida, Oyama (JP)

(73) Assignee: Gigaphoton Inc., Tochigi (JP)

( * ) Notice: Subject to any disclaimer, the term of this patent is extended or adjusted under 35 U.S.C. 154(b) by 32 days.

(21) Appl. No.: 15/017,000

(22) Filed: Feb. 5, 2016

(65) Prior Publication Data

US 2016/0234920 A1 Aug. 11, 2016

Related U.S. Application Data

(63) Continuation of application No. PCT/JP2014/074594, filed on Sep. 17, 2014.

(30) Foreign Application Priority Data

Sep. 17, 2013 (JP) ................................. 2013-192036

(51) Int. Cl.
*H05G 2/00* (2006.01)
*G03F 7/20* (2006.01)

(52) U.S. Cl.
CPC .......... *H05G 2/008* (2013.01); *G03F 7/70033* (2013.01); *H05G 2/003* (2013.01); *H05G 2/005* (2013.01)

(58) Field of Classification Search
CPC ........ H05G 2/003; H05G 2/005; H05G 2/008; G03F 7/70033
See application file for complete search history.

(56) References Cited

U.S. PATENT DOCUMENTS 7,087,914 B2  8/2006  Akins et al.
7,164,144 B2  1/2007  Partlo et al.
(Continued)

FOREIGN PATENT DOCUMENTS

JP   2007-528607 A   10/2007
JP   2012-134433 A    7/2012
(Continued)

OTHER PUBLICATIONS

International Search Report—PCT/JP2014/074594 dated Dec. 22, 2014.

*Primary Examiner* — Eliza Osenbaugh-Stewart
(74) *Attorney, Agent, or Firm* — Studebaker & Brackett PC

(57) ABSTRACT

An extreme ultraviolet light generation apparatus may include: a chamber including a plasma generation region to which a target is supplied, the target being turned into plasma so that extreme ultraviolet light is generated in the chamber; a target supply part configured to supply the target to the plasma generation region by outputting the target as a droplet into the chamber; a droplet detector configured to detect the droplet traveling from the target supply part to the plasma generation region; an imaging part configured to capture an image of an imaging region containing the plasma generation region in the chamber; and a controller configured to control an imaging timing at which the imaging part captures the image of the imaging region, based on a detection timing at which the droplet detector detects the droplet.

8 Claims, 55 Drawing Sheets

(56) References Cited

U.S. PATENT DOCUMENTS

| | | | |
|---|---|---|---|
| 8,791,440 B1 * | 7/2014 | Tao | H01S 3/10 |
| | | | 250/493.1 |
| 2005/0199829 A1 | 9/2005 | Partlo et al. | |
| 2011/0309260 A1 * | 12/2011 | Nishisaka | G03B 27/54 |
| | | | 250/372 |
| 2012/0228525 A1 * | 9/2012 | Moriya | H05G 2/003 |
| | | | 250/504 R |
| 2012/0243566 A1 | 9/2012 | Hori et al. | |
| 2013/0026393 A1 | 1/2013 | Abe et al. | |
| 2015/0261095 A1 * | 9/2015 | Jansen | H05G 2/003 |
| | | | 355/67 |

FOREIGN PATENT DOCUMENTS

| | | |
|---|---|---|
| JP | 2012-199512 A | 10/2012 |
| JP | 2013-004258 A | 1/2013 |
| JP | 2013-030546 A | 2/2013 |

\* cited by examiner

EXTREME ULTRAVIOLET LIGHT GENERATION APPARATUS

CROSS-REFERENCES TO RELATED APPLICATIONS

This application claims the benefit of Japanese Patent Application No. 2013-192036, filed Sep. 17, 2013, which is incorporated herein by reference.

BACKGROUND

Technical Field

The present disclosure relates to an EUV (extreme ultraviolet) light generation apparatus.

In recent years, as semiconductor processes become finer, transfer patterns for use in photolithographies of semiconductor processes have rapidly become finer. In the next generation, microfabrication at 70 nm to 45 nm, further, microfabrication at 32 nm or less would be demanded. In order to meet the demand for microfabrication at 32 nm or less, for example, it is expected to develop an exposure apparatus in which a system for generating EUV light at a wavelength of approximately 13 nm is combined with a reduced projection reflective optical system.

Three types of EUV light generation systems have been proposed, which include an LPP (laser produced plasma) type system using plasma generated by irradiating a target material with a laser beam, a DPP (discharge produced plasma) type system using plasma generated by electric discharge, and an SR (synchrotron radiation) type system using synchrotron orbital radiation.

CITATION LIST

Patent Literature

PTL1: U.S. Pat. No. 7,087,914
PTL2: U.S. Pat. No. 7,164,144

SUMMARY

According to an aspect of the present disclosure, an extreme ultraviolet light generation apparatus may include: a chamber including a plasma generation region to which a target is supplied, the target being turned into plasma so that extreme ultraviolet light is generated in the chamber; a target supply part configured to supply the target to the plasma generation region by outputting the target as a droplet into the chamber; a droplet detector configured to detect the droplet traveling from the target supply part to the plasma generation region; an imaging part configured to capture an image of an imaging region containing the plasma generation region in the chamber; and a controller configured to control an imaging timing at which the imaging part captures the image of the imaging region, based on a detection timing at which the droplet detector detects the droplet.

According to an aspect of the present disclosure, an extreme ultraviolet light generation apparatus configured to generate extreme ultraviolet light, by outputting a target as a droplet to a plasma generation region in a chamber; and irradiating the target with a laser beam so that the target is turned into plasma and emits plasma light may include a controller configured to cause one imaging part to capture an image of the droplet and an image of the plasma light in the plasma generation region, and to control a position of the droplet and a position of the plasma light, based on the image of the droplet and the image of the plasma light captured by the imaging part.

BRIEF DESCRIPTION OF THE DRAWINGS

Hereinafter, selected embodiments of the present disclosure will be described with reference to the accompanying drawings by way of example.

DESCRIPTION OF EXEMPLARY EMBODIMENTS

Figure 1:
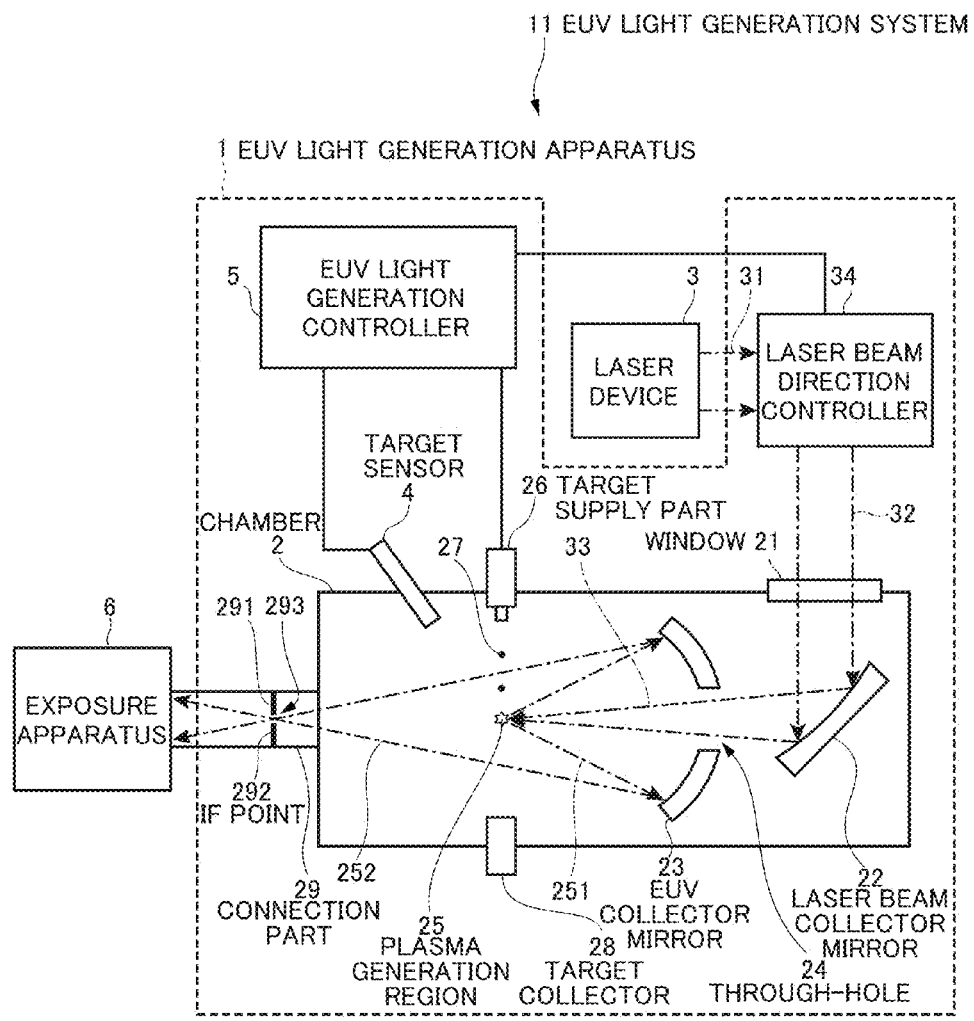
FIG. 1 schematically shows the configuration of an exemplary LPP type EUV light generation system.

<Contents>
1. Overview
2. Description of terms
3. Overview of the EUV light generation system
3.1 Configuration
3.2 Operation
4. EUV light generation apparatus including an image measurement unit
4.1 Configuration
4.2 Operation
4.3 Problem
5. Image measurement system of the EUV light generation apparatus according to Embodiment 1
5.1 Configuration
5.2 Operation
5.3 Effect
6. Shooting system using the EUV light generation apparatus according to Embodiment 2
6.1 Configuration
6.2 Operation
6.3 Effect
7. Shooting system using the EUV light generation apparatus according to Embodiment 3
7.1 Configuration
7.2 Operation
7.3 Effect
8. Shooting system using the EUV light generation apparatus according to Embodiment 4
8.1 Configuration
8.2 Operation
8.3 Effect
9. Image measurement unit included in the EUV light generation apparatus according to Embodiment 5
9.1 Configuration
9.2 Operation
9.3 Effect
10. Others
10.1 Hardware environment of each controller
10.2 Configuration of shutter
10.3 Another modification Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Corresponding elements are referenced by corresponding reference numerals and characters, and therefore duplicate descriptions will be omitted.

1. Overview

The present disclosure may at least disclose the following embodiments.

An EUV light generation apparatus 1 according to the present disclosure may include a chamber 2 including a plasma generation region 25 to which a target 27 is supplied, the target 27 being turned into plasma so that EUV light 252 is generated in the chamber 2; a target supply part 26 configured to supply the target 27 to the plasma generation region 25 by outputting the target 27 as a droplet 271 into the chamber 2; a droplet detector 41 configured to detect the droplet 271 traveling from the target supply part 26 to the plasma generation region 25; an imaging part 422 configured to capture an image of an imaging region 25a containing the plasma generation region 25 in the chamber 2; and a controller 8 configured to control an imaging timing at which the imaging part 422 captures the image of the imaging region 25a, based on the detection timing at which the droplet detector 41 detects the droplet 271. Therefore, the EUV light generation apparatus 1 according to the present disclosure can precisely measure the states of the droplet 271 and the plasma light in the plasma generation region 25.

2. Description of Terms

"Target" refers to a substance which is introduced into the chamber and is irradiated with a laser beam. The target irradiated with the laser beam is turned into plasma and emits EUV light. "Droplet" refers to one form of the target introduced into the chamber. "State of a droplet" refers to a dynamic state such as the form, the size, and the speed of a droplet outputted from the target supply part into the chamber. "Parameters of a droplet" refers to the physical quantities representing the state of the droplet. Particularly, the parameters include the size, the position and so forth of the droplet traveling through the chamber. "Plasma light" means the light emitted from the droplet having been turned into plasma. This emitted light contains EUV light. "State of plasma light" means the dynamic state such as the form and the size of plasma light, or the optical state such as the emission intensity, the emission intensity distribution, and the wavelength distribution of plasma light. "Parameters of plasma light" refers to the physical quantities representing the state of plasma light. Particularly, the parameters include the size, the position and so forth of plasma light.

3. Overview of the EUV Light Generation System

3.1 Configuration

FIG. 1 schematically shows the configuration of an exemplary LPP type EUV light generation system. The EUV light generation apparatus 1 may be used with at least one laser device 3. In the present disclosure, the system including the EUV light generation apparatus 1 and the laser device 3 is referred to as an EUV light generation system 11. As shown in FIG. 1, and as described in detail later, the EUV light generation apparatus 1 may include the chamber 2 and the target supply part 26. The chamber 2 may be sealed airtight. The target supply part 26 may be mounted onto the chamber 2, for example, to penetrate the wall of the chamber 2. A target material to be supplied from the target supply part 26 may include, but is not limited to, tin, terbium, gadolinium, lithium, xenon, or a combination of any two or more of them.

The chamber 2 may have at least one through-hole in its wall. A window 21 may be provided on the through-hole. A pulsed laser beam 32 outputted from the laser device 3 may transmit through the window 21. In the chamber 2, an EUV collector mirror 23 having a spheroidal reflective surface may be provided. The EUV collector mirror 23 may have a first focal point and a second focal point. The surface of the EUV collector mirror 23 may have a multi-layered reflective film in which molybdenum layers and silicon layers are alternately laminated, for example. The EUV collector mirror 23 may be preferably arranged such that a first focal point is positioned in the plasma generation region 25 and a second focal point is positioned in an intermediate focus (IF) point 292. The EUV collector mirror 23 may have a through-hole 24 formed at the center thereof so that a pulsed laser beam 33 may pass through the through-hole 24.

The EUV light generation apparatus 1 may include an EUV light generation controller 5 and a target sensor 4. The target sensor 4 may have an imaging function and detect the presence, trajectory, position and speed of the target 27.

Further, the EUV light generation apparatus 1 may include a connection part 29 that allows the interior of the chamber 2 to be in communication with the interior of an exposure apparatus 6. In the connection part 29, a wall 291 having an aperture 293 may be provided. The wall 291 may be positioned such that the second focal point of the EUV collector mirror 23 lies in the aperture 293.

The EUV light generation apparatus 1 may further include a laser beam direction control unit 34, a laser beam collector mirror 22, and a target collector 28 for collecting the target 27. The laser beam direction control unit 34 may include an optical element for defining the traveling direction of the laser beam and an actuator for adjusting the position or the posture of the optical element.

3.2 Operation

With reference to FIG. 1, a pulsed laser beam 31 outputted from the laser device 3 may pass through the laser beam direction control unit 34, transmit through the window 21 as the pulsed laser beam 32, and then enter the chamber 2. The pulsed laser beam 32 may travel through the chamber 2 along at least one laser beam path, be reflected from the laser beam collector mirror 22, and be emitted to at least one target 27 as the pulsed laser beam 33.

The target supply part 26 may be configured to output the target 27 to the plasma generation region 25 in the chamber 2. The target 27 may be irradiated with at least one pulse of the pulsed laser beam 33. Upon being irradiated with the pulsed laser beam, the target 27 may be turned into plasma, and EUV light 251 may be emitted from the plasma together with the emission of light at different wavelengths. The EUV light 251 may be selectively reflected from the EUV collector mirror 23. EUV light 252 reflected from the EUV collector mirror 23 may be focused on the IF point 292, and outputted to the exposure apparatus 6. Here, one target 27 may be irradiated with multiple pulses of the pulsed laser beam 33.

The EUV light generation controller 5 may be configured to totally control the EUV light generation system 11. The EUV light generation controller 5 may be configured to process the image data and so forth of the target 27 captured by the target sensor 4. Further, the EUV light generation controller 5 may be configured to control at least one of: the timing at which the target 27 is outputted; and the direction in which the target 27 is outputted. Furthermore, the EUV light generation controller 5 may be configured to control at least one of: the timing at which the laser device 3 oscillates; the traveling direction of the pulsed laser beam 32; and the position on which the pulsed laser beam 33 is focused. The various controls described above are merely examples, and other controls may be added as necessary.

4. EUV Light Generation Apparatus Including an Image Measurement Unit

4.1 Configuration

Figure 2:
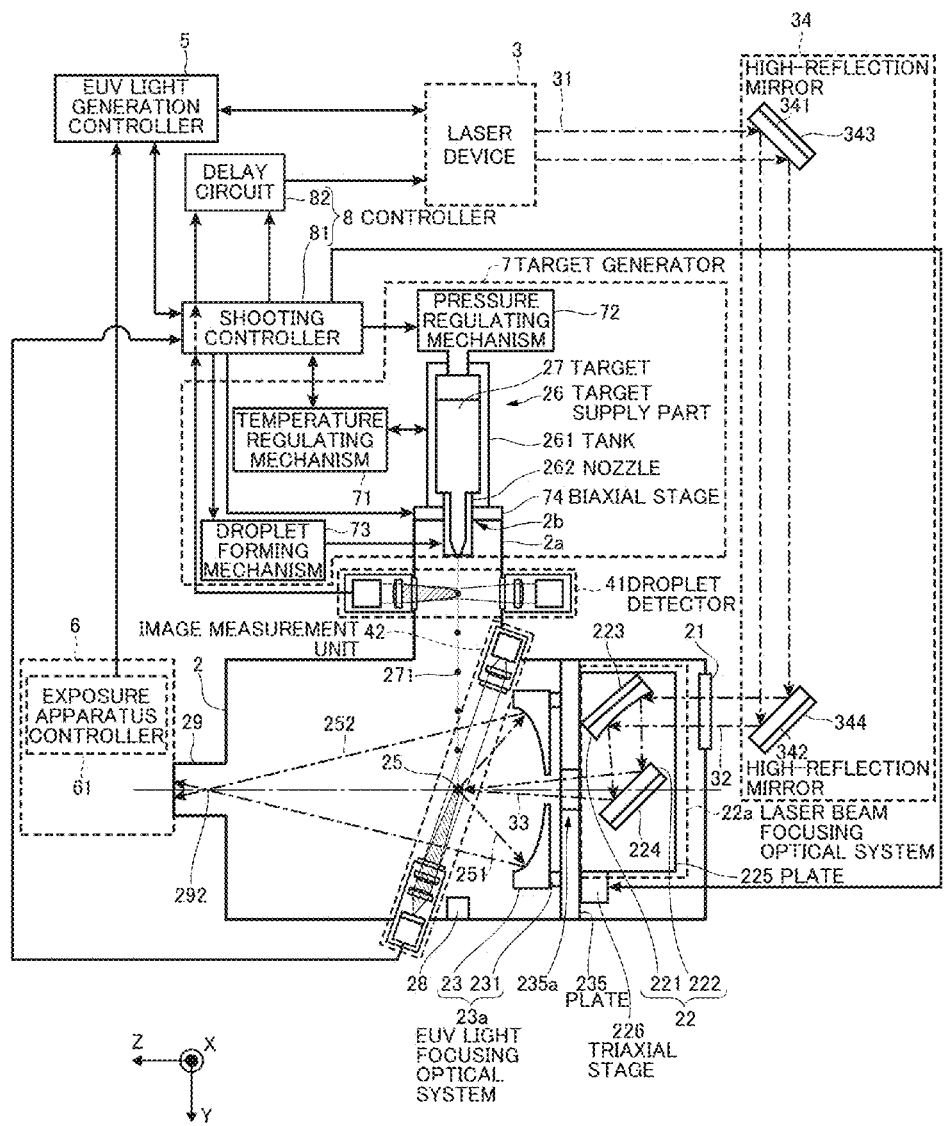
FIG. 2 shows the configuration of an EUV light generation apparatus including an image measurement unit.
Figure 3:
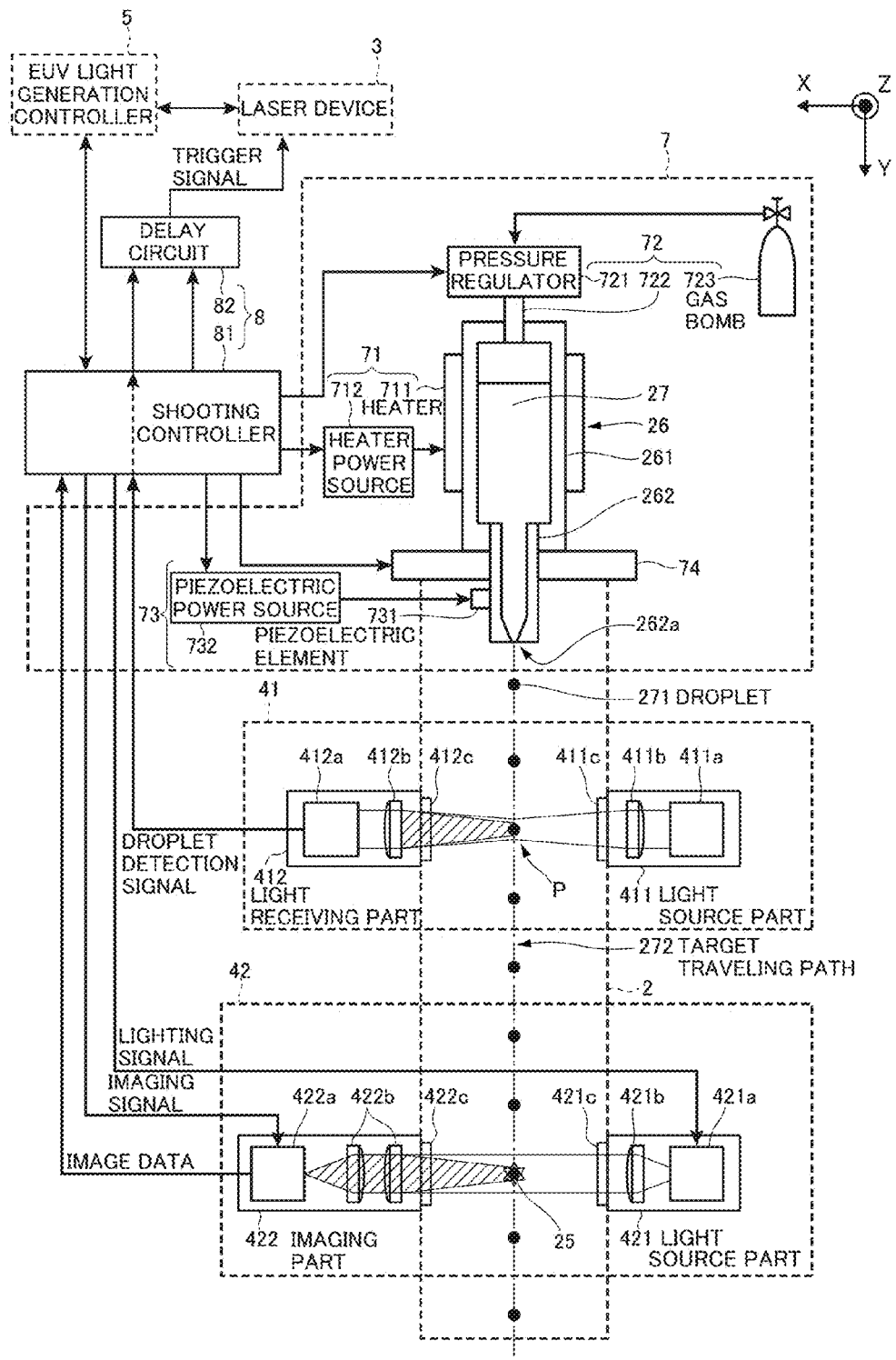
FIG. 3 shows the configuration of an image measurement system of the EUV light generation apparatus.

With reference to FIGS. 2 and 3, the configuration of the EUV light generation apparatus 1 including an image measurement unit 42 will be described. In FIG. 2, the direction in which the EUV light 252 is outputted from the chamber 2 in the EUV light generation apparatus 1 to the exposure apparatus 6 is defined as a Z-axis. An X-axis and a Y-axis are orthogonal to the Z-axis, and are orthogonal to one another. The same definition of these coordinate axes will be applied to the other drawings described later.

The chamber 2 of the EUV light generation apparatus 1 may be formed into, for example, a hollow spherical shape or a hollow cylindrical shape. The direction of the central axis of the cylindrical chamber 2 may be the same as the direction in which the EUV light 252 is outputted to the exposure apparatus 6.

The cylindrical chamber 2 may include a target supply passage 2a formed on its side surface, for supplying the target 27 into the chamber 2 from the outside of the chamber 2. The target supply passage 2a may be formed in a cylindrical shape. A target supply hole 2b may be formed in the front end of the target supply passage 2a. The direction of the central axis of the cylindrical target supply passage 2a may be orthogonal to the direction in which the EUV light 252 is outputted to the exposure apparatus 6. If the chamber 2 is formed into a hollow spherical shape, the target supply passage 2a may be formed on the wall surface of the chamber 2 at a position in which the window 21 and the connection part 29 are not provided.

In the chamber 2, a laser beam focusing optical system 22a, an EUV light focusing optical system 23a, the target collector 28, a plate 225, a plate 235, and a triaxial stage 226 may be provided.

The plate 235 may be fixed to the inner side surface of the chamber 2. A hole 235a that allows the pulsed laser beam 33 to pass therethrough may be formed at the center of the plate 235 in the thickness direction of the plate 235. The opening direction of the hole 235a may be the same as the direction of the axis passing through the through-hole 24 and the plasma generation region 25 shown in FIG. 1.

The EUV light focusing optical system 23a may be provided on one surface of the plate 235. Meanwhile, on the other surface of the plate 235, the plate 225 may be provided via the triaxial stage 226.

The EUV light focusing optical system 23a provided on the one surface of the plate 235 may include the EUV collector mirror 23 and a holder 231. The holder 231 may hold the EUV collector mirror 23. The holder 231 holding the EUV collector mirror 23 may be fixed to the plate 235.

The plate 225 provided on the other surface of the plate 235 may be changed in its position and posture by the triaxial stage 226. The triaxial stage 226 may move the plate 225 in the triaxial directions of X, Y, and Z. The triaxial stage 226 may be connected to a shooting controller 81 described later. The triaxial stage 226 may move the plate 225 according to a control signal from the shooting controller 81. By this means, the position and the posture of the plate 225 may be changed. The laser beam focusing optical system 22a may be provided on the plate 225.

The laser beam focusing optical system 22a may include the laser beam collector mirror 22, a holder 223 and a holder 224. The laser beam collector mirror 22 may include an off-axis paraboloidal mirror 221 and a plane mirror 222.

The holder 223 may hold the off-axis paraboloidal mirror 221. The holder 223 holding the off-axis paraboloidal mirror 221 may be fixed to the plate 225. The holder 224 may hold the plane mirror 222. The holder 224 holding the plane mirror 222 may be fixed to the plate 225.

The off-axis paraboloidal mirror 221 may be placed to face each of the window 21 provided on the bottom surface of the chamber 2 and the plane mirror 222. The plane mirror 222 may be placed to face each of the hole 235a and the off-axis paraboloidal mirror 221. The shooting controller 81 changes the position and posture of the plate 225 via the triaxial stage 226, so that it is possible to adjust the positions and postures of the off-axis paraboloidal mirror 221 and the plane mirror 222. This adjustment may be performed such that the pulsed laser beam 33, which is a reflected beam of the pulsed laser beam 32 having entered the off-axis paraboloidal mirror 221 and the plane mirror 222, is focused on the plasma generation region 25.

The target collector 28 may be positioned on the extension of the traveling direction of the droplet 271 outputted into the chamber 2.

Meanwhile, the laser beam direction control unit 34, the EUV light generation controller 5, the target generator 7, the droplet detector 41, the image measurement unit 42, and the controller 8 may be provided outside the chamber 2. The controller 8 may include the shooting controller 81 and a delay circuit 82.

The laser beam direction control unit 34 may be provided between the window 21 formed on the bottom surface of the chamber 2 and the laser device 3. The laser beam direction control unit 34 may include a high-reflection mirror 341, a high-reflection mirror 342, a holder 343 and a holder 344.

The holder 343 may hold the high-reflection mirror 341. The holder 344 may hold the high-reflection mirror 342. The positions and postures of the holders 343 and 344 may be changed by an actuator (not shown) which is connected to the EUV light generation controller 5.

The high-reflection mirror 341 may be placed to face each of the exit aperture of the laser device 3 from which the pulsed laser beam 31 exits, and the high-reflection mirror 342. The high-reflection mirror 342 may be placed to face each of the window 21 of the chamber 2 and the high-reflection mirror 341. The EUV light generation controller 5 changes the positions and postures of the holders 343 and 344, so that it is possible to adjust the positions and postures of the high-reflection mirrors 341 and 342. This adjustment may be performed such that the pulsed laser beam 32, which is the reflected beam of the pulsed laser beam 31 having entered the high-reflection mirrors 341 and 342, transmits through the window 21 formed on the bottom surface of the chamber 2.

Figure 42:
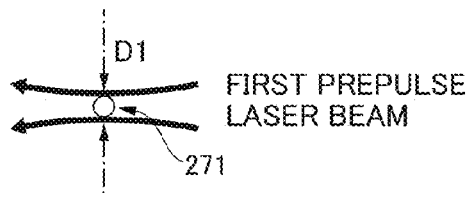
FIG. 42A is a drawing showing the relationship between a first prepulse laser beam and the form of the target to be irradiated with the first prepulse laser beam.
FIG. 42B is a drawing showing the relationship between a second prepulse laser beam and the form of the target to be irradiated with the second prepulse laser beam.
FIG. 42C is a drawing showing the relationship between a main pulse laser beam and the form of the target to be irradiated with the main pulse laser beam.
FIG. 42D is a drawing explaining plasma light emitted from the target having been irradiated with the main pulse laser beam.
Figure 42:
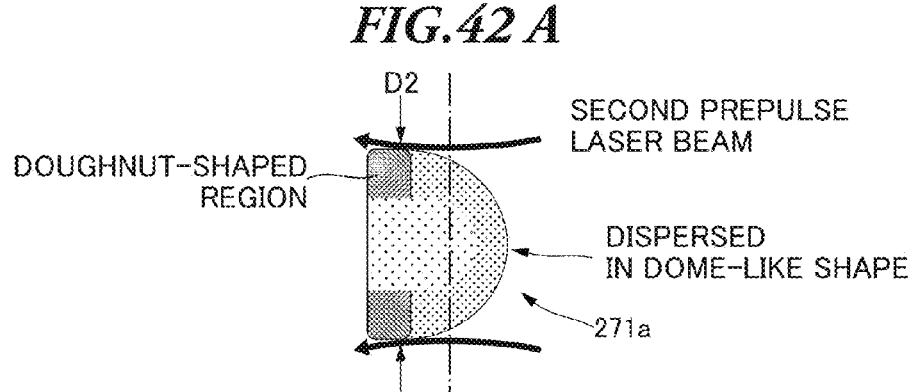
Figure 42:
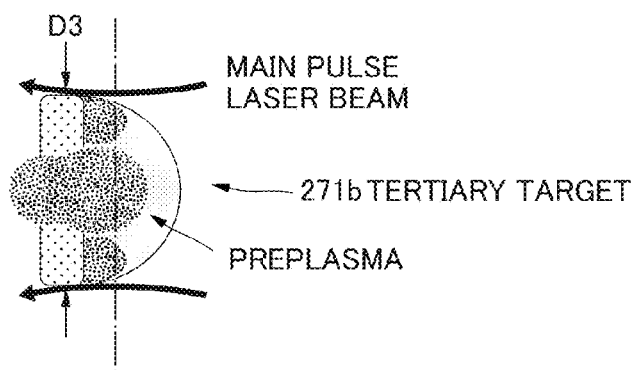
Figure 42:
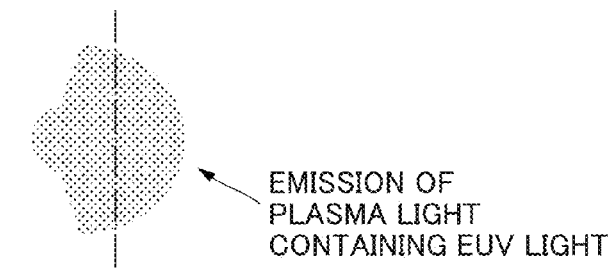

The EUV light generation controller 5 may send/receive control signals to/from an exposure apparatus controller 61 which is the controller of the exposure apparatus 6. By this means, the EUV light generation controller 5 may totally control the entire operation of the EUV light generation system 11 according to commands from the exposure apparatus 6. The EUV light generation controller 5 may send/receive control signals to/from the laser device 3. By this means, the EUV light generation controller 5 may control the operation of the laser device 3. The EUV light generation controller 5 may send/receive control signals to/from the actuators of the laser beam direction control unit 34 and the laser beam focusing optical system 22a. By this means, the EUV light generation controller 5 may adjust the traveling directions and the focused positions of the pulsed laser beams 31 to 33. The EUV light generation controller 5 may send/receive control signals to/from the shooting controller 81. By this means, the EUV light generation controller 5 may control the operations of the target generator 7, the droplet detector 41, and the image measurement unit 42. Here, the hardware configuration of the EUV light generation controller 5 will be described later with reference to FIG. 42.

The target generator 7 may be provided on the end of the target supply passage 2a of the chamber 2. The target generator 7 may include the target supply part 26, a temperature regulating mechanism 71, a pressure regulating mechanism 72, a droplet forming mechanism 73, and a biaxial stage 74.

The target supply part 26 may include a tank 261, and a nozzle 262. The tank 261 may be formed into a hollow cylindrical shape. The hollow tank 261 may accommodate the target 27. At least the interior of the tank 261 accommodating the target 27 may be made of a material which is not likely to react with the target 27. The material which is not likely to react with the target 27 may be any of, for example, SiC, $SiO_2$, $Al_2O_3$, molybdenum, tungsten and tantalum.

The nozzle 262 may be provided on the bottom surface of the cylindrical tank 261. The nozzle 262 may be placed inside the chamber 2 via the target supply hole 2b of the chamber 2. The target supply hole 2b may be closed by providing the target supply part 26. By this means, it is possible to isolate the interior of the chamber 2 from the atmosphere. At least the inner surface of the nozzle 262 may be made of a material which is not likely to react with the target 27.

One end of the pipe-like nozzle 262 may be fixed to the hollow tank 261. A nozzle hole 262a may be formed in the other end of the pipe-like nozzle 262 as shown in FIG. 3. The tank 261 provided in one end side of the nozzle 262 may be placed outside the chamber 2. Meanwhile, the nozzle hole 262a provided on the other end side of the nozzle 262 may be placed inside the chamber 2. The plasma generation region 25 placed inside the chamber 2 may be positioned on the extension of the direction of the central axis of the nozzle 262. The interiors of the tank 261, the nozzle 262, the target supply passage 2a, and the chamber 2 may communicate with each other. The nozzle hole 262a may be formed into a shape that allows the molten target 27 to be jetted into the chamber 2.

The temperature regulating mechanism 71 may regulate the temperature of the tank 261. As shown in FIG. 3, the temperature regulating mechanism 71 may include a heater 711 and a heater power source 712.

The heater 711 may be fixed to the outer side surface of the cylindrical tank 261. The heater 711 fixed to the tank 261 may heat the tank 261. The heater 711 that heats the tank 261 may be connected to the heater power source 712. The heater power source 712 may supply electric power to the heater 711. The heater power source 712 that supplies electric power to the heater 711 may be connected to the shooting controller 81. The power supply from the heater power source 712 to the heater 711 may be controlled by the shooting controller 81.

A temperature sensor (not shown) may be fixed to the outer side surface of the cylindrical tank 261. The temperature sensor fixed to the tank 261 may be connected to the shooting controller 81. The temperature sensor may detect the temperature of the tank 261 and output a detection signal to the shooting controller 81. The shooting controller 81 may regulate the electric power to be supplied to the heater 711, based on the detection signal outputted from the temperature sensor.

With the above-described configuration, the temperature regulating mechanism 71 can regulate the temperature of the tank 261, according to the control signal from the shooting controller 81.

The pressure regulating mechanism 72 may regulate the pressure in the tank 261. As shown in FIG. 3, the pressure regulating mechanism 72 may include a pressure regulator 721, a pipe 722, and a gas bomb 723.

The pipe 722 may connect between the bottom surface of the cylindrical tank 261 in the opposite side of the nozzle 262 and the pressure regulator 721. The pipe 722 allows the communication between the target supply part 26 including the tank 261 and the pressure regulator 721. The pipe 722 may be covered with, for example, a heat insulating material (not shown). A heater (not shown) may be provided at the pipe 722. The temperature in the pipe 722 may be maintained at the same temperature as the temperature in the tank 261 of the target supply part 26.

The gas bomb 723 may be filled with inert gas such as helium, argon and so forth. The gas bomb 723 may supply the inert gas into the tank 261 via the pressure regulator 721.

As described above, the pressure regulator 721 may be provided on the bottom surface of the cylindrical tank 261 in the opposite side of the nozzle 262 via the pipe 722. The pressure regulator 721 may include, for example, a solenoid valve for air supply and air exhaust, and a pressure sensor.

The pressure regulator 721 may detect the pressure in the tank 261 by using the pressure sensor. The pressure regulator 721 may be connected to the gas bomb 723. The pressure regulator 721 may supply the inert gas contained in the gas bomb 723 into the tank 261. The pressure regulator 721 may be connected to an exhaust pump (not shown). The pressure regulator 721 may activate the exhaust pump to exhaust the gas from the tank 261. The pressure regulator 721 may supply the gas into the tank 261 or exhaust the gas from the tank 261, and therefore to increase or reduce the pressure in the tank 261.

The pressure regulator 721 may be connected to the shooting controller 81. The pressure regulator 721 may output the detection signal indicating the detected pressure to the shooting controller 81. The control signal outputted from the shooting controller 81 may be inputted to the pressure regulator 721. The control signal outputted from the shooting controller 81 may be a control signal for controlling the operation of the pressure regulator 721 such that the pressure in the tank 261 is a target pressure, according to the detection signal outputted from the pressure regulator 721. The pressure regulator 721 may supply the gas into the tank 261 or exhaust the gas from the tank 261, according to the control signal from the shooting controller 81. By this means, it is possible to regulate the pressure in the tank 261 at the target pressure.

With the above-described configuration, the pressure regulating mechanism 72 can cause the pressure regulator 721 to regulate the pressure in the tank 261, according to the control signal from the shooting controller 81.

The droplet forming mechanism 73 may periodically divide the flow of the target 27 jetted from the nozzle 262 to form droplets 271. The droplet forming mechanism 73 may form the droplets 271 by, for example, the continuous jet method. With the continuous jet method, a standing wave may be given to the flow of the jetted target 27 by vibrating the nozzle 262 to periodically divide the target 27. The divided target 27 may form a free interface by means of its own surface tension to form a droplet 271. As shown in FIG. 3, the droplet forming mechanism 73 may include a piezoelectric element 731 and a piezoelectric power source 732.

The piezoelectric element 731 may be fixed to the outer side surface of the pipe-like nozzle 262. The piezoelectric element 731 fixed to the nozzle 262 may cause a vibration of the nozzle 262. The piezoelectric element 731 that causes a vibration of the nozzle 262 may be connected to the piezoelectric power source 732. The piezoelectric power source 732 may supply electric power to the piezoelectric element 731. The piezoelectric power source 732 that supplies electric power to the piezoelectric element 731 may be connected to the shooting controller 81. The power supply from the piezoelectric power source 732 to the piezoelectric element 731 may be controlled by the shooting controller 81.

With the above-described configuration, the droplet forming mechanism 73 can form the droplet 271, according to the control signal from the shooting controller 81.

The biaxial stage 74 may move the target supply part 26 in the biaxial directions of X and Z. The biaxial stage 74 may be connected to the shooting controller 81. The control signal outputted from the shooting controller 81 may be inputted to the biaxial stage 74. The control signal outputted from the shooting controller 81 may be a control signal for adjusting the position of the target supply part 26 to allow the droplet 271 outputted into the chamber 2 to reach the target position. The biaxial stage 74 may move the target supply part 26 according to the control signal from the shooting controller 81. By this means, it is possible to adjust the position of the droplet 271 outputted into the chamber 2 in the X direction and the Z direction to allow the droplet 271 to reach the target position.

The droplet detector 41 may detect the droplet 271 outputted into the chamber 2. As shown in FIG. 2, the droplet detector 41 may be provided on the side surface of the target supply passage 2a at a predetermined position. The droplet detector 41 may be placed between the target supply part 26 and the plasma generation region 25.

As shown in FIG. 3, the droplet detector 41 may include a light source part 411 and a light receiving part 412. The light source part 411 and the light receiving part 412 may be placed to face one another across a target traveling path 272 through which the target 27 outputted into the chamber 2 travels. The direction in which the light source part 411 and the light receiving part 412 face one another may be orthogonal to the target traveling path 272.

Note that although FIG. 2 shows an arrangement where the light source part 411 and the light receiving part 412 face one another in the direction orthogonal to the X direction for the sake of convenience, the direction in which the light source part 411 and the light receiving part 412 face one another is not limited to that. The light source part 411 and the light receiving part 412 may face one another in the X direction as shown in FIG. 3.

The light source part 411 may emit continuous light to the droplets 271 traveling through the target traveling path 272. The continuous light emitted to the droplet 271 may be a continuous laser beam. The light source part 411 may include a light source 411a, an illumination optical system 411b, and a window 411c.

The light source 411a may be, for example, a CW (continuous wave) laser oscillator which emits a continuous laser beam. The beam diameter of the continuous laser beam may be sufficiently greater than the diameter (e.g., 20 μm) of the droplet 271.

The illumination optical system 411b may be an optical element such as a lens. This lens may be a cylindrical lens. The illumination optical system 411b may focus the continuous laser beam emitted from the light source 411a on a predetermined position P on the target traveling path 272 via the window 411c.

With the above-described configuration, the light source part 411 can emit the continuous laser beam toward the predetermined position P on the target traveling path 272. When passing through the predetermined position P, the droplet 271 traveling through the target traveling path 272 may be irradiated with the continuous laser beam emitted from the light source part 411.

The light receiving part 412 may receive the continuous laser beam emitted from the light source part 411 and detect the optical intensity of the continuous laser beam. The light receiving part 412 may include an optical sensor 412a, a light receiving optical system 412b, and a window 412c.

The light receiving optical system 412b may be an optical system such as a collimator, or be formed by an optical element such as a lens. The light receiving optical system 412b may guide the continuous laser beam emitted from the light source part 411 to the optical sensor 412a via the window 412c.

The optical sensor 412a may be a light receiving element including a photodiode. The optical sensor 412a may detect the optical intensity of the continuous laser beam guided by the light receiving optical system 412b. The optical sensor 412a may be connected to the shooting controller 81. The optical sensor 412a may output a detection signal indicating the detected optical intensity to the shooting controller 81.

With the above-described configuration, the light receiving part 412 can detect the optical intensity of the continuous laser beam emitted from the light source part 411, and output the detection signal to the shooting controller 81. When the droplet 271 passes through the predetermined position P on the target traveling path 272, the optical intensity of the continuous laser beam detected by the light receiving part 412 is reduced because the continuous laser beam is blocked by the droplet 271. The light receiving part 412 may output a signal responsive to the reduction in the optical intensity due to the passage of the droplet 271, to the shooting controller 81. Here, the signal responsive to the reduction in the optical intensity due to the passage of the droplet 271 may be referred to as "droplet detection signal."

With the above-described configuration, the droplet detector 41 can detect the droplet 271 traveling from the target supply part 26 to the plasma generation region 25, and output the droplet detection signal to the shooting controller 81. By this means, the shooting controller 81 can detect the timing at which the droplet 271 traveling from the target supply part 26 to the plasma generation region 25 is detected. In particular, the shooting controller 81 can detect the timing at which the droplet 271 is passing through the predetermined position P on the target traveling path 272. Here, the timing at which the droplet detector 41 detects the droplet 271 may be referred to as "detection timing." The detection timing may be a timing at which the droplet detector 41 outputs the droplet detection signal to the shooting controller 81.

The image measurement unit 42 may capture the image of the plasma generation region 25 and the vicinity thereof in the chamber 2 and generate the image data. The image measurement unit 42 may be provided on the wall surface of the chamber 2 in the vicinity of the plasma generation region 25.

The image measurement unit 42 may include a light source part 421 and an imaging part 422. The light source part 421 and the imaging part 422 may be placed to face one another across the plasma generation region 25 on the target traveling path 272. The direction in which the light source part 421 and the imaging part 422 face one another may be orthogonal to the target traveling path 272.

Note that although FIG. 2 shows an arrangement where the light source part 421 and the imaging part 422 face one another in the direction orthogonal to the X direction for the sake of convenience, the direction in which the light source part 421 and the imaging part 422 face one another is not limited to that. The light source part 421 and the imaging part 422 may face one another in the X direction as shown in FIG. 3.

The light source part 421 may emit pulsed light to the droplet 271 having traveled through the target traveling path 272 and reaching the plasma generation region 25. The light source part 421 may include a light source 421a, an illumination optical system 421b, and a window 421c.

The light source 421a may be, for example, a xenon flash tube or a laser beam source which performs pulse-lighting. The light source 421a may be connected to the shooting controller 81. "Lighting signal" outputted from the shooting controller 81 may be inputted to the light source 421a. The lighting signal outputted from the shooting controller 81 may be a control signal for controlling the operation of the light source 421a such that the light source 421a performs pulse-lighting at a predetermined timing. The light source 421a may emit pulsed light according to the lighting signal from the shooting controller 81.

The illumination optical system 421b may be an optical system such as a collimator, or be formed by an optical element such as a lens. The illumination optical system 421b may guide the pulsed light emitted from the light source 421a to the plasma generation region 25 on the target traveling path 272 via the window 421c.

With the above-described configuration, the light source part 421 can emit light to the plasma generation region 25 on the target traveling path 272. Upon reaching the plasma generation region 25, the droplet 271 having traveled through the target traveling path 272 may be irradiated with the pulsed light emitted from the light source part 421.

The imaging part 422 may capture the image of the shadow of the droplet 271 irradiated with the pulsed light from the light source part 421. The imaging part 422 may include an image sensor 422a, a transfer optical system 422b and a window 422c.

The transfer optical system 422b may be an optical element such as a pair of lenses. These lenses may be cylindrical lenses. The transfer optical system 422b may form the image of the shadow of the droplet 271 in the plasma generation region 25, which is guided via the window 422c, on the light receiving surface of the image sensor 422a.

The image sensor 422a may be a two-dimensional image sensor such as a CCD (charge-coupled device). The image sensor 422a may capture the image of the shadow of the droplet 271, which has been formed by the transfer optical system 422b. The image sensor 422a may include a shutter (not shown). The shutter may be an electric shutter or a mechanical shutter. The image sensor 422a may capture an image only when the shutter (not shown) is open. The image sensor 422a may be connected to the shooting controller 81. "Imaging signal" outputted from the shooting controller 81 may be inputted to the image sensor 422a. The imaging signal outputted from the shooting controller 81 may be a control signal for controlling the operation of the image sensor 422a such that the image sensor 422a captures the image of the shadow of the droplet 271 at a predetermined timing. The image sensor 422a may capture the image of the shadow of the droplet 271, according to the imaging signal from the shooting controller 81. Then, the image sensor 422a may generate the image data of the image of the shadow of the droplet 271 captured. The image sensor 422a may output the generated image data to the shooting controller 81.

With the above-described configuration, the imaging part 422 can capture the image of the shadow of the droplet 271 irradiated with the pulsed light from the light source part 421, and output the image data to the shooting controller 81.

With the above-described configuration, the image measurement unit 42 may output the image data of the droplet 271 reaching the plasma generation region 25, to the shooting controller 81. By this means, the shooting controller 81 can acquire the image data of the droplet 271 reaching the plasma generation region 25. The shooting controller 81 can measure the state of the droplet 271 based on the acquired image data.

The shooting controller 81 may send/receive control signals to/from the EUV light generation controller 5. By this means, the shooting controller 81 may totally control the operations of the target generator 7, the droplet detector 41, and the image measurement unit 42, according to the control signals from the EUV light generation controller 5. The shooting controller 81 may output a control signal to the heater power source 712 to control the operation of the temperature regulating mechanism 71 including the heater power source 712. The shooting controller 81 may output a control signal to the pressure regulator 721 to control the operation of the pressure regulating mechanism 72 including the pressure regulator 721. The shooting controller 81 may output a control signal to the piezoelectric power source 732 to control the operation of the droplet forming mechanism 73 including the piezoelectric power source 732. The shooting controller 81 may output a control signal to the biaxial stage 74 to control the operation of the biaxial stage 74. The shooting controller 81 may output a lighting signal to the light source 421a to control the operation of the light source part 421 including the light source 421a. The shooting controller 81 may output an imaging signal to the image sensor 422a to control the operation of the imaging part 422 including the image sensor 422a.

Moreover, the shooting controller 81 may be connected to the laser device 3 via the delay circuit 82. The shooting controller 81 may output the droplet detection signal outputted from the droplet detector 41 directly to the delay circuit 82.

The delay circuit 82 may output "trigger signal" to the laser device 3 at the timing that is delayed by "delay time Tdl" from when the droplet detection signal is outputted. The trigger signal outputted from the delay circuit 82 may be a signal that triggers laser oscillation of the laser device 3 to output the pulsed laser beam 31. The delay time Tdl may be defined to synchronize the timing at which the pulsed laser beam 33 is focused on the plasma generation region 25 with the timing at which the droplet 271 reaches the plasma generation region 25. By this means, when the droplet 271 having passed through the predetermined position P on the target traveling path 272 reaches the plasma generation region 25, the droplet 271 can be irradiated with the pulsed laser beam 33. The shooting controller 81 may set the delay time Tdl in the delay circuit 82.

The timing at which the droplet 271 is irradiated with the pulsed laser beam 33 in the plasma generation region 25 may be referred to as "irradiation timing." The period of time required from when the delay circuit 82 outputs a trigger signal to the laser device 3 until the pulsed laser beam 33 is focused on the plasma generation region 25 may be referred to as "time α." The irradiation timing of the pulsed laser beam 33 may be a timing having elapsed by "delay time Tdl+time α" from when the droplet detection signal is outputted. By setting the delay time Tdl in the delay circuit 82, the shooting controller 81 can control the irradiation timing of the pulsed laser beam 33, based on the detection timing of the droplet 271. Here, the hardware configuration of the shooting controller 81 will be described later with reference to FIG. 42.

4.2 Operation

Figure 4:
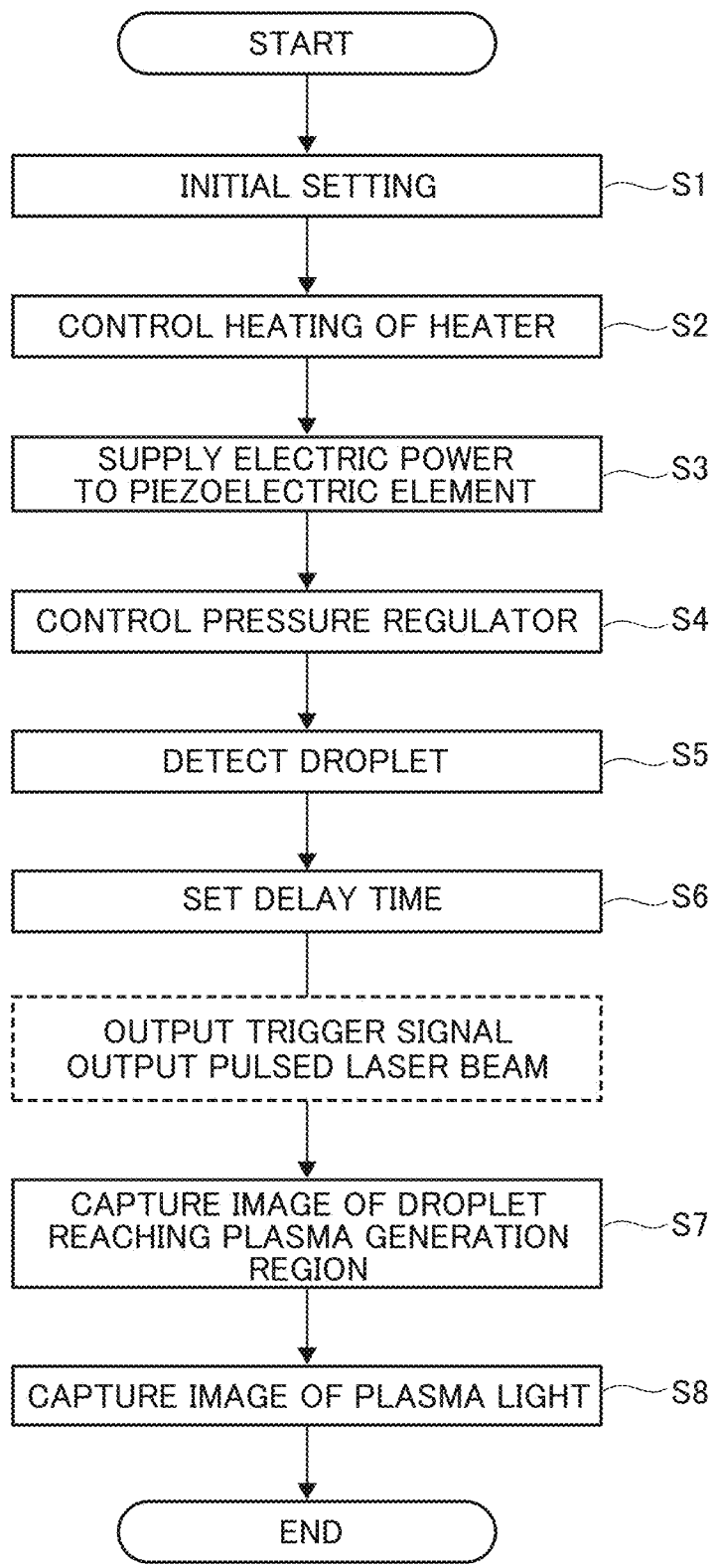
FIG. 4 is a flowchart explaining the outline of the operation of the EUV light generation apparatus including the image measurement unit.

With reference to FIG. 4, the outline of the operation of the EUV light generation apparatus 1 including the image measurement unit 42 will be described.

In step S1, the shooting controller 81 may perform initial setting for the target generator 7, the droplet detector 41, and the image measurement unit 42. The shooting controller 81 may activate these components and check their operations. Then, the shooting controller 81 may initialize each of the components and set an initial setting value in each of the components.

In particular, the shooting controller 81 may set the initial pressure setting value of the pressure regulator 721 to make the pressure in the tank 261 have a value in an approximately vacuum state. The pressure value in the approximately vacuum state may be, for example, about 1 hPa. The gas which is likely to react with the target 27 in the tank 261 may be discharged before the target 27 has molten. In this case, the inert gas in the gas bomb 723 may be supplied into the tank 261 several times to purge the tank 261.

Moreover, the shooting controller 81 may set an initial temperature setting value of the heater 711 to make the temperature of the target 27 have a value equal to or higher than the melting point of the target 27. When the target 27 is tin, the initial temperature setting value of the heater 711 may be, for example, equal to or higher than 232 degrees Celsius and lower than 300 degrees Celsius. Alternatively, the initial temperature setting value of the heater 711 may be equal to or higher than 300 degrees Celsius.

In step S2, the shooting controller 81 may control the heating by the heater 711 via the heater power source 712. The target 27 accommodated in the tank 261 may be heated to a temperature equal to or higher than its melting point. The heated target 27 may be molten. The shooting controller 81 may appropriately correct the temperature setting value to maintain the temperature of the target 27 within a predetermined range that is equal to or higher than the melting point of the target 27. The shooting controller 81 may control the power supply to the heater 711 based on the correction of the temperature setting value.

In step S3, the shooting controller 81 may cause the piezoelectric power source 732 to supply electric power to the piezoelectric element 731. The piezoelectric element 731 may cause a vibration of the nozzle 262. Here, the shooting controller 81 may control the operation of the piezoelectric power source 732 to supply the electric power having a predetermined waveform to the piezoelectric element 731. This predetermined waveform may be a waveform to generate the droplets 271 at a predetermined generation frequency. The predetermined generation frequency may be, for example, from 50 kHz to 100 kHz.

In step S4, the shooting controller 81 may set a pressure setting value in the pressure regulator 721, which allows the pressure in the tank 261 to be able to supply the target 27. The pressure regulator 721 may regulate the pressure in the tank 261 at the pressure setting value set as above. The pressure at which the target 27 can be supplied may be a pressure at which a constant amount of the molten target 27 jets from the nozzle hole 262a and reaches the plasma generation region 25 at a predetermined speed. The pressure may be applied to the molten target 27 accommodated in the tank 261. The target 27 under pressure may flow from the tank 261 to the nozzle 262, and a constant amount of the target 27 may be jetted from the nozzle hole 262a. The constant amount of the target 27 jetted may be vibrated by the piezoelectric element 731 for a constant cycle, so that it is possible to form the uniform droplet 271 for the constant cycle. The formed droplets 271 may be outputted into the chamber 2. Here, the cycle for which the droplet 271 is outputted from the target supply part 26 into the chamber 2 may be referred to as "generation cycle" of the droplet 271.

In step S5, the shooting controller 81 may detect the droplet 271 outputted into the chamber 2. The droplet detector 41 may output a droplet detection signal to the shooting controller 81. When the droplet 271 is outputted for a predetermined generation cycle, the droplet detection signal may be outputted to the shooting controller 81 for the same cycle as the predetermined generation cycle. By receiving the droplet detection signal, the shooting controller 81 may detect the droplet 271. To be more specific, the shooting controller 81 may detect that the droplet 271 outputted into the chamber 2 is passing through the predetermined position P on the target traveling path 272.

In step S6, the shooting controller 81 may set a delay time. The shooting controller 81 may output the inputted droplet detection signal to the delay circuit 82 to set the delay time Tdl. The delay circuit 82 may output a trigger signal to the laser device 3 at a timing that is delayed from the inputted droplet detection signal by the delay time Tdl. The laser device 3 may oscillate and output the pulsed laser beam 31. The pulsed laser beam 31 outputted from the laser device 3 may be introduced into the chamber 2 as a pulsed laser beam 32, via the laser beam direction control unit 34. The pulsed laser beam 32 introduced into the chamber 2 may be focused by the laser beam focusing optical system 22a, and guided to the plasma generation region 25 as a pulsed laser beam 33.

In step S7, the shooting controller 81 may capture the image of the droplet 27a reaching the plasma generation region 25. The droplet 271 outputted into the chamber 2 may pass through the predetermined position P on the target traveling path 272, and then reach the plasma generation region 25. The shooting controller 81 may capture the image of the droplet 271 just before being irradiated with the pulsed laser beam 33.

In step S8, the shooting controller 81 may capture the image of plasma light. When the timing at which the droplet 271 reaches the plasma generation region 25 is synchronized with the irradiation timing of the pulsed laser beam 33, the droplet 271 is irradiated with the pulsed laser beam 33. The droplet 271 irradiated with the pulsed laser beam 33 may be turned into plasma. The droplet 271 turned into plasma may emit plasma light containing the EUV light 251. The shooting controller 81 may capture the image of the plasma light emitted from the droplet 271 just after being irradiated with the pulsed laser beam 33.

4.3 Problem

The EUV light generation apparatus 1 may output a plurality of droplets 271 into the chamber 2. It is preferred that each of the plurality of droplets 271 is in a certain state in the plasma generation region 25. Likewise, it is also preferred that the plasma light emitted from the droplet 271 having been turned into plasma is in a certain state in the plasma generation region 25. Therefore, there is a demand for technology that can precisely measure the states of the droplet 271 and the plasma light in the plasma generation region 25, and can correctly recognize that the droplet 271 and the plasma light are in the certain states, respectively.

With the EUV light generation apparatus 1 configured to output the EUV light 252 at a high repetition frequency, the plasma light having a high optical intensity may be repeatedly emitted for a significantly short cycle. The generation cycle of the droplet 271 may be significantly short, for example, about 10 μs. When the droplet 271 is irradiated with the pulsed laser beam 33 every time the droplet 271 reaches the plasma generation region 25, the cycle for which the plasma light is emitted may be significantly short, for example, about 10 μs. Therefore, there is a demand for a technology that can precisely control the timing at which the droplet 271 reaches the plasma generation region 25, the imaging timing of the imaging part 422, and the irradiation timing of the pulsed laser beam 33.

In particular, when the image of plasma light is captured during the operation of the EUV light generation apparatus 1, some phenomena, such as smearing and blooming occur. The smearing is a phenomenon in which unnecessary saturated charge generated by plasma light having a high optical intensity is mixed into the charge transfer process of the CCD of the image sensor 422a. The blooming is a phenomenon in which unnecessary saturated charge generated by plasma light having a high optical intensity overflows from a proper pixel and flows into an adjacent pixel. If these phenomena occur, the unnecessary saturated charge appears in the image as a noise, and it makes it difficult to precisely measure the state of the plasma light. Therefore, in order to measure the droplet 271 and the plasma light in the plasma generation region 25, there is a demand for a technology that can precisely control the above-described timings.

Moreover, if an image measurement unit for performing image measurement by capturing the image of plasma light is provided separately from an image measurement unit for performing image measurement by capturing the image of the droplet 271, the EUV light generation apparatus 1 becomes complicated and the cost is increased. Therefore, there is a demand for a technology that can measure the states of the droplet 271 and the plasma light in the plasma generation region 25 by one image measurement unit while the EUV light generation apparatus 1 is operated.

5. Image Measurement System Included in the EUV Light Generation Apparatus According to Embodiment 1

5.1 Configuration

Now, the configuration of the image measurement system included in the EUV light generation apparatus 1 according to Embodiment 1 will be described with reference to FIG. 5. The image measurement system included in the EUV light generation apparatus 1 according to Embodiment 1 may include the target generator 7, the droplet detector 41, the image measurement unit 42, and the controller 8. The controller 8 may include the shooting controller 81, the delay circuit 82, and an image measurement control circuit 83. The configuration of the image measurement system shown in FIG. 5, which is the same as the configuration of the EUV light generation apparatus 1 shown in FIGS. 2 and 3, will not be described again here.

Figure 5:
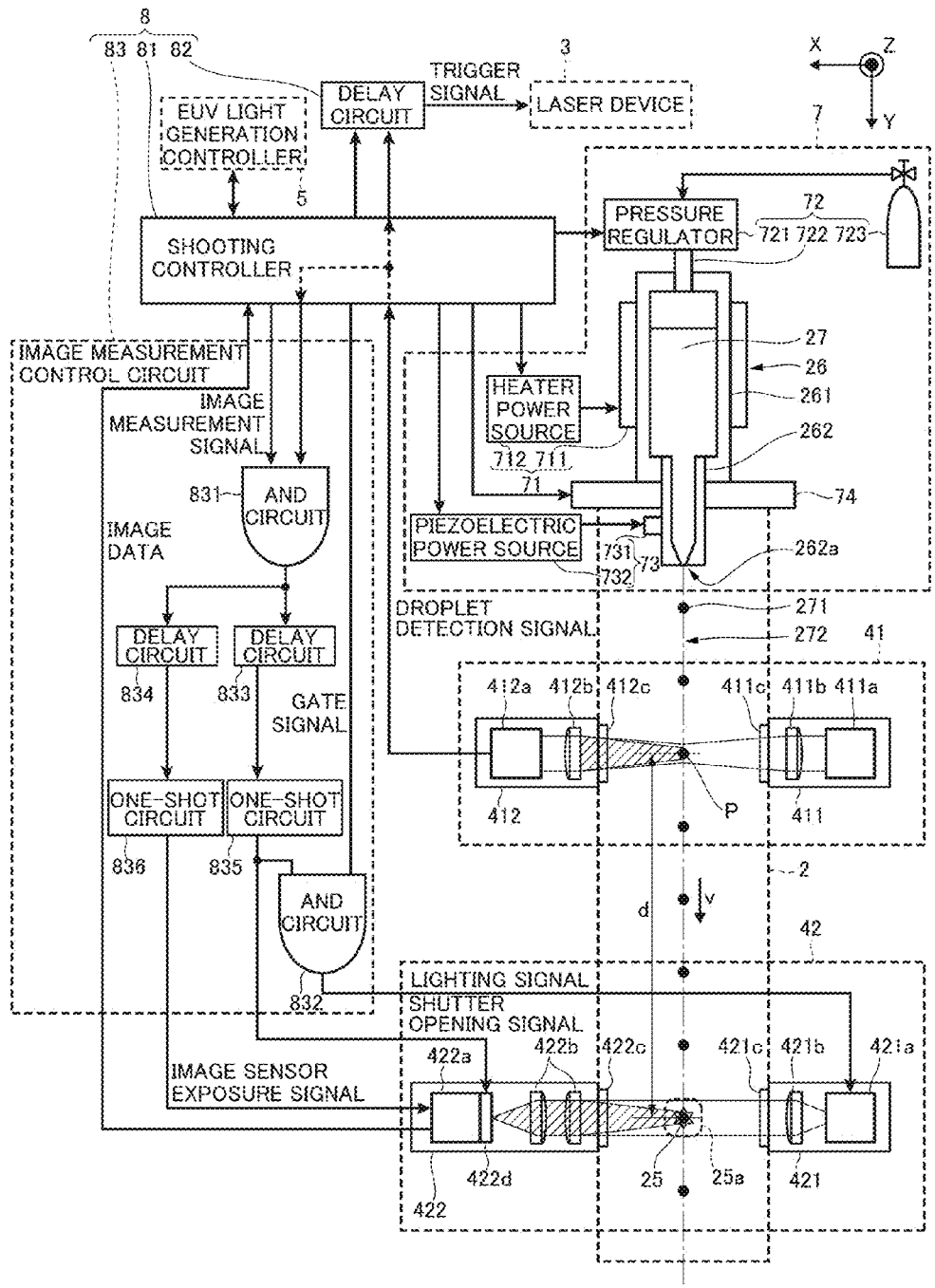
FIG. 5 shows the configuration of an image measurement system of an EUV light generation apparatus according to Embodiment 1.

The configurations of the target generator 7 and the droplet detector 41 shown in FIG. 5 may be the same as those of the target generator 7 and the droplet detector 41 shown in FIGS. 2 and 3.

The image measurement unit 42 shown in FIG. 5 may measure the image of the droplet 271 reaching the plasma generation region 25. The image measurement unit 42 may measure the image of the plasma light emitted in the plasma generation region 25. The image measurement unit 42 may include the light source part 421 and the imaging part 422. The light source part 421 and the imaging part 422 may be placed to face one another across the plasma generation region 25 on the target traveling path 272. The direction in which the light source part 421 and the imaging part 422 face one another may be orthogonal to the target traveling path 272.

The light source part 421 may include a light source 421a, an illumination optical system 421b, and a window 421c.

The light source 421a may be connected to the shooting controller 81 via the image measurement control circuit 83. A lighting signal outputted from the image measurement control circuit 83 may be inputted to the light source 421a. The lighting signal outputted from the image measurement control circuit 83 may be a control signal for controlling the operation of the light source 421a such that the light source 421a performs pulse-lighting at a predetermined timing. The light source 421a may emit pulsed light according to the lighting signal outputted from the image measurement control circuit 83.

The other configuration of the light source 421a may be the same as that of the light source 421a shown in FIG. 3.

Moreover, the configurations of the illumination optical system 421b and the window 421c may be the same as those of the illumination optical system 421b and the window 421c shown in FIG. 3.

The imaging part 422 may capture the image of the imaging region 25a. The imaging region 25a may be a predetermined region including the plasma generation region 25 in the chamber 2. The center of the imaging region 25a may be located on the target traveling path 272. The size of the imaging region 25a may be sufficiently greater than the size of each of the plasma generation region 25, the droplet 271, and the plasma light. The droplet 271 reaching the plasma generation region 25 may fall within the imaging region 25a. The plasma light emitted in the plasma generation region 25 may fall within the imaging region 25a. That is, the imaging part 422 may capture the images of the droplet 271 and the plasma light in the plasma generation region 25.

The imaging part 422 may include the image sensor 422a, the transfer optical system 422b, the window 422c, and a shutter 422d.

The image sensor 422a may be a two-dimensional image sensor such as a CCD and a CMOS (complementary metal oxide semiconductor). The image sensor 422a may be connected to the shooting controller 81 via the image measurement control circuit 83. "Image sensor exposure signal" outputted from the image measurement control circuit 83 may be inputted to the image sensor 422a. The image sensor exposure signal outputted from the image measurement control circuit 83 may be a control signal for controlling the operation of the image sensor 422a to expose the light receiving surface of the image sensor 422a to the light. When the input of the image sensor exposure signal to the image sensor 422a is started, the exposure of the image sensor 422a may be started. Then, when the input of the image sensor exposure signal is stopped, the exposure of the image sensor 422a may be stopped. The image sensor 422a after the completion of the exposure may generate the image data of the captured image, and output the data to the shooting controller 81. Here, the period of time from when the exposure of the image sensor 422a is started until the exposure is stopped may be referred to as "exposure time Tr."

The other configuration of the image sensor 422a may be the same as the configuration of the image sensor 422a shown in FIG. 3. Moreover, the configurations of the transfer optical system 422b and the window 422c may be the same as those of the transfer optical system 422b and the window 422c shown in FIG. 3.

The shutter 422d may be provided on the light receiving surface of the image sensor 422a. The shutter 422d may be, for example, an image intensifier with a microchannel plate. Here, the specific configuration of the shutter 422d will be described in detail later with reference to FIG. 43.

The shutter 422d may be connected to the shooting controller 81 via the image measurement control circuit 83. "Shutter opening signal" outputted from the image measurement control circuit 83 may be inputted to the shutter 422d. The shutter opening signal outputted from the image measurement control circuit 83 may be a control signal for controlling the opening and closing of the shutter 422d. When the input of the shutter opening signal to the shutter 422d is started, the shutter 422d may open. Then, when the input of the shutter opening signal to the shutter 422d is stopped, the shutter 422d may close. The image sensor 422a may capture the image formed by the transfer optical system 422b from when the shutter 422d opens until the shutter 422d closes. Here, the period of time from when the shutter 422d opens until the shutter 422d closes may be referred to as "shutter opening time Tex."

The image measurement control circuit 83 shown in FIG. 5 may be a circuit for controlling the operation timing of the image measurement unit 42. The image measurement control circuit 83 may be provided between the shooting controller 81 and the image measurement unit 42. The image measurement control circuit 83 may include an AND circuit 831, an AND circuit 832, a delay circuit 833, a delay circuit 834, a one-shot circuit 835, and a one-shot circuit 836.

The input side of the AND circuit 831 may be connected to the shooting controller 81. The output side of the AND circuit 831 may be connected to the delay circuit 833 and the delay circuit 834. The droplet detection signal and "image measurement signal" outputted from the shooting controller 81 may be inputted to the AND circuit 831. The droplet detection signal outputted from the shooting controller 81 may be a signal which has been outputted from the droplet detector 41 and is inputted directly to the AND circuit 831 via the shooting controller 81. The droplet detection signal may be inputted to the AND circuit 831 for the same cycle as the generation cycle of the droplet 271. The image measurement signal outputted from the shooting controller 81 may be a control signal to allow the image measurement unit 42 to perform image measurement. The image measurement signal may have a pulse width longer than the pulse width of the droplet detection signal and shorter than the generation cycle of the droplet 271. When the AND circuit 831 receives the droplet detection signal while receiving the image measurement signal, the AND circuit 831 may output enable signals to activate the delay circuit 833 and the delay circuit 834.

The delay circuit 833 may change the delay time for an input signal, based on the setting by the shooting controller 81. The input side of the delay circuit 833 may be connected to the AND circuit 831. The output side of the delay circuit 833 may be connected to the one-shot circuit 835. Moreover, the input side (not shown) of the delay circuit 833 for setting the delay time may be connected to the shooting controller 81.

The enable signal outputted from the AND circuit 831 may be inputted to the delay circuit 833. The delay circuit 833 may output the enable signal to activate the one-shot circuit 835 at the timing delayed from the inputted enable signal by "delay time Tds". The delay time Tds may be applied to determine the timing at which the image measurement unit 42 starts image measurement. To be more specific, the delay time Tds may be applied to determine the timing at which the image measurement control circuit 83 outputs a lighting signal to the light source 421a of the light source part 421. Moreover, the delay time Tds may be applied to determine the timing at which the image measurement control circuit 83 outputs a shutter opening signal to the shutter 422d of the imaging part 422.

The delay circuit 834 may change the delay time for an input signal, based on the setting by the shooting controller 81. The input side of the delay circuit 834 may be connected to the AND circuit 831. The output side of the delay circuit 834 may be connected to the one-shot circuit 836. Moreover, the input side (not shown) of the delay circuit 834 for setting the delay time may be connected to the shooting controller 81.

The enable signal outputted from the AND circuit 831 may be inputted to the delay circuit 834. The delay circuit 834 may output the enable signal to activate the one-shot circuit 836 at the timing delayed from the inputted enable signal by "delay time Tdi." The delay time Tdi may be applied to determine the timing at which an image sensor exposure signal is outputted to the image sensor 422a of the imaging part 422. The delay time Tdi may be equal to or shorter than the delay time Tds.

The one-shot circuit 835 may change the pulse width of the output signal, based on the setting by the shooting controller 81. The pulse width which is set in the one-shot circuit 835 by the shooting controller 81 may correspond to the above-described shutter opening time Tex. The input side of the one-shot circuit 835 may be connected to the delay circuit 833. The output side of the one-shot circuit 835 may be connected to the shutter 422d of the imaging part 422 and the AND circuit 832. Moreover, the input side (not shown) of the one-shot circuit 835 for setting the pulse width of the output signal may be connected to the shooting controller 81.

The enable signal outputted from the delay circuit 833 may be inputted to the one-shot circuit 835. The one-shot circuit 835 may output an output signal having the pulse width of the shutter opening time Tex, according to the inputted enable signal as a trigger. According to the output signal from the one-shot circuit 835, it is possible to determine the length of the shutter opening time of the shutter 422d and the length of the lighting time of the light source 421a. Among the output signals from the one-shot circuit 835, the signal inputted to the shutter 422d may function as the above-described shutter opening signal.

The one-shot circuit 836 may change the pulse width of the output signal, based on the setting by the shooting controller 81. The pulse width which is set in the one-shot circuit 836 by the shooting controller 81 may correspond to the above-described exposure time Tr. The input side of the one-shot circuit 836 may be connected to the delay circuit 834. The output side of the one-shot circuit 836 may be connected to the image sensor 422a of the imaging part 422. Moreover, the input side (not shown) of the one-shot circuit 836 for setting the pulse width of the output signal may be connected to the shooting controller 81.

The enable signal outputted from the delay circuit 834 may be inputted to the one-shot circuit 836. The one-shot circuit 836 may output an output signal having the pulse width of the exposure time Tr, according to the inputted enable signal as a trigger. According to the output signal from the one-shot circuit 836, it is possible to determine the length of the exposure time Tr of the image sensor 422a. The output signal from the one-shot circuit 836 may be inputted to the image sensor 422a and function as the above-described image sensor exposure signal.

The input side of the AND circuit 832 may be connected to the shooting controller 81 and the one-shot circuit 835. The output side of the AND circuit 832 may be connected to the light source 421a of the light source part 421. "Gate signal" outputted from the shooting controller 81 and the output signal from the one-shot circuit 835 may be inputted to the AND circuit 832. The gate signal outputted from the shooting controller 81 may determine whether or not to turn on the light source 421a. When the AND circuit 832 receives the output signal from the one-shot circuit 835 while receiving the gate signal, the AND circuit 832 may output a lighting signal having the same pulse width as the pulse width of the output signal from the one-shot circuit 835, to the light source 421a. Here, an instance where the shooting controller 81 outputs a gate signal to the AND circuit 832 may be referred to as "gate signal is turned on." Meanwhile, an instance where the shooting controller 81 does not output a gate signal to the AND circuit 832 may be referred to as "gate signal is turned off."

With the above-described configuration, the image measurement control circuit 83 can control the operation timing of each component of the image measurement unit 42, based on various times and various signals set by the shooting controller 81. In particular, the image measurement control circuit 83 can output the shutter opening signal according to the delay time Tds and the droplet detection signal, and therefore control the timing at which the imaging part 422 captures the image of the imaging region 25a. Here, the timing at which the imaging part 422 captures the image of the imaging region 25a may be referred to as "imaging timing." Specifically, the imaging timing may be a timing at which the shutter opening signal is outputted, and may be determined depending on the length of the delay time Tds.

The configuration of the shooting controller 81 shown in FIG. 5 may be the same as that of the shooting controller 81 shown in FIG. 3, with the exception of the configuration for communication with the image measurement control circuit 83. The configuration of the delay circuit 82 shown in FIG. 5 may be the same as that of the delay circuit 82 shown in FIG. 3.

5.2 Operation

With reference to FIGS. 6 to 12, the operation of the image measurement system included in the EUV light generation apparatus 1 according to Embodiment 1 will be described. The operation of the image measurement system included in the EUV light generation apparatus 1 according to Embodiment 1, which is the same as the operation of the EUV light generation apparatus 1 shown in FIGS. 2 and 3, will not be described again here. First, with reference to FIGS. 6 and 7, the timing control for the image measurement performed by the controller 8 of the EUV light generation apparatus 1 according to Embodiment 1 will be described.

Figure 6:
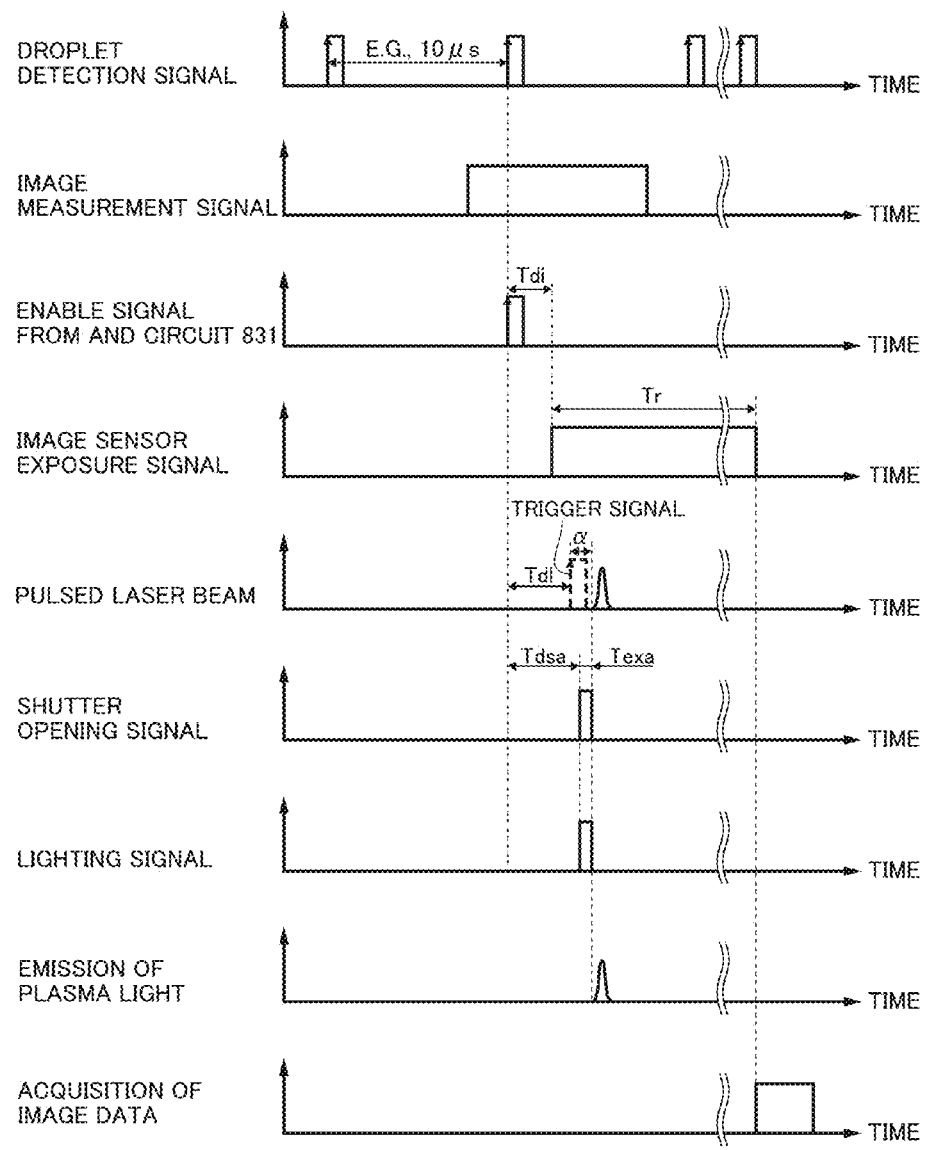
FIG. 6 is a time chart for the image measurement of a droplet by a controller shown in FIG. 5.

FIG. 6 is a time chart for the image measurement performed by the controller 8 shown in FIG. 5, where the image of the droplet 271 reaching the plasma generation region 25 is measured.

With the time chart shown in FIG. 6, the shooting controller 81 may set the shutter opening time Tex as Tex=Texa in the one-shot circuit 835 in advance. The shutter opening time Texa may be a period of time which is necessary and sufficient to capture the image of the droplet 271. The shutter opening time Texa may be, for example, 50 ns to 500 ns.

Moreover, the shooting controller 81 may set the delay time Tds as Tds=Tdsa in the delay circuit 833. When the image of the droplet 271 reaching the plasma generation region 25 is captured, the imaging timing of the imaging part 422 may be set to a timing just before the irradiation timing of the pulsed laser beam 33. That is, a summed value "Tdsa+Texa" of the delay time Tdsa that defines the output timing of the shutter opening signal and the shutter opening time Texa may be equal to or smaller than "delay time Tdl+time α" that defines the irradiation timing of the pulsed laser beam 33. The delay time Tdsa may be calculated according to the following equation.

$$Tdsa = (d/v) - Texa$$

Here, d may represent the distance between the plasma generation region 25 and the predetermined position P. For example, d may be 1 mm to 2 mm. v may represent the traveling speed of the droplet 271 shown in FIG. 5. For example, v may be 30 m/s to 150 m/s. d/v may be a period of time required from when the droplet 271 passes through the predetermined position P until reaching the plasma generation region 25.

The delay time Tdi of the delay circuit 834 and the exposure time Tr of the one-shot circuit 836 may be set in advance as the initial setting at startup.

The droplet 271 may be outputted into the chamber 2 for the predetermined generation cycle and passthrough the predetermined position P on the target traveling path 272. At this time, the controller 8 may control the output timings of various signals for the image measurement as follows, according to the droplet detection signals outputted from the droplet detector 41.

As shown in FIG. 6, the shooting controller 81 may output droplet detection signals directly to the delay circuit 82 and the AND circuit 831.

Then, as shown in FIG. 6, the shooting controller 81 may output an image measurement signal to the AND circuit 831 when the shooting controller 81 causes the image measurement unit 42 to perform the image measurement.

Then, as shown in FIG. 6, when the image measurement signal and the droplet detection signal are inputted to the AND circuit 831, the AND circuit 831 may output enable signals to the delay circuit 833 and the delay circuit 834. When the enable signal is inputted from the AND circuit 831 to the delay circuit 833, the delay circuit 833 may output the enable signal to the one-shot circuit 835 at the timing delayed by the delay time Tdsa. When the enable signal is inputted from the AND circuit 831 to the delay circuit 834, the delay circuit 834 may output the enable signal to the one-shot circuit 836 at the timing delayed by the delay time Tdi.

Then, as shown in FIG. 6, when the enable signal is inputted to the one-shot circuit 836, the one-shot circuit 836 may output an image sensor exposure signal having the pulse width of the exposure time Tr to the image sensor 422a. The image sensor 422a may be exposed to the light from when the image sensor exposure signal is inputted to the image sensor 422a until the exposure time Tr has elapsed.

Then, as shown in FIG. 6, when the droplet detection signal is inputted to the delay circuit 82, the delay circuit 82 may output a trigger signal to the laser device 3 at the timing delayed by the delay time Tdl. After a time α has elapsed from when the trigger signal is inputted to the laser device 3, the laser device 3 may emit the pulsed laser beam 33 to the plasma generation region 25.

Then, as shown in FIG. 6, when the enable signal is inputted to the one-shot circuit 835, the one-shot circuit 835 may output the output signals each having the pulse width of the shutter opening time Texa to the shutter 422d and the AND circuit 832. Among the output signals from the one-shot circuit 835, the signal inputted to the shutter 422d may function as a shutter opening signal. The shutter 422d may be open from when the shutter opening signal is inputted until the shutter opening time Texa has elapsed.

Then, as shown in FIG. 6, when the output signal from the one-shot circuit 835 and the gate signal are inputted to the AND circuit 832, the AND circuit 832 may output a lighting signal having the pulse width of the shutter opening time Texa to the light source 421a. The gate signal may be outputted from the shooting controller 81 to the AND circuit 832 before the one-shot circuit 835 outputs the output signal to the AND circuit 832. The shooting controller 81 may output the gate signal to the AND circuit 832 at the same timing as the timing at which the shooting controller 81 outputs the image measurement signal to the AND circuit 831. The light source 421a may emit pulsed light from when the lighting signal is inputted until the shutter opening time Texa has elapsed.

Then, as shown in FIG. 6, plasma light may be emitted after the shutter opening time Texa has elapsed. The imaging part 422 may capture the image of the droplet 271 just before being irradiated with the pulsed laser beam 33 in the plasma generation region 25.

Then, as shown in FIG. 6, the image sensor 422a may generate image data and output the data to the shooting controller 81 after the exposure time Tr has elapsed. The shooting controller 81 may acquire the image data of the droplet 271 just before being irradiated with the pulsed laser beam 33 in the plasma generation region 25. The shooting controller 81 may measure the state of the droplet 271, based on the acquired image data.

Figure 7:
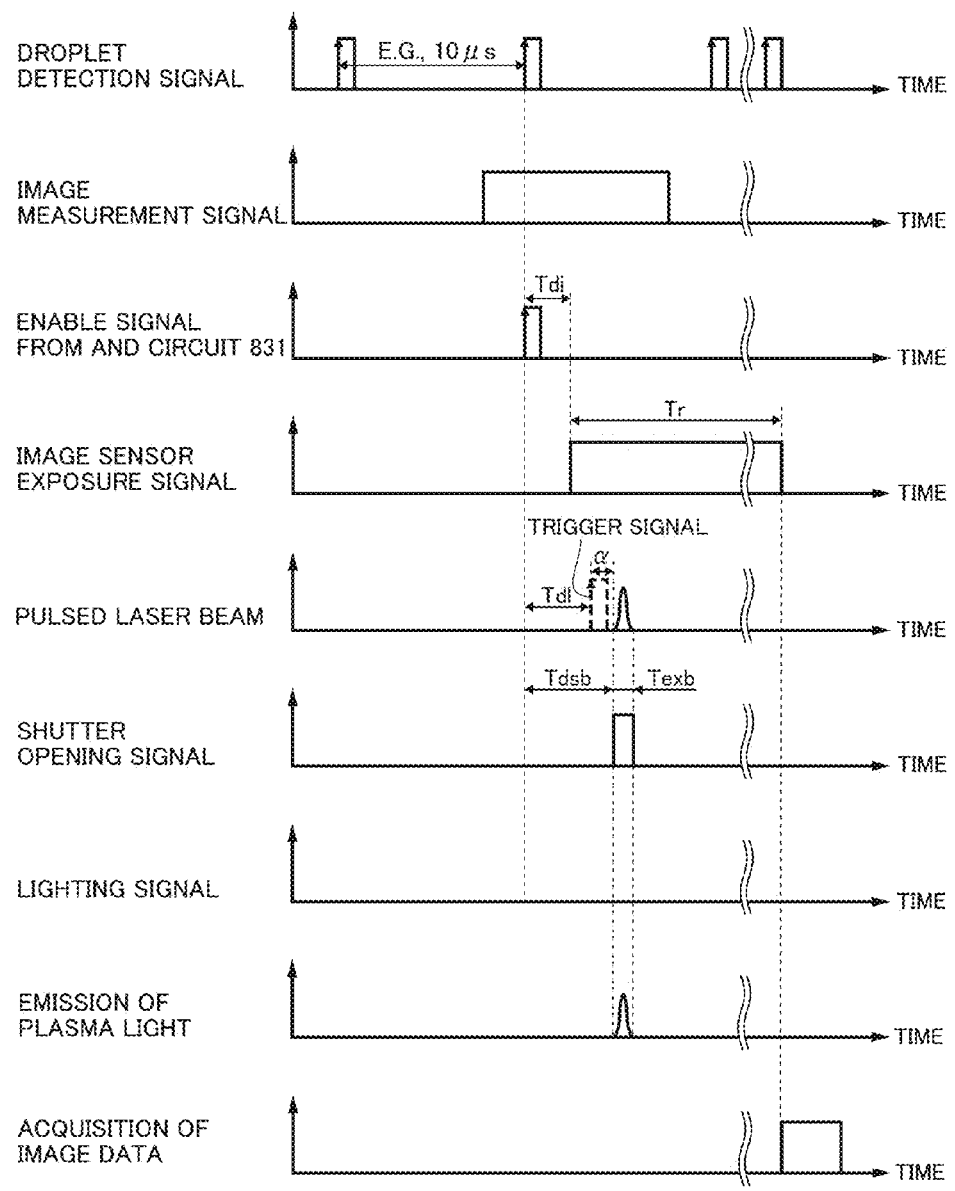
FIG. 7 is a time chart for the image measurement of plasma light by the controller shown in FIG. 5.

FIG. 7 is a time chart for the image measurement performed by the controller 8 shown in FIG. 5, where the image of the plasma light emitted in the plasma generation region 25 is measured.

With the time chart shown in FIG. 7, the shooting controller 81 may set the shutter opening time Tex as Tex=Texb in the one-shot circuit 835 in advance. The shutter opening time Texb may be a period of time which is necessary and sufficient to capture the image of the plasma light. The shutter opening time Texb may be, for example, 2 ns to 50 ns.

Moreover, the shooting controller 81 may set the delay time Tds as Tds=Tdsb in the delay circuit 833. When the image of the plasma light emitted in the plasma generation region 25 is captured, the imaging timing of the imaging part 422 may be set to a timing just after the irradiation timing of the pulsed laser beam 33. That is, the delay time Tdsb that defines the output timing of the shutter opening signal may be equal to or greater than "delay time Tdl+time α" that defines the irradiation timing of the pulsed laser beam 33. The delay time Tdsb may be calculated according to the following equation.

$$Tdsb=d/v$$

The delay time Tdi of the delay circuit 834 and the exposure time Tr of the one-shot circuit 836 may be set in advance as the initial setting at startup in the same way as the case shown in FIG. 6.

In FIG. 7, the controller 8 may control the output timings of various signals for the image measurement as follows in the same way as the case in FIG. 6.

As shown in FIG. 7, the shooting controller 81 may output droplet detection signals directly to the delay circuit 82 and the AND circuit 831.

Then, as shown in FIG. 7, the shooting controller 81 may output an image measurement signal to the AND circuit 831 when the shooting controller 81 causes the image measurement unit 42 to perform the image measurement.

Then, as shown in FIG. 7, when the image measurement signal and the droplet detection signal are inputted to the AND circuit 831, the AND circuit 831 may output enable signals to the delay circuit 833 and the delay circuit 834. When the enable signal is inputted from the AND circuit 831 to the delay circuit 833, the delay circuit 833 may output the enable signal to the one-shot circuit 835 at the timing delayed by the delay time Tdsb. When the enable signal is inputted from the AND circuit 831 to the delay circuit 834, the delay circuit 834 may output the enable signal to the one-shot circuit 836 at the timing delayed by the delay time Tdi.

Then, as shown in FIG. 7, when the enable signal is inputted to the one-shot circuit 836, the one-shot circuit 836 may output an image sensor exposure signal having the pulse width of the exposure time Tr to the image sensor 422a. The image sensor 422a may be exposed to the light from when the image sensor exposure signal is inputted to the image sensor 422a until the exposure time Tr has elapsed.

Then, as shown in FIG. 7, when the droplet detection signal is inputted to the delay circuit 82, the delay circuit 82 may output a trigger signal to the laser device 3 at the timing delayed by the delay time Tdl. After the time α has elapsed from when the trigger signal is inputted to the laser device 3, the laser device 3 may emit the pulsed laser beam 33 to the plasma generation region 25.

Then, as shown in FIG. 7, when the enable signal is inputted to the one-shot circuit 835, the one-shot circuit 835 may output the output signals each having the pulse width of the shutter opening time Texb to the shutter 422d and the AND circuit 832. Among the output signals from the one-shot circuit 835, the signal inputted to the shutter 422d may function as a shutter opening signal. The shutter opening signal may be inputted to the shutter 422d in synchronization with the irradiation timing of the pulsed laser beam 33. The shutter 422d may be open from when the shutter opening signal is inputted until the shutter opening time Texb has elapsed.

Then, as shown in FIG. 7, the AND circuit 832 may not output a lighting signal to the light source 421a. When the output signal from the one-shot circuit 835 and the gate signal are inputted to the AND circuit 832, the AND circuit 832 may output a lighting signal having the pulse width of the shutter opening time Texb to the light source 421a. However, when the image of the plasma light is captured, the shooting controller 81 may not output the gate signal. The reason for this is that the optical intensity of the plasma light is sufficiently higher than the optical intensity of the pulsed light emitted from the light source 421a, and therefore it may not necessary to turn on the light source 421a. In addition, when the light source 421a is not turned on, the light source 421a does not emit pulsed light interfering with the plasma light, and therefore it is possible to precisely measure the state of the plasma light. Moreover, if the light source 421a is not turned on, it is possible to reduce the power consumption.

Then, as shown in FIG. 7, the plasma light may be emitted during the shutter opening time Texb. The imaging part 422 may capture the image of the plasma light emitted from the droplet 271 just after being irradiated with the pulsed laser beam 33 in the plasma generation region 25.

Then, as shown in FIG. 7, after the exposure time Tr has elapsed, the image sensor 422a may generate image data and output the data to the shooting controller 81. The shooting controller 81 may acquire the image data of the plasma light emitted from the droplet 271 just after being irradiated with the pulsed laser beam 33 in the plasma generation region 25. The shooting controller 81 may measure the state of the plasma light, based on the acquired image data.

Figure 8:
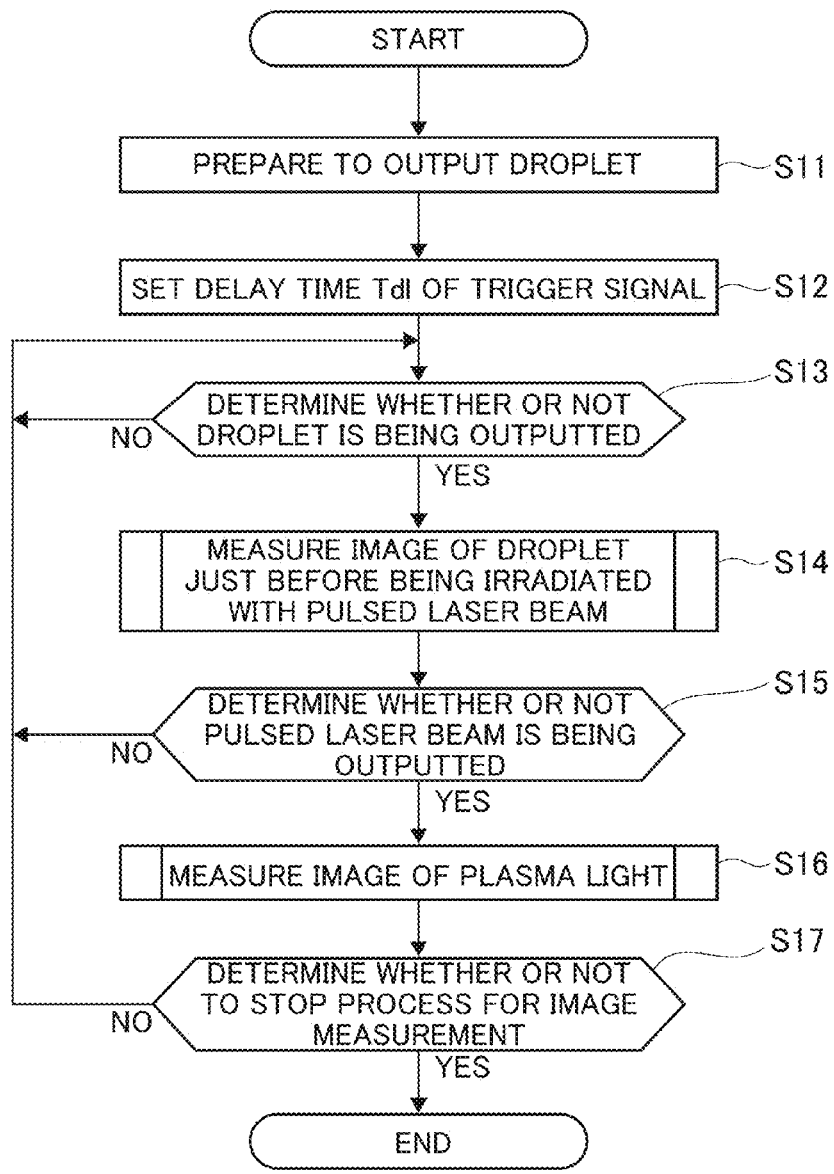
FIG. 8 is a flowchart explaining a process for image measurement by a shooting controller shown in FIG. 5.

Next, with reference to FIGS. 8 to 12, the flow of the process for the image measurement performed by the shooting controller 81 of the EUV light generation apparatus 1 according to Embodiment 1 will be described. FIG. 8 is a flowchart showing a process for the image measurement performed by the shooting controller 81.

In step S11, the shooting controller 81 may prepare to output the droplet 271 into the chamber 2. Upon receiving a target generation signal from the EUV light generation controller 5, the shooting controller 81 may perform the same steps as the steps S2 to S4 shown in FIG. 4, as the preparation for outputting the droplet 271.

In step S12, the shooting controller 81 may set the delay time Tdl for the trigger signal in the delay circuit 82.

In step S13, the shooting controller 81 may determine whether or not the droplet 271 is being outputted. The shooting controller 81 may make the determination by checking if the droplet detection signal has been inputted. When determining that the droplet 271 is not being outputted, the shooting controller 81 may wait. On the other hand, when determining that the droplet 271 is being outputted, the shooting controller 81 may move the step to step S14.

In the step S14, the shooting controller 81 may measure the image of the droplet 271 just before being irradiated with the pulsed laser beam 33. Here, a process for measuring the image of the droplet 271 will be described later with reference to FIG. 9.

In step S15, the shooting controller 81 may determine whether or not the pulsed laser beam 33 is being outputted. The shooting controller 81 may make the determination by checking if the trigger signal has been inputted to the laser device 3. When determining that the pulsed laser beam 33 is not being outputted, the shooting controller 81 may move the step to the step S13. On the other hand, when determining that the pulsed laser beam 33 is being outputted, the shooting controller 81 may move the step to step S16.

In the step S16, the shooting controller 81 may measure the image of the plasma light emitted from the droplet 271 just after being irradiated with the pulsed laser beam 33. Here, a process for measuring the image of the plasma light will be described later with reference to FIG. 11.

In step S17, the shooting controller 81 may determine whether or not to stop the process for the image measurement. When determining not to stop the process for the image measurement, the image shooting controller 81 may move the step to the step S13. On the other hand, when determining to stop the process for the image measurement, the shooting controller 81 may end this process.

Figure 9:
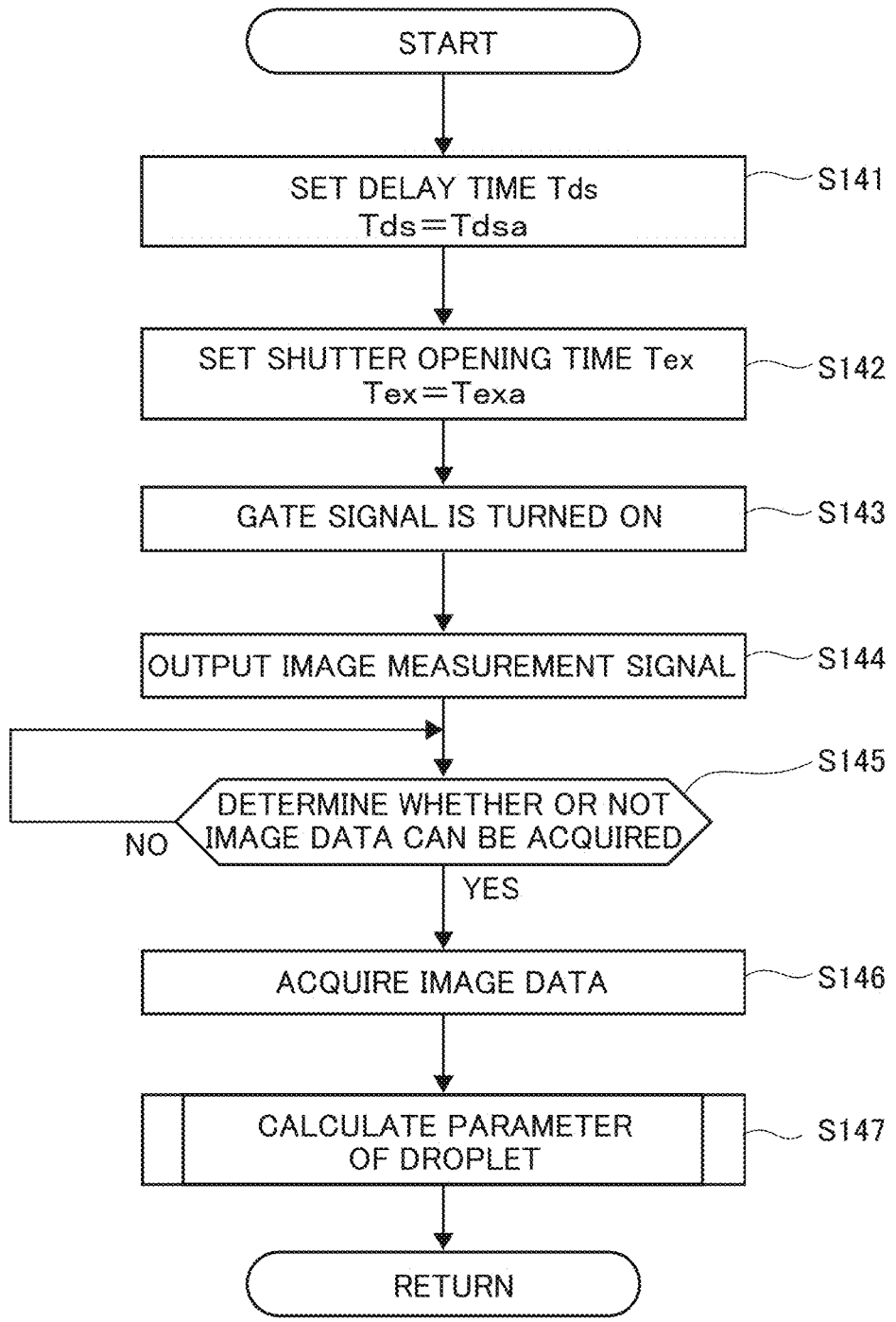
FIG. 9 is a flowchart explaining a process for measuring the image of a droplet by the shooting controller shown in FIG. 5.
Figure 10:
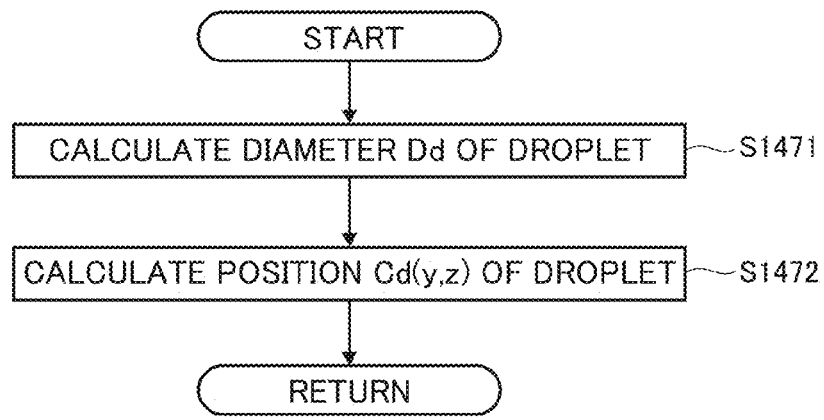
FIG. 10A is a flowchart explaining a process for calculating the parameters of a droplet by the shooting controller shown in FIG. 5.
FIG. 10B shows an exemplary image of a droplet captured by an imaging part of an image measurement unit shown in FIG. 5.
Figure 10:
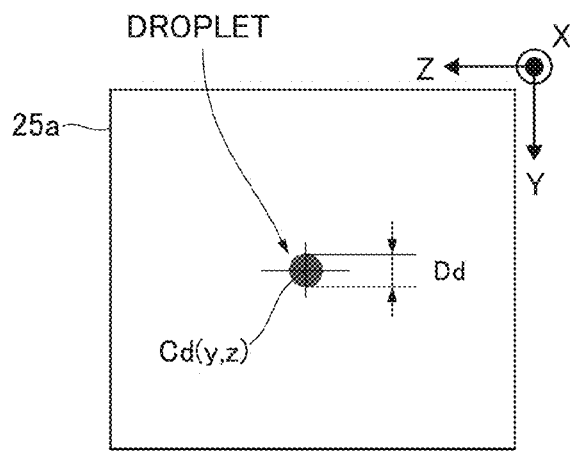

FIG. 9 is a flowchart showing the process for measuring the image of the droplet 271 in the step S14 shown in FIG. 8.

In step S141, the shooting controller 81 may set the delay time Tds in the delay circuit 833. The shooting controller 81 may set the delay time Tds as Tds=Tdsa in order to set the imaging timing of the imaging part 422 to a timing just before the irradiation timing of the pulsed laser beam 33.

In step S142, the shooting controller 81 may set the shutter opening time Tex in the one-shot circuit 835. The shooting controller 81 may set the shutter opening time Tex as Tex=Texa in order to secure necessary and sufficient time for which the image sensor 422a captures the image of the droplet 271.

In step S143, the shooting controller 81 may output a gate signal to the AND circuit 832, that is, a gate signal may be turned on. The light source 421a may emit pulsed light in synchronization with the imaging timing.

In step S144, the shooting controller 81 may output an image measurement signal to the AND circuit 831. The image measurement unit 42 may capture the image of the imaging region 25a. The captured image may contain the image of the droplet 271 just before being irradiated with the pulsed laser beam 33 in the plasma generation region 25. The image measurement unit 42 may generate image data of the captured image, and output the data to the shooting controller 81.

In step S145, the shooting controller 81 may determine whether or not the image data can be acquired. When determining that the image data cannot be acquired because the image measurement unit 42 is not ready to output the image data, the shooting controller 81 may wait. On the other hand, when determining that the image data can be acquired because the image measurement unit 42 is ready to output the image data, the shooting controller 81 may move the step to step S146.

In the step S146, the shooting controller 81 may acquire the image data outputted from the image measurement unit 42.

In step S147, the shooting controller 81 may calculate the parameters for the state of the droplet 271 just before being irradiated with the pulsed laser beam 33, based on the acquired image data. Here, a process for calculating the parameters of the droplet 271 will be described later with reference to FIG. 10A.

FIG. 10A is a flowchart showing the process for calculating the parameters of the droplet 271 in the step S147 shown in FIG. 9. FIG. 10B is a drawing showing the image of the droplet 271 captured by the imaging part 422 of the image measurement unit 42.

In step S1471, the shooting controller 81 may calculate a diameter Dd of the droplet 271, based on the image of the droplet 271 contained in the image data acquired in the step S146 shown in FIG. 9.

In step S1472, the shooting controller 81 may calculate a position Cd of the droplet 271, based on the image of the droplet 271 contained in the acquired image data.

The image of the droplet 271 captured by one imaging operation of the imaging part 422 may be an image illustrated in FIG. 10B. The shooting controller 81 may calculate the diameter Dd and the position Cd of the droplet 271 by the following way.

The shooting controller 81 may regard the width of the image of the droplet 271 in the Y direction that is the traveling direction of the droplet 271 as the diameter Dd. When the shadow of the approximately spherical droplet 271 is captured as one image having an approximately spherical shape, the shooting controller 81 may regard the average of the width of the droplet 271 in the Y direction and the width of the droplet 271 in the Z direction perpendicular to the Y direction, as the diameter Dd of the droplet 271.

In addition, the shooting controller 81 may regard the center position of the image of the droplet 271 as the position Cd of the droplet 271. To be more specific, the shooting controller 81 may regard a specific point in the imaging region 25a as the original point. Then, the shooting controller 81 may calculate the distance from the original point to the center of the image of the droplet 271 in the Y direction. At the same time, the shooting controller 81 may calculate the distance from the original point to the center of the image of the droplet 271 in the Z direction. Then, the shooting controller 81 may regard the calculated distances in the Y direction and the Z direction as coordinate values of the position Cd(y, z) of the droplet 271.

Figure 11:
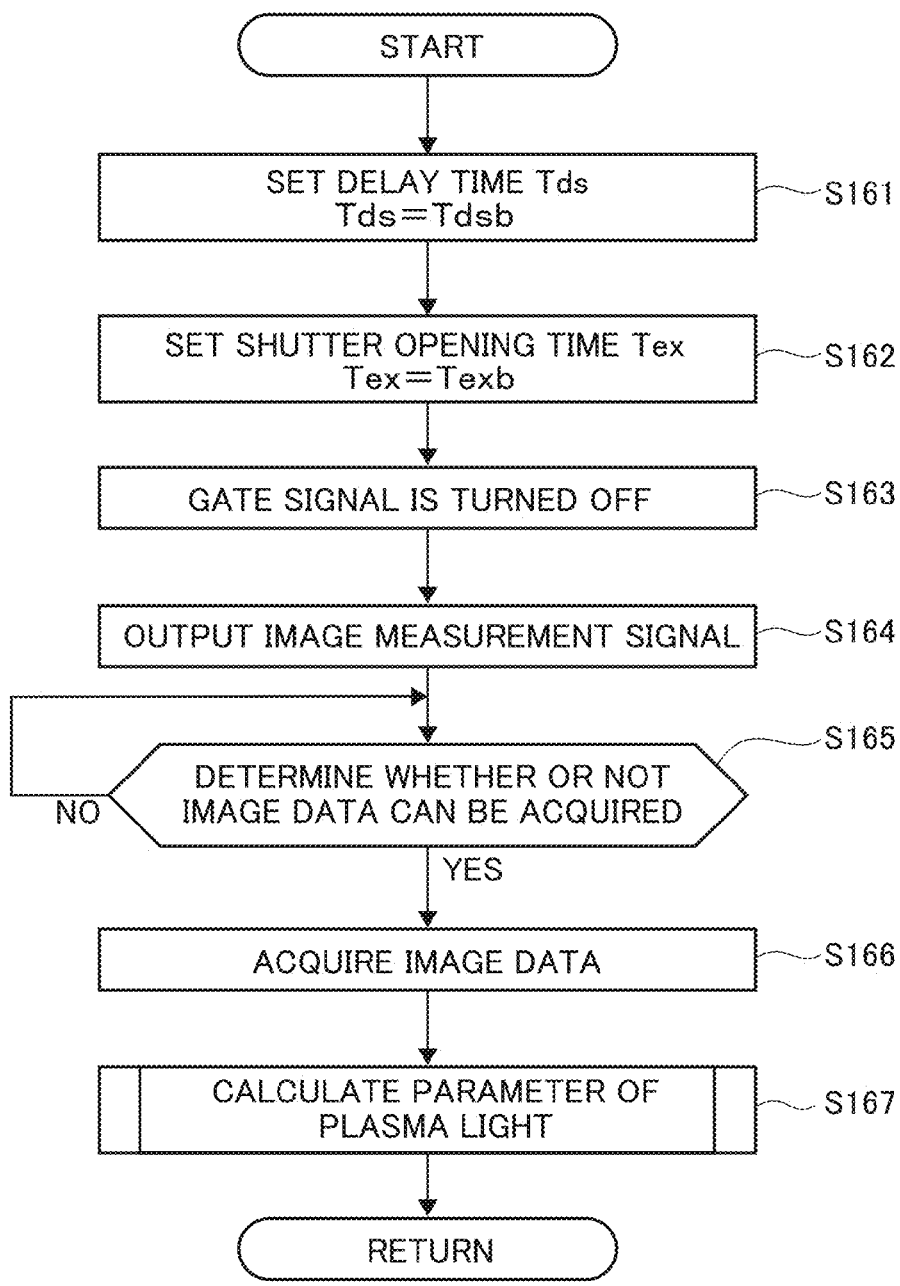
FIG. 11 is a flowchart explaining a process for measuring the image of plasma light by the shooting controller shown in FIG. 5.
Figure 12:
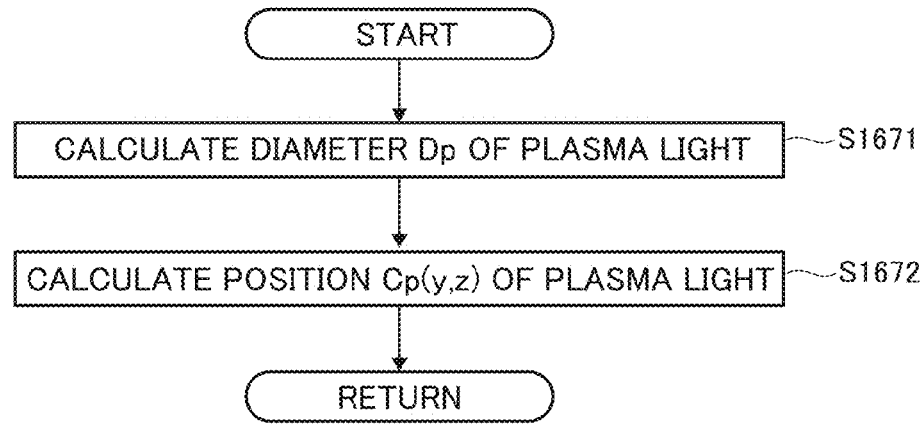
FIG. 12A is a flowchart explaining a process for calculating the parameters of plasma light by the shooting controller shown in FIG. 5.
FIG. 12B shows an exemplary image of the plasma light captured by the imaging part of the image measurement unit shown in FIG. 5.
Figure 12:
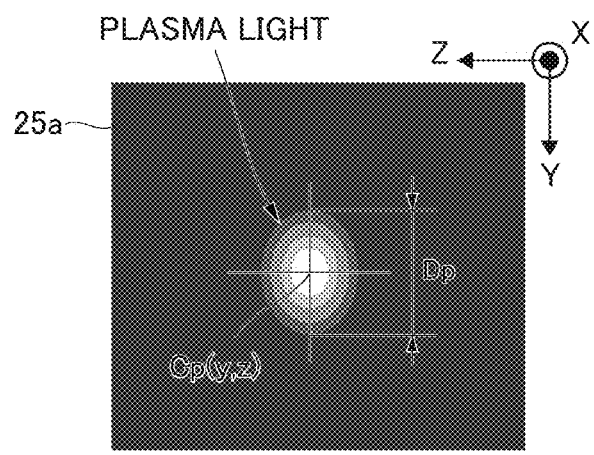

FIG. 11 is a flowchart showing the process for measuring the image of the plasma light in the step S16 shown in FIG. 8.

In step S161, the shooting controller 81 may set the delay time Tds in the delay circuit 833. The shooting controller 81 may set the delay time Tds as Tds=Tdsb in order to set the imaging timing of the imaging part 422 to a timing just after the irradiation timing of the pulsed laser beam 33.

In step S162, the shooting controller 81 may set the shutter opening time Tex in the one-shot circuit 835. The shooting controller 81 may set the shutter opening time Tex as Tex=Texb in order to secure necessary and sufficient time for which the image sensor 422a captures the image of the plasma light.

In step S163, the shooting controller 81 may not output a gate signal to the AND circuit 832, that is, a gate signal may be turned off. By this means, the light source 421a may not emit pulsed light.

In step S164, the shooting controller 81 may output an image measurement signal to the AND circuit 831. The image measurement unit 42 may capture the image of the imaging region 25a. The captured image may contain the image of the plasma light emitted from the droplet 271 just after being irradiated with the pulsed laser beam 33 in the plasma generation region 25. The image measurement unit 42 may generate image data of the captured image, and output the data to the shooting controller 81.

In step S165, the shooting controller 81 may determine whether or not the image data can be acquired. When determining that the image data cannot be acquired because the image measurement unit 42 is not ready to output the image data, the shooting controller 81 may wait. On the other hand, when determining that the image data can be acquired because the image measurement unit 42 is ready to output the image data, the shooting controller may move the step to step S166.

In the step S166, the shooting controller 81 may acquire the image data outputted from the image measurement unit 42.

In step S167, the shooting controller 81 may calculate the parameters for the state of the plasma light emitted from the droplet 271 just after being irradiated with the pulsed laser beam 33, based on the acquired image. Here, a process for calculating the parameters of the plasma light will be described later with reference to FIG. 12A.

FIG. 12A is a flowchart showing the process for calculating the parameters of the plasma light in the step S167 shown in FIG. 11. FIG. 12B is a drawing showing the image of the plasma light captured by the imaging part 422 of the image measurement unit 42.

In step S1671, the shooting controller 81 may calculate a diameter Dp of the plasma light, based on the image of the plasma light contained in the image data acquired in the step S166 shown in FIG. 11.

In step S1672, the shooting controller 81 may calculate a position Cp of the plasma light, based on the image of the plasma light contained in the acquired image data.

The image of the plasma light captured by one imaging operation of the imaging part 422 may be an image illustrated in FIG. 12B. The shooting controller 81 may calculate the diameter Dp and the position Cp of the plasma light by the following way.

The shooting controller 81 may regard the width of the image of the plasma light in the Y direction which is the traveling direction of the droplet 271, as the diameter Dp of the plasma light. When the image of the plasma light is captured as one approximately oval sphere, the shooting controller 81 may regard the width of the longer diameter as the diameter Dp of the plasma light. The shooting controller 81 may find the spatial and spectral distribution of the optical intensity of the plasma light, and regard $(1/e)^2$ width of the distribution as the diameter Dp of the plasma light.

In addition, the shooting controller 81 may regard the center position of the image of the plasma light as the position Cp of the plasma light. To be more specific, the shooting controller 81 may regard a specific point in the imaging region 25a as the original point. Then, the shooting controller 81 may calculate the distance from the original point to the center of the image of the plasma light in the Y direction. At the same time, the shooting controller 81 may calculate the distance from the original point to the center of the image of the plasma light in the Z direction. Then, the shooting controller 81 may regard the calculated distances in the Y direction and the Z direction as the coordinate values of the position Cp(y, z) of the plasma light. The shooting controller 81 may find the spatial distribution of the optical intensity of the plasma light, and regard the position corresponding to the weighted average efficiency of the optical intensity as the position Cp of the plasma light.

5.3 Effect

The EUV light generation apparatus 1 according to Embodiment 1 may capture the image of the droplet 271 just before being irradiated with the pulsed laser beam 33 in the plasma generation region 25. The EUV light generation apparatus 1 may calculate the parameters of the droplet 271 based on the captured image. Therefore, the EUV light generation apparatus 1 can precisely measure the state of the droplet 271 just before being irradiated with the pulsed laser beam 33 in the plasma generation region 25. Then, the EUV light generation apparatus 1 can correctly recognize whether or not the droplet 271 is in the certain state by comparing the calculated value with the target value of the parameter.

The EUV light generation apparatus 1 according to Embodiment 1 may capture the image of the plasma light emitted from the droplet 271 just after being irradiated with the pulsed laser beam 33 in the plasma generation region 25. The EUV light generation apparatus 1 may calculate the parameters of the plasma light based on the captured image. Therefore, the EUV light generation apparatus 1 can precisely measure the state of the plasma light emitted from the droplet 271 just after being irradiated with the pulsed laser beam 33 in the plasma generation region 25. Then, the EUV light generation apparatus 1 can correctly recognize whether or not the plasma light is in the certain state by comparing the calculated value with the target value of the parameter.

Then, with the EUV light generation apparatus 1 according to Embodiment 1, the controller 8 controls the timings of the image measurement, and therefore it is possible to capture both the image of the droplet 271 and the image of the plasma light in the plasma generation region 25 by the single imaging part 422.

6. Shooting System Using the EUV Light Generation Apparatus According to Embodiment 2

6.1 Configuration

The shooting system using the EUV light generation apparatus 1 according to Embodiment 2 may further include the laser device 3, a laser light focusing optical system 22a, a triaxial stage 226 and an image measurement unit 43, in addition to the components included in the image measurement system of the EUV light generation apparatus 1 according to Embodiment 1. This shooting system may measure the states of the droplet 271 and the plasma light in the plasma generation region 25. Moreover, the shooting system may control the position of the droplet 271, the position of the plasma light, and the focused position of the pulsed laser beam 33 in the plasma generation region 25.

Figure 13:
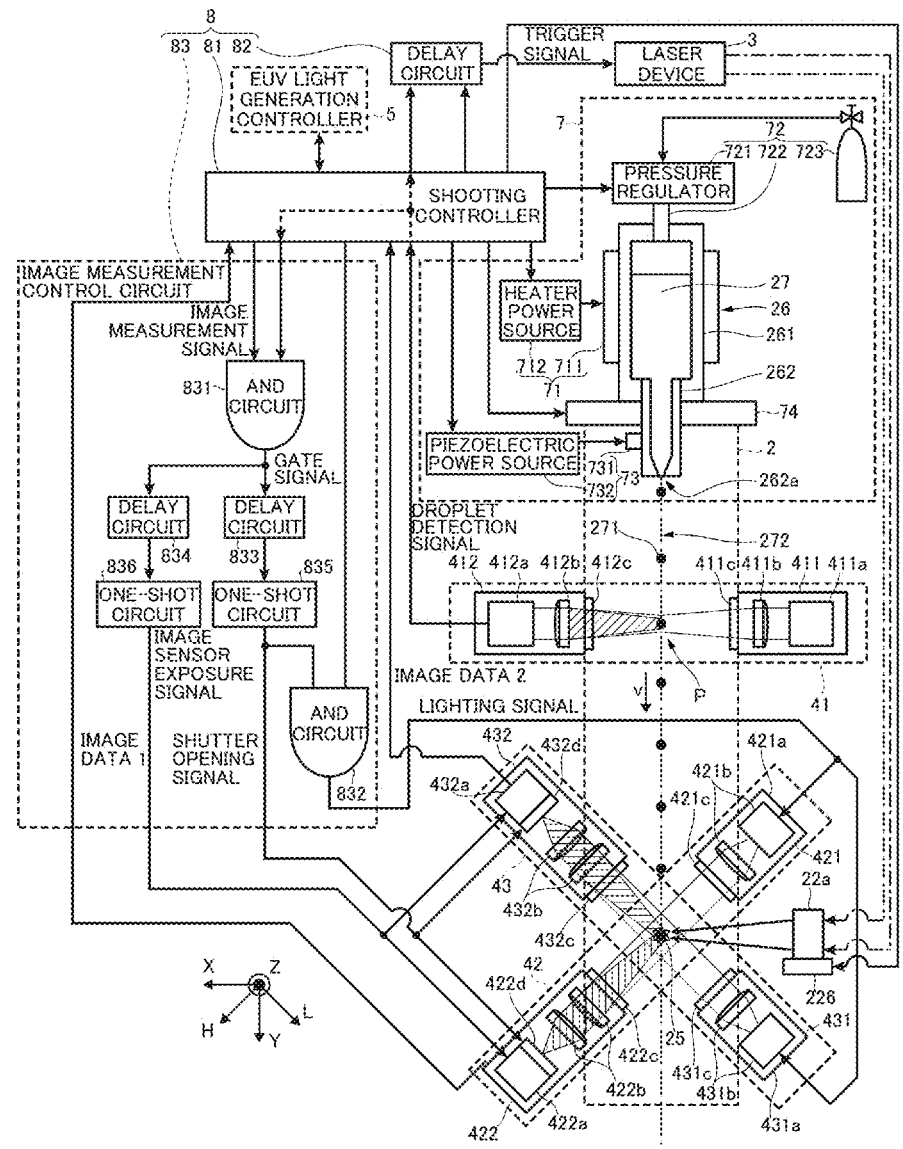
FIG. 13 shows the configuration of a shooting system using the EUV light generation apparatus according to Embodiment 2.

Now, the configuration of the shooting system using the EUV light generation apparatus 1 according to Embodiment 2 will be described with reference to FIG. 13. In FIG. 13, an H-axis may be a coordinate axis in an X-Y plane and have an angle of 45 degrees with respect to the X-axis. An L-axis may be a coordinate axis in the X-Y plane and be orthogonal to the H-axis.

The shooting system using the EUV light generation apparatus 1 according to Embodiment 2 may include the laser device 3, the laser beam focusing optical system 22a, the triaxial stage 226, the target generator 7, the droplet detector 41, the image measurement unit 42, the image measurement unit 43, and the controller 8. The controller 8 may include the shooting controller 81, the delay circuit 82, and the image measurement control circuit 83. The configurations of the shooting system shown in FIG. 13, which are the same as those of the EUV light generation apparatus 1 and the image measurement system shown in FIGS. 1 to 3 and 5, will not be described again here.

The configuration of the laser device 3 shown in FIG. 13 may be the same as that of the laser device 3 shown in FIG. 2. The configuration of the laser beam focusing optical system 22a shown in FIG. 13 may be the same as that of the laser beam focusing optical system 22a shown in FIG. 2. The configuration of the triaxial stage 226 shown in FIG. 13 may be the same as that of the triaxial stage 226 shown in FIG. 2. The configuration of the target generator 7 shown in FIG. 13 may be the same as that of the target generator 7 shown in FIG. 5. The configuration of the droplet detector 41 shown in FIG. 13 may be the same as that of the droplet detector 41 shown in FIG. 5.

The image measurement unit 42 and the image measurement unit 43 shown in FIG. 13 may measure the images of the droplet 271 and the plasma light in the plasma generation region 25, in the same way as the image measurement unit 42 shown in FIG. 5. Here, the image data of the image captured by the image measurement unit 42 may be referred to as "image data 1". The image data of the image captured by the image measurement unit 43 may be referred to as "image data 2".

The image measurement unit 42 shown in FIG. 13 may capture the image of the imaging region 25a in the normal direction of an L-Z plane, and measure the images of the droplet 271 and the plasma light. The direction in which the light source part 421 faces the imaging part 422 of the image measurement unit 42 may be the normal direction of the L-Z plane. The other configuration of the image measurement unit 42 may be the same as that of the image measurement unit 42 shown in FIG. 5.

The image measurement unit 43 shown in FIG. 13 may capture the image of the imaging region 25a in the normal direction of an H-Z plane, and measure the images of the droplet 271 and the plasma light. The image measurement unit 43 may include a light source part 431 and an imaging part 432. The light source part 431 and the imaging part 432 may be arranged to face one another across the plasma generation region 25 on the target traveling path 272. The direction in which the light source part 431 faces the imaging part 432 may be the normal direction of the H-Z plane.

The light source part 431 may include a light source 431a, an illumination optical system 431b and a window 431c. The light source 431a may be connected to the shooting controller 81 via the image measurement control circuit 83. A lighting signal outputted from the image measurement control circuit 83 may be inputted to the light source 431a. The light source 431a may emit pulsed light according to the lighting signal outputted from the image measurement control circuit 83. The other configuration of the light source 431a may be the same as that of the light source 421a shown in FIG. 5. In addition, the configurations of the illumination optical system 431b and the window 431c may be the same as those of the illumination optical system 421b and the window 421c shown in FIG. 5.

The imaging part 432 may capture the image of the imaging region 25a (not shown in FIG. 13) in the same way as the imaging part 422 shown in FIG. 5. The imaging part 432 may include an image sensor 432a, a transfer optical system 432b, a window 432c and a shutter 432d.

The image sensor 432a may be connected to the shooting controller 81 via the image measurement control circuit 83. An image sensor exposure signal outputted from the image measurement control circuit 83 may be inputted to the image sensor 432a. When the input of the image sensor exposure signal to the image sensor 432a is started, the exposure of the image sensor 432a may be started. Then, when the input of the image sensor exposure signal to the image sensor 432a is stopped, the exposure of the image sensor 432a may be stopped. The image sensor 432a may be connected to the shooting controller 81. The image sensor 432a may output the image data 2 of the captured image to the shooting controller 81. The other configuration of the image sensor 432a may be the same as that of the image sensor 422a shown in FIG. 5.

The shutter 432d may be connected to the shooting controller 81 via the image measurement control circuit 83. A shutter opening signal outputted from the image measurement control circuit 83 may be inputted to the shutter 432d. When the input of the shutter opening signal to the shutter 432d is started, the shutter 432d may open. Then, when the input of the shutter opening signal to the shutter 432d is stopped, the shutter 432d may close. The other configuration of the shutter 432d may be the same as that of the shutter 422d shown in FIG. 5. Moreover, the configurations of the transfer optical system 432b and the window 432c may be the same as those of the transfer optical system 422b and the window 422c shown in FIG. 5.

The image measurement control circuit 83 shown in FIG. 13 may control the operation timings of the image measurement unit 42 and the image measurement unit 43. The image measurement control circuit 83 may be provided between the shooting controller 81 and the image measurement units 42 and 43. The image measurement control circuit 83 may include the AND circuit 831, the AND circuit 832, the delay circuit 833, the delay circuit 834, the one-shot circuit 835, and the one-shot circuit 836.

The configurations of the AND circuit 831, the delay circuit 833, and the delay circuit 834 may be the same as those of the AND circuit 831, the delay circuit 833, and the delay circuit 834 shown in FIG. 5.

The output side of the one-shot circuit 835 may be connected to the shutter 422d of the imaging part 422, the shutter 432d of the imaging part 432, and the AND circuit 832. The output signals from the one-shot circuit 835 may be inputted to the shutter 422d and the shutter 432d at the same timing, as the shutter opening signals. The other configuration of the one-shot circuit 835 may be the same as that of the one-shot circuit 835 shown in FIG. 5.

The output side of the one-shot circuit 836 may be connected to the image sensor 422a of the imaging part 422 and the image sensor 432a of the imaging part 432. The output signals from the one-shot circuit 836 may be inputted to the image sensor 422a and the image sensor 432a at the same timing, as the image sensor exposure signals. The other configuration of the one-shot circuit 836 may be the same as that of the one-shot circuit 836 shown in FIG. 5.

The output side of the AND circuit 832 may be connected to the light source 421a of the light source part 421 and the light source 431a of the light source part 431. The output signals from the AND circuit 832 may be inputted to the light source 421a and the light source 431a at the same timing, as the lighting signals. The other configuration of the AND circuit 832 may be the same as that of the AND circuit 832 shown in FIG. 5.

The shooting controller 81 shown in FIG. 13 may acquire the image data 1 outputted from the image measurement unit 42. The shooting controller 81 may acquire the image data 2 outputted from the image measurement unit 43. The shooting controller 81 may calculate the parameters for the states of the droplet 271 and the plasma light in the plasma generation region 25, based on the acquired image data 1 and image data 2. The shooting controller 81 may set the delay time Tds and the delay time Tdl, and control the operation of the biaxial stage 74, based on the calculation result of the parameters of droplet 271. By this means, the shooting controller 81 can control the position of the droplet 271 reaching the plasma generation region 25. The shooting controller 81 may control the operation of the triaxial stage 226, based on the calculation result of the parameters of the plasma light. By this means, the shooting controller 81 can control the focused position of the pulsed laser beam 33 in the plasma generation region 25. The other configuration of the shooting controller 81 may be the same as that of the shooting controller 81 shown in FIG. 5. The configuration of the delay circuit 82 shown in FIG. 13 may be the same as that of the delay circuit 82 shown in FIG. 5.

6.2 Operation

Figure 14:
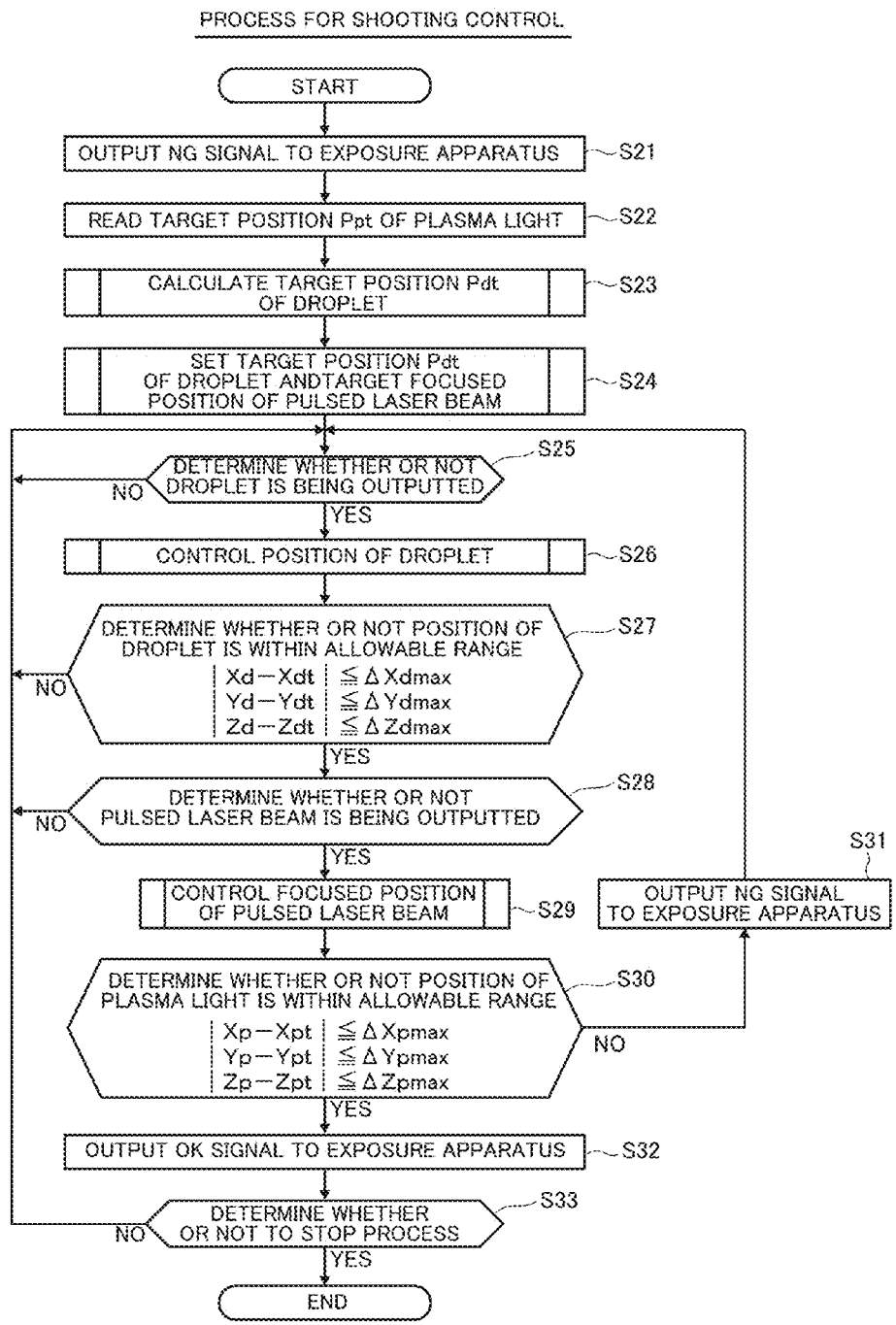
FIG. 14 is a flowchart explaining a process for shooting control by the shooting controller shown in FIG. 13.

Now, the operation of the shooting system using the EUV light generation apparatus 1 according to Embodiment 2 will be described with reference to FIGS. 14 to 23. The operations of the shooting system using the EUV light generation apparatus 1 according to Embodiment 2, which are the same as those of the EUV light generation apparatus 1 shown in FIGS. 2 and 3 and the image measurement system according to Embodiment 1, will not be described again here. FIG. 14 is a flowchart showing a process for the shooting control performed by the shooting controller 81 shown in FIG. 13.

In step S21, the shooting controller 81 may output an NG signal to the exposure apparatus controller 61 via the EUV light generation controller 5. The NG signal may be a signal to report that the EUV light generation apparatus 1 is not ready to output the EUV light 252 generated in an appropriate condition to the exposure apparatus 6.

In step S22, the shooting controller 81 may read a target position Ppt(Xpt, Ypt, Zpt) of the plasma light. The target position Ppt(Xpt, Ypt, Zpt) of the plasma light may be a target value for the center position of the plasma light emitted in the plasma generation region 25. In particular, the target position Ppt (Xpt, Ypt, Zpt) of the plasma light may be a target value for the center position of the plasma light emitted from the droplet 271 just after being irradiated with the pulsed laser beam 33 in the plasma generation region 25. The target position Ppt(Xpt, Ypt, Zpt) may be a predetermined value by the EUV light generation controller 5 according to a command from the exposure apparatus controller 61. The shooting controller 81 may read the target position Ppt (Xpt, Ypt, Zpt) of the plasma light stored in the EUV light generation controller 5.

In step S23, the shooting controller 81 may calculate a target position Pdt of the droplet 271. The target position Pdt(Xdt, Ydt, Zdt) of the droplet 271 may be a target value for the center position of the droplet 271 reaching the plasma generation region 25. In particular, the target position Pdt (Xdt, Ydt, Zdt) of the droplet 271 may be a target value for the center position of the droplet 271 just before being irradiated with the pulsed laser beam 33 in the plasma generation region 25. The shooting controller 81 may calculate the target position Pdt of the droplet 271 supplied to the plasma generation region 25, based on the target position Ppt of the plasma light read in the step S22. Here, a process for calculating the target position Pdt of the droplet 271 will be described later with reference to FIG. 15A.

In step S24, the shooting controller 81 may set the target position Pdt of the droplet 271 and the target focused position of the pulsed laser beam 33. The shooting controller 81 may set the delay time Tds, the delay time Tdl and the biaxial stage 74 such that the droplet 271 is supplied to the target position Pdt of the droplet 271 calculated in the step S23. The shooting controller 81 may set the triaxial stage 226 such that the pulsed laser beam 33 is focused on the target position Pdt of the droplet 271 calculated in the step S23. Here, a process for setting the target position Pdt of the droplet 271 and the target focused position of the pulsed laser beam 33 will be described later with reference to FIG. 16.

In step S25, the shooting controller 81 may determine whether or not the droplet 271 is being outputted. The shooting controller 81 may make the determination by checking if the droplet detection signal has been inputted. When determining that the droplet 271 is not being outputted, the shooting controller 81 may wait. On the other hand, when determining that the droplet 271 is being outputted, the shooting controller 81 may move the step to step S26.

In the step S26, the shooting controller 81 may control the position of the droplet 271. The shooting controller 81 may cause the image measurement unit 42 and the image measurement unit 43 to measure the image of the droplet 271 just before being irradiated with the pulsed laser beam 33 in the plasma generation region 25. Then, the shooting controller 81 may calculate a measurement position Cd(Xd, Yd, Zd) of the droplet 271, based on the acquired image data. Then, the shooting controller 81 may appropriately modify and set the delay time Tds and the delay time Tdl, and control the operation of the biaxial stage 74, based on the calculated measurement position Cd(Xd, Yd, Zd) of the droplet 271. Here, a process for controlling the position of the droplet 271 will be described later with reference to FIG. 17.

The measurement position Cd(Xd, Yd, Zd) of the droplet 271 may be a measured value for the center position of the droplet 271 reaching the plasma generation region 25. In particular, the measurement position Cd(Xd, Yd, Zd) of the droplet 271 may be a measured value for the center position of the droplet 271 just before being irradiated with the pulsed laser beam 33 in the plasma generation region 25. That is, the measurement position Cd(Xd, Yd, Zd) of the droplet 271 may be represented by the coordinates of the center position of the droplet 271 which has been actually outputted into the chamber 2 and is reaching the plasma generation region 25.

In step S27, the shooting controller 81 may determine whether or not the position of the droplet 271 is within an allowable range. The shooting controller 81 may determine whether or not the measurement position Cd(Xd, Yd, Zd) of the droplet 271 after the control in the step S26 fulfills all the following equations.

$$|Xd-Xdt| \leq \Delta Xd\mathrm{max}$$

$$|Yd-Ydt| \leq \Delta Yd\mathrm{max}$$

$$|Zd-Zdt| \leq \Delta Zd\mathrm{max}$$

Here, ΔXdmax, ΔYdmax and ΔZdmax in the right-hand side may be the threshold values for the respective coordinates that define the allowable range of the difference in the measurement position Cd from the target position Pdt of the droplet 271. ΔXdmax, ΔYdmax and ΔZdmax may be predetermined values to efficiently generate plasma light. When determining that the position of the droplet 271 is out of the allowable range, the shooting controller 81 may move the step to step S25. On the other hand, when determining that the position of the droplet 271 is within the allowable range, the shooting controller 81 may move the step to step S28.

In the step S28, the shooting controller 81 may determine whether or not the pulsed laser beam 33 is being outputted. The shooting controller 81 may make the determination by checking if the trigger signal has been inputted to the laser device 3. When determining that the pulsed laser beam 33 is not being outputted, the shooting controller 81 may move the step to the step S25. On the other hand, when determining that the pulsed laser beam 33 is being outputted, the shooting controller 81 may move the step to step S29.

In the step S29, the shooting controller 81 may control the focused position of the pulsed laser beam 33. The shooting controller 81 may cause the image measurement unit 42 and the image measurement unit 43 to measure the image of the plasma light emitted from the droplet 271 just after being irradiated with the pulsed laser beam 33 in the plasma generation region 25. Then, the shooting controller 81 may calculate the measurement position Cp(Xp, Yp, Zp) of the plasma light, based on the acquired image data. Then, the shooting controller 81 may control the operation of the triaxial stage 226, based on the calculated measurement position Cp(Xp, Yp, Zp) of the plasma light. Here, a process for controlling the focused position of the pulsed laser beam 33 will be described later with reference to FIG. 20.

The measurement position Cp(Xp, Yp, Zp) of the plasma light may be a measured value for the center position of the plasma light emitted in the plasma generation region 25. In particular, the measurement position Cp(Xp, Yp, Zp) of the plasma light may be a measured value for the center position of the plasma light emitted from the droplet 271 just after being irradiated with the pulsed laser beam 33 in the plasma generation region 25. That is, the measurement position Cp(Xp, Yp, Zp) of the plasma light may be represented by the coordinates of the center position of the plasma light actually emitted from the droplet 271 by irradiating the droplet 271 with the pulsed laser beam 33 after the droplet 271 is actually outputted into the chamber 2 and reaches the plasma generation region 25.

In step S30, the shooting controller 81 may determine whether or not the position of the plasma light is within the allowable range. The shooting controller 81 may determine whether or not the measurement position Cp(Xp, Yp, Zp) of the plasma light based on the focused position of the pulsed laser beam 33 after the control in the step S29 fulfills all the following expressions.

$|Xp-Xpt| \le \Delta Xp\max$ $|Yp-Ypt| \le \Delta Yp\max$ $|Zp-Zpt| \le \Delta Zp\max$ Here, ΔXpmax, ΔYpmax and ΔZpmax in the right-hand side may be the threshold values for the respective coordinates that define the allowable range of the difference in the measurement position Cp from the target position Ppt of the plasma light. ΔXpmax, ΔYpmax and ΔZpmax may be predetermined values to efficiently generate the plasma light and the EUV light 252. When determining that the position of the plasma light is within the allowable range, the shooting controller 81 may move the step to step S32. On the other hand, when determining that the position of the plasma light is out of the allowable range, the shooting controller 81 may move the step to step S31.

In the step S31, the shooting controller 81 may output an NG signal to the exposure apparatus controller 61 via the EUV light generation controller 5. After outputting the NG signal, the shooting controller 81 may move the step to the step S25.

In the step S32, the shooting controller 81 may output an OK signal to the exposure apparatus controller 61 via the EUV light generation controller 5. The OK signal may be a signal to report that the EUV light generation apparatus 1 is ready to output the EUV light 252 generated in an appropriate condition to the exposure apparatus 6.

In step S33, the shooting controller 81 may determine whether or not to stop the process for the shooting control. When determining not to stop the process for the shooting control, the shooting controller 81 may move the step to the step S25. On the other hand, when determining to stop the process for the shooting control, the shooting controller 81 may end this process.

Figure 15A:
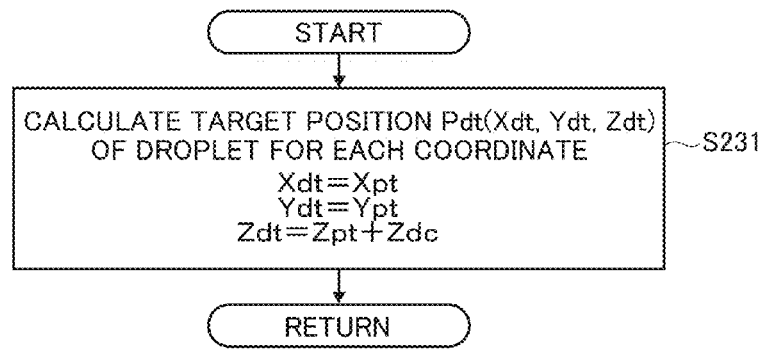
FIG. 15A is a flowchart explaining a process for calculating the target position of a droplet by the shooting controller shown in FIG. 13.
Figure 15B:
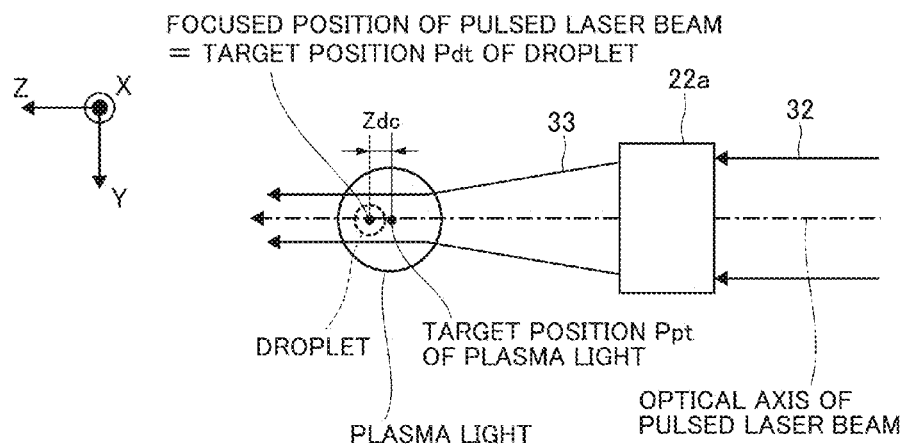
FIG. 15B is a drawing explaining the process shown in FIG. 15A.

FIG. 15A is a flowchart showing the process for calculating the target position Pdt of the droplet 271 in the step S23 shown in FIG. 14. FIG. 15B is a drawing explaining the process shown in FIG. 15A.

In step S231, the shooting controller 81 may calculate the respective coordinates of the target position Pdt(Xdt, Ydt, Zdt) of the droplet 271 supplied to the plasma generation region 25. The shooting controller 81 may calculate the target position Pdt(Xdt, Ydt, Zdt) of the droplet 271 according to the following equations, based on the target position Ppt (Xpt, Ypt, Zpt) of the plasma light read in the step S22 shown in FIG. 14.

$Xdt=Xpt$ $Ydt=Ypt$ $Zdt=Zpt+Zdc$

That is, the shooting controller 81 may regard the X-component Xpt of the target position Ppt of the plasma light as the same as the X-component Xdt of the target position Pdt of the droplet 271. The shooting controller 81 may regard the Y-component Ypt of the target position Ppt of the plasma light as the same as the Y-component Ydt of the target position Pdt of the droplet 271. The shooting controller 81 may regard the coordinate shifted from the Z-component Zpt of the target position Ppt of the plasma light by Zdc in the +Z direction as the Z-component Zdt of the target position Pdt of the droplet 271.

The target position Ppt of the plasma light may be a predetermined value by the EUV light generation controller 5, according to a command from the exposure apparatus controller 61. In order to emit the plasma light at the target position Ppt of the plasma light, the shooting controller 81 may substantially match the target position Pdt of the droplet 271 and the target focused position of the pulsed laser beam 33 with the target position Ppt of the plasma light. However, if the target position Pdt of the droplet 271 and the target focused position of the pulsed laser beam 33 are simply matched with the target position Ppt of the plasma light, the following problem may occur. Although the position of the plasma light actually emitted in the plasma generation region 25 is not shifted from the target position Ppt in the X and Y directions, it may be shifted from the target position Ppt in the Z direction. The center of the plasma light may be located at or near the periphery of the droplet 271 in the −Z direction side because the irradiation with the pulsed laser beam 33 is started at the periphery of the droplet 271 in the −Z direction side. Therefore, the center of the plasma light may be shifted from the center of the droplet 271 in the −Z direction. By this means, the position of the plasma light actually emitted in the plasma generation region 25 may be shifted from the target position Ppt. Here, the amount of shifting of the center of the plasma light in the −Z direction from the center of the droplet 271 is represented as "Zdc." Therefore, as shown in FIG. 15B, with respect to the Z direction, the shooting controller 81 may set the target position Pdt of the droplet 271 and the target focused position of the pulsed laser beam 33 to the coordinate shifted from the target position Ppt of the plasma light by Zdc in the +Z direction.

It is preferred that both the target position Pdt of the droplet 271 and the focused position of the pulsed laser beam 33 are shifted in the Z direction rather than only the target position Pdt of the droplet 271 is shifted from the target position Ppt of the plasma light in the Z direction. The reason for this is that the plasma light can be more efficiently generated when the focused position of the pulsed laser beam 33 is located at the center of the droplet 271 than when the focused position of the pulsed laser beam 33 is located at the periphery of the droplet 271. By this means, the shooting controller 81 can substantially match the position of the plasma light actually emitted in the plasma generation region 25 with the target position Ppt of the plasma light, and efficiently generate plasma light.

Figure 16:
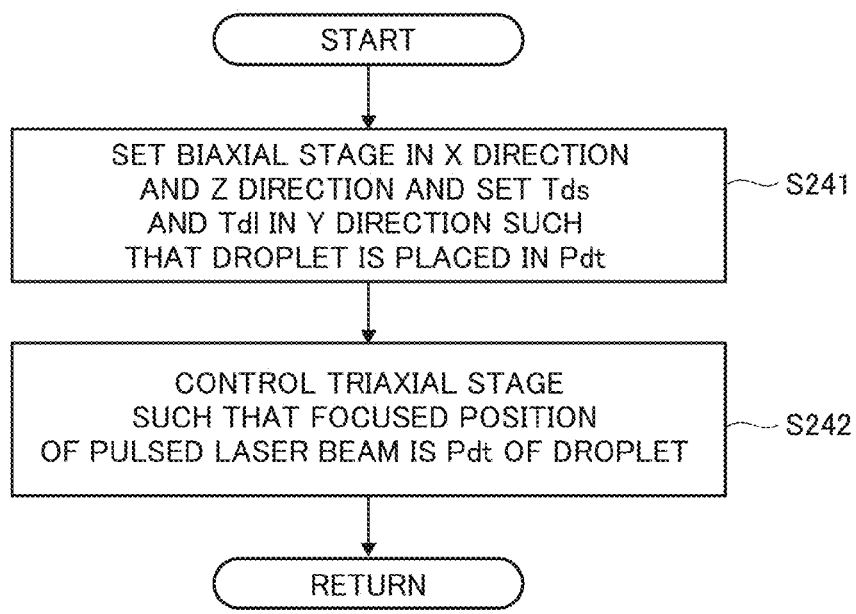
FIG. 16 is a flowchart explaining a process for setting the target position of a droplet, and the target focused position of a pulsed laser beam by the shooting controller shown in FIG. 13.

FIG. 16 is a flowchart showing the process for setting the target position Pdt of the droplet 271 and the target focused position of the pulsed laser beam 33 in the step S24 shown in FIG. 14.

In step S241, in order to allow the position of the droplet 271 supplied to the plasma generation region 25 to be the target position Pdt of the droplet 271, the shooting controller 81 may set the delay time Tds, the delay time Tdl and the biaxial stage 74 as follows. For the setting in the X direction and the Z direction, the shooting controller 81 may control the operation of the biaxial stage 74. To be more specific, the shooting controller 81 may set the biaxial stage 74 by controlling the biaxial stage 74 to be driven by a predetermined amount in the X direction and/or the Z direction. The shooting controller 81 may output a control signal containing the amount of movement of the target supply part 26 in the X direction and the Z direction, to the biaxial stage 74. For the setting in the Y direction, the shooting controller 81 may set the delay time Tds and the delay time Tdl. The shooting controller 81 may set the delay time Tds in the delay circuit 833 and also set the delay time Tdl in the delay circuit 82.

In step S242, the shooting controller 81 may set the triaxial stage 226 such that the focused position of the pulsed laser beam 33 in the plasma generation region 25 is the target position Pdt of the droplet 271. The shooting controller 81 may output a control signal containing the amount of movement of the laser beam focusing optical system 22a, to the triaxial stage 226.

Figure 17:
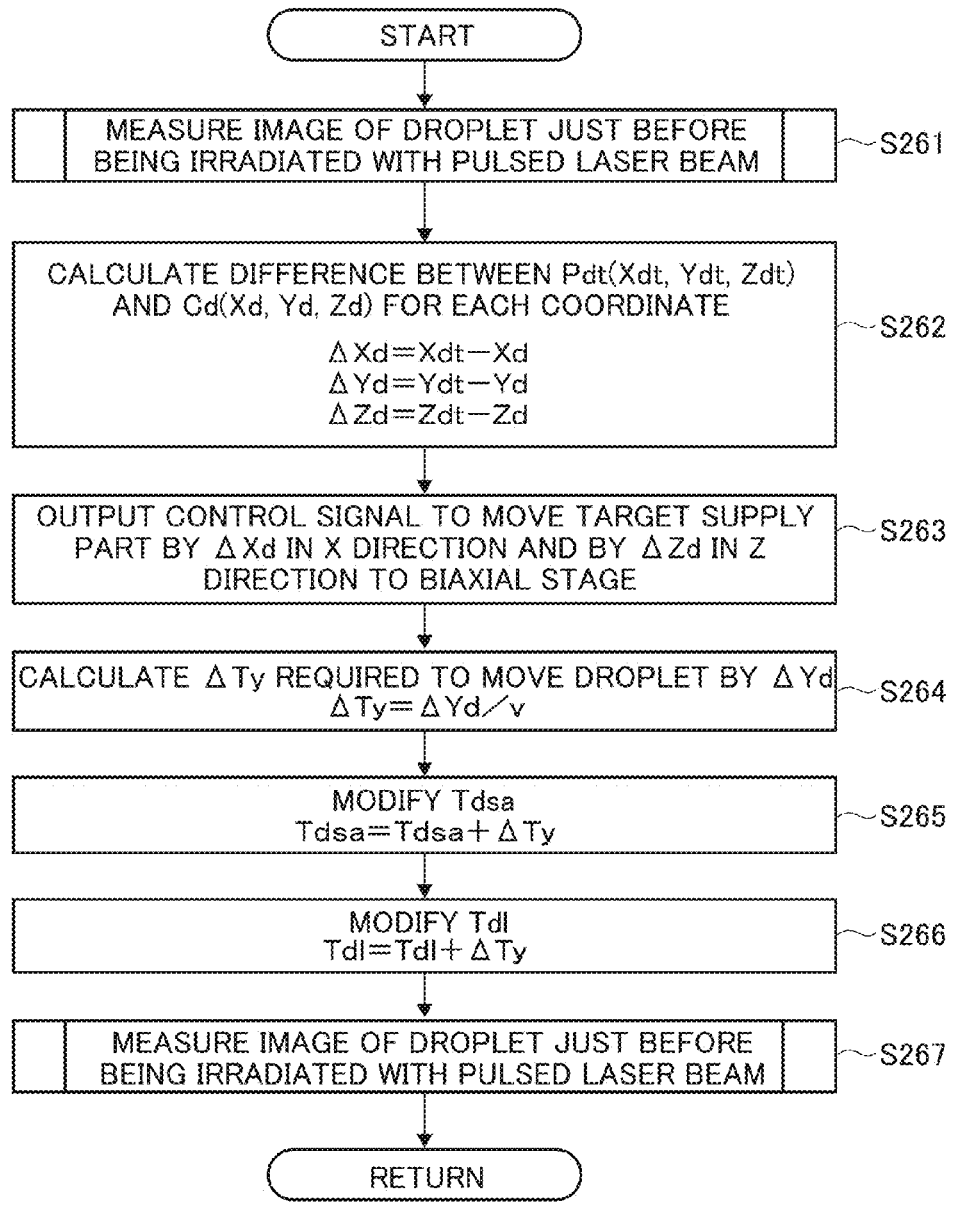
FIG. 17 is a flowchart explaining a process for controlling the position of a droplet by the shooting controller shown in FIG. 13.

FIG. 17 is a flowchart showing the process for controlling the position of the droplet 271 in the step S26 shown in FIG. 14.

In step S261, the shooting controller 81 may measure the image of the droplet 271 just before being irradiated with the pulsed laser beam 33. Here, a process for measuring the image of the droplet 271 will be described later with reference to FIG. 18.

In step S262, the shooting controller 81 may calculate the difference between the target position Pdt and the measurement position Cd of the droplet 271 for each of the coordinates. The shooting controller 81 may calculate, for each of the coordinates, the difference between the target position Pdt(Xdt, Ydt, Zdt) set in the step S24 shown in FIG. 14 and the measurement position Cd(Xd, Yd, Zd) measured in the step S261, according to the following equations.

$$\Delta Xd = Xdt - Xd$$

$$\Delta Yd = Ydt - Yd$$

$$\Delta Zd = Zdt - Zd$$

In step S263, the shooting controller 81 may output a control signal to move the target supply part 26 in the X direction and the Z direction, to the biaxial stage 74. The shooting controller 81 may control the position of the droplet 271 supplied to the plasma generation region 25 in the X direction and the Z direction, by controlling the operation of the biaxial stage 74. The shooting controller 81 may regard $\Delta Xd$ calculated in the step S262 as the amount of the movement of the target supply part 26 in the X direction. The shooting controller 81 may regard $\Delta Zd$ calculated in the step S262 as the amount of the movement of the target supply part 26 in the Z direction. The shooting controller 81 may output the control signal containing $\Delta Xd$ and $\Delta Zd$ to the biaxial stage 74.

In step S264, the shooting controller 81 may calculate a time $\Delta Ty$ required to move the droplet 271 by $\Delta Yd$. The shooting controller 81 may calculate $\Delta Ty$ by using $\Delta Yd$ calculated in the step S262, according to the following equation.

$$\Delta Ty = \Delta Yd / v$$

Here, v in the right-hand side may be the traveling speed of the droplet 271.

In step S265, the shooting controller 81 may modify the delay time Tdsa. The shooting controller 81 may control the position of the droplet 271 supplied to the plasma generation region 25 in the Y direction by setting the delay time Tdsa and the delay time Tdl. The shooting controller 81 may calculate the modified delay time Tdsa by using $\Delta Ty$ calculated in the step S264, according to the following equation.

$$Tdsa = Tdsa + \Delta Ty$$

The shooting controller 81 may set the modified delay time Tdsa in the delay circuit 833.

In step S266, the shooting controller 81 may modify the delay time Tdl. The shooting controller 81 may calculate the modified delay time Tdl by using $\Delta Ty$ calculated in the step S264, according to the following equation.

$$Tdl = Tdl + \Delta Ty$$

The shooting controller 81 may set the modified delay time Tdl in the delay circuit 82.

In step S267, the shooting controller 81 may measure the image of the droplet 271 just before being irradiated with the pulsed laser beam 33. Here, the process for measuring the image of the droplet 271 will be described later with reference to FIG. 18.

Figure 18:
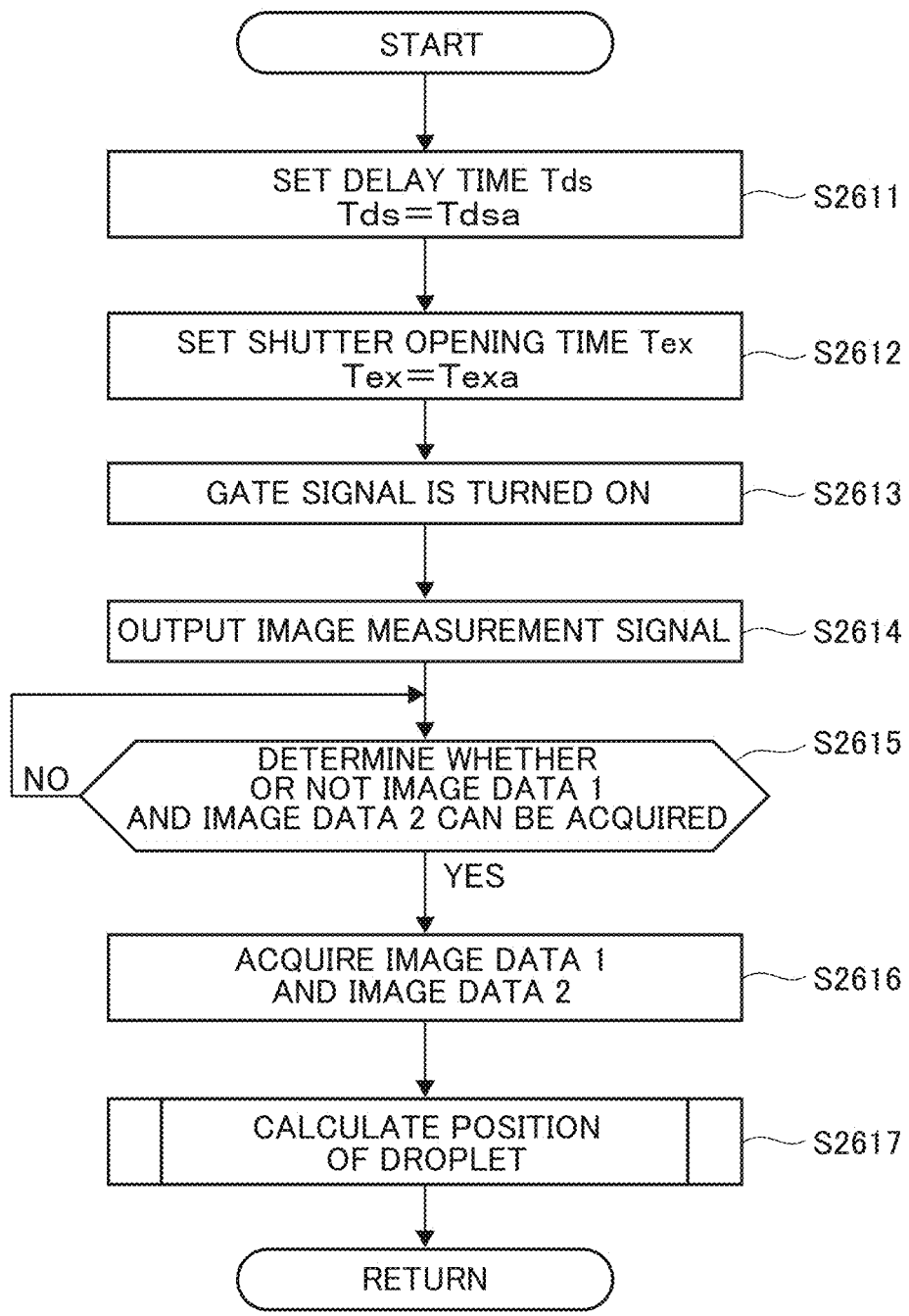
FIG. 18 is a flowchart explaining a process for measuring the image of a droplet by the shooting controller shown in FIG. 13.

FIG. 18 is a flowchart showing the process for measuring the image of the droplet 271 in the step S261 and the step S267 shown in FIG. 17.

In step S2611, the shooting controller 81 may set the delay time Tds in the delay circuit 833. The shooting controller 81 may set the delay time Tds as Tds=Tdsa in order to set the imaging timing of the imaging part 422 and the imaging part 423 to a timing just before the irradiation timing of the pulsed laser beam 33.

In step S2612, the shooting controller 81 may set the shutter opening time Tex in the one-shot circuit 835. The shooting controller 81 may set the shutter opening time Tex as Tex=Texa in order to secure necessary and sufficient time for which the image sensor 422a and the image sensor 432a capture the image of the droplet 271.

In step S2613, the shooting controller 81 may output a gate signal to the AND circuit 832, that is, the gate signal may be turned on. The light source 421a and the light source 431a may emit pulsed light in synchronization with the imaging timing.

In step S2614, the shooting controller 81 may output an image measurement signal to the AND circuit 831. The image measurement unit 42 and the image measurement unit 43 may capture the image of the imaging region 25a. The captured image may contain the image of the droplet 271 just before being irradiated with the pulsed laser beam 33 in the plasma generation region 25. The image measurement unit 42 and the image measurement unit 43 may generate image data of the captured image, and output the data to the shooting controller 81.

In step S2615, the shooting controller 81 may determine whether or not the image data 1 and the image data 2 can be acquired. When determining that the image data 1 and the image data 2 cannot be acquired because the image measurement unit 42 and the image measurement unit 43 are not ready to output the image data 1 and the image data 2, the shooting controller 81 may wait. On the other hand, when determining that the image data 1 and the image data 2 can be acquired because the image measurement unit 42 and the image measurement unit 43 are ready to output the image data 1 and the image data 2, the shooting controller 81 may move the step to step S2616.

In the step S2616, the shooting controller 81 may acquire the image data 1 and the image data 2 outputted from the image measurement unit 42 and the image measurement unit 43.

In step S2617, the shooting controller 81 may calculate the position of the droplet 271 just before being irradiated with the pulsed laser beam 33, based on the acquired image data 1 and image data 2. Here, a process for calculating the position of the droplet 271 will be described later with reference to FIG. 19.

Figure 19:
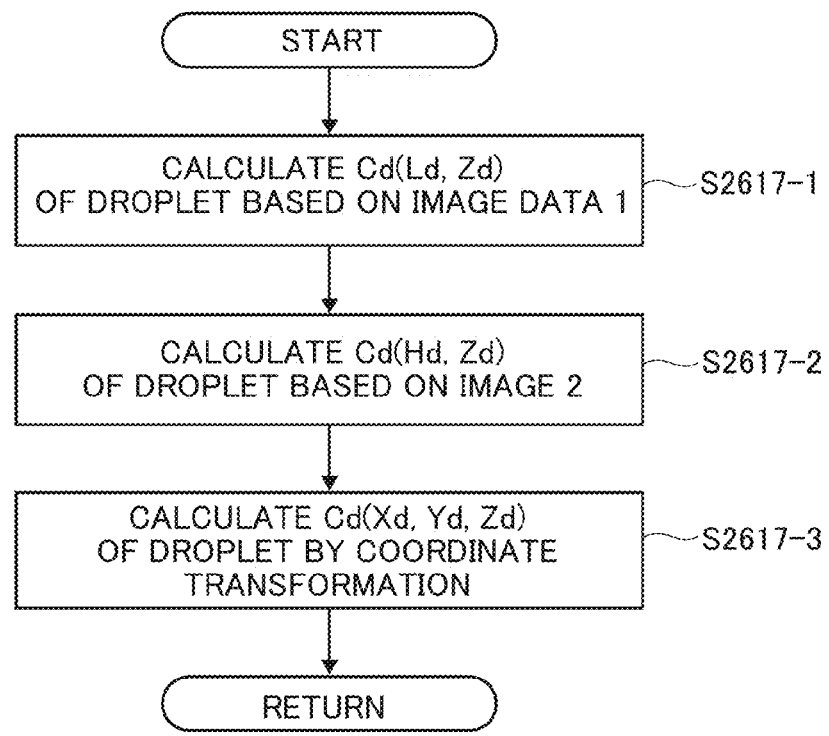
FIG. 19 is a flowchart explaining a process for calculating the position of a droplet by the shooting controller shown in FIG. 13.

FIG. 19 is a flowchart showing the process for calculating the position of the droplet 271 in the step S2617 shown in FIG. 18.

In step S2617-1, the shooting controller 81 may calculate a measurement position Cd(Ld, Zd) of the droplet 271, based on the image of the droplet 271 contained in the image data 1 acquired in the step S2616 shown in FIG. 18. The image measurement unit 42 may measure the image of the droplet 271 in the normal direction of the L-Z plane. The image contained in the image data 1 acquired from the image measurement unit 42 may be an image of the droplet 271 projected onto the L-Z plane. Therefore, the coordinates of the measurement position Cd of the droplet 271, which can be calculated based on the image data 1, may be represented by an L-component Ld and a Z-component Zd.

In step S2617-2, the shooting controller 81 may calculate a measurement position Cd(Hd, Zd) of the droplet 271, based on the image of the droplet 271 contained in the image data 2 acquired in the step S2616 in FIG. 18. The image measurement unit 43 may measure the image of the droplet 271 in the normal direction of the H-Z plane. The image contained in the image data 2 acquired from the image measurement unit 43 may be an image of the droplet 271 projected onto the H-Z plane. Therefore, the coordinates of the measurement position Cd of the droplet 271, which can be calculated based on the image data 2, may be represented by an H-component Hd and the Z-component Zd.

In step S2617-3, the shooting controller 81 may calculate the measurement position Cd(Xd, Yd, Zd) of the droplet 271. The shooting controller 81 may calculate the measurement position Cd(Xd, Yd, Zd) of the droplet 271, by the coordinate transformation of the Cd(Ld, Zd) calculated in the step S2617-1 and the Cd(Hd, Zd) calculated in the step S2617-2.

Figure 20:
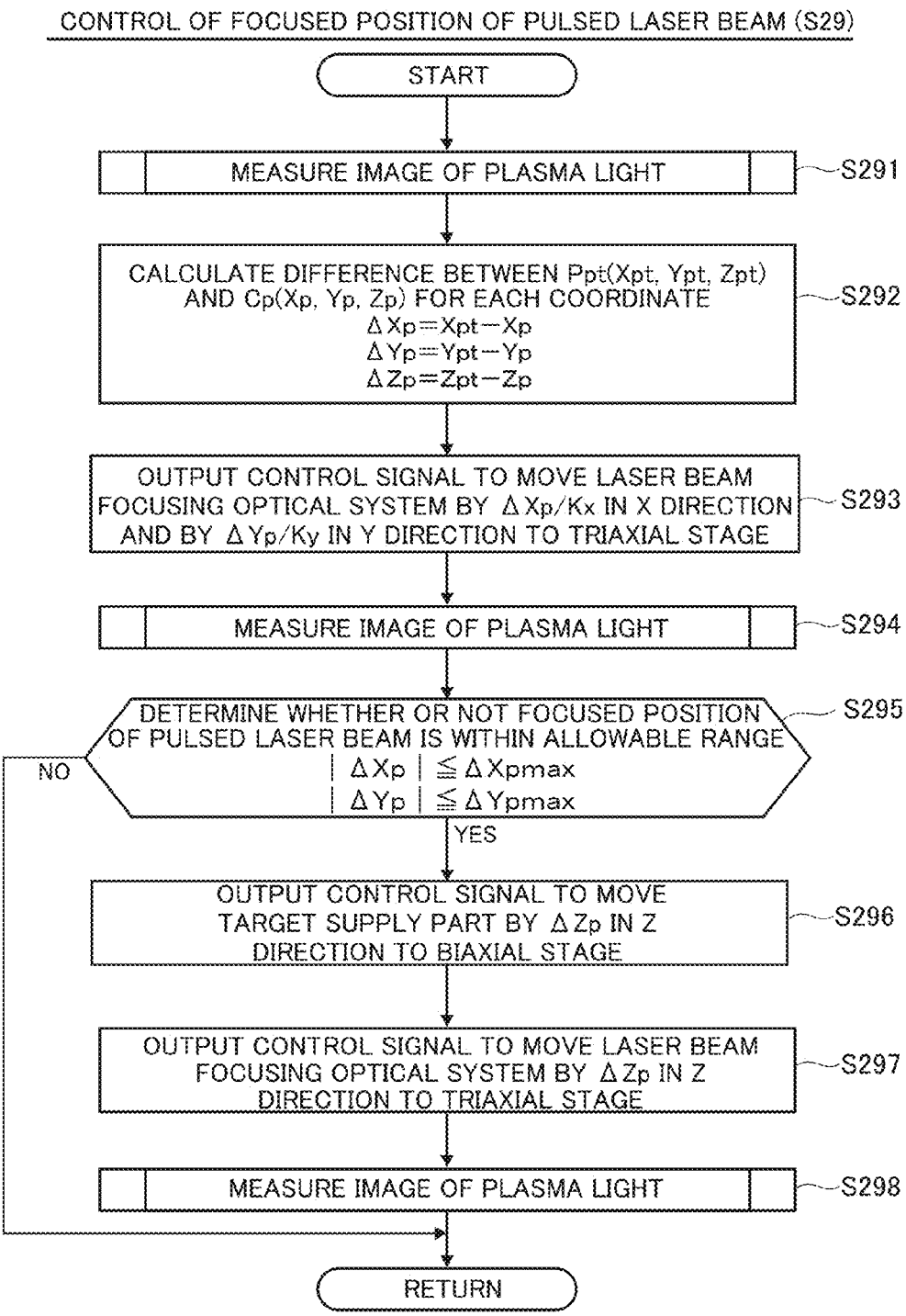
FIG. 20 is a flowchart explaining a process for controlling the focused position of a pulsed laser beam by the shooting controller shown in FIG. 13.

FIG. 20 is a flowchart showing the process for controlling the focused position of the pulsed laser beam 33 in the step S29 shown in FIG. 14.

In step S291, the shooting controller 81 may measure the image of the plasma light just after being irradiated with the pulsed laser beam 33. Here, a process for measuring the image of the plasma light will be described later with reference to FIG. 21.

In step S292, the shooting controller 81 may calculate the difference between the target position Ppt and the measurement position Cp of the plasma light, by using each of the coordinates. The shooting controller 81 may calculate, for each of the coordinates, the difference between the target position Ppt(Xpt, Ypt, Zpt) read in the step S22 shown in FIG. 14 and the measurement position Cp(Xp, Yp, Zp) measured in the step S291, according to the following equations.

$$\Delta Xp = Xpt - Xp$$

$$\Delta Yp = Ypt - Yp$$

$$\Delta Zp = Zpt - Zp$$

In step S293, the shooting controller 81 may output a control signal to move the laser beam focusing optical system 22a in the X direction and the Y direction, to the triaxial stage 226. The shooting controller 81 may control the focused position of the pulsed laser beam 33 in the plasma generation region 25 in the X direction and the Y direction by controlling the operation of the triaxial stage 226. The shooting controller 81 may regard "$\Delta Xp/Kx$" obtained by dividing $\Delta Xp$ calculated in the step S292 by a constant Kx as the amount of the movement of the laser beam focusing optical system 22a in the X direction. The shooting controller 81 may regard "$\Delta Yp/Ky$" obtained by dividing $\Delta Yp$ calculated in the step S292 by a constant Ky as the amount of the movement of the laser beam focusing optical system 22a in the Y direction. The shooting controller 81 may output the control signal containing $\Delta Xp/Kx$ and $\Delta Yp/Ky$ to the triaxial stage 226. By using $\Delta Xp/Kx$ and $\Delta Yp/Ky$ obtained by dividing $\Delta Xp$ and $\Delta Yp$ by the constant Kx and the constant Ky, respectively, as the amount of the movement of the laser beam focusing optical system 22a, it is possible to move the laser beam focusing optical system 22a with a high degree of accuracy. Here, the constant Kx and the constant Ky may be constants reflecting an optical parameter of the laser beam focusing optical system 22a. Here, the relationship of the focused position of the pulsed laser beam 33 and the position of the droplet 271 with the position of the plasma light will be described later with reference to FIG. 23.

In step S294, the shooting controller 81 may measure the image of the plasma light just after being irradiated with the pulsed laser beam 33. Here, a process for measuring the image of the plasma light will be described later with reference to FIG. 21.

In step S295, the shooting controller 81 may determine whether or not the focused position of the pulsed laser beam 33 in the X direction and the Y direction is within an allowable range. When determining that the position of the plasma light is within the allowable range, the shooting controller 81 may regard the focused position of the pulsed laser beam 33 as being within the allowable range. The shooting controller 81 may determine whether or not ΔXp and ΔYp fulfill all the following expressions, based on the focused position of the pulsed laser beam 33 after the control in the step S293.

$$|\Delta Xp| \leq \Delta Xp\text{max}$$

$$|\Delta Yp| \leq \Delta Yp\text{max}$$

When determining that the position of the plasma light is within the allowable range, the shooting controller 81 may regard the focused position of the pulsed laser beam 33 as being within the allowable range, and move the step to step S296. On the other hand, when determining that the position of the plasma light is out of the allowable range, the shooting controller 81 may regard the focused position of the pulsed laser beam 33 as being out of the allowable range, and end this process.

In the step S296, the shooting controller 81 may output a control signal to move the target supply part 26 by ΔZp in the Z direction, to the biaxial stage 74. As described with reference to FIG. 15B, when the focused position of the pulsed laser beam 33 matches the target position Pdt of the droplet 271, it is possible to efficiently generate plasma light. Therefore, the shooting controller 81 may move the position of the droplet 271 by ΔZp calculated in the step S292 in the Z direction. For this, the shooting controller 81 may move the target supply part 26 by ΔZp in the Z direction.

In step S297, the shooting controller 81 may output a control signal to move the laser beam focusing optical system 22a in the Z direction, to the triaxial stage 226. The shooting controller 81 may control the focused position of the pulsed laser beam 33 in the plasma generation region 25 in the Z direction by controlling the operation of the triaxial stage 226. The shooting controller 81 may regard ΔZp calculated in the step S292 as the amount of the movement of the laser focusing optical system 22a in the Z direction. The shooting controller 81 may output the control signal containing ΔZp to the triaxial stage 226.

In step S298, the shooting controller 81 may measure the image of the plasma light just after being irradiated with the pulsed laser beam 33. Here, the process for measuring the image of the plasma light will be described later with reference to FIG. 21.

Figure 21:
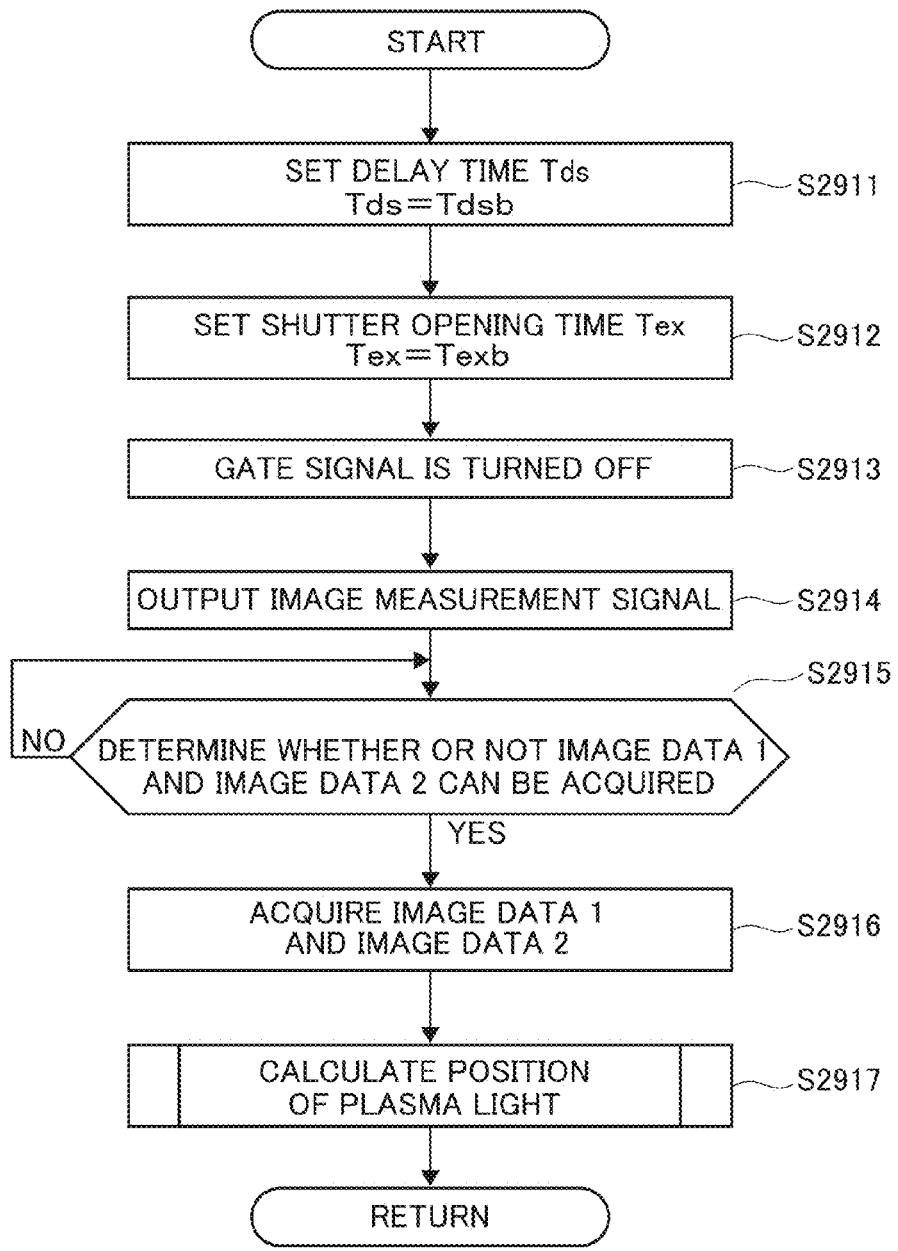
FIG. 21 is a flowchart explaining a process for measuring the image of plasma light by the shooting controller shown in FIG. 13.

FIG. 21 is a flowchart showing the process for measuring the image of the plasma light in the step S291, the step S294 and the step S298 shown in FIG. 20.

In step S2911, the shooting controller 81 may set the delay time Tds as Tds=Tdsb in order to set the imaging timing of the imaging part 422 and the imaging part 432 to a timing just after the irradiation timing of the pulsed laser beam 33.

In step S2912, the shooting controller 81 may set the shutter opening time Tex in the one-shot circuit 835. The shooting controller 81 may set the shutter opening time Tex as Tex=Texb in order to secure necessary and sufficient time for which the image sensor 422a and the image sensor 432a capture the image of the plasma light.

In step S2913, the shooting controller 81 may not output a gate signal to the AND circuit 832, that is, the gate signal may be turned off. By this means, the light source 421a and the light source 431a may not emit pulsed light.

In step S2914, the shooting controller 81 may output an image measurement signal to the AND circuit 831. The image measurement unit 42 and the image measurement unit 43 may capture the image of the imaging region 25a. The captured image may contain the image of the plasma light emitted from the droplet 271 just after being irradiated with the pulsed laser beam 33 in the plasma generation region 25. The image measurement unit 42 and the image measurement unit 43 may generate the image data 1 and the image data 2 of the captured image, and output the data to the shooting controller 81.

In step S2915, the shooting controller 81 may determine whether or not the image data 1 and the image data 2 can be acquired. When determining that the image data 1 and the image data 2 cannot be acquired because the image measurement unit 42 and the image measurement unit 43 are not ready to output the image data 1 and the image data 2, the shooting controller 81 may wait. On the other hand, when determining that the image data 1 and the image data 2 can be acquired because the image measurement unit 42 and the image measurement unit 43 are ready to output the image data 1 and the image data 2, the shooting controller 81 may move the step to step S2916.

In the step S2916, the shooting controller 81 may acquire the image data 1 and the image data 2 outputted from the image measurement unit 42 and the image measurement unit 43.

In step S2917, the shooting controller 81 may calculate the position of the plasma light emitted from the droplet 271 just after being irradiated with the pulsed laser beam 33, based on the acquired image data 1 and image data 2. Here, a process for calculating the position of the plasma light will be described later with reference to FIG. 22.

Figure 22:
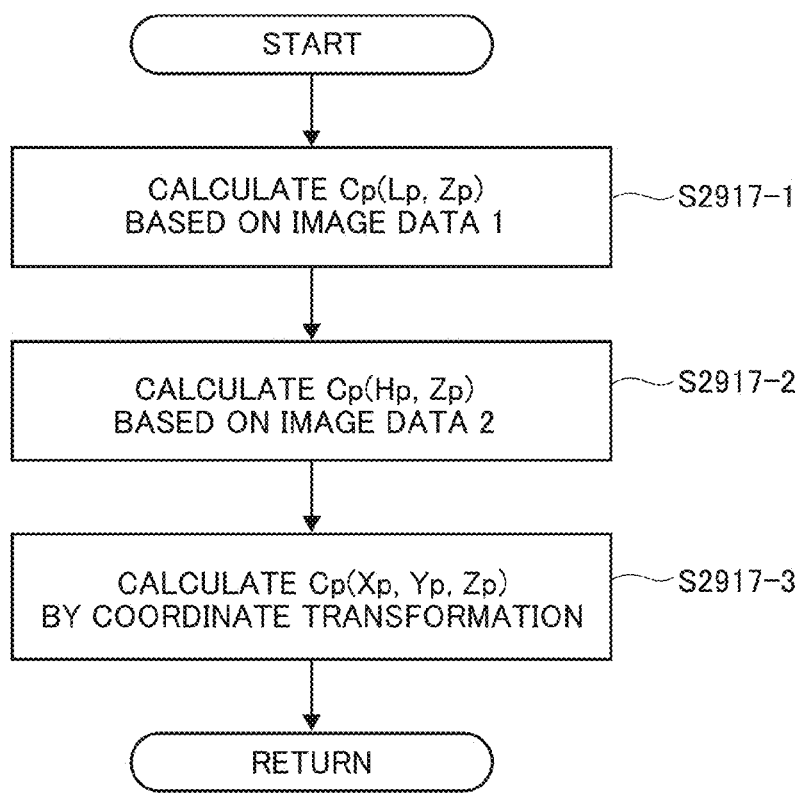
FIG. 22 is a flowchart explaining a process for calculating the position of plasma light by the shooting controller shown in FIG. 13.

FIG. 22 is a flowchart showing the process for calculating the position of the plasma light in the step S2917 shown in FIG. 21.

In step S2917-1, the shooting controller 81 may calculate a measurement position Cp(Lp, Zp) of the plasma light, based on the image of the plasma light contained in the image data 1 acquired in the step S2916 shown in FIG. 21. The image measurement unit 42 may measure the image of the plasma light in the normal direction of the L-Z plane. The image contained in the image data 1 acquired from the image measurement unit 42 may be an image of the plasma light projected onto the L-Z plane. Therefore, the coordinates of the measurement position Cp of the plasma light, which can be calculated based on the image data 1, may be represented by an L-component Lp and a Z-component Zp.

In step S2917-2, the shooting controller 81 may calculate a measurement position Cp(Hp, Zp) of the plasma light, based on the image of the plasma light contained in the image data 2 acquired in the step S2916 shown in FIG. 21. The image measurement unit 43 may measure the image of the plasma light in the normal direction of the H-Z plane. The image contained in the image data 2 acquired from the image measurement unit 43 may be an image of the plasma light projected onto the H-Z plane. Therefore, the coordinates of the measurement position Cp of the plasma light, which can be calculated based on the image data 2, may be represented by an H-component Hp and the Z-component Zp.

In step S2917-3, the shooting controller 81 may calculate the measurement position Cp(Xp, Yp, Zp) of the plasma light. The shooting controller 81 may calculate the measurement position Cp(Xp, Yp, Zp) of the plasma light by the coordinate transformation of the Cp(Lp, Zp) calculated in the step S2917-1, and the Cp(Hp, Zp) calculated in the step S2917-2.

FIGS. 23A to 23C are drawings each showing the relationship of the focused position of the pulsed laser beam 33 and the position of the droplet 271 with the position of the plasma light.

FIG. 23A is a drawing showing a case in which the actual focused position of the pulsed laser beam matches the measurement position Cd of the droplet 271. In the case shown in FIG. 23A, the measurement position Cp of the plasma light may match the target position Ppt of the plasma light. Here, as described with reference to FIG. 15B, the coordinates of the target position Pdt of the droplet 271 and the target focused position of the pulsed laser beam 33 may be shifted from the target position Ppt of the plasma light by Zdc in the Z direction. Therefore, as shown in FIG. 23A, both the measurement position Cd of the droplet 271 and the actual focused position of the pulsed laser beam 33 may be shifted from the measurement position Cp of the plasma light by Zdp in the Z direction. Zdp may represent the amount of shifting in the measured value corresponding to the amount of shifting Zdc in the target value.

FIG. 23B is a drawing showing a case in which the actual focused position of the pulsed laser beam is shifted from the measurement position Cd of the droplet 271 in the −Y direction. In the case shown in FIG. 23B, the measurement position Cp of the plasma light may be shifted from the target position Ppt of the plasma light by ΔYp in the −Y direction. The reason for this is that the irradiation of the pulsed laser beam 33 is started at the periphery of the droplet 271 in the −Y direction side, and therefore the center of the plasma light is shifted in the −Y direction.

FIG. 23C is a drawing showing a case in which the actual focused position of the pulsed laser beam is shifted from the measurement position Cd of the droplet 271 in the +Y direction. In the case shown in FIG. 23C, the measurement position Cp of the plasma light may be shifted from the target position Ppt of the plasma light by ΔYp in the +Y direction. The reason for this is that the irradiation of the pulsed laser beam 33 is started at the periphery of the droplet 271 in the +Y direction side, and therefore the center of the plasma light is shifted in the +Y direction.

Figure 23:
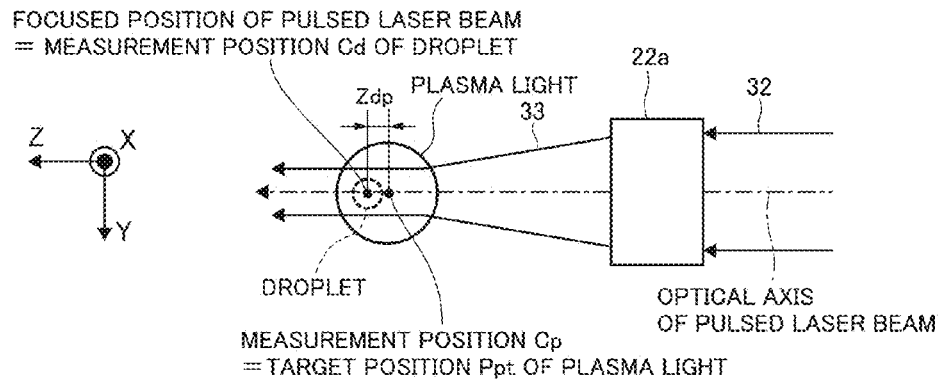
FIG. 23A is a drawing showing the relationship of the focused position of a pulsed laser beam and the position of a droplet, with the position of plasma light, where the focused position of the pulsed laser beam matches the position of the droplet.
FIG. 23B is a drawing showing the relationship of the focused position of a pulsed laser beam and the position of a droplet, with the position of plasma light, where the focused position of the pulsed laser beam is shifted from the position of the droplet in a −Y direction.
FIG. 23C is a drawing showing the relationship of the focused position of a pulsed laser beam and the position of a droplet, with the position of plasma light, where the focused position of the pulsed laser beam is shifted from the position of the droplet in a +Y direction.
Figure 23:
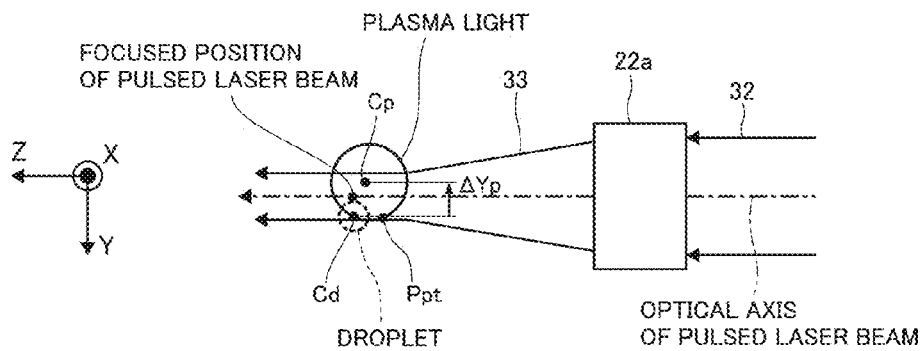
Figure 23:
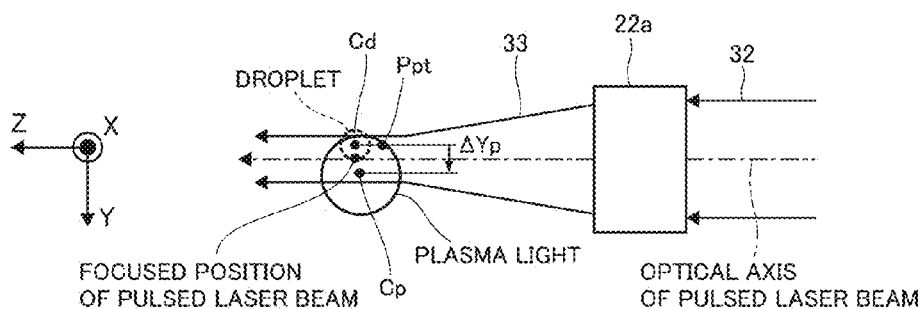

In this way, when the actual focused position of the pulsed laser beam 33 is shifted from the measurement position Cd of the droplet 271 in the Y direction, the measurement position Cp of the plasma light may be shifted from the target position Ppt of the plasma light in the Y direction. The shooting controller 81 may correct the difference in the measurement position Cp from the target position Ppt of the plasma light. For this, the shooting controller 81 may move the laser beam focusing optical system 22a as described in the step S293 shown in FIG. 20, in order to move the focused position of the pulsed laser beam 33. Here, although FIG. 23 shows a case in which the actual focused position of the pulsed laser beam 33 is shifted from the measurement position Cd of the droplet 271 in the Y direction, the same may apply to a case in which the actual focused position of the pulsed laser beam 33 is shifted in the X direction.

6.3 Effect

The EUV light generation apparatus 1 according to Embodiment 2 can precisely control the position of the droplet 271 in the plasma generation region 25. In addition, the EUV light generation apparatus 1 can precisely control the focused position of the pulsed laser beam 33. Therefore, the EUV light generation apparatus 1 according to Embodiment 2 can substantially match the position of the droplet 271 with the focused position of the pulsed laser beam 33, and therefore efficiently generate plasma light. Consequently, the EUV light generation apparatus 1 can efficiently generate the EUV light 252. Moreover, the EUV light generation apparatus 1 according to Embodiment 2 can substantially match the position of the plasma light actually emitted in the plasma generation region 25 with the target position of the plasma light determined according to a command from the exposure apparatus 6. Therefore, the EUV light generation apparatus 1 can stably output the EUV light 252 appropriately generated, to the exposure apparatus 6.

7. Shooting System Using the EUV Light Generation Apparatus According to Embodiment 3

7.1 Configuration

The shooting system using the EUV light generation apparatus 1 according to Embodiment 3 may further include the following components in addition to the components of the shooting system according to Embodiment 2. That is, this shooting system may further include a main pulse laser device 3, a prepulse laser device 3b, a wavefront adjustment unit 36, a wavefront adjustment unit 37, and a beam combiner 35. The shooting system may measure the states of the droplet 271 and the plasma light in the plasma generation region 25. In addition, the shooting system may control the focused position of the pulsed laser beam 33 outputted from each of the main pulse laser device 3a and the prepulse laser device 3b. Moreover, the shooting system may control the position of the droplet 271 reaching the plasma generation region 25 and the position of the plasma light.

Figure 24:
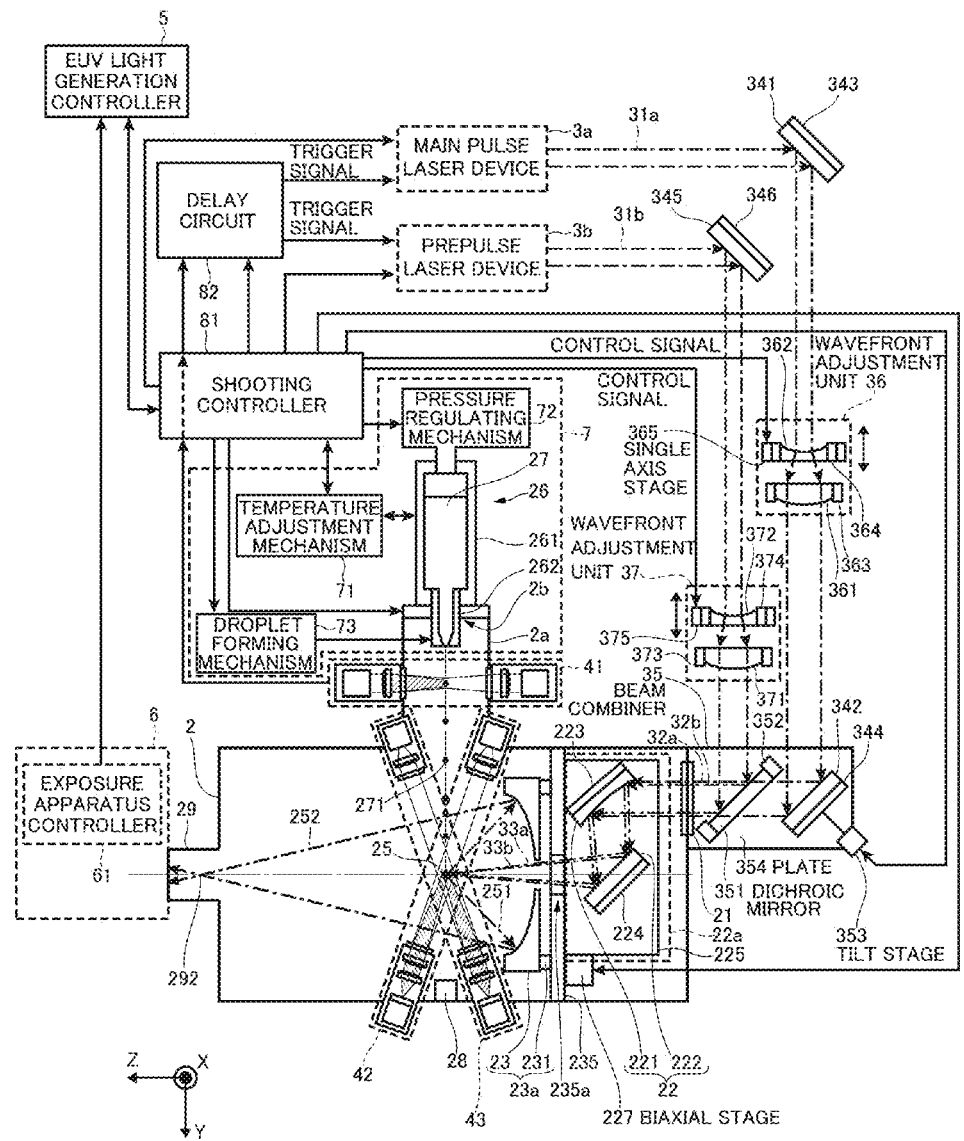
FIG. 24 shows the configuration of the EUV light generation apparatus according to Embodiment 3.
Figure 25:
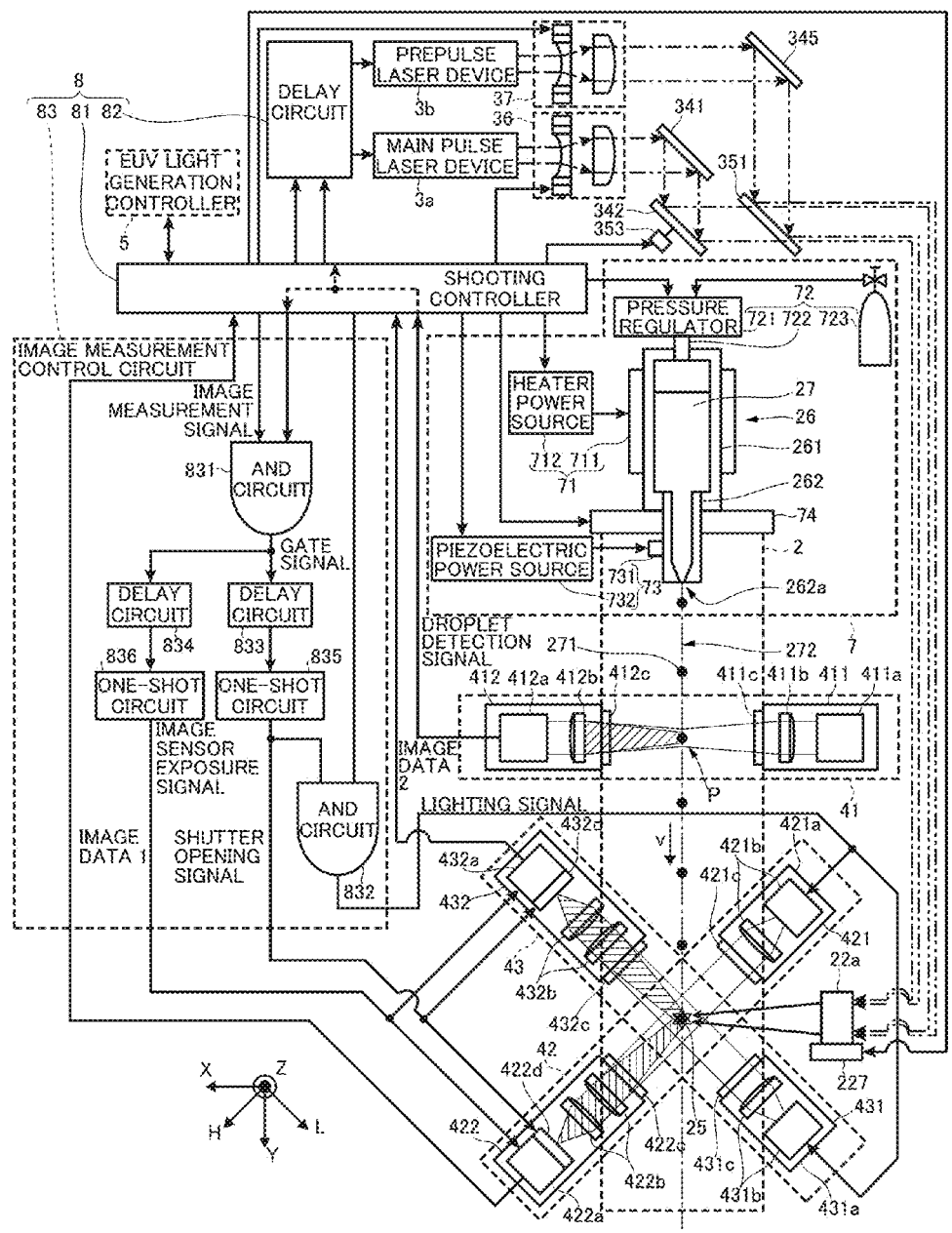
FIG. 25 shows the configuration of the shooting system using the EUV light generation apparatus according to Embodiment 3.

Now, the configuration of the shooting system using the EUV light generation apparatus 1 according to Embodiment 3 will be described with reference to FIGS. 24 and 25. FIG. 24 is a drawing showing the configuration of the EUV light generation apparatus 1 according to Embodiment 3. FIG. 25 is a drawing showing the configuration of the shooting system using the EUV light generation apparatus 1 according to Embodiment 3.

The shooting system using the EUV light generation apparatus 1 according to Embodiment 3 may include the main pulse laser device 3a, the prepulse laser device 3b, the laser beam focusing optical system 22a, the biaxial stage 227, the target generator 7, the droplet detector 41, the image measurement unit 42, the image measurement unit 43, the wavefront adjustment unit 36, the wavefront adjustment unit 37, the high-reflection mirror 341, the high-reflection mirror 345, the holder 343, the holder 346, the beam combiner 35, and the controller 8. The controller 8 may include the shooting controller 81, the delay circuit 82, and the image measurement control circuit 83. The configurations of the EUV light generation apparatus 1 and the shooting system shown in FIGS. 24 and 25, which are the same as those of the EUV light generation apparatus 1, the image measurement system and the shooting system shown in FIGS. 1 to 3, 5, and 13, are not described again here.

The configuration of the laser beam focusing optical system 22a shown in FIGS. 24 and 25 may be the same as that of the laser beam focusing optical system 22a shown in FIG. 2. The configuration of the high-reflection mirrors 341 and 345 shown in FIGS. 24 and 25 may be the same as that of the high-reflection mirror shown in FIG. 2. The configuration of the holders 343 and 346 shown in FIG. 24 may be the same as that of the holder 343 shown in FIG. 2. The configuration of the target generator 7 shown in FIGS. 24 and 25 may be the same as that of the target generator 7 shown in FIG. 13. The configuration of the droplet detector 41 shown in FIGS. 24 and 25 may be the same as that of the droplet detector 41 shown in FIG. 13. The configuration of the image measurement units 42 and 43 shown in FIGS. 24 and 25 may be the same as that of the image measurement units 42 and 43 shown in FIG. 13. The configuration of the image measurement control circuit 83 shown in FIG. 25 may be the same as that of the image measurement control circuit 83 shown in FIG. 13.

Here, although FIG. 24 shows an arrangement where the light source part 411 and the light receiving part 412 of the droplet detector 41 face one another in the Z direction for the sake of convenience, this is by no means limiting. The light source part 411 and the light receiving part 412 may face one another in the X direction as shown in FIG. 25. In addition, although FIG. 24 shows an arrangement where the direction in which the light source part 421 and the imaging part 422 of the image measurement unit 42 face one another is orthogonal to the X direction for the sake of convenience, this is by no means limiting. The direction in which the light source 421 and the imaging part 422 face one another may be the H direction as shown in FIG. 25. Moreover, although FIG. 24 shows an arrangement where the direction in which the light source part 431 and the imaging part 432 face one another is orthogonal to the X direction for the sake of convenience, this is by no means limiting. The direction in which the light source part 431 and the imaging part 432 face one another may be the L direction as shown in FIG. 25.

The configuration of the main pulse laser device 3a shown in FIGS. 24 and 25 may be the same as that of the laser device 3 shown in FIG. 13. The wavelength of a laser beam outputted from the main pulse laser device 3a may be, for example, 10.6 µm. Laser beams outputted from the main pulse laser device 3a may be referred to as "main pulse laser beams 31a to 33a", in the same way as described above with reference to FIG. 1.

The prepulse laser device 3b shown in FIGS. 24 and 25 may be a solid laser device such as a YAG laser. The wavelength of a laser beam outputted from the prepulse laser device 3b may be, for example, 1.06 µm. Laser beams outputted from the prepulse laser device 3b may be referred to as "prepulse laser beams 31b to 33b" like the main pulse laser beams 31a to 33a. The other configuration of the prepulse laser device 3b may be the same as that of the laser device 3 shown in FIG. 13.

Figure 26:
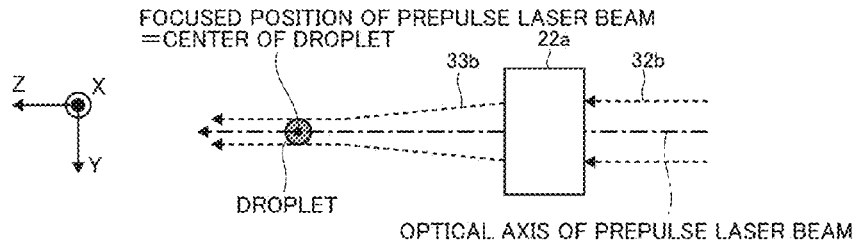
FIG. 26A shows the state in which the form of a droplet is changed by irradiating the droplet with a main pulse laser beam or a prepulse laser beam, where the droplet just before being irradiated with the prepulse laser beam is shown.
FIG. 26B shows the state in which the form of a droplet is changed by irradiating the droplet with a main pulse laser beam or a prepulse laser beam, where the droplet just after being irradiated with the prepulse laser beam is shown.
FIG. 26C shows the state in which the form of a droplet is changed by irradiating the droplet with a main pulse laser beam or a prepulse laser beam, where a secondary target just before being irradiated with the main pulse laser beam is shown.
FIG. 26D shows the state in which the form of a droplet is changed by irradiating the droplet with a main pulse laser beam or a prepulse laser beam, where the secondary target just after being irradiated with the main pulse laser beam is shown.
Figure 26:
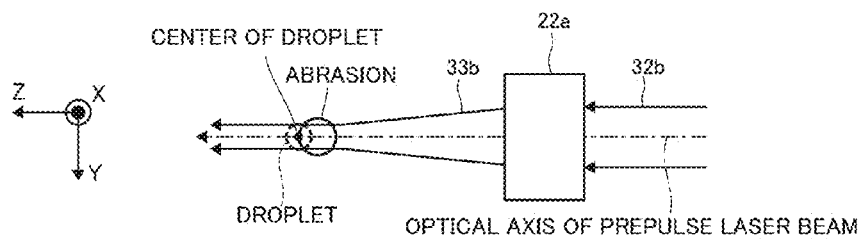
Figure 26:
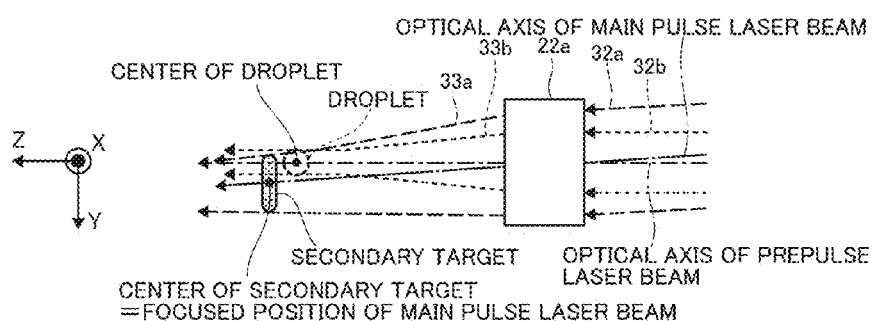
Figure 26:
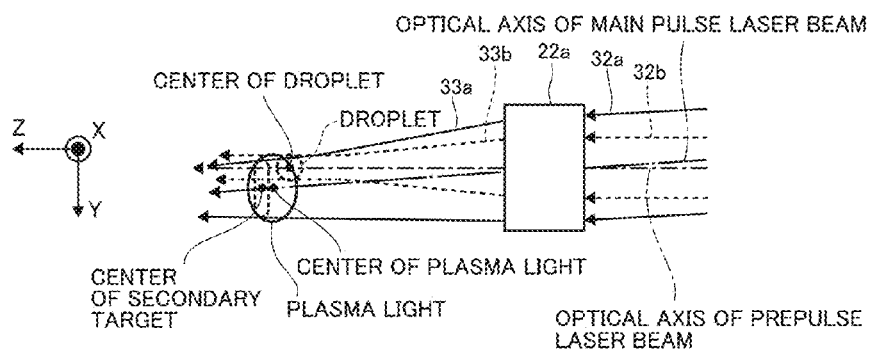

The prepulse laser beam may be a pulsed laser beam to be emitted to the droplet 271 before the main pulse laser beam is emitted to the droplet 271. Upon being irradiated with the prepulse laser beam, the droplet 271 may be broken into a plurality of fine particles of the target 27, and dispersed. The dispersed particles of the target 27 can improve the efficiency of generating EUV light by the main pulse laser beam. The dispersed particles of the target 27 resulting from irradiating the droplet 271 with the prepulse laser beam may be referred to as "secondary target 271a." Here, a change in the shape of the droplet 271 by the irradiation of the main pulse laser beam 33a or the prepulse laser beam 33b will be described later with reference to FIG. 26.

The biaxial stage 227 shown in FIGS. 24 and 25 may be provided instead of the triaxial stage 226 shown in FIG. 2. A plate 225 may be provided on the biaxial stage 227. The biaxial stage 227 may move the plate 225 in two directions, the X direction and the Y direction. The biaxial stage 227 may be connected to the shooting controller 81. The biaxial stage 227 may move the plate 225 according to a control signal from the shooting controller 81. By this means, the position and the posture of the laser beam focusing optical system 22a fixed to the plate 225 can be changed.

The beam combiner 35 shown in FIG. 24 may be an optical system configured to introduce the main pulse laser beam 31a and the prepulse laser beam 31b into the chamber 2 through substantially the same optical path. The beam combiner 35 may include the high-reflection mirror 342, the holder 344, a dichroic mirror 351, a holder 352, a tilt stage 353, and a plate 354.

The holder 344 may hold the high-reflection mirror 342. The holder 344 holding the high-reflection mirror 342 may be provided on the tilt stage 353. The tilt stage 353 on which the holder 344 is provided may be fixed to the plate 354. The tilt stage 353 may rotate the holder 344 about two axes, the X-axis and the Y-axis. The tilt stage 353 may move the holder 344 in the biaxial directions, the X direction and the Y direction. The tilt stage 353 may be connected to the shooting controller 81. The tilt stage 353 may move the holder 344 according to a control signal from the shooting controller 81. By this means, it is possible to change the position and the posture of the high-reflection mirror 342 held by the holder 344.

The holder 352 may hold the dichroic mirror 351. The holder 352 holding the dichroic mirror 351 may be fixed to the plate 354.

The high-reflection mirror 342 may be arranged to face the window 21 of the chamber 2 and the high-reflection mirror 341. The high-reflection mirror 342 may reflect the main pulse laser beam 31a having been outputted from the main pulse laser device 3a and reflected from the high-reflection mirror 341, and guide the main pulse laser beam 31a to the window 21. The main pulse laser beam 32a reflected from the high-reflection mirror 342 may transmit through the window 21 and be introduced into the chamber 2.

The dichroic mirror 351 may be formed by coating a diamond substrate with a thin film which allows the main pulse laser beam 31a to transmit therethrough and reflects the prepulse laser beam 31b. The dichroic mirror 351 may be arranged to face the window 21 and the high-reflection mirror 345. The dichroic mirror 351 may be provided on the optical path of the main pulse laser beam 32a reflected from the high-reflection mirror 342. The dichroic mirror 351 may reflect the prepulse laser beam 31b having been outputted from the prepulse laser device 3b and reflected from the high-reflection mirror 345, and guide the prepulse laser beam 31b to the window 21. The dichroic mirror 351 may allow the main pulse laser beam 32a reflected from the high-reflection mirror 342 to transmit therethrough and guide the main pulse laser beam 32a to the window 21. In this case, the dichroic mirror 351 may guide the main pulse laser beam 32a and the prepulse laser beam 32b to the window 21 through substantially the same optical path.

The wavefront adjustment unit 36 may adjust the wavefront of the main pulse laser beam 31a. The wavefront adjustment unit 36 may be arranged between the main pulse laser device 3a and the high-reflection mirror 342 on the optical path of the main pulse laser beam 31a. In particular, the wavefront adjustment unit 36 may be arranged between the high-reflection mirror 341 and the high-reflection mirror 342 as shown in FIG. 24. The wavefront adjustment unit 36 may include a convex lens 361, a concave lens 362, a holder 363, a holder 364, and a single axis stage 365.

The holder 363 may hold the convex lens 361. The holder 364 may hold the concave lens 362. The holder 364 holding the concave lens 362 may be provided on the single axis stage 365. The single axis stage 365 may move the holder 364 in the Y direction which is the direction of the optical axis of the main pulse laser beam 31a entering the concave lens 362. The single axis stage 365 may be connected to the shooting controller 81. The single axis stage 365 may move the holder 364 according to a control signal from the shooting controller 81. By this means, it is possible to change the distance between the convex lens 361 held by the holder 363 and the concave lens 362 held by the holder 364.

By changing the distance between the convex lens 361 and the concave lens 362, it is possible to adjust the wavefront of the main pulse laser beam 31a exiting the convex lens 361. By adjusting the wavefront of the main pulse laser beam 31a, it is possible to adjust the wavefront of the main pulse laser beam 33a. By this means, it is possible to control the focused position of the main pulse laser beam 33a in the plasma generation region 25 in the Z direction.

The wavefront adjustment unit 37 may adjust the wavefront of the prepulse laser beam 31b. The wavefront adjustment unit 37 may be arranged between the prepulse laser device 3b and the dichroic mirror 351 on the optical path of the prepulse laser beam 31b. In particular, the wavefront adjustment unit 37 may be arranged between the high-reflection mirror 345 and the dichroic mirror 351 as shown in FIG. 24. The wavefront adjustment unit 37 may include a convex lens 371, a concave lens 372, a holder 373, a holder 374, and a single axis stage 375.

The holder 373 may hold the convex lens 371. The holder 374 may hold the concave lens 372. The holder 374 holding the concave lens 372 may be provided on the single axis stage 375. The single axis stage 375 may move the holder 374 in the Y direction which is the direction of the optical axis of the prepulse laser beam 31b entering the concave lens 372. The single axis stage 375 may be connected to the shooting controller 81. The single axis stage 375 may move the holder 374 according to a control signal from the shooting controller 81. By this means, it is possible to change the distance between the convex lens 371 held by the holder 373 and the concave lens 372 held by the holder 374.

By changing the distance between the convex lens 371 and the concave lens 372, it is possible to adjust the wavefront of the prepulse laser beam 31b exiting the convex lens 371. By adjusting the wavefront of the prepulse laser beam 31b, it is possible to adjust the wavefront of the prepulse laser beam 33b. By this means, it is possible to control the focused position of the prepulse laser beam 33b in the plasma generation region 25 in the Z direction.

The shooting controller 81 shown in FIGS. 24 and 25 may output a control signal to the biaxial stage 227 to control the position and posture of the laser beam focusing optical system 22a. The shooting controller 81 may output a control signal to the tilt stage 353 to control the position and the posture of the high-reflection mirror 342. The shooting controller 81 may output a control signal to the single axis stage 365 to control the operation of the wavefront adjustment unit 36 including the single axis stage 365. The shooting controller 81 may output a control signal to the single axis stage 375 to control the operation of the wavefront adjustment unit 37 including the single axis stage 375.

The shooting controller 81 may be connected to the main pulse laser device 3a and the prepulse laser device 3b via the delay circuit 82. Here, the delay time Tdl set in the delay circuit 82 by the shooting controller 81, which defines the timing at which a trigger signal is outputted to the main pulse laser device 3a, is referred to as "delay time Tdlm." Meanwhile, the delay time Tdl set in the delay circuit 82 by the shooting controller 81, which defines the timing at which a trigger signal is outputted to the prepulse laser device 3b, is referred to as "delay time Tdlp." The other configurations of the shooting controller 81 and the delay circuit 82 may be the same as those of the shooting controller 81 and the delay circuit 82 shown in FIG. 13.

FIGS. 26A to 26D are drawings showing the state in which the shape of the droplet 271 is changed by irradiating the droplet 271 with the main pulse laser beam 33a or the prepulse laser beam 33b.

FIG. 26A is a drawing showing the state just before the droplet 271 is irradiated with the prepulse laser beam 33b. FIG. 26A shows the state before the droplet 271 is irradiated with the main pulse laser beam 33a and the prepulse laser beam 33b, and therefore the droplet 271 may have the original shape. The shooting controller 81 may match the focused position of the prepulse laser beam 33b with the center position of the droplet 271. The beam diameter of the focused prepulse laser beam 33b may be equal to or greater than the diameter of the droplet 271. The diameter of the droplet 271 may be, for example, about 20 µm. The beam diameter of the focused prepulse laser beam 33b may be, for example, about 20 µm to 70 µm.

FIG. 26B shows the state just after the droplet 271 is irradiated with the prepulse laser beam 33b. In the case shown in FIG. 26B, the abrasion of the droplet 271 due to the irradiation of the prepulse laser beam 33b is started at the periphery of the droplet 271 to which the prepulse laser beam 33b is applied. The reaction of this abrasion may generate thrust that allows the droplet 271 to move in the Z direction which is the irradiation direction of the prepulse laser beam 33b.

FIG. 26C is a drawing showing the state just before the secondary target 271a is irradiated with the main pulse laser beam 33a. In the case shown in FIG. 26C, due to the reaction of the abrasion, the droplet 271 may be turned into the secondary target 271a and dispersed. The secondary target 271a may be an aggregation of a plurality of fine particles of the target 27 produced from one droplet 271. The center position of the secondary target 271a may be the center position of the spatial distribution of the fine particles. The secondary target 271a may be formed in an approximately discoid shape. The cross section of the secondary target 271a in parallel to the Z direction may be formed in an approximately oval shape. When the focused position of the prepulse laser beam 33b matches the center position of the droplet 271, the irradiation of the prepulse laser beam 33b is started at the center of the periphery of the droplet 271 in the −Z direction side. Therefore, the droplet 271 irradiated with the prepulse laser beam 33b may be abraded, and consequently turned into a plurality of fine particles of the target 27, and then dispersed in an approximately discoid shape having the central axis approximately parallel to the Z direction. That is, when the focused position of the prepulse laser beam 33b matches the center position of the droplet 271, the secondary target 271a may be formed in an approximately discoid shape having the central axis approximately parallel to the Z direction.

In addition, the secondary target 271a is produced from the droplet 271 traveling through the target traveling path 272, and therefore can maintain the inertia force of the droplet 271 to travel in the Y direction. Therefore, the thrust in the Z direction due to the abrasion and the inertia force in the Y direction may act on the secondary target 271a.

Therefore, the center of the secondary target 271a may move from the center of the droplet 271 in the Z direction and the Y direction. The shooting controller 81 may substantially match the focused position of the main pulse laser beam 33a with the center position of the moved secondary target 271a. The beam diameter of the focused main pulse laser beam 33a may be equal to or greater than the diameter of the secondary target 271a. The diameter of the secondary target 271a may be, for example, about 300 μm to 400 μm. Also the beam diameter of the focused main pulse laser beam 33a may be, for example, about 300 μm to 400 μm.

FIG. 26D is a drawing showing the state just after the secondary target 271a is irradiated with the main pulse laser beam 33a. In the case shown in FIG. 26D, the secondary target 271a may be turned into plasma and emit plasma light by irradiating the secondary target 271a with the main pulse laser beam 33a. The center of the plasma light may be located at or near the periphery of the secondary target 271a to which the main pulse laser beam 33a is applied, in the same way as described above with reference to FIG. 15B. Therefore, the center of the plasma light may be shifted from the center of the secondary target 271a in the −Z direction.

Here, the measured value for the center position of the droplet 271 just before being irradiated with the prepulse laser beam 33b may be represented as "measurement position Cd(Xd, Yd, Zd) of the droplet 271." The measured value for the center position of the secondary target 271a just before being irradiated with the main pulse laser beam 33a may be represented as "measurement position Cs(Xs, Ys, Zs) of the secondary target 271a." The measured value for the center position of the plasma light emitted from the secondary target 271a just after being irradiated with the main pulse laser beam 33a may be represented as "measurement position Cpm (Xpm, Ypm, Zpm) of the plasma light." The shooting controller 81 may store the relationship of the relative positions of Cd, Cs and Cpm in advance.

7.2 Operation

Now, the operations of the shooting system using the EUV light generation apparatus 1 according to Embodiment 3 will be described with reference to FIGS. 27 to 41. The operations of the shooting system using the EUV light generation apparatus 1 according to Embodiment 3, which are the same as those of the EUV light generation apparatus 1 shown in FIGS. 2 and 3, the image measurement system according to Embodiment 1, and the shooting system according to Embodiment 2, will not be described again here. First, the timing control for the image measurement performed by the shooting system using the EUV light generation apparatus 1 according to Embodiment 3 will be described with reference to FIGS. 27 to 29.

Figure 27:
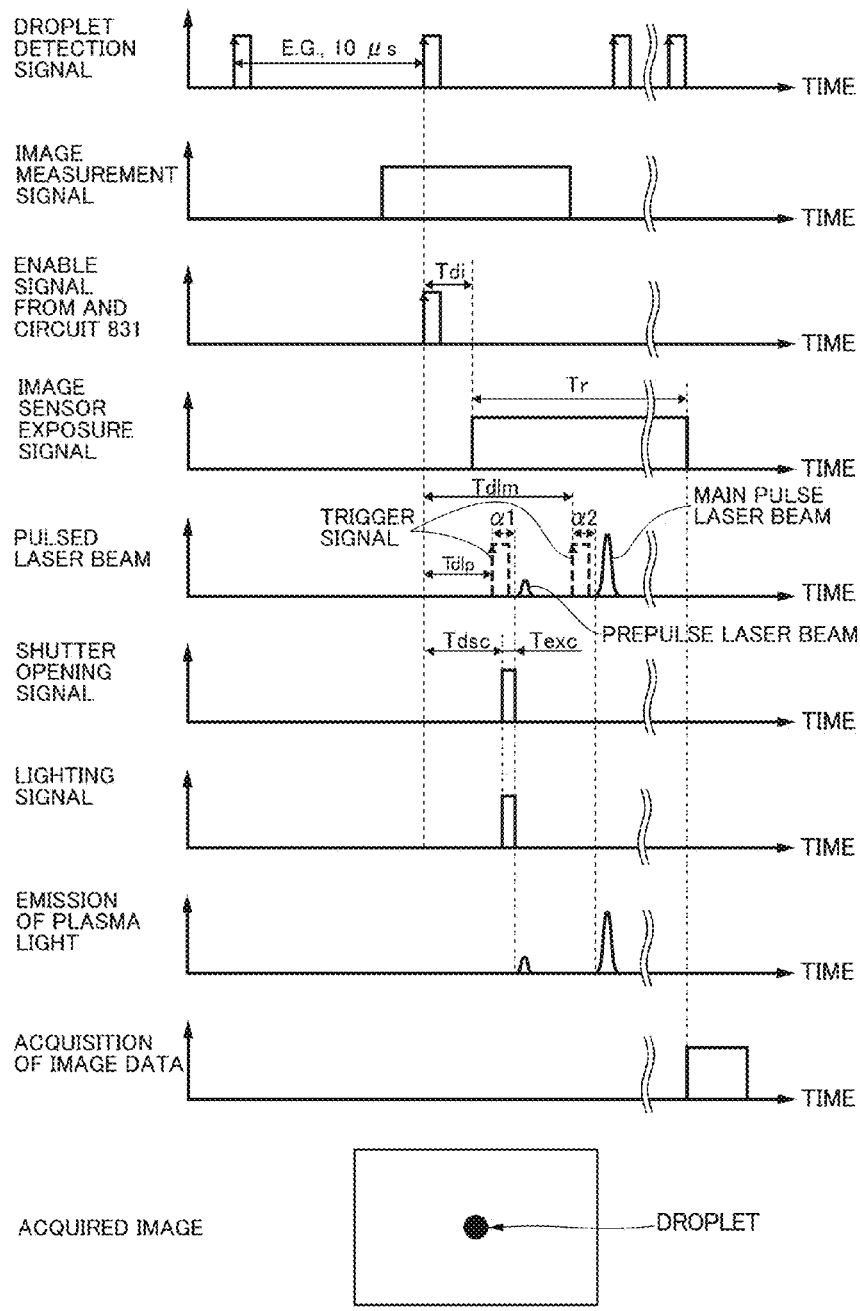
FIG. 27 is a time chart for the image measurement of a droplet by the controller shown in FIG. 25.

FIG. 27 is a time chart for the image measurement performed by the controller 8 shown in FIG. 25, where the image of the droplet 271 just before being irradiated with the prepulse laser beam 33b is measured.

With the time chart shown in FIG. 27, the shooting controller 81 may set the shutter opening time Texas Tex=Texc in the one-shot circuit 835 in advance. The shutter opening time Texc may be a period of time which is necessary and sufficient to capture the image of the droplet 271. The shutter opening time Texc may be equal to the above-described shutter opening time Texa.

Moreover, the shooting controller 81 may set the delay time Tds as Tds=Tdsc in the delay circuit 833. When the image of the droplet 271 just before being irradiated with the prepulse laser beam 33b is captured, the imaging timing of the imaging part 422 and the imaging part 432 may be defined as follows. A summed value "Tdsc+Texc" of the delay time Tdsc that defines the output timing of the shutter opening signal and the shutter opening time Texc may be equal to or smaller than a value "delay time Tdlp+time α1" that defines the irradiation timing of the prepulse laser beam 33b. The delay time Tdsc may be calculated according to the following equation.

$$Tdsc=(d/v)-Texc$$

The delay time Tdi of the delay circuit 834 and the exposure time Tr of the one-shot circuit 836 may be set in advance as the initial setting at startup in the same way as the case shown in FIGS. 6 and 7.

The controller 8 may control the output timings of various signals for the image measurement as follows, based on the droplet detection signals outputted from the droplet detector 41.

As shown in FIG. 27, the shooting controller 81 may output the droplet detection signals directly to the delay circuit 82 and the AND circuit 831.

Then, as shown in FIG. 27, the shooting controller 81 may output an image measurement signal to the AND circuit 831 when the shooting controller 81 causes the image measurement unit 42 and the image measurement unit 43 to perform the image measurement.

Then, as shown in FIG. 27, when the image measurement signal and the droplet detection signal are inputted to the AND circuit 831, the AND circuit 831 may output enable signals to the delay circuit 833 and the delay circuit 834. When the enable signal is inputted from the AND circuit 831 to the delay circuit 833, the delay circuit 833 may output the enable signal to the one-shot circuit 835 at the timing delayed by the delay time Tdsc. When the enable signal is inputted from the AND circuit 831 to the delay circuit 834, the delay circuit 834 may output the enable signal to the one-shot circuit 836 at the timing delayed by the delay time Tdi.

Then, as shown in FIG. 27, when the enable signal is inputted to the one-shot circuit 836, the one-shot circuit 836 may output image sensor exposure signals each having the pulse width of the exposure time Tr to the image sensor 422a and the image sensor 432a. The image sensor 422a and the image sensor 432a may be exposed to the light from when the image sensor exposure signals are inputted until the exposure time Tr has elapsed.

Then, as shown in FIG. 27, when the droplet detection signal is inputted to the delay circuit 82, the delay circuit 82 may output a trigger signal to the prepulse laser device 3b at the timing delayed by the delay time Tdlp. After a time α1 has elapsed from when the trigger signal is inputted to the prepulse laser device 3b, the prepulse laser device 3b may emit the prepulse laser beam 33b to the plasma generation region 25. Then, when the droplet detection signal is inputted to the delay circuit 82, the delay circuit 82 may output a trigger signal to the main pulse laser device 3a at the timing delayed by the delay time Tdlm. After a time α2 has elapsed from when the trigger signal is inputted to the main pulse laser device 3a, the main pulse laser device 3a may emit the main pulse laser beam 33a to the plasma generation region 25.

Then, as shown in FIG. 27, when the enable signal is inputted to the one-shot circuit 835, the one-shot circuit 835 may output the output signals each having the pulse width of the shutter opening time Texc to the shutter 422d, the shutter 432d, and the AND circuit 832. Among the output signals from the one-shot circuit 835, the signals inputted to the shutter 422d and the shutter 432d may function as shutter opening signals. The shutter 422d and the shutter 432d may be open from when the shutter opening signals are inputted until the shutter opening time Texc has elapsed.

Then, as shown in FIG. 27, when the output signal from the one-shot circuit 835 and the gate signal are inputted to the AND circuit 832, the AND circuit 832 may output lighting signals each having the pulse width of the shutter opening time Texc to the light source 421a and the light source 431a. The gate signal may be outputted from the shooting controller 81 to the AND circuit 832 before the one-shot circuit 835 outputs the output signal to the AND circuit 832. The light source 421a and the light source 431a may emit pulsed light from when the lighting signals are inputted until the shutter opening time Texc has elapsed.

Then, as shown in FIG. 27, the plasma light may be emitted after the shutter opening time Texc has elapsed. The plasma light may be emitted when the secondary target 271a is irradiated with the main pulse laser beam 33a. In addition, the plasma light with a low intensity may be emitted when the droplet 271 is irradiated with the prepulse laser beam 33b. The timing at which this plasma light with a low intensity is emitted may also be a timing just after the shutter opening time Texc has elapsed. The imaging part 422 and the imaging part 432 may capture the image of the droplet 271 just before being irradiated with the prepulse laser beam 33b.

Then, as shown in FIG. 27, the image sensor 422a and the image sensor 432a may generate the image data 1 and the image data 2 and output the data to the shooting controller 81, after the exposure time Tr has elapsed. The shooting controller 81 may acquire the image data 1 and the image data 2 of the droplet 271 just before being irradiated with the prepulse laser beam 33b. The shooting controller 81 may calculate the measurement position Cd(Xd, Yd, Zd) of the droplet 271, based on the acquired image data 1 and image data 2.

The image of the droplet 271 just before being irradiated with the prepulse laser beam 33b may be the image, for example, as shown in FIG. 27.

Figure 28:
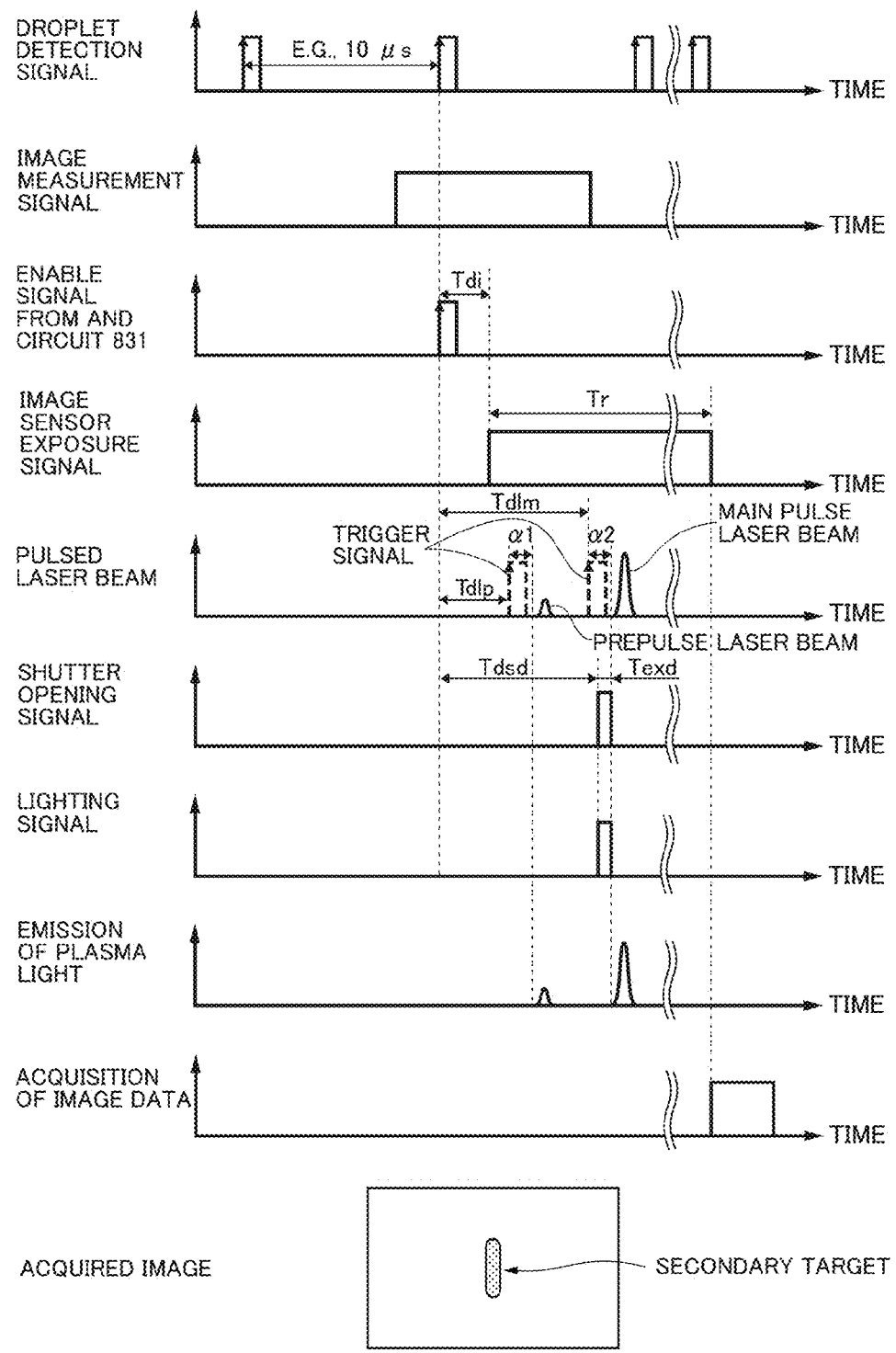
FIG. 28 is a time chart for the image measurement of a secondary target by the controller shown in FIG. 25.

FIG. 28 is a time chart for the image measurement performed by the controller 8 shown in FIG. 25, where the image of the droplet 271 just before being irradiated with the main pulse laser beam 33a is measured.

With the time chart shown in FIG. 28, the shooting controller 81 may set the shutter opening time Tex as Tex=Texd in the one-shot circuit 835 in advance. The shutter opening time Texd may be a period of time which is necessary and sufficient to capture the image of the secondary target 271a.

Moreover, the shooting controller 81 may set the delay time Tds as Tds=Tdsd in the delay circuit 833. When the image of the secondary target 271a just before being irradiated with the main pulse laser beam 33a is captured, the imaging timing of the imaging part 422 and the imaging part 432 may be defined as follows. A summed value "Tdsd+Texd" of the delay time Tdsd that defines the output timing of the shutter opening signal and the shutter opening time Texd may be equal to or smaller than a value "delay time Tdlm+time α2" that defines the irradiation timing of the main pulse laser beam 33a.

The delay time Tdi of the delay circuit 834 and the exposure time Tr of the one-shot circuit 836 may be set in advance as the initial setting at startup in the same way as the case shown in FIG. 27.

The controller 8 may control the output timings of various signals for the image measurement as follows, based on the droplet detection signals outputted from the droplet detector 41.

As shown in FIG. 28, the shooting controller 81 may output the droplet detection signals directly to the delay circuit 82 and the AND circuit 831.

Then, as shown in FIG. 28, the shooting controller 81 may output an image measurement signal to the AND circuit 831 when the shooting controller 81 causes the image measurement unit 42 and the image measurement unit 43 to perform the image measurement.

Then, as shown in FIG. 28, when the image measurement signal and the droplet detection signal are inputted to the AND circuit 831, the AND circuit 831 may output enable signals to the delay circuit 833 and the delay circuit 834. When the enable signal is inputted from the AND circuit 831 to the delay circuit 833, the delay circuit 833 may output the enable signal to the one-shot circuit 835 at the timing delayed by the delay time Tdsd. When the enable signal is inputted from the AND circuit 831 to the delay circuit 834, the delay circuit 834 may output the enable signal to the one-shot circuit 836 at the timing delayed by the delay time Tdi.

Then, as shown in FIG. 28, when the enable signal is inputted to the one-shot circuit 836, the one-shot circuit 836 may output image sensor exposure signals each having the pulse width of the exposure time Tr to the image sensor 422a and the image sensor 432a. The image sensor 422a and the image sensor 432a may be exposed to the light from when the image sensor exposure signals are inputted until the exposure time Tr has elapsed.

Then, as shown FIG. 28, when the droplet detection signal is inputted to the delay circuit 82, the delay circuit 82 may output a trigger signal to the prepulse laser device 3b at the timing delayed by the delay time Tdlp. After the time α1 has elapsed from when the trigger signal is inputted to the prepulse laser device 3b, the prepulse laser device 3b may emit the prepulse laser beam 33b to the plasma generation region 25. In addition, when the droplet detection signal is inputted to the delay circuit 82, the delay circuit 82 may output a trigger signal to the main pulse laser device 3a at the timing delayed by the delay time Tdlm. After the time α2 has elapsed from when the trigger signal is inputted to the main pulse laser device 3a, the main pulse laser device 3a may emit the main pulse laser beam 33a to the plasma generation region 25.

Then, as shown in FIG. 28, when the enable signal is inputted to the one-shot circuit 835, the one-shot circuit 835 may output the output signals each having the pulse width of the shutter opening time Texd to the shutter 422d, the shutter 432d, and the AND circuit 832. Among the output signals from the one-shot circuit 835, the signals inputted to the shutter 422d and the shutter 432d may function as shutter opening signals. The shutter 422d and the shutter 432d may be open from when the shutter opening signals are inputted until the shutter opening time Texd has elapsed.

Then, as shown in FIG. 28, when the output signal from the one-shot circuit 835 and the gate signal are inputted to the AND circuit 832, the AND circuit 832 may output lighting signals each having the pulse width of the shutter opening time Texd to the light source 421a and the light source 431a. The gate signal may be outputted from the shooting controller 81 to the AND circuit 832 before the one-shot circuit 835 outputs the output signal to the AND circuit 832. The light source 421a and the light source 431a may emit pulsed light from when the lighting signals are inputted until the shutter opening time Texd has elapsed.

Then, as shown in FIG. 28, the plasma light may be emitted after the shutter opening time Texd has elapsed, from the secondary target 271a irradiated with the main pulse laser beam 33a. The imaging part 422 and the imaging part 432 may capture the image of the secondary target 271a just before being irradiated with the main pulse laser beam 33a.

Then, as shown in FIG. 28, the image sensor 422a and the image sensor 432a may generate the image data 1 and the image data 2 and output the data to the shooting controller 81, after the exposure time Tr has elapsed. The shooting controller 81 may acquire the image data 1 and the image data 2 of the secondary target 271a just before being irradiated with the main pulse laser beam 33a. The shooting controller 81 may calculate the measurement position Cs(Xs, Ys, Zs) of the secondary target 271a, based on the acquired image data 1 and image data 2.

The image of the secondary target 271a just before being irradiated with the main pulse laser beam 33a may be the image, for example, as shown in FIG. 28.

Figure 29:
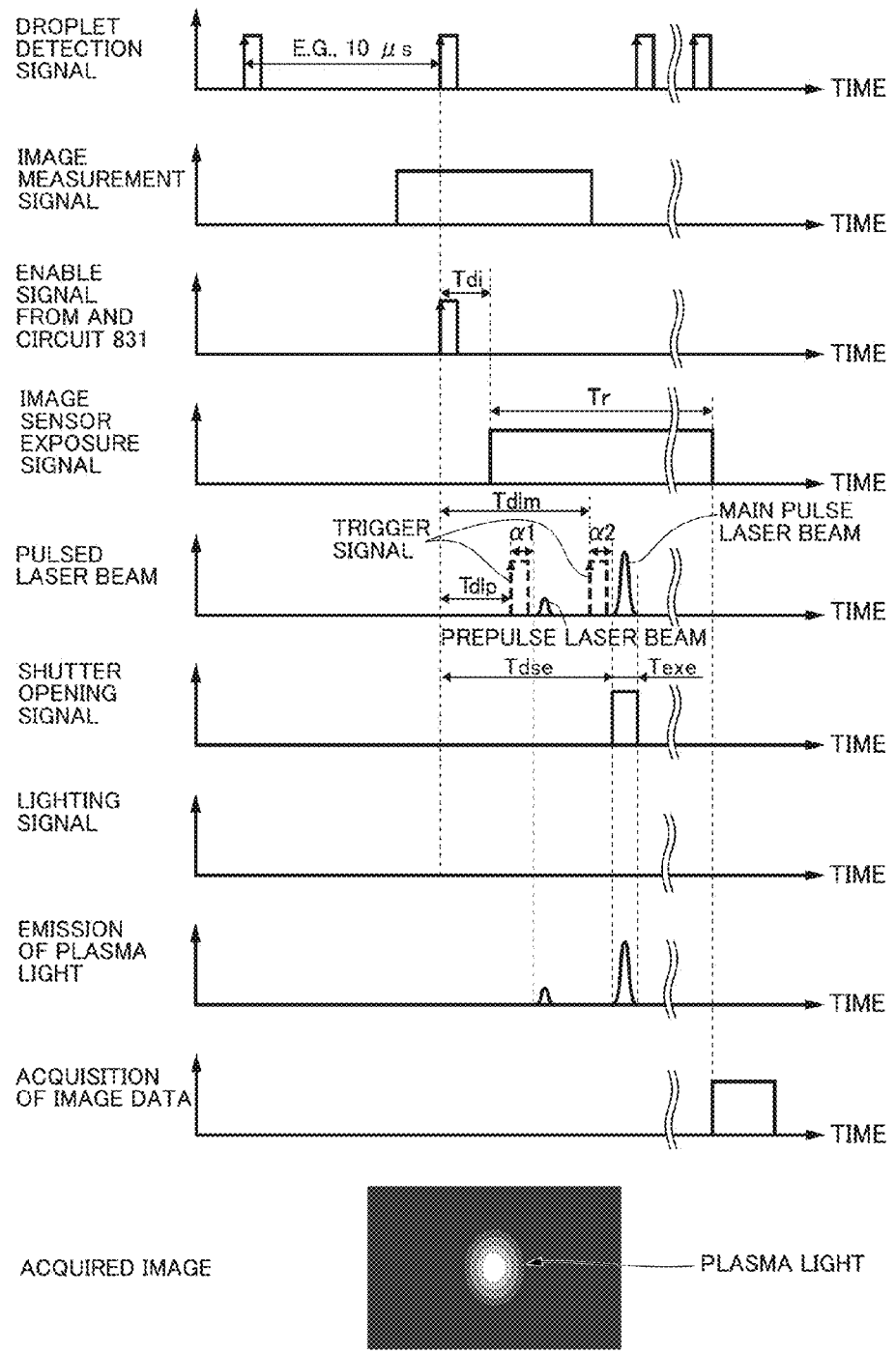
FIG. 29 is a time chart for the image measurement of plasma light by the controller shown in FIG. 25.

FIG. 29 is a time chart for the image measurement performed by the controller 8 shown in FIG. 25, where the image of the plasma light emitted from the secondary target 271a just after being irradiated with the main pulse laser beam 33a is measured.

With the time chart shown in FIG. 29, the shooting controller 81 may set the shutter opening time Tex as Tex=Texe in the one-shot circuit 835 in advance. The shutter opening time Texe may be a period of time which is necessary and sufficient to capture the image of the plasma light.

Moreover, the shooting controller 81 may set the delay time Tds as Tds=Tdse in the delay circuit 833. When the image of the plasma light emitted from the secondary target 271a just after being irradiated with the main pulse laser beam 33a is captured, the imaging timing of the imaging part 422 and the imaging part 432 may be defined as follows. A summed value "Tdse+Texe" of the delay time Tdse that defines the output timing of the shutter opening signal and the shutter opening time Texe may be equal to or greater than a value "delay time Tdlm+time α2" that defines the irradiation timing of the main pulse laser beam 33a.

The delay time Tdi of the delay circuit 834 and the exposure time Tr of the one-shot circuit 836 may be set in advance as the initial setting at startup in the same way as the case shown in FIGS. 27 and 28.

The controller 8 may control the output timings of various signals for the image measurement as follows, based on the droplet detection signals outputted from the droplet detector 41.

As shown in FIG. 29, the shooting controller 81 may output the droplet detection signals directly to the delay circuit 82 and the AND circuit 831.

Then, as shown in FIG. 29, the shooting controller 81 may output an image measurement signal to the AND circuit 831 when the shooting controller 81 causes the image measurement unit 42 and the image measurement unit 43 to perform the image measurement.

Then, as shown in FIG. 29, when the image measurement signal and the droplet detection signal are inputted to the AND circuit 831, the AND circuit 831 may output enable signals to the delay circuit 833 and the delay circuit 834. When the enable signal is inputted from the AND circuit 831 to the delay circuit 833, the delay circuit 833 may output the enable signal to the one-shot circuit 835 at the timing delayed by the delay time Tdse. When the enable signal is inputted from the AND circuit 831 to the delay circuit 834, the delay circuit 834 may output the enable signal to the one-shot circuit 836 at the timing delayed by the delay time Tdi.

Then, as shown in FIG. 29, when the enable signal is inputted to the one-shot circuit 836, the one-shot circuit 836 may output image sensor exposure signals each having the pulse width of the exposure time Tr to the image sensor 422a and the image sensor 432a. The image sensor 422a and the image sensor 432a may be exposed to the light from when the image sensor exposure signals are inputted until the exposure time Tr has elapsed.

Then, as shown in FIG. 29, when the droplet detection signal is inputted to the delay circuit 82, the delay circuit 82 may output a trigger signal to the prepulse laser device 3b at the timing delayed by the delay time Tdlp. After the time α1 has elapsed from when the trigger signal is inputted to the prepulse laser device 3b, the prepulse laser device 3b may emit the prepulse laser beam 33b to the plasma generation region 25. In addition, when the droplet detection signal is inputted to the delay circuit 82, the delay circuit 82 may output a trigger signal to the main pulse laser device 3a at the timing delayed by the delay time Tdlm. After the time α2 has elapsed from when the trigger signal is inputted to the main pulse laser device 3a, the main pulse laser device 3a may emit the main pulse laser beam 33a to the plasma generation region 25.

Then, as shown in FIG. 29, when the enable signal is inputted to the one-shot circuit 835, the one-shot circuit 835 may output the output signals each having the pulse width of the shutter opening time Texe to the shutter 422d, the shutter 432d, and the AND circuit 832. Among the output signals from the one-shot circuit 835, the signals inputted to the shutter 422d and the shutter 432d may function as shutter opening signals. The shutter 422d and the shutter 432d may be open from when the shutter opening signals are inputted until the shutter opening time Texe has elapsed.

Then, as shown in FIG. 29, the AND circuit 832 may not output lighting signals to the light source 421a and the light source 431a. When the image of the plasma light is captured, the shooting controller 81 may not output a gate signal to the AND circuit 832.

Then, as shown in FIG. 29, the plasma light may be emitted during the shutter opening time Texe. The imaging part 422 and the imaging part 432 may capture the image of the plasma light emitted from the secondary target 271a just after being irradiated with the main pulse laser beam 33a.

Then, as shown in FIG. 29, the image sensor 422a and the image sensor 432a may generate the image data 1 and the image data 2 and output the data to the shooting controller 81, after the exposure time Tr has elapsed. The shooting controller 81 may acquire the image data 1 and the image data 2 of the plasma light emitted from the secondary target 271a just after being irradiated with the main pulse laser beam 33a. The shooting controller 81 may calculate the measurement position Cpm (Xpm, Ypm, Zpm) of the plasma light, based on the acquired image data 1 and image data 2.

The image of the plasma light emitted from the secondary target 271a just after being irradiated with the main pulse laser beam 33a may be the image, for example, as shown in FIG. 29.

Figure 30:
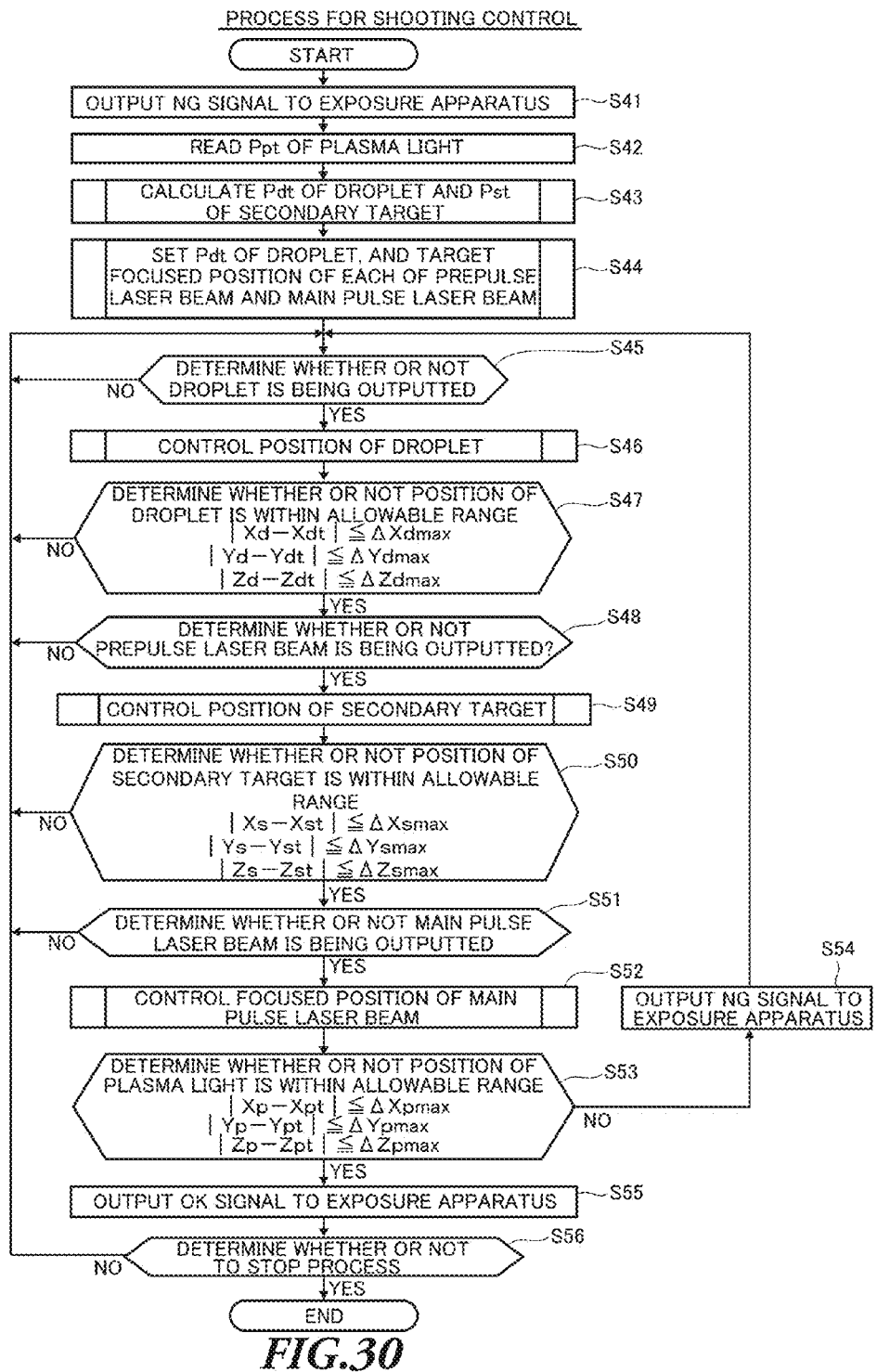
FIG. 30 is a flowchart explaining a process for shooting control by the shooting controller shown in FIG. 25.
Figure 31:
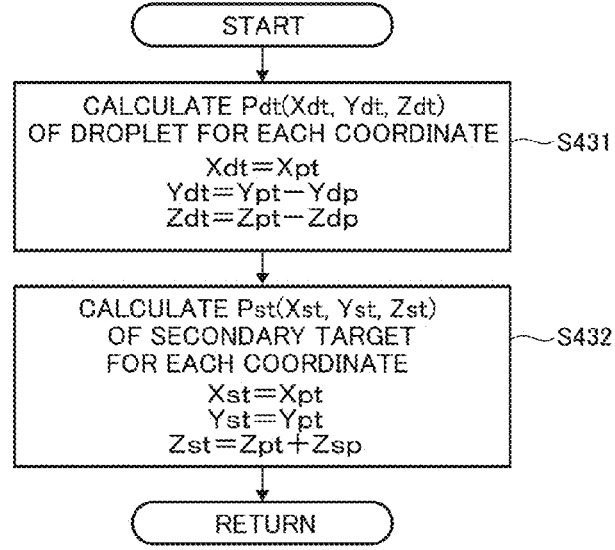
FIG. 31A is a flowchart explaining a process for calculating the target position of a droplet and the target position of a secondary target by the shooting controller shown in FIG. 25.
FIG. 31B is a drawing explaining the process shown in FIG. 31A.
Figure 31:
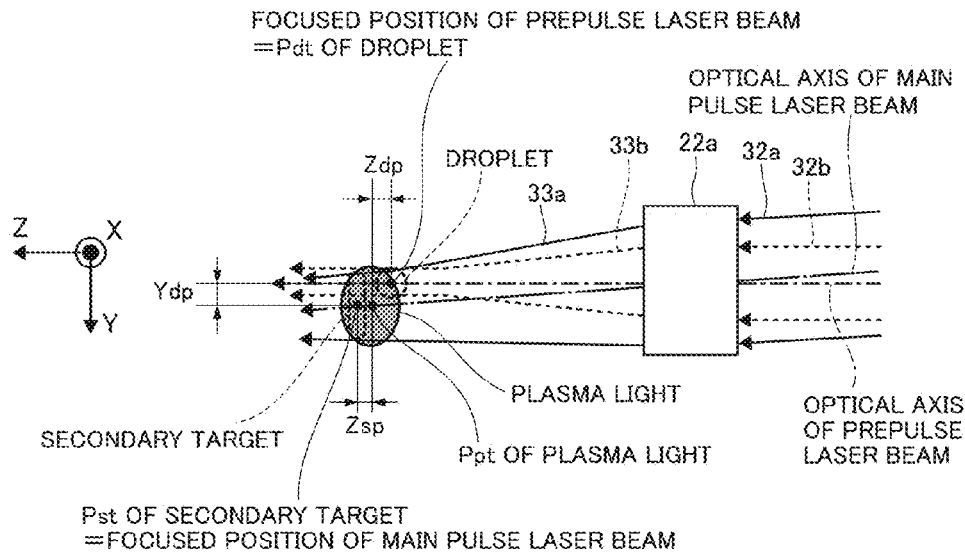

Next, with reference to FIGS. 30 to 41, a process for the shooting control of the shooting system using the EUV light generation apparatus 1 according to Embodiment 3 will be described. FIG. 30 is a flowchart showing a process for the shooting control performed by the shooting controller 81 shown in FIG. 25.

In step S41, the shooting controller 81 may output an NG signal to the exposure apparatus controller 61 via the EUV light generation controller 5.

In step S42, the shooting controller 81 may read the target position Ppt(Xpt, Ypt, Zpt) of the plasma light. The target position Ppt(Xpt, Ypt, Zpt) of the plasma light may be a target value for the center position of the plasma light emitted from the secondary target 271a just after being irradiated with the main pulse laser beam 33a in the plasma generation region 25. The shooting controller 81 may read the target position Ppt (Xpt, Ypt, Zpt) of the plasma light stored in the EUV light generation controller 5.

In step S43, the shooting controller 81 may calculate the target position Pdt of the droplet 271 and the target position Pst of the secondary target 271a. The target position Pst(Xst, Yst, Zst) of the secondary target 271a may be a target value for the center position of the secondary target 271a generated in the plasma generation region 25. In particular, the target position Pst(Xst, Yst, Zst) of the secondary target 271a may be a target value for the center position of the secondary target 271a just before being irradiated with the main pulse laser beam 33a in the plasma generation region 25. The shooting controller 81 may calculate the target position Pdt of the droplet 271 and the target position Pst of the secondary target 271a, based on the target position Ppt of the plasma light read in the step S42. Here, a process for calculating the target position Pdt of the droplet 271 and the target position Pst of the secondary target 271a will be described later with reference to FIG. 31A.

In step S44, the shooting controller 81 may set the target position Pdt of the droplet 271, and the target focused positions of the main pulse laser beam 33a and the prepulse laser beam 33b. The shooting controller 81 may set the delay time Tds, the delay time Tdl, and the biaxial stage 74 to supply the droplet 271 to the target position Pdt of the droplet 271 calculated in the step S43. The shooting controller 81 may set the biaxial stage 227 and the wavefront adjustment unit 37 to focus the prepulse laser beam 33b on the target position Pdt of the droplet 271 calculated in the step S43. The shooting controller 81 may set the tilt stage 353 and the wavefront adjustment unit 36 to focus the main pulse laser beam 33a on the target position Pst of the secondary target 271a calculated in the step S43. Here, a process for setting the target position Pdt of the droplet 271 and the target focused positions of the main pulse laser beam 33a and the prepulse laser beam 33b will be described later with reference to FIG. 32.

In step S45, the shooting controller 81 may determine whether or not the droplet 271 is being outputted. When determining that the droplet 271 is not being outputted, the shooting controller 81 may wait. On the other hand, when determining that the droplet 271 is being outputted, the shooting controller 81 may move the step to step S46.

In the step S46, the shooting controller 81 may control the position of the droplet 271. The shooting controller 81 may cause the image measurement unit 42 and the image measurement unit 43 to measure the image of the droplet 271 just before being irradiated with the prepulse laser beam 33b in the plasma generation region 25. Then, the shooting controller 81 may calculate the measurement position Cd(Xd, Yd, Zd) of the droplet 271, based on the acquired image data. Then, the shooting controller 81 may appropriately modify and set the delay time Tds and the delay time Tdl and control the operation of the biaxial stage 74, based on the calculated measurement position Cd(Xd, Yd, Zd) of the droplet 271. Here, a process for controlling the position of the droplet 271 will be described later with reference to FIG. 33.

In step S47, the shooting controller 81 may determine whether or not the position of the droplet 271 is within an allowable range. The shooting controller 81 may determine whether or not the measurement position Cd(Xd, Yd, Zd) of the droplet 271 after the control in the step S46 fulfills all the following expressions.

$|Xd-Xdt| \leq \Delta Xd\text{max}$ $|Yd-Ydt| \leq \Delta Yd\text{max}$ $|Zd-Zdt| \leq \Delta Zd\text{max}$ When determining that the position of the droplet 271 is out of the allowable range, the shooting controller 81 may move the step to the step S45. On the other hand, when determining that the position of the droplet 271 is within the allowable range, the shooting controller 81 may move the step to step S48.

In the step S48, the shooting controller 81 may determine whether or not the prepulse laser beam 33b is being outputted. The shooting controller 81 may make the determination by checking if a trigger signal has been inputted to the prepulse laser device 3b. When determining that the prepulse laser beam 33b is not being outputted, the shooting controller 81 may move the step to the step S45. On the other hand, when determining that the prepulse laser beam 33b is being outputted, the shooting controller 81 may move the step to step S49.

In the step S49, the shooting controller 81 may control the position of the secondary target 271a. The shooting controller 81 may cause the image measurement unit 42 and the image measurement unit 43 to measure the image of the secondary target 271a just before being irradiated with the main pulse laser beam 33a in the plasma generation region 25. Then, the shooting controller 81 may calculate the measurement position Cs(Xs, Ys, Zs) of the secondary target 271a, based on the acquired image data. Then, the shooting controller 81 may appropriately modify and set the delay time Tds and the delay time Tdl and control the operation of the biaxial stage 74, based on the calculated measurement position Cs(Xs, Ys, Zs) of the secondary target 271a. Moreover, the shooting controller 81 may control the operations of the biaxial stage 227 and the wavefront adjustment unit 37, based on the calculated measurement position Cs(Xs, Ys, Zs) of the secondary target 271a. Here, a process for controlling the position of the secondary target 271a will be described later with reference to FIG. 35.

In step S50, the shooting controller 81 may determine whether or not the position of the secondary target 271a is within an allowable range. The shooting controller 81 may determine whether or not the measurement position Cs(Xs, Ys, Zs) of the secondary target 271a after the control in the step S49 fulfills all the following expressions.

$|Xs-Xst| \leq \Delta Xs\text{max}$ $|Ys-Yst| \leq \Delta Ys\text{max}$ $|Zs-Zst| \leq \Delta Zs\text{max}$ Here, $\Delta Xs\text{max}$, $\Delta Ys\text{max}$ and $\Delta Zs\text{max}$ in the right-hand side may be threshold values for the respective coordinates that define the allowable range of the difference in the measurement position Cs from the target position Pst of the secondary target 271a. $\Delta Xs\text{max}$, $\Delta Ys\text{max}$ and $\Delta Zs\text{max}$ may be predetermined values to efficiently generate plasma light. When determining that the position of the secondary target 271a is out of the allowable range, the shooting controller 81 may move the step to the step S45. On the other hand, when determining that the position of the secondary target 271a is within the allowable range, the shooting controller 81 may move the step to step S51.

In the step S51, the shooting controller 81 may determine whether or not the main pulse laser beam 33a is being outputted. The shooting controller 81 may make the determination by checking if a trigger signal has been inputted to the main pulse laser device 3a. When determining that the main pulse laser beam 33a is not being outputted, the shooting controller 81 may move the step to the step S45. On the other hand, when determining that the main pulse laser beam 33a is being outputted, the shooting controller 81 may move the step to step S52.

In the step S52, the shooting controller 81 may control the focused position of the main pulse laser beam 33a. The shooting controller 81 may cause the image measurement unit 42 and the image measurement unit 43 to measure the image of the plasma light emitted from the secondary target 271a just after being irradiated with the main pulse laser beam 33a in the plasma generation region 25. Then, the shooting controller 81 may calculate the measurement position Cp(Xp, Yp, Zp) of the plasma light, based on the acquired image data. Then, the shooting controller 81 may control the operations of the tilt stage 353 and the wavefront adjustment unit 36, based on the calculated measurement position Cp(Xp, Yp, Zp) of the plasma light. In addition, the shooting controller 81 may appropriately modify and set the delay time Tds and the delay time Tdl and control the operation of the biaxial stage 74, based on the calculated measurement position Cp(Xp, Yp, Zp) of the plasma light. Moreover, the shooting controller 81 may control the operations of the biaxial stage 227 and the wavefront adjustment unit 37, based on the calculated measurement position Cp(Xp, Yp, Zp) of the plasma light. Here, a process for controlling the focused position of the main pulse laser beam 33a will be described later with reference to FIG. 39.

In step S53, the shooting controller 81 may determine whether or not the position of the plasma light is within an allowable range. The shooting controller 81 may determine whether or not the measurement position Cp(Xp, Yp, Zp) of the plasma light fulfills all the following expressions, based on the focused position of the main pulse laser beam 33a after the control in the step S52.

$|Xp-Xpt| \leq \Delta Xp\max$ $|Yp-Ypt| \leq \Delta Yp\max$ $|Zp-Zpt| \leq \Delta Zp\max$ When determining that the position of the plasma light is within the allowable range, the shooting controller 81 may move the step to step S55. On the other hand, when determining that the position of the plasma light is out of the allowable range, the shooting controller 81 may move the step to step S54.

In the step S54, the shooting controller 81 may output an NG signal to the exposure apparatus controller 61 via the EUV light generation controller 5. After outputting the NG signal, the shooting controller 81 may move the step to the step S45.

In the step S55, the shooting controller 81 may output an OK signal to the exposure apparatus controller 61 via the EUV light generation controller 5.

In step S56, the shooting controller 81 may determine whether or not to stop the process for the shooting control. When determining not to stop the process for the shooting control, the shooting controller 81 may move the step to the step S45. On the other hand, when determining to stop the process for the shooting control, the shooting controller 81 may end this process.

FIG. 31A is a flowchart showing the process for calculating the target position Pdt of the droplet 271 and the target position Pst of the secondary target 271a in the step S43 shown in FIG. 30. FIG. 31B is a drawing explaining the process shown in FIG. 31A.

In step S431, the shooting controller 81 may calculate each of the coordinates of the target position Pdt(Xdt, Ydt, Zdt) of the droplet 271. The shooting controller 81 may calculate the target position Pdt(Xdt, Ydt, Zdt) of the droplet 271 according to the following equations, based on the target position Ppt (Xpt, Ypt, Zpt) of the plasma light read in the step S42 shown in FIG. 30.

$Xdt = Xpt$ $Ydt = Ypt - Ydp$ $Zdt = Zpt - Zdp$

The shooting controller 81 may regard the X-component Xpt of the target position Ppt of the plasma light as the same as the X-component Xdt of the target position Pdt of the droplet 271. The shooting controller 81 may regard the coordinate shifted from the Y-component Ypt of the target position Ppt of the plasma light by Ydp in the −Y direction as the Y-component Ydt of the target position Pdt of the droplet 271. The shooting controller 81 may regard the coordinate shifted from the Z-component Zpt of the target position Ppt of the plasma light by Zdp in the −Z direction as the Z-component Zdt of the target position Pdt of the droplet 271.

In step S432, the shooting controller 81 may calculate each of the coordinates of the target position Pst(Xst, Yst, Zst) of the secondary target 271a. The shooting controller 81 may calculate the target position Pst (Xst, Yst, Zst) of the secondary target 271a according to the following equations, based on the target position Ppt(Xpt, Ypt, Zpt) of the plasma light read in the step S42 shown in FIG. 30.

$Xst = Xpt$ $Yst = Ypt$ $Zst = Zpt + Zsp$

The shooting controller 81 may regard the X-component Xpt of the target position Ppt of the plasma light as the same as the X-component Xst of the target position Pst of the secondary target 271a. The shooting controller 81 may regard the Y-component Ypt of the target position Ppt of the plasma light as the same as the Y-component Yst of the target position Pst of the secondary target 271a. The shooting controller 81 may regard the coordinate shifted from the Z-component Zpt of the target position Ppt of the plasma light by Zsp in the +Z direction as the Z-component Zst of the target position Pst of the secondary target 271a.

In order to emit the plasma light at the target position Ppt of the plasma light, the shooting controller 81 may substantially match the target position Pst of the secondary target 271a and the target focused position of the main pulse laser beam 33a with the target position Ppt of the plasma light. However, the center of the plasma light may be shifted from the center of the secondary target 271a in the −Z direction, in the same way as described above with reference to FIGS. 15B and 26D. The reason for this is that the irradiation of the main pulse laser beam 33a is started at the periphery of the secondary target 271a in the −Z direction side, and therefore the center of the plasma light may be located at or near the periphery. Here, the amount of the shifting of the center of the plasma light from the center of the secondary target 271a in the −z direction is defined as "Zsp." Therefore, as shown in FIG. 31B, the shooting controller 81 may set the target position Pst of the secondary target 271a and the target focused position of the main pulse laser beam 33a as the coordinates shifted from the target position Ppt of the plasma light by Zsp in the +Z direction.

In addition, as described above with reference to FIG. 26C, the center of the secondary target 271a may be shifted from the center of the droplet 271 in the Z direction and the Y direction. The reason for this may be that the thrust in the Z direction due to the abrasion and the inertia force retained in the droplet 271 in the Y direction act on the droplet 271 irradiated with the prepulse laser beam 33b. Here, the amount of the movement of the secondary target 271a from the center of the droplet 271 in the Z direction is defined as "Zsp+Zdp." In addition, the amount of the movement of the secondary target 271a from the center of the droplet 271 in the Y direction is defined as "Ydp." Therefore, as shown in FIG. 31B, the shooting controller 81 may regard the coordinates shifted from the target position Ppt of the plasma light by Zdp in the −Z direction and by Ydp in the −Y direction as the target position Pdt of the droplet 271 and the target focused position of the prepulse laser beam 33b.

Figure 32:
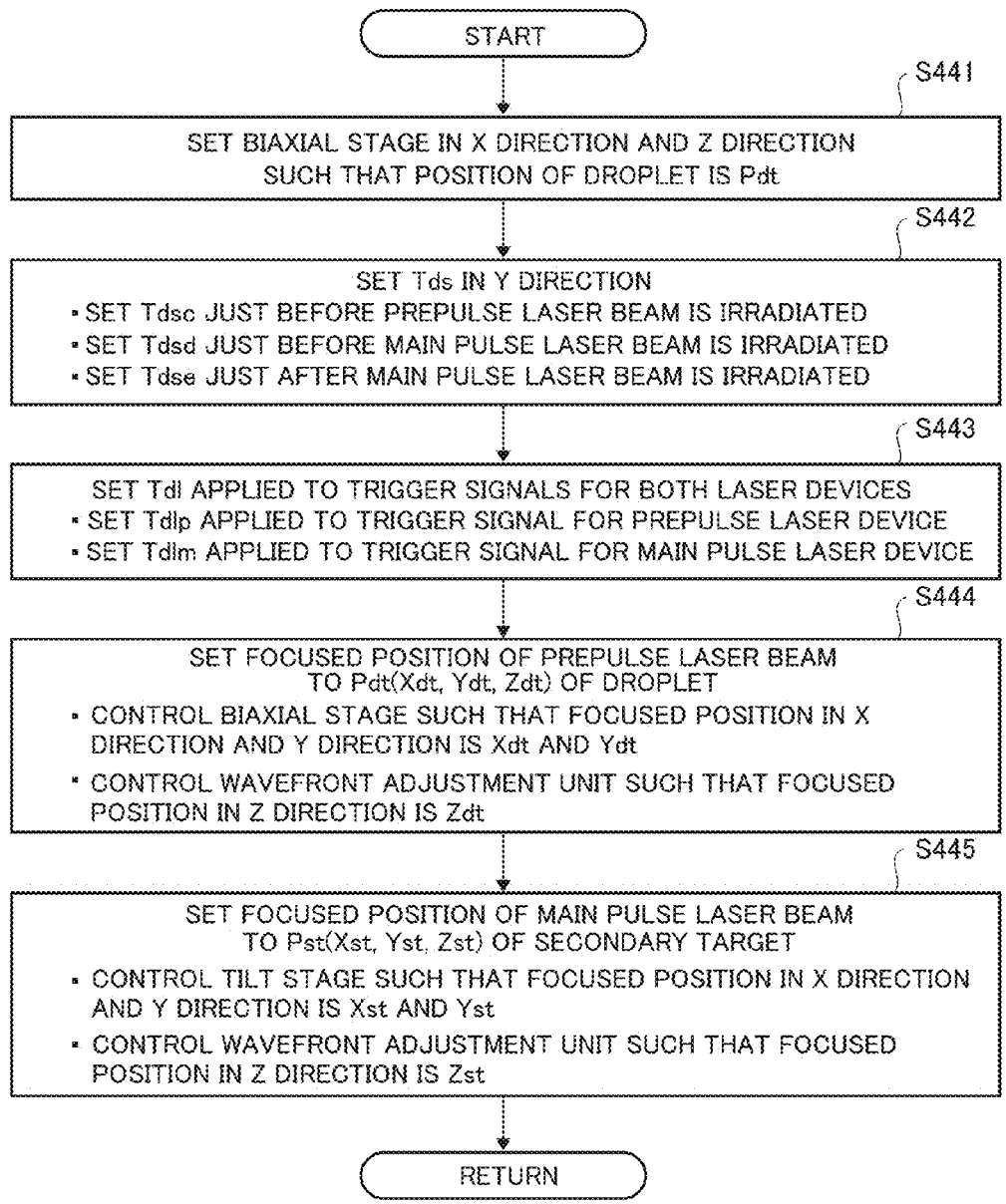
FIG. 32 is a flowchart explaining a process for setting the target position of a droplet and the target focused positions of a prepulse laser beam and a main pulse laser beam by the shooting controller shown in FIG. 25.

FIG. 32 is a flowchart showing the process for setting the target position Pdt of the droplet 271 and the target focused positions of the prepulse laser beam 33b and the main pulse laser beam 33a in the step S44 shown in FIG. 30.

In step S441, the shooting controller 81 may set the biaxial stage 74 such that the position of the droplet 271 supplied to the plasma generation region 25 in the X direction and the Z direction is the target position Pdt of the droplet 271. The shooting controller 81 may output a control signal containing the amount of the movement of the target supply part 26 in the X direction and the Z direction, to the biaxial stage 74.

In step S442, the shooting controller 81 may set the delay time Tds such that the position of the droplet 271 supplied to the plasma generation region 25 in the Y direction is the target position Pdt of the droplet 271. Here, the delay time Tds used to measure the image of the droplet 271 just before being irradiated with the prepulse laser beam 33b is referred to as "delay time Tdsc". The shooting controller 81 may set the delay time Tdsc in the delay circuit 833. Meanwhile, the delay time Tds used to measure the image of the secondary target 271a just before being irradiated with the main pulse laser beam 33a is referred to as "delay time Tdsd." The shooting controller 81 may set the delay time Tdsd in the delay circuit 833. Moreover, the delay time Tds used to measure the image of the plasma light emitted from the secondary target 271a just after being irradiated with the main pulse laser beam 33a is referred to as "delay time Tdse." The shooting controller 81 may set the delay time Tdse in the delay circuit 833.

In step S443, the shooting controller 81 may set the delay time Tdl applied to the trigger signals for the prepulse laser device 3b and the main pulse laser device 3a. To be more specific, the delay time Tdl which is applied to the trigger signal for the prepulse laser device 3b is referred to as "delay time Tdlp." The shooting controller 81 may set the delay time Tdlp in the delay circuit 82. Meanwhile, the delay time Tdl which is applied to the trigger signal for the main pulse laser device 3a is referred to as "delay time Tdlm." The shooting controller 81 may set the delay time Tdlm in the delay circuit 82.

In step S444, the shooting controller 81 may set the focused position of the prepulse laser beam 33b in the plasma generation region 25 as the target position Pdt(Xdt, Ydt, Zdt) of the droplet 271. The shooting controller 81 may control the operation of the biaxial stage 227 such that the focused position of the prepulse laser beam 33b in the X direction and the Y direction is represented by Xdt and Ydt of the target position Pdt of the droplet 271. The shooting controller 81 may output a control signal containing the amount of the movement of the laser beam focusing optical system 22a in the X direction and the Y direction, to the biaxial stage 227. The shooting controller 81 may control the operation of the wavefront adjustment unit 37 such that the focused position of the prepulse laser beam 33b in the Z direction is represented by Zdt of the target position Pdt of the droplet 271. The shooting controller 81 may output a control signal containing the amount of the movement of the holder 374 holding the concave lens 372 to the single axis stage 375.

In step S445, the shooting controller 81 may set the focused position of the main pulse laser beam 33a in the plasma generation region 25 as the target position Pst(Xst, Yst, Zst) of the secondary target 271a. The shooting controller 81 may control the operation of the tilt stage 353 such that the focused position of the main pulse laser beam 33a in the X direction and the Y direction is represented by Xst and Yst of the target position Pst of the secondary target 271a. The shooting controller 81 may output a control signal containing the amount of the movement and the amount of the rotation of the high-reflection mirror 342 of the beam combiner 35 in the X direction and the Y direction, to the tilt stage 353. The shooting controller 81 may control the operation of the wavefront adjustment unit 36 such that the focused position of the main pulse laser beam 33a in the Z direction is represented by Zst of the target position Pst of the secondary target 271a. The shooting controller 81 may output a control signal containing the amount of the movement of the holder 364 holding the concave lens 362 to the single axis stage 365.

Figure 33:
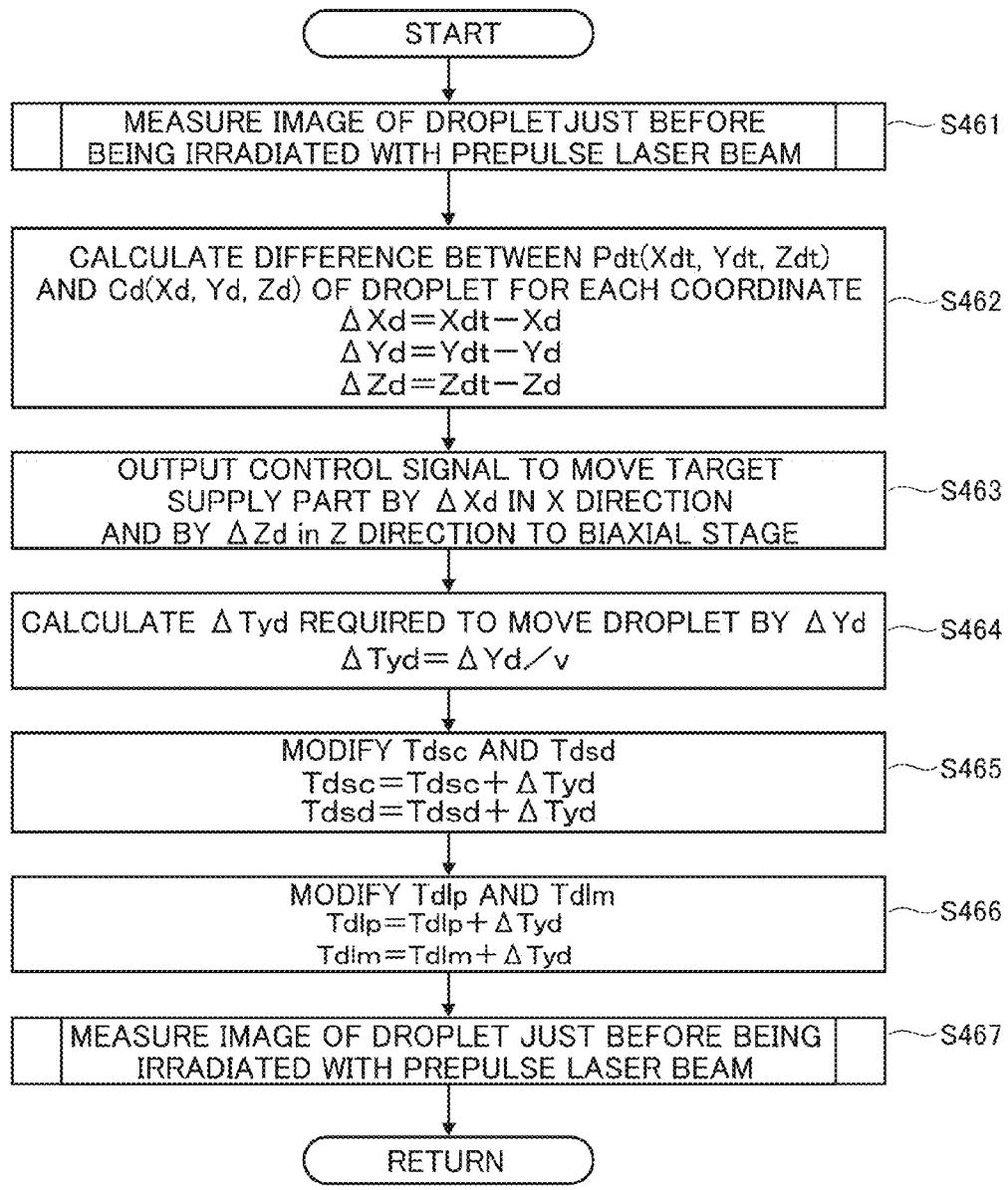
FIG. 33 is a flowchart explaining a process for controlling the position of a droplet by the shooting controller shown in FIG. 25.

FIG. 33 is a flowchart showing the process for controlling the position of the droplet 271 in the step S46 shown in FIG. 30.

In step S461, the shooting controller 81 may measure the image of the droplet 271 just before being irradiated with the pulsed laser beam 33b. Here, a process for measuring the image of the droplet 271 will be described later with reference to FIG. 34.

In step S462, the shooting controller 81 may calculate the difference between the target position Pdt and the measurement position Cd of the droplet 271 for each of the coordinates. The shooting controller 81 may calculate, for each of the coordinates, the difference between the target position Pdt(Xdt, Ydt, Zdt) set in the step S44 shown in FIG. 30 and the measurement position Cd(Xd, Yd, Zd) measured in the step S461, according to the following equations.

$\Delta Xd = Xdt - Xd$ $\Delta Yd = Ydt - Yd$ $\Delta Zd = Zdt - Zd$

In step S463, the shooting controller 81 may output a control signal to move the target supply part 26 in the X direction and the Z direction to the biaxial stage 74. The shooting controller 81 may control the position of the droplet 271 supplied to the plasma generation region 25 in the X direction and the Z direction, by controlling the operation of the biaxial stage 74. The shooting controller 81 may regard ΔXd calculated in the step S462 as the amount of movement of the target supply part 26 in the X direction. The shooting controller 81 may regard ΔZd calculated in the step S462 as the amount of movement of the target supply part 26 in the Z direction. The shooting controller 81 may output the control signal containing ΔXd and ΔZd to the biaxial stage 74.

In step S464, the shooting controller 81 may calculate a time ΔTyd required to move the droplet 271 by ΔYd. The shooting controller 81 may calculate ΔTyd by using ΔYd calculated in the step S462, according to the following equation.

$$\Delta Tyd = \Delta Yd/v$$

Here, v in the right-hand side may be the traveling speed of the droplet 271.

In step S465, the shooting controller 81 may modify the delay time Tdsc and the delay time Tdsd. The shooting controller 81 may control the position of the droplet 271 supplied to the plasma generation region 25 in the Y direction by setting the delay time Tds and the delay time Tdl. The shooting controller 81 may calculate the modified delay time Tdsc and delay time Tdsd by using ΔTyd calculated in the step S464, according to the following equations.

$$Tdsc = Tdsc + \Delta Tyd$$

$$Tdsd = Tdsd + \Delta Tyd$$

The shooting controller 81 may set the modified delay time Tdsc and delay time Tdsd in the delay circuit 833.

In step S466, the shooting controller 81 may modify the delay time Tdlp and the delay time Tdlm. The shooting controller 81 may calculate the modified delay time Tdlp and delay time Tdlm by using ΔTyd calculated in the step S464, according to the following equations.

$$Tdlp = Tdlp + \Delta Tyd$$

$$Tdlm = Tdlm + \Delta Tyd$$

The shooting controller 81 may set the modified delay time Tdlp and delay time Tdlm in the delay circuit 82.

In step S467, the shooting controller 81 may measure the image of the droplet 271 just before being irradiated with the prepulse laser beam 33b. Here, the process for measuring the image of the droplet 271 will be described later with reference to FIG. 34.

Figure 34:
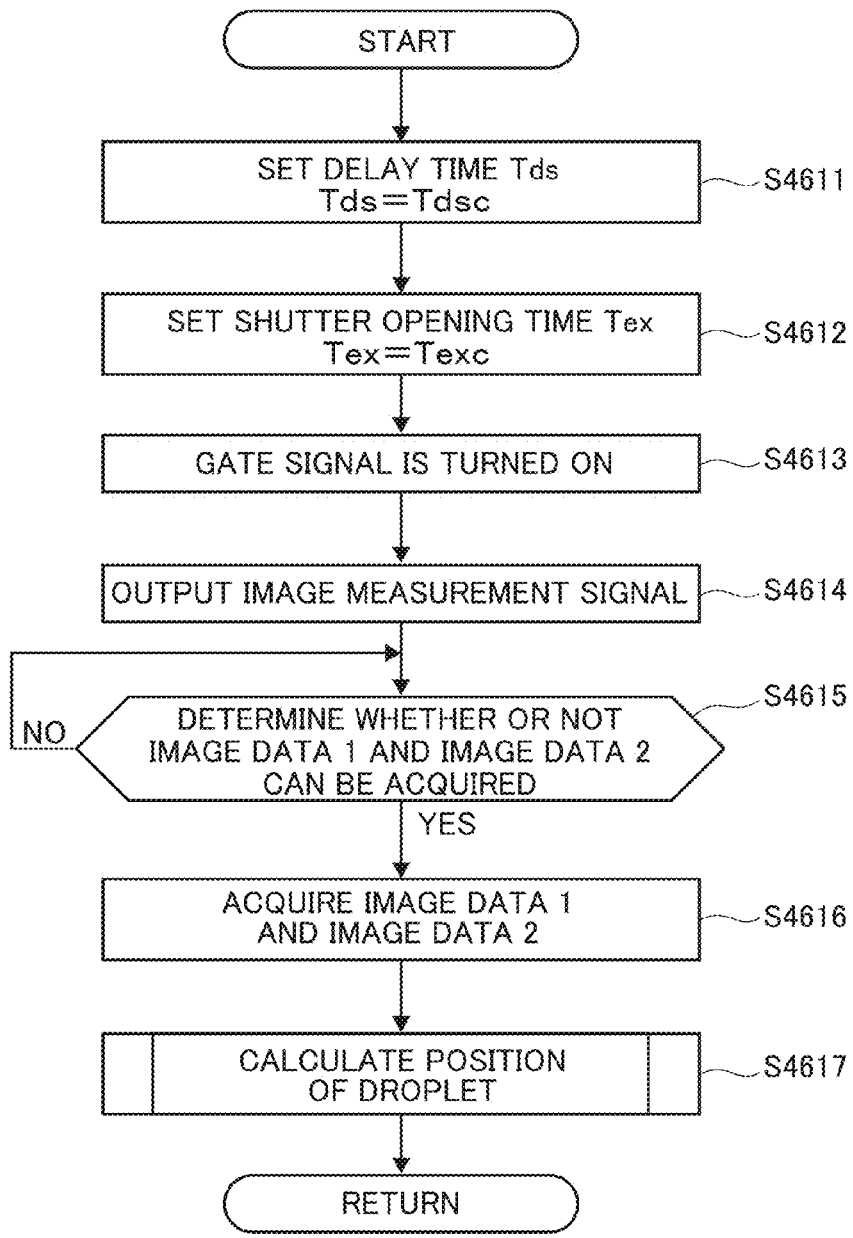
FIG. 34 is a flowchart explaining a process for measuring the image of a droplet by the shooting controller shown in FIG. 25.

FIG. 34 is a flowchart showing the process for measuring the image of the droplet 271 in the step S461 and the step S467 shown in FIG. 33.

In step S4611, the shooting controller 81 may set the delay time Tds in the delay circuit 833. The shooting controller 81 may set the delay time Tds as Tds=Tdsc in order to set the imaging timing of the imaging part 422 and the imaging part 423 to the timing just before the irradiation timing of the prepulse laser beam 33b.

In step S4612, the shooting controller 81 may set the shutter opening time Tex in the one-shot circuit 835. The shooting controller 81 may set the shutter opening time Tex as Tex=Texc in order to secure necessary and sufficient time for which the image sensor 422a and the image sensor 432a capture the image of the droplet 271.

In step S4613, the shooting controller 81 may output a gate signal to the AND circuit 832, that is, the gate signal may be turned on. The light source 421a and the light source 431a may emit pulsed light in synchronization with the imaging timing.

In step S4614, the shooting controller 81 may output an image measurement signal to the AND circuit 831. The image measurement unit 42 and the image measurement unit 43 may capture the image of the imaging region 25a. The captured image may contain the image of the droplet 271 just before being irradiated with the prepulse laser beam 33b in the plasma generation region 25. The image measurement unit 42 and the image measurement unit 43 may generate image data of the captured image, and output the data to the shooting controller 81.

In step S4615, the shooting controller 81 may determine whether or not the image data 1 and the image data 2 can be acquired. When determining that the image data 1 and the image data 2 cannot be acquired because the image measurement unit 42 and the image measurement unit 43 are not ready to output the image data 1 and the image data 2, the shooting controller 81 may wait. On the other hand, when determining that the image data 1 and the image data 2 can be acquired because the image measurement unit 42 and the image measurement unit 43 are ready to output the image data 1 and the image data 2, the shooting controller 81 may move the step to step S4616.

In the step S4616, the shooting controller 81 may acquire the image data 1 and the image data 2 outputted from the image measurement unit 42 and the image measurement unit 43.

In step S4617, the shooting controller 81 may calculate the position of the droplet 271 just before being irradiated with the prepulse laser beam 33b, based on the acquired image data 1 and image data 2. A process for calculating the position of the droplet 271 may be the same as the process shown in FIG. 19, and therefore will not be described again here.

Figure 35:
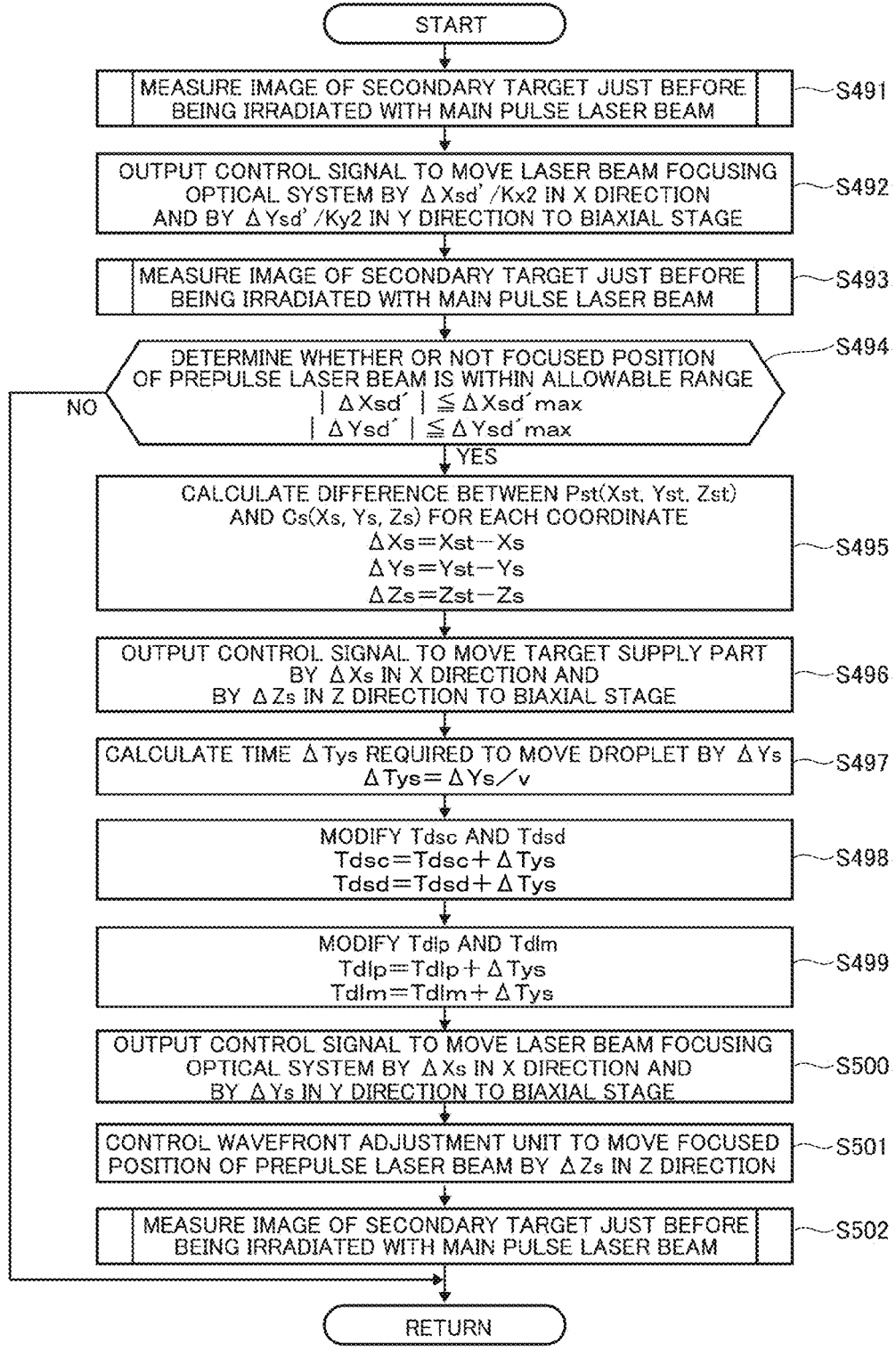
FIG. 35 is a flowchart explaining a process for controlling the position of a secondary target by the shooting controller shown in FIG. 25.

FIG. 35 is a flowchart showing the process for controlling the position of the secondary target 271a in the step S49 shown in FIG. 30.

In step S491, the shooting controller 81 may measure the image of the secondary target 271a just before being irradiated with the main pulse laser beam 33a. Here, a process for measuring the image of the secondary target 271a will be described later with reference to FIG. 36.

In step S492, the shooting controller 81 may output a control signal to move the laser beam focusing optical system 22a in the X direction and the Y direction, to the biaxial stage 227. The shooting controller 81 may control the focused position of the prepulse laser beam 33b in the plasma generation region 25 in the X direction and the Y direction, by controlling the operation of the biaxial stage 227. The shooting controller 81 may regard ΔXsd'/Kx2 obtained by dividing ΔXsd' calculated in the step S491 by a constant Kx2 as the amount of movement of the laser beam focusing optical system 22a in the X direction. The shooting controller 81 may regard ΔYsd'/Ky2 obtained by dividing ΔYsd' calculated in the step S491 by a constant Ky2 as the amount of movement of the laser beam focusing optical system 22a in the Y direction. The shooting controller 81 may output the control signal containing ΔXsd'/Kx2 and ΔYsd'/Ky2 to the biaxial stage 227. By using ΔXsd'/Kx2 and ΔYsd'/Ky2 as the amount of movement of the laser beam focusing optical system 22a, it is possible to move the laser beam focusing optical system 22a with a high degree of accuracy. Here, the constant Kx2 and the constant Ky2 may be constants reflecting an optical parameter of the laser beam focusing optical system 22a.

ΔXsd' and ΔYsd' may be the differences between the measurement position Cs of the secondary target 271a and "virtual position Cd' of the droplet 271" in the X direction and the Y direction, respectively. The virtual position Cd' (Xd', Yd', Zd') of the droplet 271 may be a position of the droplet 271 if the droplet 271 would not have been irradiated with the prepulse laser beam 33b. In particular, the virtual position Cd' (Xd', Yd', Zd') of the droplet 271 may be a position of the droplet 271 at the timing just before the droplet 271 is irradiated with the main pulse laser beam 33a if the droplet 271 would not have been irradiated with the prepulse laser beam 33b. The shooting controller 81 may control the position of the secondary target 271a to allow the plasma light to be efficiently generated, by controlling the focused position of the prepulse laser beam 33b based on ΔXsd' and ΔYsd'. Here, the virtual position Cd' of the droplet 271, ΔXsd' and ΔYsd' will be described in detail later with reference to FIG. 38.

In step S493, the shooting controller 81 may measure the image of the secondary target 271a just before being irradiated with the main pulse laser beam 33a. Here, the process for measuring the image of the secondary target 271a will be described later with reference to FIG. 36.

In step S494, the shooting controller 81 may determine whether or not the focused position of the prepulse laser beam 33b in the X direction and the Y direction is within an allowable range. When determining that the position of the secondary target 271a is within the allowable range, the shooting controller 81 may regard the focused position of the prepulse laser beam 33b as being within the allowable range. The shooting controller 81 may determine whether or not ΔXsd' and ΔYsd' fulfill all the following expressions, based on the focused position of the prepulse laser beam 33b after the control in the step S492.

$$|\Delta Xsd'| \leq \Delta Xsd'\text{max}$$

$$|\Delta Ysd'| \leq \Delta Ysd'\text{max}$$

Here, ΔXsd'max and ΔYsd'max in the right-hand side may be the threshold values for the respective coordinates that define the allowable range of the difference between the measurement position Cs of the secondary target 271a and the virtual position Cd' of the droplet 271. ΔXsd'max and ΔYsd'max may be predetermined values to efficiently generate plasma light. When determining that the position of the secondary target 271a is within the allowable range, the shooting controller 81 may regard the focused position of the prepulse laser beam 33b as being within the allowable range, and move the step to step S495. On the other hand, when determining that the position of the secondary target 271a is out of the allowable range, the shooting controller 81 may regard the focused position of the prepulse laser beam 33b as being out of the allowable range, and end this process.

In the step S495, the shooting controller 81 may calculate the difference between the target position Pst and the measurement position Cs of the secondary target 271a for each of the coordinates. The shooting controller 81 may calculate, for each of the coordinates, the difference between the target position Pst(Xst, Yst, Zst) set in the step S44 shown in FIG. 30 and the measurement position Cs(Xs, Ys, Zs) measured in the step S493, according to the following equations.

$$\Delta Xs = Xst - Xs$$

$$\Delta Ys = Yst - Ys$$

$$\Delta Zs = Zst - Zs$$

In step S496, the shooting controller 81 may output a control signal to move the target supply part 26 in the X direction and the Z direction, to the biaxial stage 74. The shooting controller 81 may control the position of the droplet 271 supplied to the plasma generation region 25 in the X direction and the Z direction, by controlling the operation of the biaxial stage 74. The shooting controller 81 may regard ΔXs calculated in the step S495 as the amount of movement of the target supply part 26 in the X direction. The shooting controller 81 may regard ΔZs calculated in the step S495 as the amount of movement of the target supply part 26 in the Z direction. The shooting controller 81 may output the control signal containing ΔXs and ΔZs to the biaxial stage 74.

In step S497, the shooting controller 81 may calculate a time ΔTys required to move the droplet 271 by ΔYs. The shooting controller 81 may calculate ΔTys by using ΔYs calculated in the step S495, according to the following equation.

$$\Delta Tys = \Delta Ys/v$$

Here, v in the right-hand side may be the traveling speed of the droplet 271.

In step S498, the shooting controller 81 may modify the delay time Tdsc and the delay time Tdsd. The shooting controller 81 may control the position of the droplet 271 supplied to the plasma generation region 25 in the Y direction by setting the delay time Tds and the delay time Tdl. The shooting controller 81 may calculate the modified delay time Tdsc and delay time Tdsd by using ΔTys calculated in the step S497, according to the following equations.

$$Tdsc = Tdsc + \Delta Tys$$

$$Tdsd = Tdsd + \Delta Tys$$

The shooting controller 81 may set the modified delay time Tdsc and delay time Tdsd in the delay circuit 833.

In step S499, the shooting controller 81 may modify the delay time Tdlp and the delay time Tdlm. The shooting controller 81 may calculate the modified delay time Tdlp and delay time Tdlm by using ΔTys calculated in the step S497, according to the following equations.

$$Tdlp = Tdlp + \Delta Tys$$

$$Tdlm = Tdlm + \Delta Tys$$

The shooting controller 81 may set the modified delay time Tdlp and delay time Tdlm in the delay circuit 82.

In step S500, the shooting controller 81 may output a control signal to move the laser beam focusing optical system 22a in the X direction and the Y direction, to the biaxial stage 227. The shooting controller 81 may control the focused position of the prepulse laser beam 33b in the plasma generation region 25 in the X direction and the Y direction by controlling the operation of the biaxial stage 227. The shooting controller 81 may regard ΔXs calculated in the step S495 as the amount of movement of the laser beam focusing optical system 22a in the X direction. The shooting controller 81 may regard ΔYs calculated in the step S495 as the amount of movement of the laser beam focusing optical system 22a in the Y direction. The shooting controller 81 may output the control signal containing ΔXs and ΔYs to the biaxial stage 227.

In step S501, the shooting controller 81 may control the operation of the wavefront adjustment unit 37 to move the focused position of the prepulse laser beam 33b by ΔZs in the Z direction. The shooting controller 81 may control the focused position of the prepulse laser beam 33b in the plasma generation region 25 in the Z direction by controlling the operation of the wavefront adjustment unit 37. The shooting controller 81 may convert ΔZs representing the amount of movement of the focused position of the prepulse laser beam 33b into the amount of movement of the holder 374 holding the concave lens 372 of the wavefront adjustment unit 37. The shooting controller 81 may output the control signal containing the amount of movement of the holder 374 to the single axis stage 375.

In step S502, the shooting controller 81 may measure the image of the secondary target 271a just before being irradiated with the main pulse laser beam 33a. Here, the process for measuring the image of the secondary target 271a will be described later with reference to FIG. 36.

Figure 36:
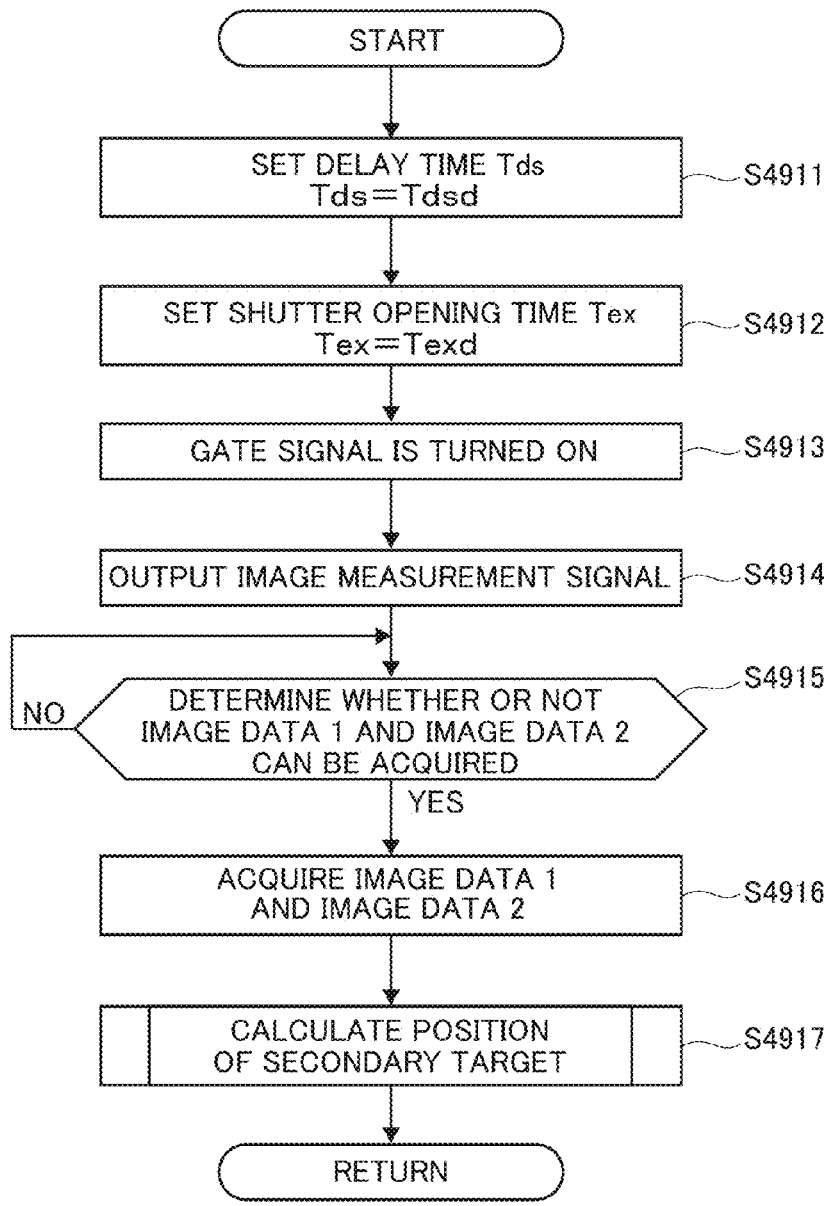
FIG. 36 is a flowchart explaining a process for measuring the image of a secondary target by the shooting controller shown in FIG. 25.

FIG. 36 is a flowchart showing the process for measuring the image of the secondary target 271a in the step S491, the step S493, and the step S502 shown in FIG. 35.

In step S4911, the shooting controller 81 may set the delay time Tds in the delay circuit 833. The shooting controller 81 may set the delay time Tds as Tds=Tdsd in order to set the imaging timing of the imaging part 422 and the imaging part 423 to a timing just before the irradiation timing of the main pulse laser beam 33a.

In step S4912, the shooting controller 81 may set the shutter opening time Tex in the one-shot circuit 835. The shooting controller 81 may set the shutter opening time Tex as Tex=Texd in order to secure necessary and sufficient time for which the image sensor 422a and the image sensor 432a capture the image of the secondary target 271a.

In step S4913, the shooting controller 81 may output a gate signal to the AND circuit 832, that is, the gate signal may be turned on. The light source 421a and the light source 431a may emit pulsed light in synchronization with the imaging timing.

In step S4914, the shooting controller 81 may output an image measurement signal to the AND circuit 831. The image measurement unit 42 and the image measurement unit 43 may capture the image of the imaging region 25a. The captured image may contain the image of the secondary target 271a just before being irradiated with the main pulse laser beam 33a in the plasma generation region 25. The image measurement unit 42 and the image measurement unit 43 may generate image data of the captured image, and output the data to the shooting controller 81.

In step S4915, the shooting controller 81 may determine whether or not the image data 1 and the image data 2 can be acquired. When determining that the image data 1 and the image data 2 cannot be acquired because the image measurement unit 42 and the image measurement unit 43 are not ready to output the image data 1 and the image data 2, the shooting controller 81 may wait. On the other hand, when determining that the image data 1 and the image data 2 can be acquired because the image measurement unit 42 and the image measurement unit 43 are ready to output the image data 1 and the image data 2, the shooting controller 81 may move the step to step S4916.

In the step S4916, the shooting controller 81 may acquire the image data 1 and the image data 2 outputted from the image measurement unit 42 and the image measurement unit 43.

In step S4917, the shooting controller 81 may calculate the position of the secondary target 271a just before being irradiated with the main pulse laser beam 33a, based on the acquired image data 1 and image data 2. Moreover, the shooting controller 81 may calculate ΔXsd' and ΔYsd' used in, for example, the step S492 shown in FIG. 35. Here, a process for calculating the position of the secondary target 271a will be described later with reference to FIG. 37.

Figure 37:
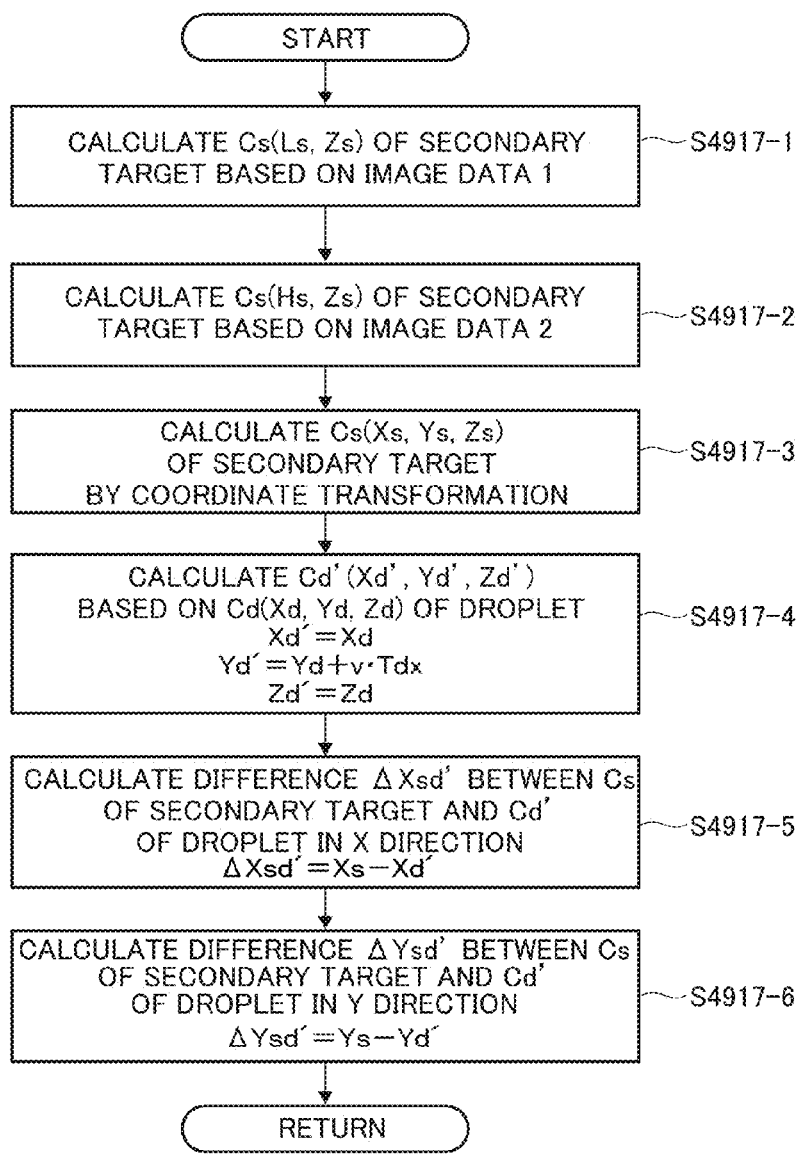
FIG. 37 is a flowchart explaining a process for calculating the position of a secondary target by the shooting controller shown in FIG. 25.
Figure 38:
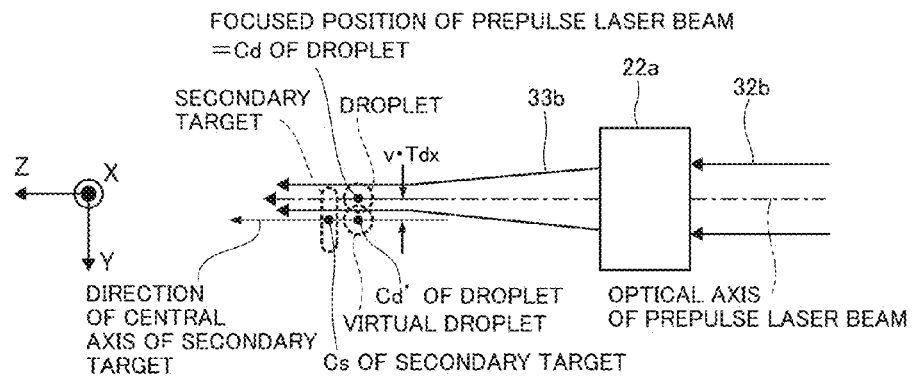
FIG. 38A is a drawing showing the relationship of the focused position of a prepulse laser beam and the position of a droplet, with the position of a secondary target, where the focused position of the prepulse laser beam matches the position of the droplet.
FIG. 38B is a drawing showing the relationship of the focused position of a prepulse laser beam and the position of a droplet, with the position of a secondary target, where the focused position of the prepulse laser beam is shifted from the position of the droplet in the −Y direction.
FIG. 38C is a drawing showing the relationship of the focused position of a prepulse laser beam and the position of a droplet, with the position of a secondary target, where the focused position of the prepulse laser beam is shifted from the position of the droplet in the +Y direction.
Figure 38:
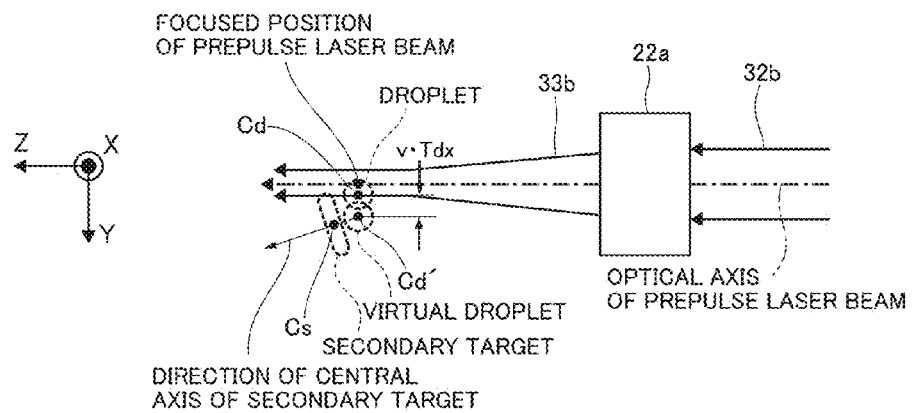
Figure 38:
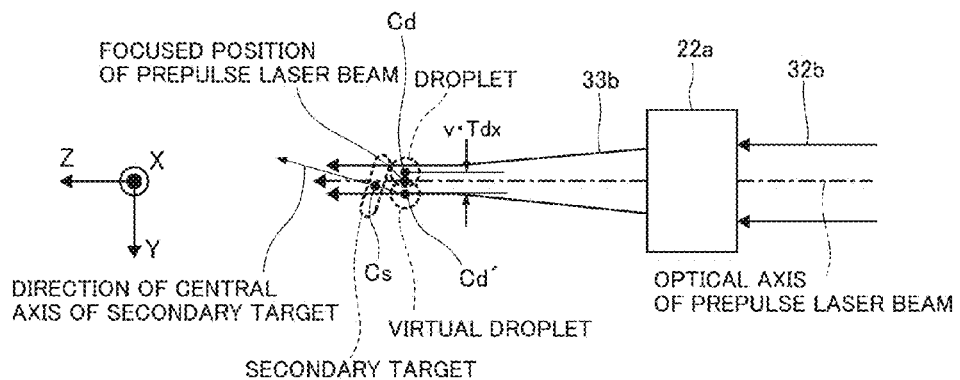

FIG. 37 is a flowchart showing the process for calculating the position of the secondary target 271a in the step S4917 shown in FIG. 36.

In step S4917-1, the shooting controller 81 may calculate a measurement position Cs(Ls, Zs) of the secondary target 271a, based on the image of the secondary target 271a contained in the image data 1 acquired in the step S4916 shown in FIG. 36. The image measurement unit 42 may measure the image of the secondary target 271a in the normal direction of the L-Z plane. Therefore, the coordinates of the measurement position Cs of the secondary target 271a, which can be calculated based on the image data 1, may be represented by an L-component Ls and a Z-component Zs.

In step S4917-2, the shooting controller 81 may calculate a measurement position Cs(Hs, Zs) of the secondary target 271a, based on the image of the secondary target 271a contained in the image data 2 acquired in the step S4916 shown in FIG. 36. The image measurement unit 43 may measure the image of the secondary target 271a in the normal direction of the H-Z plane. Therefore, the coordinates of the measurement position Cs of the secondary target 271a, which can be calculated based on the image data 2, may be represented by an H-component Hs and the Z-component Zs.

In step S4917-3, the shooting controller 81 may calculate the measurement position Cs(Xs, Ys, Zs) of the secondary target 271a. The shooting controller 81 may calculate the measurement position Cs(Xs, Ys, Zs) of the secondary target 271a by the coordinate transformation of Cs(Ls, Zs) calculated in the step S4917-1 and Cs(Hs, Zs) calculated in the step S4917-2.

In step S4917-4, the shooting controller 81 may calculate the virtual position Cd' (Xd', Yd', Zd') of the droplet 271. The virtual position Cd' (Xd', Yd', Zd') of the droplet 271 may be a position of the droplet 271 at the timing just before the droplet 271 is irradiated with the main pulse laser beam 33a if the droplet 271 would not have been irradiated with the prepulse laser beam 33b. If the droplet 271 has not been irradiated with the prepulse laser beam 33b, it may be understood that the position of the droplet 271 is changed in the Y direction which is the traveling direction of the droplet 271, but is not changed in the X direction and the Z direction. In this case, it may be understood that the droplet 271 moves in the +Y direction at the traveling speed v from the irradiation timing of the prepulse laser beam 33b until the irradiation timing of the main pulse laser beam 33a. Here, the period of time from the irradiation timing of the prepulse laser beam 33b until the irradiation timing of the main pulse laser beam 33a may be represented as Tdx. The shooting controller 81 may calculate the virtual position Cd'(Xd', Yd', Zd') based on the measurement position Cd(Xd, Yd, Zd) of the droplet 271 calculated in the step S4617 shown in FIG. 34, according to the following equations.

$$Xd' = Xd$$

$$Yd' = Yd' + v \cdot Tdx$$

$$Zd' = Zd$$

Here, v·Tdx in the right-hand side may be the distance for which the droplet travels from the irradiation timing of the prepulse laser beam 33b until the irradiation timing of the main pulse laser beam 33a.

In step S4917-5, the shooting controller 81 may calculate the difference ΔXsd' between the measurement position Cs of the secondary target 271a and the virtual position Cd' of the droplet 271 in the X direction. The shooting controller 81 may calculate the difference ΔXsd' by using the measurement position Cs of the secondary target 271a calculated in the step S4917-3 and the virtual position Cd' of the droplet 271 calculated in the step S4917-4, according to the following equation.

$$\Delta Xsd' = Xs - Xd'$$

In step S4917-6, the shooting controller 81 may calculate the difference ΔYsd' between the measurement position Cs of the secondary target 271a and the virtual position Cd' of the droplet 271 in the Y direction. The shooting controller 81 may calculate the difference ΔYsd' according to the following equation, in the same way as the step S4917-5.

$$\Delta Ysd' = Ys - Yd'$$

FIGS. 38A to 38C are drawings each showing the relationship of the focused position of the prepulse laser beam 33b and the position of the droplet 271 with the position of the secondary target 271a.

FIG. 38A is a drawing showing a case in which the actual focused position of the prepulse laser beam 33b matches the measurement position Cd of the droplet 271. In the case shown in FIG. 38A, the measurement position Cs of the secondary target 271a matches the target position Pst of the secondary target 271a, as described above with reference to FIG. 31B. This measurement position Cs of the secondary target 271a may match the position to which the virtual position Cd' of the droplet 271 is moved parallel to the +Z direction. That is, the difference ΔYsd' in the measurement position Cs of the secondary target 271a from the virtual position Cd' of the droplet 271 in the Y direction may be equal to 0 (ΔYsd'=0). Then, the direction of the central axis of the secondary target 271a may be approximately parallel to the Z direction. In the case shown in FIG. 38A, the irradiation of the prepulse laser beam 33b is started at a center of the periphery of the droplet 271 in the −Z direction side. Therefore, as described with reference to FIG. 26C, the droplet 271 may be turned into a plurality of fine particles of the target 27 and dispersed in an approximately discotic shape having the central axis approximately parallel to the Z direction.

FIG. 38B shows a case in which the actual focused position of the prepulse laser beam 33b is shifted from the measurement position Cd of the droplet 271 in the −Y direction. In the case shown in FIG. 38B, the measurement position Cs of the secondary target 271a may be shifted in the +Y direction from the position to which the virtual position Cd' of the droplet 271 is moved parallel to the +Z direction. That is, the difference ΔYsd' in the measurement position Cs of the secondary target 271a from the virtual position Cd' of the droplet 271 in the Y direction may be greater than 0 (ΔYsd'>0). Then, the direction of the central axis of the secondary target 271a may not be approximately parallel to the Z direction, but be inclined toward the +Y direction with respect to the +Z direction. In the case shown in FIG. 38B, the irradiation of the prepulse laser beam 33b is started at a position shifted in the −Y direction from the center of the periphery of the droplet 271 in the −Z direction side. Therefore, the droplet 271 may be turned into a plurality of fine particles of the target 27, and dispersed in an approximately discoid shape having the central axis inclining toward the +Y direction with respect to the +Z direction.

FIG. 38C is a drawing showing a case in which the actual focused position of the prepulse laser beam 33b is shifted from the measurement position Cd of the droplet 271 in the +Y direction. In the case shown in FIG. 38C, the measurement position Cs of the secondary target 271a may be shifted in the −Y direction, from the position to which the virtual position Cd' of the droplet 271 is moved parallel to the +Z direction. That is, the difference ΔYsd' in the measurement position Cs of the secondary target 271a from the virtual position Cd' of the droplet 271 in the Y direction may be smaller than 0 (ΔYsd'<0). Then, the direction of the central axis of the secondary target 271a may not be approximately parallel to the Z direction, but be inclined toward the −Y direction with respect to the +Z direction. In the case shown in FIG. 38C, the irradiation of the prepulse laser beam 33b is started at a position shifted in the +Y direction from the center of the periphery of the droplet 271 in the −Z direction side. Therefore, the droplet 271 may be turned into a plurality of fine particles of the target 27, and dispersed in an approximately discoid shape having the central axis inclining toward the −Y direction with respect to the +Z direction.

As described above, when the actual focused position of the prepulse laser beam 33b is shifted from the measurement position Cd of the droplet 271 in the Y direction, the direction of the central axis of the secondary target 271a may not be approximately parallel to the Z direction, but be inclined in the Y direction. In this case, the distribution of the irradiation energy of the main pulse laser beam 33a over the periphery of the secondary target 271a irradiated with the main pulse laser beam 33a may be uneven, as compared to the case in which the direction of the central axis of the secondary target 271a is approximately parallel to the Z direction. Therefore, the plasma light emitted from the secondary target 271a irradiated with the main pulse laser beam 33a may have a lower optical intensity and be generated less stably than the case in which the direction of the central axis of the secondary target 271a is approximately parallel to the Z direction. In other words, the shooting controller 81 can stably generate the plasma light having a high optical intensity by controlling the focused position of the prepulse laser beam 33b and the measurement position Cd of the droplet 271 such that the direction of the central axis of the secondary target 271a is approximately parallel to the Z direction. That is, the shooting controller 81 can more efficiently generate plasma light from the secondary target 271a when ΔYsd' is closer to 0.

For this, the shooting controller 81 may calculate ΔYsd' in the step S4917-6 shown in FIG. 37. Then, in order to correct ΔYsd', the shooting controller 81 may move the laser beam focusing optical system 22a like in the step S492 shown in FIG. 35 to move the focused position of the prepulse laser beam 33b. Here, although each of FIGS. 38B and 38C shows the case where the actual focused position of the prepulse laser beam is shifted from the measurement position Cd of the droplet 271 in the Y direction, the same may apply to another case where the actual focused position is shifted in the X direction.

Figure 39A:
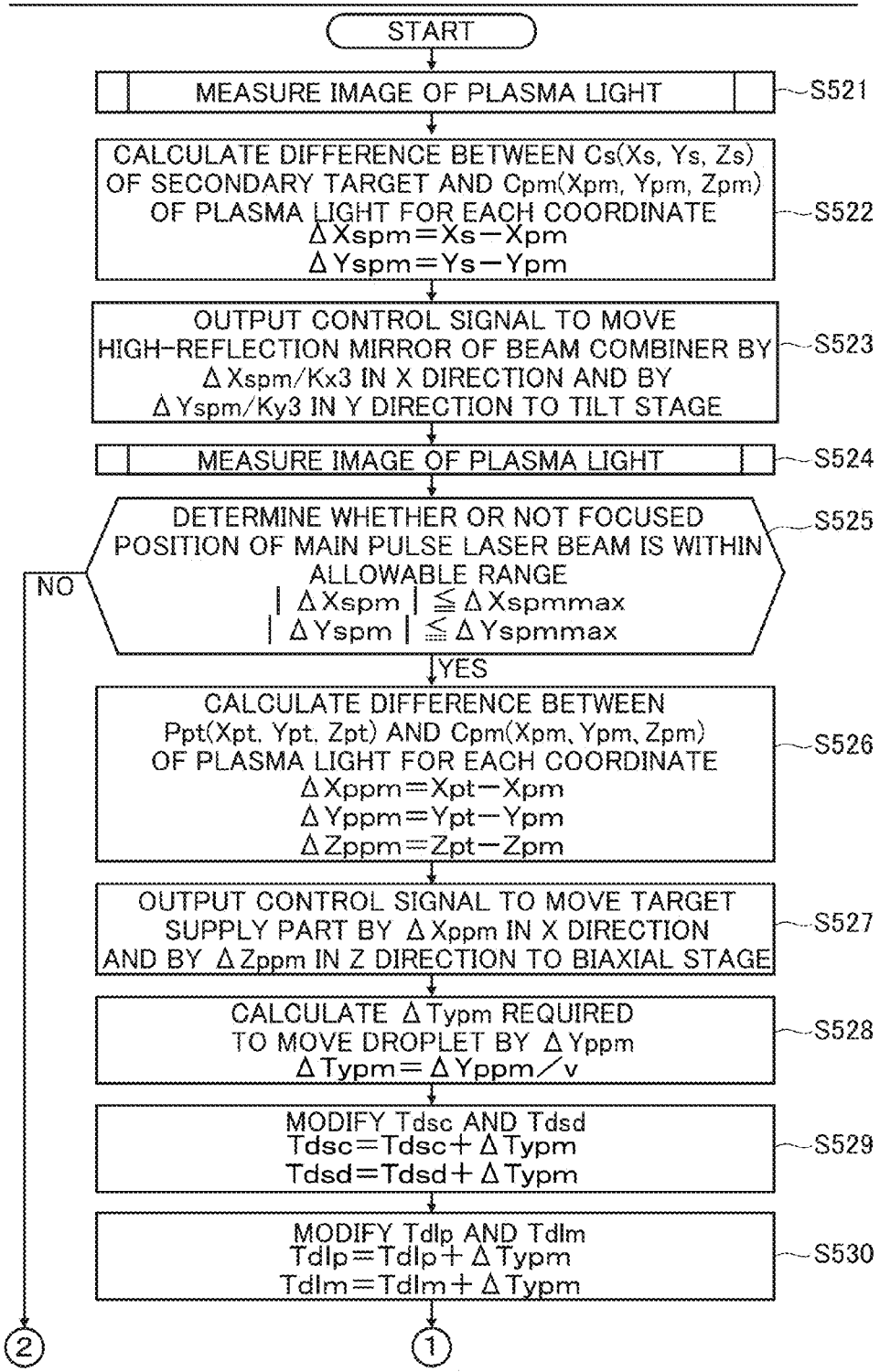
FIG. 39A is a flowchart explaining a process for controlling the focused position of a main pulse laser beam by the shooting controller shown in FIG. 25.
Figure 39:
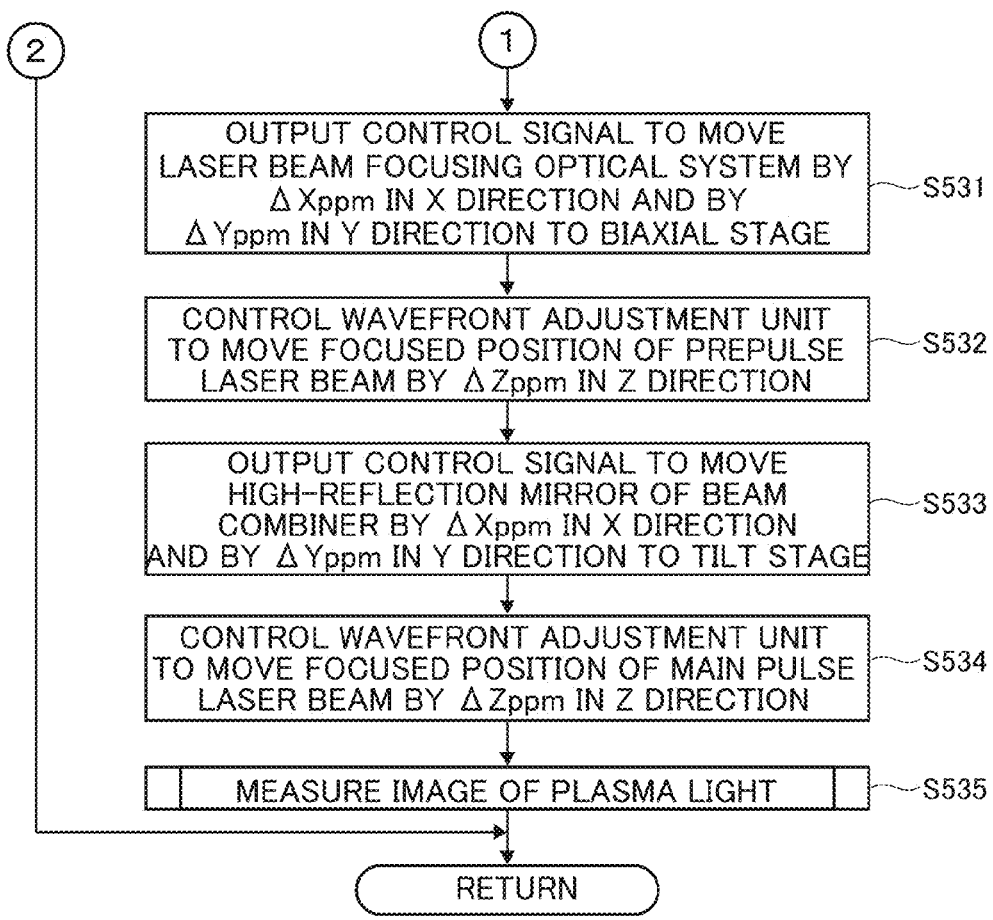
FIG. 39B is a flowchart explaining the process continuing from the process shown in FIG. 39A.

FIGS. 39A and 39B are flowcharts each showing the process for controlling the focused position of the main pulse laser beam 33a in the step S52 shown in FIG. 30.

In step S521, the shooting controller 81 may measure the image of the plasma light emitted from the secondary target 271a just after being irradiated with the main pulse laser beam 33a. Here, a process for measuring the image of the plasma light will be described later with reference to FIG. 40.

In step S522, the shooting controller 81 may calculate the difference between the measurement position Cs of the secondary target 271a and the measurement position Cpm of the plasma light for each of the coordinates. The shooting controller 81 may calculate, for each of the coordinates, the difference between the measurement position Cs(Xs, Ys, Zs) measured in the step S49 shown in FIG. 30 and the measurement position Cpm(Xpm, Ypm, Zpm) measured in the step S521, according to the following equations.

$$\Delta Xspm = Xs - Xpm$$

$$\Delta Yspm = Ys - Ypm$$

In step S523, the shooting controller 81 may output a control signal to move the high-reflection mirror 342 of the beam combiner 35 in the X direction and the Y direction, to the tilt stage 353. The shooting controller 81 may control the focused position of the main pulse laser beam 33a in the plasma generation region 25 in the X direction and the Y direction, by controlling the operation of the tilt stage 353. The shooting controller 81 may regard ΔXspm/Kx3 obtained by dividing ΔXspm calculated in the step S522 by a constant Kx3 as the amount of movement of the high-reflection mirror 342 in the X direction. The shooting controller 81 may regard ΔYspm/Ky3 obtained by dividing ΔYspm calculated in the step S522 by a constant Ky3 as the amount of movement of the high-reflection mirror 342 in the Y direction. The shooting controller 81 may output the control signal containing ΔXspm/Kx3 and ΔYspm/Ky3 to the tilt stage 353. By using ΔXspm/Kx3 and ΔYspm/Ky3 as the amounts of movement of the high-reflection mirror 342, it is possible to move the high-reflection mirror 342 with a high degree of accuracy. Here, the constant Kx3 and the constant Ky3 may be constants reflecting an optical parameter of the laser beam focusing optical system 22a. The relationship of the focused position of the main pulse laser beam 33a and the position of the secondary target 271a with the position of the plasma light will be described later with reference to FIG. 41.

In step S524, the shooting controller 81 may measure the image of the plasma light emitted from the secondary target 271a just after being irradiated with the main pulse laser beam 33a. Here, the process for measuring the image of the plasma light will be described later with reference to FIG. 40.

In step S525, the shooting controller 81 may determine whether or not the focused position of the main pulse laser beam 33a in the X direction and the Y direction is within an allowable range. When determining that the position of the plasma light is within the allowable range, the shooting controller 81 may regard the focused position of the main pulse laser beam 33a as being within the allowable range. The shooting controller 81 may determine whether or not ΔXspm and ΔYspm fulfill all the following expressions, based on the focused position of the main pulse laser beam 33a after the control in the step S523.

$$|\Delta Xspm| \leq \Delta Xspm\text{max}$$

$$|\Delta Yspm| \leq \Delta Yspm\text{max}$$

Here, ΔXspmmax and ΔYspmmax in the right-hand side may be the threshold values for the respective coordinates that define the allowable range of the difference between the measurement position Cs of the secondary target 271a and the measurement position Cpm of the plasma light. ΔXspmmax and ΔYspmmax may be predetermined values to efficiently generate plasma light. When determining that the position of the plasma light is within the allowable range, the shooting controller 81 may regard the focused position of the main pulse laser beam 33a as being within the allowable range, and move the step to step S526. On the other hand, when determining that the position of the plasma light is out of the allowable range, the shooting controller 81 may regard the focused position of the main pulse laser beam 33a as being out of the allowable range, and end this process.

In the step S526, the shooting controller 81 may calculate the difference between the target position Ppt and the measurement position Cpm of the plasma light for each of the coordinates. The shooting controller 81 may calculate, for each of the coordinates, the difference between the target position Ppt (Xpt, Ypt, Zpt) read in the step S42 shown in FIG. 30 and the measurement position Cpm(Xpm, Ypm, Zpm) measured in the step S524, according to the following equations.

$$\Delta Xppm = Xpt - Xpm$$

$$\Delta Yppm = Ypt - Ypm$$

$$\Delta Zppm = Zpt - Zpm$$

In step S527, the shooting controller 81 may output a control signal to move the target supply part 26 in the X direction and the Z direction to the biaxial stage 74. The shooting controller 81 may control the position of the droplet 271 supplied to the plasma generation region 25 in the X direction and the Z direction, by controlling the operation of the biaxial stage 74. The shooting controller 81 may regard ΔXppm calculated in the step S526 as the amount of movement of the target supply part 26 in the X direction. The shooting controller 81 may regard ΔZppm calculated in the step S526 as the amount of movement of the target supply part 26 in the Z direction. The shooting controller 81 may output the control signal containing ΔXppm and ΔZppm to the biaxial stage 74.

In step S528, the shooting controller 81 may calculate a time ΔTypm required to move the droplet 271 by ΔYppm. The shooting controller may calculate ΔTypm by using ΔYppm calculated in the step S526, according to the following equation.

$$\Delta Typm = \Delta Yppm/v$$

Here, v in the right-hand side may be the traveling speed of the droplet 271.

In step S529, the shooting controller 81 may modify the delay time Tdsc and the delay time Tdsd. The shooting controller 81 may control the position of the droplet 271 supplied to the plasma generation region 25 in the Y direction, by setting the delay time Tds and the delay time Tdl. The shooting controller 81 may calculate the modified delay time Tdsc and delay time Tdsd by using ΔTypm calculated in the step S528, according to the following equations.

$$Tdsc = Tdsc + \Delta Typm$$

$$Tdsd = Tdsd + \Delta Typm$$

The shooting controller 81 may set the modified delay time Tdsc and delay time Tdsd in the delay circuit 833.

In step S530, the shooting controller 81 may modify the delay time Tdlp and the delay time Tdlm. The shooting controller 81 may calculate the modified delay time Tdlp and delay time Tdlm by using ΔTypm calculated in the step S528, according to the following equations.

$$Tdlp = Tdlp + \Delta Typm$$

$$Tdlm = Tdlm + \Delta Typm$$

The shooting controller 81 may set the modified delay time Tdlp and delay time Tdlm in the delay circuit 82.

In step S531, the shooting controller 81 may output a control signal to move the laser beam focusing optical system 22a in the X direction and the Y direction to the biaxial stage 227. The shooting controller 81 may control the focused position of the prepulse laser beam 33b in the plasma generation region 25 in the X direction and the Y direction, by controlling the operation of the biaxial stage 227. The shooting controller 81 may regard ΔXppm calculated in the step S526 as the amount of movement of the laser beam focusing optical system 22a in the X direction. The shooting controller 81 may regard ΔYppm calculated in the step S526 as the amount of movement of the laser beam focusing optical system 22a in the Y direction. The shooting controller 81 may output the control signal containing ΔXppm and ΔYppm to the biaxial stage 227.

In step S532, the shooting controller 81 may control the operation of the wavefront adjustment unit 37 to move the focused position of the prepulse laser beam 33b by ΔZppm in the Z direction. The shooting controller 81 may control the focused position of the prepulse laser beam 33b in the plasma generation region 25 in the Z direction, by controlling the operation of the wavefront adjustment unit 37. The shooting controller 81 may convert ΔZppm representing the amount of movement of the focused position of the prepulse laser beam 33b into the amount of movement of the holder 374 holding the concave lens 372 of the wavefront adjustment unit 37. The shooting controller 81 may output the control signal containing the amount of movement of the holder 374 to the single axis stage 375.

In step S533, the shooting controller 81 may output a control signal to move the high-reflection mirror 342 of the beam combiner 35 in the X direction and the Y direction, to the tilt stage 353. The shooting controller 81 may control the focused position of the main pulse laser beam 33a in the plasma generation region 25 in the X direction and the Y direction, by controlling the operation of the tilt stage 353. The shooting controller 81 may regard ΔXppm calculated in the step S526 as the amount of movement of the high-reflection mirror 342 in the X direction. The shooting controller 81 may regard ΔYppm calculated in the step S526 as the amount of movement of the high-reflection mirror 342 in the Y direction. The shooting controller 81 may output the control signal containing ΔXppm and ΔYppm to the tilt stage 353.

In step S534, the shooting controller 81 may control the operation of the wavefront adjustment unit 36 to move the focused position of the main pulse laser beam 33a by ΔZppm in the Z direction. The shooting controller 81 may control the focused position of the main pulse laser beam 33a in the plasma generation region 25 in the Z direction, by controlling the operation of the wavefront adjustment unit 36. The shooting controller 81 may convert ΔZppm representing the amount of movement of the focused position of the main pulse laser beam 33a into the amount of movement of the holder 364 holding the concave lens 362 of the wavefront adjustment unit 36. The shooting controller 81 may output the control signal containing the amount of movement of the holder 364 to the single axis stage 365.

In step S535, the shooting controller 81 may measure the image of the plasma light emitted from the secondary target 271a just after being irradiated with the main pulse laser beam 33a. Here, the process for measuring the image of the plasma light will be described later with reference to FIG. 40.

Figure 40:
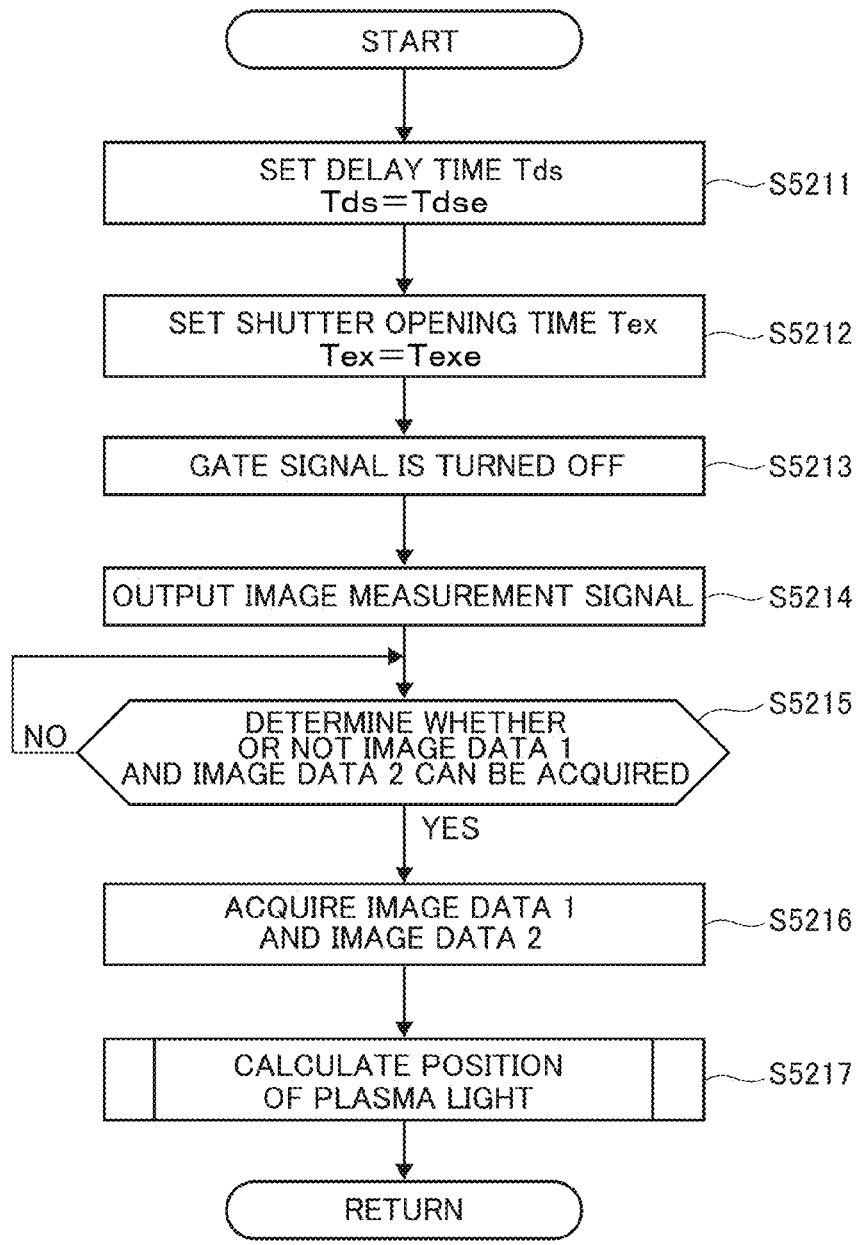
FIG. 40 is a flowchart explaining a process for measuring the image of plasma light by the shooting controller shown in FIG. 25.
Figure 41:
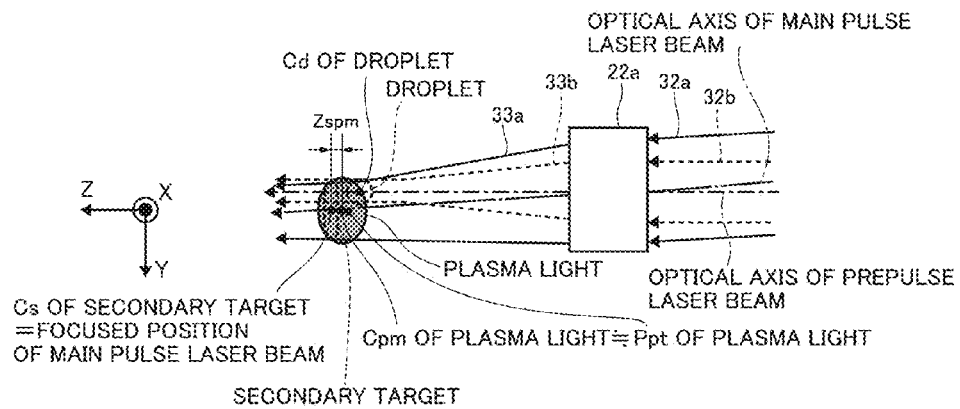
FIG. 41A is a drawing showing the relationship of the focused position of a main pulse laser beam and the position of a secondary target, with the position of plasma light, where the focused position of the main pulse laser beam matches the position of the secondary target.
FIG. 41B is a drawing showing the relationship of the focused position of a main pulse laser beam and the position of a secondary target, with the position of plasma light, where the focused position of the main pulse laser beam is shifted from the position of the secondary target in the −Y direction.
FIG. 41C is a drawing showing the relationship of the focused position of a main pulse laser beam and the position of a secondary target, with the position of plasma light, where the focused position of the main pulse laser beam is shifted from the position of the secondary target in the +Y direction.
Figure 41:
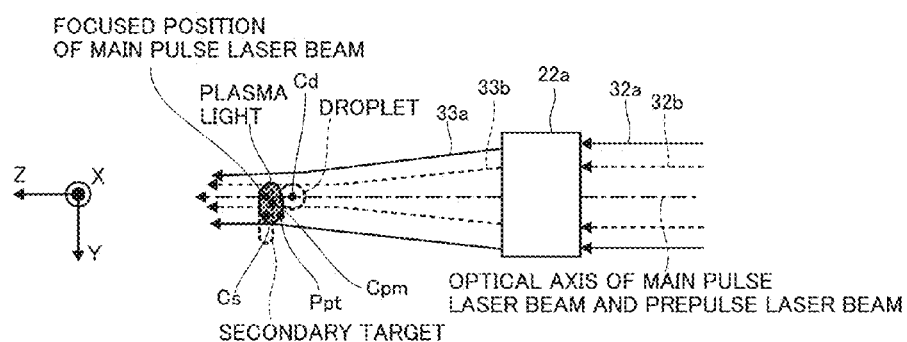
Figure 41:
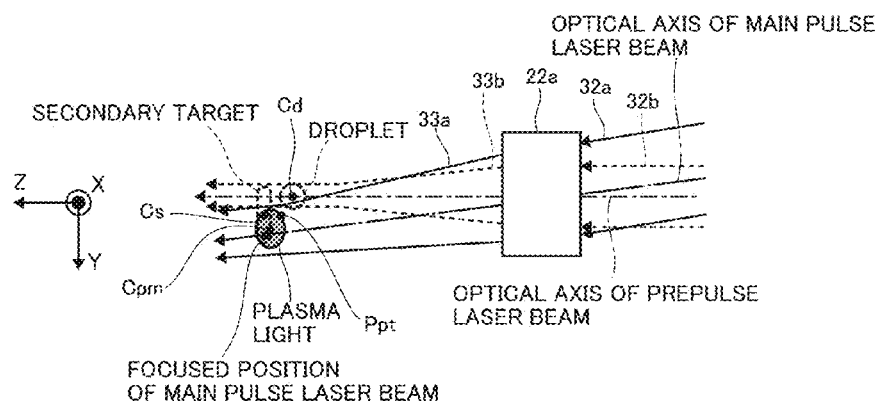

FIG. 40 is a flowchart showing the process for measuring the image of the plasma light in the step S521, the step S524, and the step S535 shown in FIGS. 39A and 39B.

In step S5211, the shooting controller 81 may set the delay time Tds in the delay circuit 833. The shooting controller 81 may set the delay time Tds as Tds=Tdse in order to set the imaging timing of the imaging part 422 and the imaging part 432 to a timing just after the irradiation timing of the main pulse laser beam 33a.

In step S5212, the shooting controller 81 may set the shutter opening time Tex in the one-shot circuit 835. The shooting controller 81 may set the shutter opening time Tex as Tex=Texe in order to secure necessary and sufficient time for which the image sensor 422a and the image sensor 432a capture the image of the plasma light.

In step S5213, the shooting controller 81 may not output a gate signal to the AND circuit 832, that is, the gate signal may be turned off. By this means, the light source 421a and the light source 431a may not emit pulsed light.

In step S5214, the shooting controller 81 may output an image measurement signal to the AND circuit 831. The image measurement unit 42 and the image measurement unit 43 may capture the image of the imaging region 25a. The captured image may contain the image of the plasma light emitted from the secondary target 271a just after being irradiated with the main pulse laser beam 33a in the plasma generation region 25. The image measurement unit 42 and the image measurement unit 43 may generate image data of the captured image, and output the data to the shooting controller 81.

In step S5215, the shooting controller 81 may determine whether or not the image data 1 and the image data 2 can be acquired. When determining that the image data 1 and the image data 2 cannot be acquired because the image measurement unit 42 and the image measurement unit 43 are not ready to output the image data 1 and the image data 2, the shooting controller 81 may wait. On the other hand, when determining that the image data 1 and the image data 2 can be acquired because the image measurement unit 42 and the image measurement unit 43 are ready to output the image data 1 and the image data 2, the shooting controller 81 may move the step to step S5216.

In the step S5216, the shooting controller 81 may acquire the image data 1 and the image data 2 outputted from the image measurement unit 42 and the image measurement unit 43.

In step S5217, the shooting controller 81 may calculate the position of the plasma light emitted from the secondary target 271a just after being irradiated with the main pulse laser beam 33a, based on the acquired image data 1 and image data 2. A process for calculating the position of the plasma light may be the same as the process shown in FIG. 22, and therefore is not described again here.

FIGS. 41A to 41C are drawings each showing the relationship of the focused position of the main pulse laser beam 33a and the position of the secondary target 271a with the position of the plasma light.

FIG. 41A is a drawing showing a case in which the actual focused position of the main pulse laser beam 33a matches the measurement position Cs of the secondary target 271a. In the case shown in FIG. 41A, the measurement position Cpm of the plasma light may match the target position Ppt of the plasma light. Here, as described with reference to FIG. 31B, the coordinates of the target position Pst of the secondary target 271a and the target focused position of the main pulse laser beam 33a may be shifted from the target position Ppt of the plasma light by Zsp in the Z direction. As a result, as shown in FIG. 41A, both the measurement position CS of the secondary target 271a and the actual focused position of the main pulse laser beam 33a may be shifted from the measurement position Cpm of the plasma light by Zspm in the Z direction. Zspm may represent the amount of shifting in the measured value corresponding to the amount of shifting Zsp in the target value. In addition, the beam diameter of the main pulse laser beam 33a may be equal to the diameter of the secondary target 271a. Therefore, in the case shown in FIG. 41A, almost the entire periphery of the secondary target 271a in the −Z direction side may be irradiated with the main pulse laser beam 33a. Consequently, the diameter of the plasma light may be equal to or greater than the beam diameter of the main pulse laser beam 33a.

FIG. 41B shows a case in which the actual focused position of the main pulse laser beam 33a is shifted from the measurement position Cs of the secondary target 271a in the −Y direction. In the case shown in FIG. 41B, the measurement position Cpm of the plasma light may be shifted from target position Ppt of the plasma light in the −Y direction. The reason for this is that the irradiation of the main pulse laser beam 33a is started at the periphery of the secondary target 271a in the −Y direction side, and therefore the center of the plasma light is shifted in the −Y direction. In addition, in the case shown in FIG. 41B, only a portion of the periphery of the secondary target 271a in the −Z direction side may be irradiated with the main pulse laser beam 33a. Therefore, the diameter of the plasma light may be smaller than the diameter in the case shown in FIG. 41A.

FIG. 41C shows a case in which the actual focused position of the main pulse laser beam 33a is shifted from the measurement position Cs of the secondary target 271a in the +Y direction. In the case shown in FIG. 41C, the measurement position Cpm of the plasma light may be shifted from the target position Ppt of the plasma light in the +Y direction. The reason for this is that the irradiation of the main pulse laser beam 33a is started at the periphery of the secondary target 271a in the +Y direction side, and therefore the center of the plasma light is shifted in the +Y direction. In addition, in the case shown in FIG. 41C, only a portion of the periphery of the secondary target 271a in the −Z direction side may be irradiated with the main pulse laser beam 33a. Therefore, the diameter of the plasma light may be smaller than the diameter in the case shown in FIG. 41A.

As described above, when the actual focused position of the main pulse laser beam 33a is shifted from the measurement position Cs of the secondary target 271a in the Y direction, the measurement position Cpm of the plasma light may be shifted from the target position Ppt of the plasma light in the Y direction. The shooting controller 81 may correct the difference in the measurement position Cpm from the target position Ppt of the plasma light. For this, in order to move the focused position of the main pulse laser beam 33a, the shooting controller 81 may cause the tilt stage 353 to move the high-reflection mirror 342 of the beam combiner 35 as shown in the step S523 of FIG. 39. Here, although each of FIGS. 41B and 41C shows the case where the actual focused position of the main pulse laser beam 33a is shifted from the measurement position Cs of the secondary target 271a in the Y direction, the same may apply to another case where the actual focused position of the main pulse laser beam 33a is shifted in the X direction.

7.3 Effect

The EUV light generation apparatus 1 according to Embodiment 3 can precisely control the positions of the droplet 271 and the secondary target 271a in the plasma generation region 25. Moreover, the EUV light generation apparatus 1 can precisely control the focused positions of the prepulse laser beam 33b and the main pulse laser beam 33a. Therefore, the EUV light generation apparatus 1 according to Embodiment 3 can substantially match the position of the droplet 271 with the focused position of the prepulse laser beam 33b, and therefore generate the secondary target 271a that can efficiently generate plasma light. Moreover, the EUV light generation apparatus 1 can substantially match the position of the secondary target 271a with the focused position of the main pulse laser beam 33a, and therefore efficiently generate plasma light. Consequently, the EUV light generation apparatus 1 can efficiently generate the EUV light 252. Moreover, the EUV light generation apparatus 1 according to Embodiment 3 can substantially match the position of the plasma light actually emitted in the plasma generation region 25 with the target position of the plasma light determined according to a command from the exposure apparatus 6. Consequently, the EUV light generation apparatus 1 can stably output the EUV light 252 to the exposure apparatus 6.

8. Shooting System Using the EUV Light Generation Apparatus According to Embodiment 4

8.1 Configuration

With the shooting system using the EUV light generation apparatus 1 according to Embodiment 3, in order to generate the EUV light 252 emitted in a single pulse, one prepulse laser beam and one main pulse laser beam may be introduced into the plasma generation region 25. Meanwhile, with the shooting system using the EUV light generation apparatus 1 according to Embodiment 4, in order to generate the EUV light 252 emitted in a single pulse, a plurality of prepulse laser beams and one main pulse laser beam may be introduced into the plasma generation region 25. Here, with the present embodiment, although the number of the plurality of prepulse laser beams is two in the description for the sake of convenience, the number of prepulse laser beams may be three or more.

Among the plurality of prepulse laser beams, a prepulse laser beam which is first outputted from a prepulse laser device to irradiate the droplet 271 may be referred to as "first prepulse laser beam." Among the plurality of prepulse laser beams, a prepulse laser beam which is outputted next to the first prepulse laser beam from a prepulse laser device may be referred to as "second prepulse laser beam."

FIGS. 42A to 42D are drawings showing the relationship of the first and second prepulse laser beams and the main pulse laser beam with the form of the target 27 irradiated with these laser beams.

When the droplet 271 reaches the plasma generation region 25 in the chamber 2, the shooting system according to Embodiment 4 may irradiate the droplet 271 with the first prepulse laser beam as shown in FIG. 42A. A beam diameter D1 of the focused first prepulse laser beam may be equal to or greater than the diameter of the droplet 271 in the plasma generation region 25. The beam diameter D1 may be, for example, about 20 μm to 100 μm.

Upon being irradiated with the first prepulse laser beam, the secondary target 271a may be generated from the target 271 as described above. As shown in FIG. 42B, the secondary target 271a may be dispersed in a dome-like shape. A high-density region where the plurality of atomized particles of the target 27 increases in density may be formed in the bottom side of the dome-shaped dispersed secondary target 271a. This high-density region may be formed in a doughnut shape. A low-density region where the plurality of atomized particles of the target 27 decreases in density may be formed inside the doughnut-shaped high density region. The top region of the dome-shaped dispersed secondary target 271a may be formed in the side in which the droplet 271 is irradiated with the first prepulse laser beam. The low-density region may be also formed inside the top region of the dome-shaped secondary target 271a.

As shown in FIG. 42B, the shooting system according to Embodiment 4 may irradiate the generated secondary target 271a with the second prepulse laser beam. A beam diameter D2 of the focused second prepulse laser beam may be equal to the outer diameter of the secondary target 271a in the plasma generation region 25. The beam diameter D2 may be, for example, about 300 µm to 400 µm.

When the secondary target 271a is irradiated with the second prepulse laser beam, a tertiary target 271b may be generated from the secondary target 271a. As shown in FIG. 42C, the tertiary target 271b may be generated such that the secondary target 271a is irradiated with the second prepulse laser beam and then is transformed. The tertiary target 271b may be an aggregation generated by the irradiation of the second prepulse laser beam and including a plurality of fine particles of the targets 27 which are finer than the fine particles of the secondary target 271a, the vapor of the target 27, and a preplasma part of which has been turned into plasma. The preplasma may be the target 27 containing ions or neutral particles because part of the secondary target 271a is turned into plasma. The preplasma may have a low energy not enough to emit the EUV light 251. The preplasma may develop into the side in which the secondary target 271a is irradiated with the second prepulse laser beam.

As shown in FIG. 42C, the shooting system according to Embodiment 4 may irradiate the generated tertiary target 271b with the main pulse laser beam. A beam diameter D3 of the focused main pulse laser beam may be equal to the outer diameter of the tertiary target 271b in the plasma generation region 25. The beam diameter D3 may be, for example, about 300 µm to 400 µm.

Upon being irradiated with the main pulse laser beam, the tertiary target 271b may emit plasma light as shown in FIG. 42D. The plasma light may contain the EUV light 251. The tertiary target 271b may contain vapor and preplasma, and therefore, when being irradiated with the main pulse laser beam, the tertiary target 271b may be efficiently heated and turned into plasma. By this means, the tertiary target 271b containing vapor and preplasma can improve the efficiency of generating the EUV light 251 by the irradiation of the main pulse laser beam.

The shooting system according to Embodiment 4 may have a configuration different from the shooting system according to Embodiment 3 in that two prepulse laser devices and two wavefront adjustment units are provided. To be more specific, the shooting system according to Embodiment 4 may include a first prepulse laser device 3c and a second prepulse laser device 3d, instead of the prepulse laser device 3b of the shooting system according to Embodiment 3. In addition, the shooting system according to Embodiment 4 may include a wavefront adjustment unit 38 and a wavefront adjustment unit 39, instead of the wavefront adjustment unit 37 of the shooting system according to Embodiment 3. Moreover, the shooting system according to Embodiment 4 may include a high-reflection mirror 347 and a beam combiner 348, instead of the high-reflection mirror 345 of the shooting system according to Embodiment 3.

Then, the shooting system according to Embodiment 4 may measure the states of the target 27 and the plasma light in the plasma generation region 25. In addition, the shooting system according to Embodiment 4 may control the focused position of the pulsed laser beam 33 outputted from each of the first prepulse laser device 3c, the second prepulse laser device 3d, and the main pulse laser device 3a. Moreover, the shooting system according to Embodiment 4 may control the position of the target 27 reaching the plasma generation region 25, and the position of the plasma light.

Figure 43:
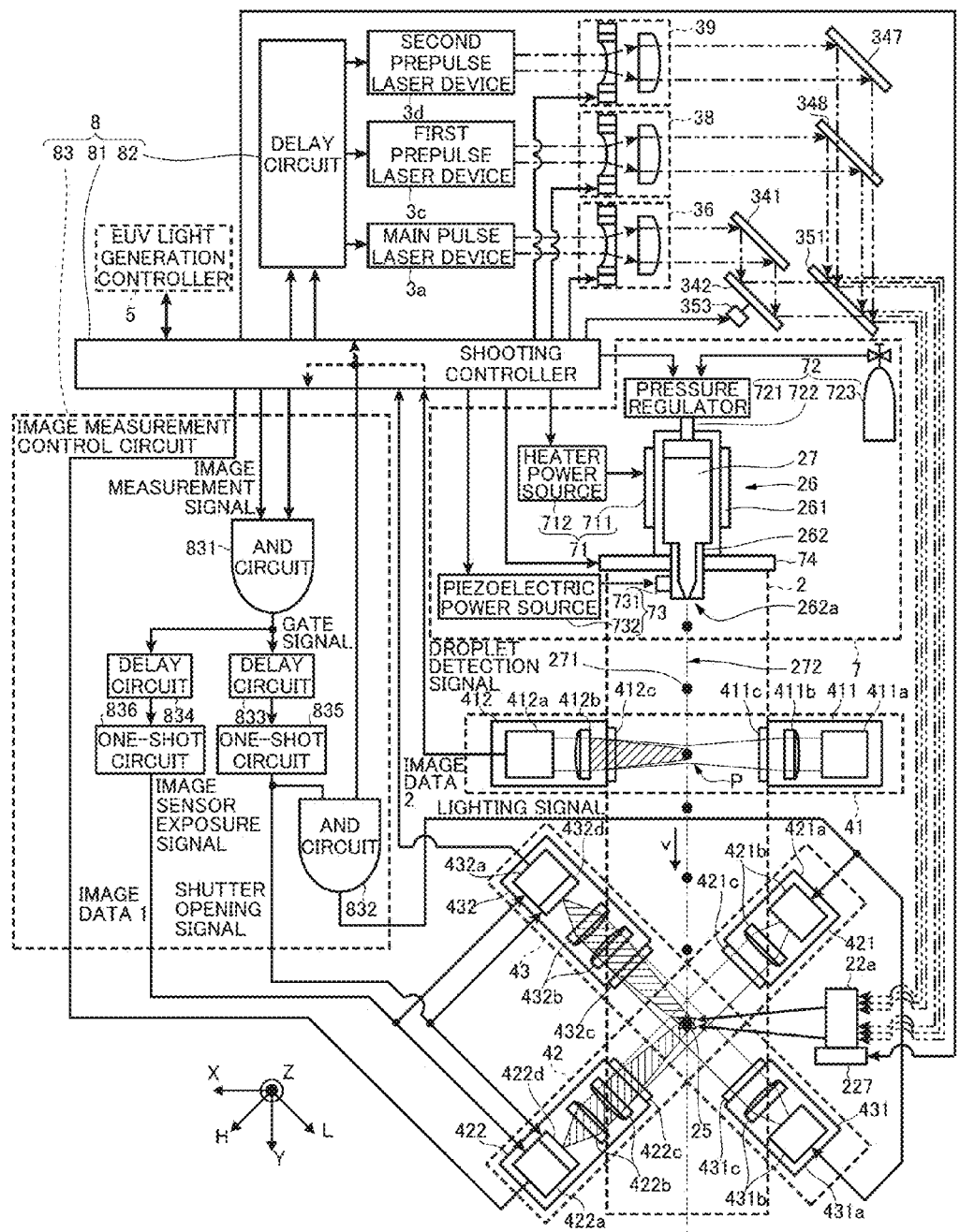
FIG. 43 is the configuration of the shooting system using the EUV light generation apparatus according to Embodiment 4.

Now, the configuration of the shooting system using the EUV light generation apparatus 1 according to Embodiment 4 will be described with reference to FIG. 43. FIG. 43 is a drawing showing the configuration of the shooting system using the EUV light generation apparatus 1 according to Embodiment 4.

The shooting system using the EUV light generation apparatus 1 according to Embodiment 4 may include the main pulse laser device 3a, the first prepulse laser device 3c, the second prepulse laser device 3d, the laser beam focusing optical system 22a, the biaxial stage 227, the target generator 7, the droplet detector 41, the image measurement unit 42, the image measurement unit 43, the wavefront adjustment unit 36, the wavefront adjustment unit 38, the wavefront adjustment unit 39, the high-reflection mirror 341, the high-reflection mirrors 342, the high-reflection mirror 347, the dichroic mirror 351, the tilt stage 353, the beam combiner 348, and the controller 8. The controller 8 may include the shooting controller 81, the delay circuit 82, and the image measurement control circuit 83. The configurations of the EUV light generation apparatus 1 and the shooting system shown in FIG. 43, which are the same as the configurations of the EUV light generation apparatus 1 according to Embodiment 3 with the image measurement system and the shooting system shown in FIGS. 24 and 25, will not be described again here.

The configuration of the main pulse laser device 3a shown in FIG. 43 may be the same as that of the main pulse laser device 3a shown in FIGS. 24 and 25. The configurations of the laser beam focusing optical system 22a and the biaxial stage 227 shown in FIG. 43 may be the same as those of the laser beam focusing optical system 22a and the biaxial stage 227 shown in FIGS. 24 and 25. The configurations of the target generator 7 and the droplet detector 41 shown in FIG. 43 may be the same as those of the target generator 7 and the droplet detector 41 shown in FIGS. 24 and 25. The configurations of the wavefront adjustment unit 36, the high-reflection mirrors 341 and 342, and the tilt stage 353 shown in FIG. 43 may be the same as those of the wavefront adjustment unit 36, the high-reflection mirrors 341 and 342, and the tilt stage 353 shown in FIGS. 24 and 25. Moreover, the configuration of the image measurement control circuit 83 shown in FIG. 43 may be the same as that of the image measurement control circuit 83 shown in FIGS. 24 and 25.

The first prepulse laser device 3c shown in FIG. 43 may be provided to output the first prepulse laser beam. The first prepulse laser device 3c may be configured to output a pulsed laser beam having a pulse width on the picosecond or nanosecond time scale. The first prepulse laser device 3c may be formed by a solid laser device, for example, an Nd:YAG laser and an Nd:YVO$_4$ laser. In this case, the first prepulse laser device 3c may be configured to convert a laser beam having a fundamental wave outputted from the laser device such as an Nd:YAG laser into a laser beam having a harmonic wave and to output the laser beam. Alternatively, the first prepulse laser device 3c may be formed by a gas laser device such as a CO$_2$ laser and an excimer laser. The first prepulse laser device 3c may be configured to output a linearly polarized laser beam. Laser beams outputted from the first prepulse laser device 3c may be referred to as "first prepulse laser beams 31c to 33c" in the same way as the main pulse laser beams 31a to 33a. The other configuration of the first prepulse laser device 3c may be the same as the configuration of the prepulse laser device 3b shown in FIGS. 24 and 25.

The second prepulse laser device 3d shown in FIG. 43 may be provided to output the second prepulse laser beam. The second prepulse laser device 3d may be configured to output a pulsed laser beam having a pulse width on the picosecond or nanosecond time scale. The second prepulse laser device 3d may be formed by a solid laser device, for example, an Nd:YAG laser and an Nd:YVO$_4$ laser. In this case, the second prepulse laser device 3d may be configured to convert a laser beam having a fundamental wave outputted from the laser device such as an Nd:YAG laser into a laser beam having a harmonic wave and to output the laser beam. Alternatively, the second prepulse laser device 3d may be formed by a gas laser device such as a CO$_2$ laser and an excimer laser. The second prepulse laser device 3d may be configured to output a linearly polarized laser beam which is different from the linearly polarized laser beam outputted from the first prepulse laser device 3c. Laser beams outputted from the second prepulse laser device 3d may be referred to as "second prepulse laser beams 31d to 33d" in the same way as the first prepulse laser beams 31c to 33c. The other configuration of the second prepulse laser device 3d may be the same as the configuration of the prepulse laser device 3b shown in FIGS. 24 and 25.

The wavefront adjustment unit 38 shown in FIG. 43 may adjust the wavefront of the first prepulse laser beam 31c. The wavefront adjustment unit 38 may be arranged between the first prepulse laser device 3c and the beam combiner 348 on the optical path of the first prepulse laser beam 31c. The other configuration of the wavefront adjustment unit 38 may be the same as the configuration of the wavefront adjustment unit 37 shown in FIGS. 24 and 25. That is, the wavefront adjustment unit 38 may include a convex lens, a concave lens, and a single axis stage. Then, the distance between the convex lens and the concave lens of the wavefront adjustment unit 38 may be changed by the control of the shooting controller 81. By this means, it is possible to adjust the wavefront of the first prepulse laser beam 31c exiting the convex lens. As a result, it is possible to control the focused position of the first prepulse laser beam 33c in the plasma generation region 25 in the Z direction shown in FIGS. 44A and 44B.

The wavefront adjustment unit 39 shown in FIG. 43 may adjust the wavefront of the second prepulse laser beam 31d. The wavefront adjustment unit 39 may be arranged between the second prepulse laser device 3d and the high-reflection mirror 347 on the optical path of the second prepulse laser beam 31d. The other configuration of the wavefront adjustment unit 39 may be the same as the configuration of the wavefront adjustment unit 37 shown in FIGS. 24 and 25. That is, the wavefront adjustment unit 39 may include a convex lens, a concave lens, and a single axis stage. Then, the distance between the convex lens and the concave lens of the wavefront adjustment unit 39 may be changed by the control of the shooting controller 81. By this means, it is possible to adjust the wavefront of the second prepulse laser beam 31d exiting the convex lens. As a result, it is possible to control the focused position of the second prepulse laser beam 33d in the plasma generation region 25 in the Z direction shown in FIGS. 44C and 44D.

The high-reflection mirror 347 shown in FIG. 43 may be provided on the optical path of the second prepulse laser beam 31d to face the wavefront adjustment unit 39 and the beam combiner 348. The high-reflection mirror 347 may reflect the second prepulse laser beam 31d having exited the wavefront adjustment unit 39, and guide the second prepulse laser beam 31d to the beam combiner 348. The other configuration of the high-reflection mirror 347 may be the same as the configuration of the high-reflection mirror 345 shown in FIGS. 24 and 25.

The beam combiner 343 shown in FIG. 43 may be an optical system configured to introduce the first prepulse laser beam 31c and the second prepulse laser beam 31d to the dichroic mirror 351 through substantially the same optical path. The beam combiner 348 may be, for example, a polarization beam splitter. The beam combiner 348 may highly reflect, for example, the first prepulse laser beam 31c, and allow, for example, the second prepulse laser beam 31d to highly transmit therethrough. The beam combiner 348 may be provided on the optical path of the first prepulse laser beam 31c to face the wavefront adjustment unit 38 and the dichroic mirror 351. The beam combiner 348 may be provided on the optical path of the second prepulse laser beam 31d having been reflected from the high-reflection mirror 347. The beam combiner 348 may be provided such that the optical axis of the first prepulse laser beam 31c substantially matches the optical axis of the second prepulse laser beam 31d.

The first prepulse laser beam 31c having exited the wavefront adjustment unit 38 may be reflected from the beam combiner 348 and be guided to the dichroic mirror 351 by the same. Meanwhile, the second prepulse laser beam 31d having exited the wavefront adjustment unit 39 and been reflected from the high-reflection mirror 347 may transmit through the beam combiner 348 and be guided to the dichroic mirror 351. At this time, the beam combiner 348 may guide the first prepulse laser beam 31c and the second prepulse laser beam 31d to the dichroic mirror 351 through substantially the same optical path.

The dichroic mirror 351 shown in FIG. 43 may be formed by coating a diamond substrate with a thin film which allows the main pulse laser beam 31a to transmit therethrough and reflects the first and second prepulse laser beams 31c and 31d. The dichroic mirror 351 may be arranged to face the window 21 and the beam combiner 348. The dichroic mirror 351 may be provided on the optical path of the main pulse laser beam 32a having been reflected from the high-reflection mirror 342.

The dichroic mirror 351 may reflect the first prepulse laser beam 31c and the second prepulse laser beam 31d having been guided from the beam combiner 348 through substantially the same optical path, and guide the first prepulse laser beam 31c and the second prepulse laser beam 31d to the window 21. The main pulse laser beam 32a having been reflected from the high-reflection mirror 342 may transmit through the dichroic mirror 351 and be guided to the window 21. At this time, the dichroic mirror 351 may guide the main pulse laser beam 32a, the first prepulse laser beam 32c, and the second prepulse laser beam 32d to the window 21 through substantially the same optical path. The other configuration of the dichroic mirror 351 may be the same as that of the dichroic mirror 351 shown in FIGS. 24 and 25.

The image measurement units 42 and 43 shown in FIG. 43 may capture the image of the imaging region 25a, and measure the images of the droplet 271, the secondary target 271a, the tertiary target 271b, and the plasma light. The other configurations of the image measurement units 42 and 43 may be the same as those of the image measurement units 42 and 43 shown in FIGS. 24 and 25.

The shooting controller 81 shown in FIG. 43 may output a control signal to the single axis stage of the wavefront adjustment unit 38 to control the operation of the wavefront adjustment unit 38, including changing the distance between the convex lens and the concave lens. The shooting controller 81 may also output a control signal to the single axis stage of the wavefront adjustment unit 39 to control the operation of the wavefront adjustment unit 39, including changing the distance between the convex lens and the concave lens.

The shooting controller 81 may be connected to the main pulse laser device 3a, the first prepulse laser device 3c, and the second prepulse laser device 3d via the delay circuit 82. Here, the delay time Tdl set in the delay circuit 82 by the shooting controller 81, which defines the timing at which a trigger signal is outputted to the first prepulse laser device 3c, is referred to also as "delay time Tdlp1." Meanwhile, the delay time Tdl set in the delay circuit 82 by the shooting controller 81, which defines the timing at which a trigger signal is outputted to the second prepulse laser device 3d, is referred to also as "delay time Tdlp2." The other configurations of the shooting controller 81 and the delay circuit 82 may be the same as those of the shooting controller 81 and the delay circuit 82 shown in FIGS. 24 and 25.

FIGS. 44A to 44E are drawings showing the state in which the shape of the droplet 271 is changed by the irradiation with the main pulse laser beam 33a, the first prepulse laser beam 33c, and the second prepulse laser beam 33d.

Figure 44:
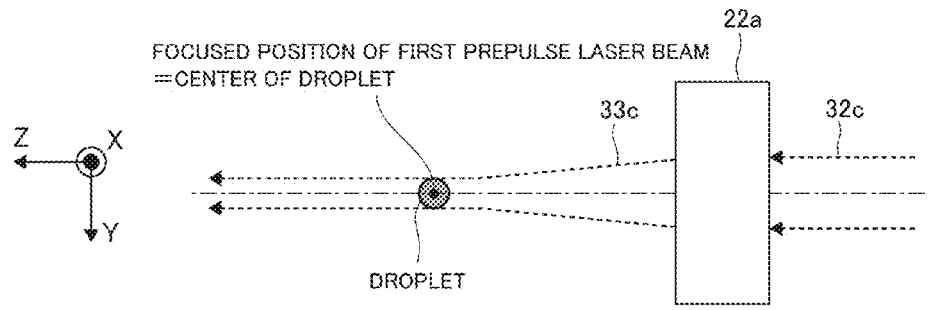
FIG. 44A is a drawing showing the state of a droplet just before being irradiated with a first prepulse laser beam.
FIG. 44B is a drawing showing the state of the droplet just after being irradiated with the first prepulse laser beam.
FIG. 44C is a drawing showing the state of a secondary target just before being irradiated with a second prepulse laser beam.
FIG. 44D is a drawing showing the state of a tertiary target just before being irradiated with a main pulse laser beam.
FIG. 44E is a drawing showing the state of plasma light emitted from the tertiary target just after being irradiated with the main pulse laser beam.
Figure 44:
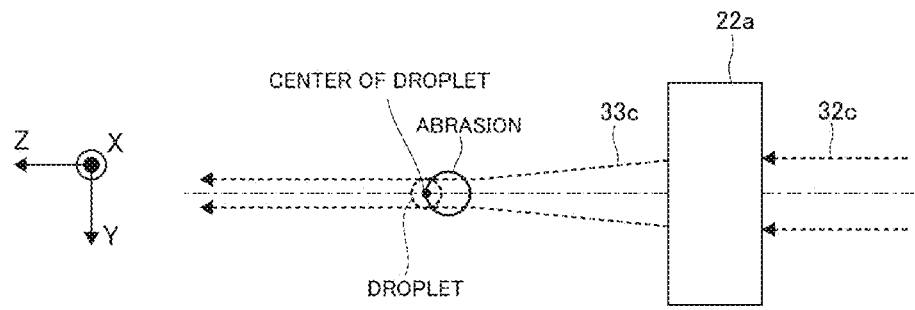
Figure 44:
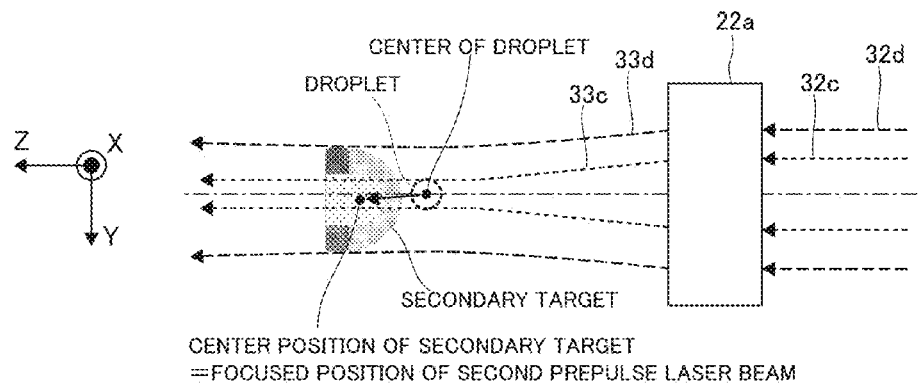
Figure 44:
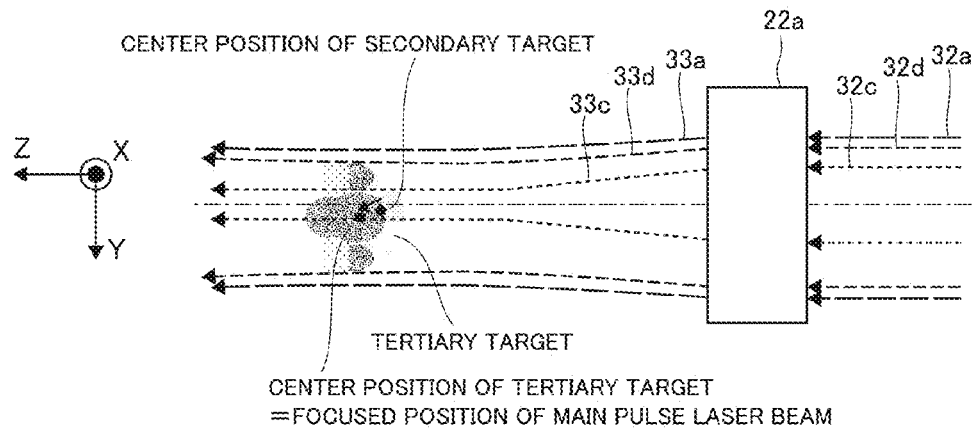
Figure 44:
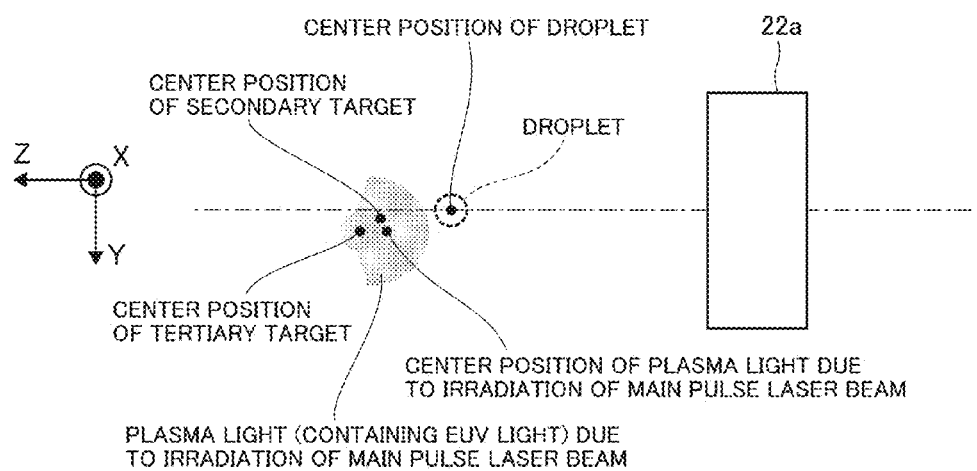

FIG. 44A is a drawing showing the state of the droplet 271 just before being irradiated with the first prepulse laser beam 33c. FIG. 44A shows the state before the droplet 271 is irradiated with the first prepulse laser beam 33c, and therefore the droplet 271 may have the original shape. The shooting controller 81 may substantially match the focused position of the first prepulse laser beam 33c with the center position of the droplet 271.

FIG. 44B is a drawing showing the state of the droplet 271 just after being irradiated with the first prepulse laser beam 33c. In the case shown in FIG. 44B, abrasion of the droplet 271 is started at the periphery of the droplet 271 to which the first prepulse laser beam 33c is applied. The reaction of this abrasion may generate a thrust that allows the droplet 271 to move in the Z direction which is the irradiation direction of the first prepulse laser beam 33c.

FIG. 44C is a drawing showing the state of the secondary target 271a just before being irradiated with the second prepulse laser beam 33d. In the case shown in FIG. 44C, the droplet 271 may be turned into the secondary target 271a and dispersed due to the reaction of the abrasion. The secondary target 271a may be dispersed in a dome-like shape as described above. The center position of the secondary target 271a may be the center position of the space distribution of the fine particles dispersed in the dome-like shape. The secondary target 271a is generated from the droplet 271 traveling through the target traveling path 272, and therefore can maintain the inertia force of the droplet 271 moving in the Y direction. Therefore, the thrust in the Z direction due to the abrasion and the inertia force in the Y direction may act on the secondary target 271a. By this means, the center position of the secondary target 271a may be moved from the center position of the droplet 271, in the Z direction and the Y direction. The shooting controller 81 may substantially match the focused position of the second prepulse laser beam 33d with the center position of the moved secondary target 271a. Alternatively, the shooting controller 81 may irradiate the secondary target 271a with the defocused secondary prepulse laser beam 33d. In this case, the optical axis of the defocused secondary prepulse laser beam 33d may not pass through the center position of the secondary target 271a, as long as the secondary target 271a falls within a beam cross-section of the defocused secondary prepulse laser beam 33d. Here, the second prepulse laser beam 33d and the first prepulse laser beam 33c may be substantially coaxial with one another.

FIG. 44D is a drawing showing the state of the tertiary target 271b just before being irradiated with the main pulse laser beam 33a. In the case shown in FIG. 44D, the secondary target 271a may be turned into the tertiary target 271b due to the irradiation with the second prepulse laser beam 33d. The thrust in the Z direction due to the abrasion and the inertia force in the Y direction may act on the tertiary target 271b in the same way as the secondary target 271a. By this means, the center position of the tertiary target 271b may be moved from the center position of the secondary target 271a, in the Z direction and the Y direction. The shooting controller 81 may substantially match the focused position of the main pulse laser beam 33a with the center position of the moved tertiary target 271b. Alternatively, the shooting controller 81 may irradiate the tertiary target 271b with the defocused main pulse laser beam 33a. In this case, the optical axis of the defocused main pulse laser beam 33a may not pass through the center position of the tertiary target 271b, but have a beam cross-section containing the tertiary target 271b. Here, the main pulse laser beam 33a and the second prepulse laser beam 33d may be substantially coaxial with one another.

FIG. 44E is a drawing showing the state of the plasma light emitted from the tertiary target 271b just after being irradiated with the main pulse laser beam 33a. In the case shown in FIG. 44E, the tertiary target 271b may be turned into plasma due to the irradiation with the main pulse laser beam 33a, and emit plasma light containing the EUV light 251. The center of the plasma light may be located at or near the periphery of the tertiary target 271b to which the main pulse laser beam 33a is applied, in the same way as described above with reference to FIG. 15B. Therefore, the center position of the plasma light may be shifted from the center position of the tertiary target 271b in the −Z direction.

Here, the measured value of the center position of the droplet 271 just before being irradiated with the first prepulse laser beam 33c may be represented as "measurement position Cd(Xd, Yd, Zd) of the droplet 271." The measured value of the center position of the secondary target 271a just before being irradiated with the second prepulse laser beam 33d may be represented as "measurement position Cs1(Xs1, Ys1, Zs1) of the secondary target 271a." The measured value of the center position of the tertiary target 271b just before being irradiated with the main pulse laser beam 33a may be represented as "measurement position Cs2 (Xs2, Ys2, Zs2) of the tertiary target 271b." The measured value of the center position of the plasma light emitted from the tertiary target 271b just after being irradiated with the main pulse laser beam 33a may be represented as "measurement position Cpm (Xpm, Ypm, Zpm) of the plasma light." The shooting controller 81 may store the relationship of the relative positions of Cd, Cs1, Cs2, and Cpm in advance.

8.2 Operation

Now, the operations of the shooting system using the EUV light generation apparatus 1 according to Embodiment 4 will be described with reference to FIGS. 45 to 48. The operations of the shooting system using the EUV light generation apparatus 1 according to embodiment 4, which are the same as the operations of the EUV light generation apparatus 1 according to Embodiment 3 with the image measurement system and the shooting system shown in FIGS. 24 and 25, will not be described again here.

First, the timing control for the image measurement performed by the shooting system using the EUV light generation apparatus 1 according to Embodiment 4 will be described.

Figure 45:
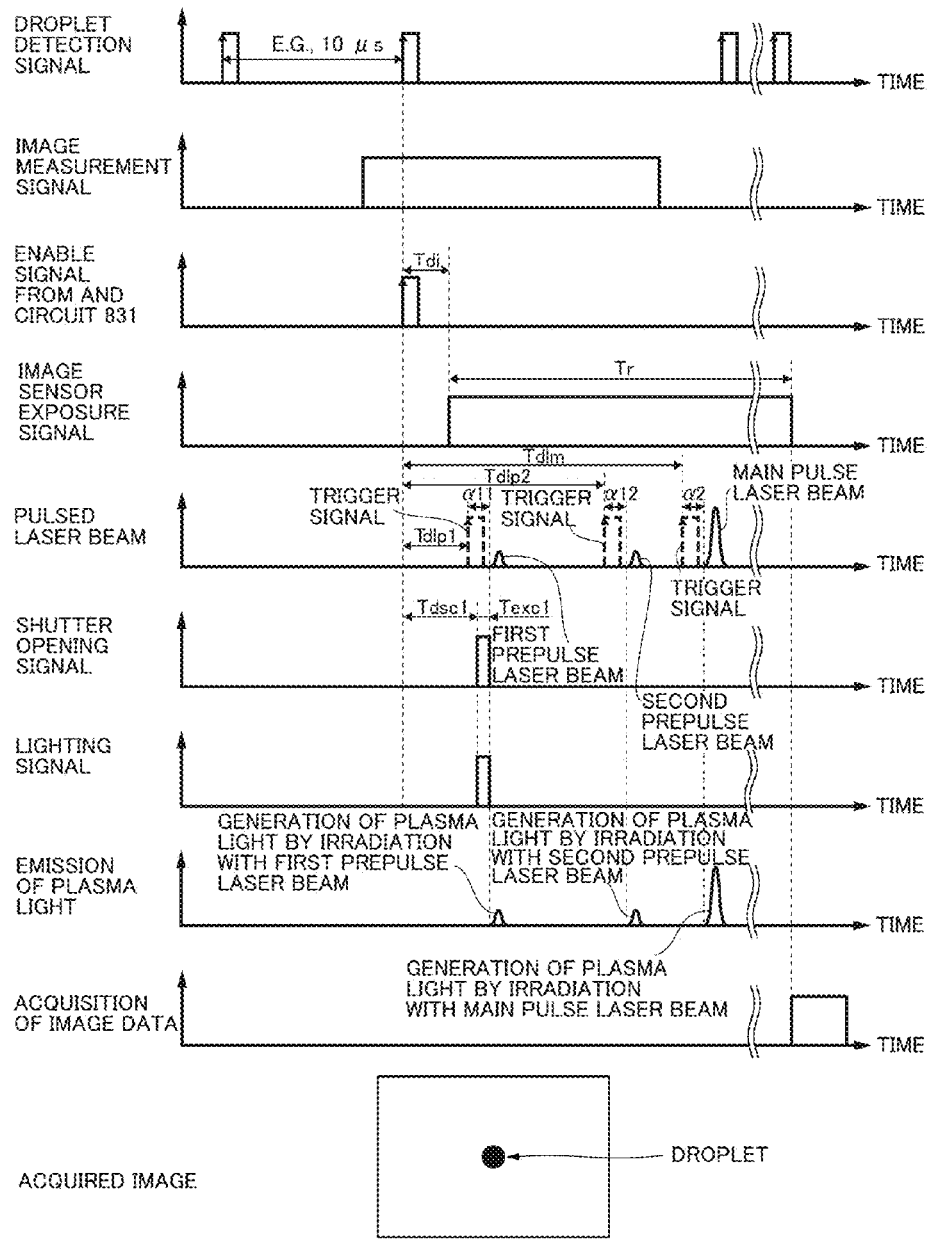
FIG. 45 is a time chart for the image measurement by the controller shown in FIG. 43, where the image of a droplet is measured just before the droplet is irradiated with a first prepulse laser beam.

FIG. 45 is a time chart for the image measurement performed by the controller 8 shown in FIG. 43, where the image of the droplet 271 just before being irradiated with the first prepulse laser beam 33c is measured.

With the time chart shown in FIG. 45, the shooting controller 81 may set the shutter opening time Tex as Tex=Texc1 in the one-shot circuit 835 in advance. The shutter opening time Texc1 may be a period of time which is necessary and sufficient to capture the image of the droplet 271. The shutter opening time Texc1 may be equal to the above-described shutter opening time Texa.

Moreover, the shooting controller 81 may set the delay time Tds as Tds=Tdsc1 in the delay circuit 833. When the image of the droplet 271 just before being irradiated with the first prepulse laser beam 33c is captured, the imaging timing of the imaging part 422 and the imaging part 432 may be defined as follows. A summed value "Tdsc1+Texc1" of the delay time Tdsc1 that defines the output timing of the shutter opening signal and the shutter opening time Texc1 may be equal to or smaller than a value "delay time Tdlp1+time α11" that defines the irradiation timing of the first prepulse laser beam 33c. The delay time Tdsc1 may be calculated according to the following equation.

$$Tdsc1=(d/v)-Texc1$$

Here, the time α11 may be a time required from when the delay circuit 82 outputs a trigger signal to the first prepulse laser device 3c until the first prepulse laser beam 33c is focused on the plasma generation region 25. A time α12 may be a time required from when the delay circuit 82 outputs a trigger signal to the second prepulse laser device 3d until the second prepulse laser beam 33d is focused on the plasma generation region 25. A time α2 may be a time required from when the delay circuit 82 outputs a trigger signal to the main pulse laser device 3a until the main pulse laser beam 33a is focused on the plasma generation region 25.

The delay time Tdi of the delay circuit 834 and the exposure time Tr of the one-shot circuit 836 may be set in advance as the initial setting at startup in the same way as the case shown in FIGS. 27 to 29.

The controller 8 may control the output timings of various signals for the image measurement as follows, based on droplet detection signals outputted from the droplet detector 41.

As shown in FIG. 45, the shooting controller 81 may output the droplet detection signals directly to the delay circuit 82 and the AND circuit 831.

Then, as shown in FIG. 45, the shooting controller 81 may output an image measurement signal to the AND circuit 831 when the shooting controller 81 causes the image measurement unit 42 and the image measurement unit 43 to perform the image measurement.

Then, as shown in FIG. 45, when the image measurement signal and the droplet detection signal are inputted to the AND circuit 831, the AND circuit 831 may output enable signals to the delay circuit 833 and the delay circuit 834. When the enable signal is inputted from the AND circuit 831 to the delay circuit 833, the delay circuit 833 may output the enable signal to the one-shot circuit 835 at the timing delayed by the delay time Tdsc1. When the enable signal is inputted from the AND circuit 831 to the delay circuit 834, the delay circuit 834 may output the enable signal to the one-shot circuit 836 at the timing delayed by the delay time Tdi.

Then, as shown in FIG. 45, when the enable signal is inputted to the one-shot circuit 836, the one-shot circuit 836 may output image sensor exposure signals each having the pulse width of the exposure time Tr to the image sensor 422a and the image sensor 432a. The image sensor 422a and the image sensor 432a may be exposed to the light from when the image sensor exposure signals are inputted until the exposure time Tr has elapsed.

Then, as shown in FIG. 45, when the droplet detection signal is inputted to the delay circuit 82, the delay circuit 82 may output a trigger signal to the first prepulse laser device 3c at the timing delayed by the delay time Tdlp1. After the time α11 has elapsed from when the trigger signal is inputted to the first prepulse laser device 3c, the first prepulse laser device 3c may emit the first prepulse laser beam 33c to the plasma generation region 25. In addition, when the droplet detection signal is inputted to the delay circuit 82, the delay circuit 82 may output a trigger signal to the second prepulse laser device 3d at the timing delayed by the delay time Tdlp2. After the time α12 has elapsed from when the trigger signal is inputted to the second prepulse laser device 3d, the second prepulse laser device 3d may emit the second prepulse laser beam 33d to the plasma generation region 25. In addition, when the droplet detection signal is inputted to the delay circuit 82, the delay circuit 82 may output a trigger signal to the main pulse laser device 3a at the timing delayed by the delay time Tdlm. After the time α2 has elapsed from when the trigger signal is inputted to the main pulse laser device 3a, the main pulse laser device 3a may emit the main pulse laser beam 33a to the plasma generation region 25.

Then, as shown in FIG. 45, when the enable signal is inputted to the one-shot circuit 835, the one-shot circuit 835 may output the output signals each having the pulse width of the shutter opening time Texc1 to the shutter 422d, the shutter 432d, and the AND circuit 832. Among the output signals from the one-shot circuit 835, the signals inputted to the shutter 422d and the shutter 432d may function as shutter opening signals. The shutter 422d and the shutter 432d may be open from when the shutter opening signals are inputted until the shutter opening time Texc1 has elapsed.

Then, as shown in FIG. 45, when the output signal from the one-shot circuit 835 and the gate signal are inputted to the AND circuit 832, the AND circuit 832 may output lighting signals each having the pulse width of the shutter opening time Texc1 to the light source 421a and the light source 431a. The gate signal may be outputted from the shooting controller 81 to the AND circuit 832 before the one-shot circuit 835 outputs the output signal to the AND circuit 832. The light source 421a and the light source 431a may emit pulsed light from when the lighting signals are inputted until the shutter opening time Texc1 has elapsed.

Then, as shown in FIG. 45, the plasma light may be emitted after the shutter opening time Texc1 has elapsed, from the droplet 271 irradiated with the first prepulse laser beam 33c. The optical intensity of this plasma light may be lower than the optical intensity of the plasma light that is emitted from the tertiary target 271b irradiated with the main pulse laser beam 33a. The imaging part 422 and the imaging part 432 may capture the image of the droplet 271 just before being irradiated with the first prepulse laser beam 33c.

Then, as shown in FIG. 45, the image sensor 422a and the image sensor 432a may generate the image data 1 and the image data 2 and output the data to the shooting controller 81, after the exposure time Tr has elapsed. The shooting controller 81 may acquire the image data 1 and the image data 2 of the droplet 271 just before being irradiated with the first prepulse laser beam 33c. The shooting controller 81 may calculate the measurement position Cd(Xd, Yd, Zd) of the droplet 271, based on the acquired image data 1 and image data 2.

The image of the droplet 271 just before being irradiated with the first prepulse laser beam 33c may be, for example, the image as shown in FIG. 45.

Figure 46:
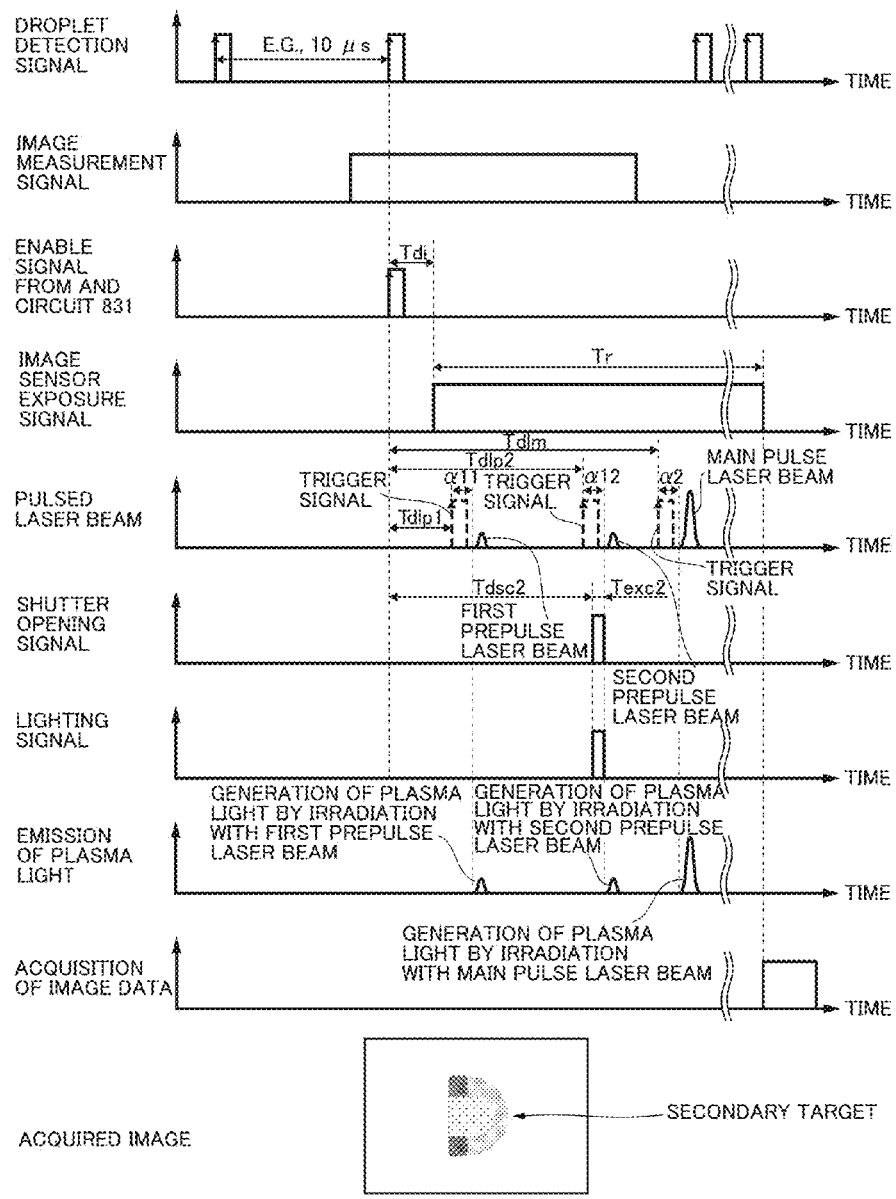
FIG. 46 is a time chart for the image measurement by the controller shown in FIG. 43, where the image of a secondary target is measured just before the secondary target is irradiated with a second prepulse laser beam.

FIG. 46 is a time chart for the image measurement performed by the controller 8 shown in FIG. 43, where the image of the secondary target 271a just before being irradiated with the second prepulse laser beam 33d is measured.

With the time chart shown in FIG. 46, the shooting controller 81 may set the shutter opening time Tex as Tex=Texc2 in the one-shot circuit 835 in advance. The shutter opening time Texc2 may be a period of time which is necessary and sufficient to capture the image of the secondary target 271a.

Moreover, the shooting controller 81 may set the delay time Tds as Tds=Tdsc2 in the delay circuit 833. When the image of the secondary target 271a just before being irradiated with the second prepulse laser beam 33d is captured, the imaging timing of the imaging part 422 and the imaging part 432 may be defined as follows. A summed value "Tdsc2+Texc2" of the delay time Tdsc2 that defines the output timing of the shutter opening signal and the shutter opening time Texc2 may be equal to or smaller than a value "delay time Tdlp2+time α12" that defines the irradiation timing of the second prepulse laser beam 33d.

The delay time Tdi of the delay circuit 834 and the exposure time Tr of the one-shot circuit 836 may be set in advance as the initial setting at startup in the same way as the case shown in FIG. 45.

The controller 8 may control the output timings of various signals for the image measurement as follows, based on droplet detection signals outputted from the droplet detector 41.

As shown in FIG. 46, the shooting controller 81 may output the droplet detection signals directly to the delay circuit 82 and the AND circuit 831 in the same way as the case shown in FIG. 45.

Then, as shown in FIG. 46, the shooting controller 81 may output an image measurement signal to the AND circuit 831 when the shooting controller 81 causes the image measurement unit 42 and the image measurement unit 43 to perform the image measurement, in the same way as the case shown in FIG. 45.

Then, as shown in FIG. 46, when the image measurement signal and the droplet detection signal are inputted to the AND circuit 831, the AND circuit 831 may output enable signals to the delay circuit 833 and the delay circuit 834 in the same way as the case shown in FIG. 45. When the enable signal is inputted from the AND circuit 831 to the delay circuit 833, the delay circuit 833 may output the enable signal to the one-shot circuit 835 at the timing delayed by the delay time Tdsc2. When the enable signal is inputted from the AND circuit 831 to the delay circuit 834, the delay circuit 834 may output the enable signal to the one-shot circuit 836 at the timing delayed by the delay time Tdi in the same way as the case shown in FIG. 45.

Then, as shown in FIG. 46, when the enable signal is inputted to the one-shot circuit 836, the one-shot circuit 836 may output image sensor exposure signals to the image sensor 422a and the image sensor 432a in the same way as the case shown in FIG. 45.

Then, as shown in FIG. 46, when the droplet detection signal is inputted to the delay circuit 82, the delay circuit 82 may output a trigger signal to the first prepulse laser device 3c at the timing delayed by the delay time Tdlp1 in the same way as the case shown in FIG. 45. In addition, when the droplet detection signal is inputted to the delay circuit 82, the delay circuit 82 may output a trigger signal to the second prepulse laser device 3d at the timing delayed by the delay time Tdlp2 in the same way as the case shown in FIG. 45. Moreover, when the droplet detection signal is inputted to the delay circuit 82, the delay circuit 82 may output a trigger signal to the main pulse laser device 3a at the timing delayed by the delay time Tdlm in the same way as the case shown in FIG. 45.

Then, as shown in FIG. 46, when the enable signal is inputted to the one-shot circuit 835, the one-shot circuit 835 may output the output signals each having the pulse width of the shutter opening time Texc2 to the shutter 422d, the shutter 432d, and the AND circuit 832. Among the output signals from the one-shot circuit 835, the signals inputted to the shutter 422d and the shutter 432d may function as shutter opening signals, in the same way as the case shown in FIG. 45. The shutter 422d and the shutter 432d may be open from when the shutter opening signals are inputted until the shutter opening time Texc2 has elapsed.

Then, as shown in FIG. 46, when the output signal from the one-shot circuit 835 and the gate signal are inputted to the AND circuit 832, the AND circuit 832 may output lighting signals each having the pulse width of the shutter opening time Texc2 to the light source 421a and the light source 431a, in the same way as the case shown in FIG. 45. The gate signal may be outputted from the shooting controller 81 to the AND circuit 832 before the one-shot circuit 835 outputs the output signal to the AND circuit 832 in the same way as the case shown in FIG. 45. The light source 421a and the light source 431a may emit pulsed light from when the lighting signals are inputted until the shutter opening time Texc2 has elapsed.

Then, as shown in FIG. 46, plasma light may be emitted after the shutter opening time Texc2 has elapsed, from the droplet 271 irradiated with the second prepulse laser beam 33d. This plasma light may be emitted from the preplasma contained in the secondary target 271a. The optical intensity of this plasma light may be lower than the optical intensity of the plasma light that is emitted from the tertiary target 271b irradiated with the main pulse laser beam 33a. The imaging part 422 and the imaging part 432 may capture the image of the secondary target 271a just before being irradiated with the second prepulse laser beam 33d.

Then, as shown in FIG. 46, the image sensor 422a and the image sensor 432a may generate the image data 1 and the image data 2 and output the data to the shooting controller 81, after the exposure time Tr has elapsed. The shooting controller 81 may acquire the image data 1 and the image data 2 of the secondary target 271a just before being irradiated with the second prepulse laser beam 33d. The shooting controller 81 may calculate the measurement position Cs1(Xs1, Ys1, Zs1) of the secondary target 271a, based on the acquired image data 1 and image data 2.

The image of the secondary target 271a just before being irradiated with the second prepulse laser beam 33d may be, for example, the image as shown in FIG. 46.

Figure 47:
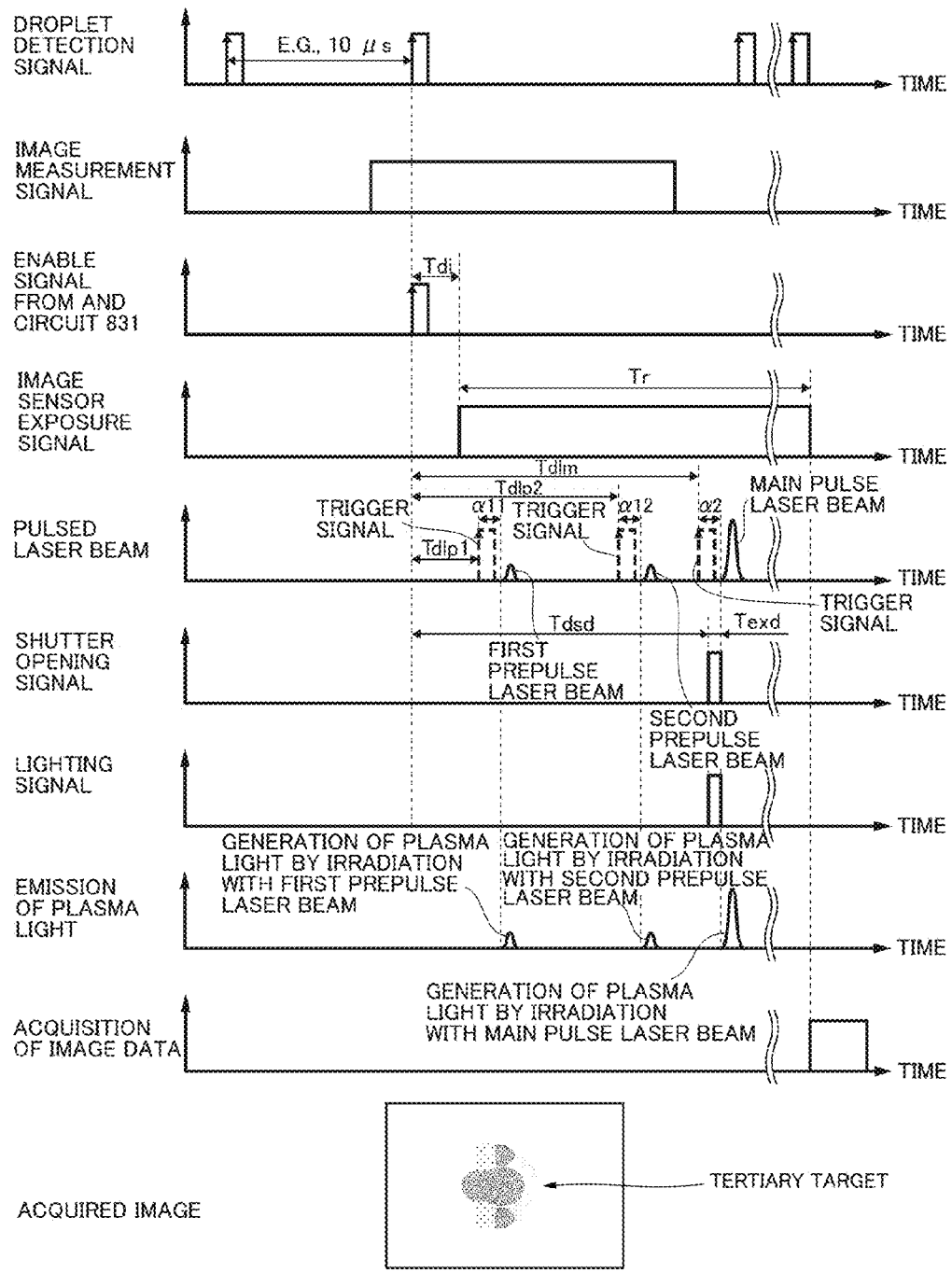
FIG. 47 is a time chart for the image measurement by the controller shown in FIG. 43, where the image of a tertiary target is measured just before the tertiary target is irradiated with a main pulse laser beam.

FIG. 47 is a time chart for the image measurement performed by the controller 8 shown in FIG. 43, where the image of the tertiary target 271b just before being irradiated with the main pulse laser beam 33a is measured.

With the time chart shown in FIG. 47, the shooting controller 81 may set the shutter opening time Tex as Tex=Texd in the one-shot circuit 835 in advance. The shutter opening time Texd may be a period of time which is necessary and sufficient to capture the image of the tertiary target 271b.

Moreover, the shooting controller 81 may set the delay time Tds as Tds=Tdsd in the delay circuit 833. When the image of the tertiary target 271b just before being irradiated with the main pulse laser beam 33a is captured, the imaging timing of the imaging part 422 and the imaging part 432 may be defined as follows. A summed value "Tdsd+Texd" of the delay time Tdsd that defines the output timing of the shutter opening signal and the shutter opening time Texd may be equal to or smaller than a value "delay time Tdlm+time α2" that defines the irradiation timing of the main pulse laser beam 33a.

The delay time Tdi of the delay circuit 834 and the exposure time Tr of the one-shot circuit 836 may be set in advance as the initial setting at startup in the same way as the case shown in FIG. 46.

The controller 8 may control the output timings of various signals for the image measurement as follows, based on droplet detection signals outputted from the droplet detector 41.

As shown in FIG. 47, the shooting controller 81 may output the droplet detection signals directly to the delay circuit 82 and the AND circuit 831 in the same way as the case shown in FIG. 46.

Then, as shown in FIG. 47, the shooting controller 81 may output an image measurement signal to the AND circuit 831 when the shooting controller 81 causes the image measurement unit 42 and the image measurement unit 43 to perform the image measurement, in the same way as the case shown in FIG. 46.

Then, as shown in FIG. 47, when the image measurement signal and the droplet detection signal are inputted to the AND circuit 831, the AND circuit 831 may output enable signals to the delay circuit 833 and the delay circuit 834 in the same way as the case shown in FIG. 46. When the enable signal is inputted from the AND circuit 831 to the delay circuit 833, the delay circuit 833 may output the enable signal to the one-shot circuit 835 at the timing delayed by the delay time Tdsd. When the enable signal is inputted from the AND circuit 831 to the delay circuit 834, the delay circuit 834 may output the enable signal to the one-shot circuit 836 at the timing delayed by the delay time Tdi in the same way as the case shown in FIG. 46.

Then, as shown in FIG. 47, when the enable signal is inputted to the one-shot circuit 836, the one-shot circuit 836 may output image sensor exposure signals to the image sensor 422a and the image sensor 432a in the same way as the case shown in FIG. 46.

Then, as shown in FIG. 47, when the droplet detection signal is inputted to the delay circuit 82, the delay circuit 82 may output a trigger signal to the first prepulse laser device 3c at the timing delayed by the delay time Tdlp1 in the same way as the case shown in FIG. 46. In addition, when the droplet detection signal is inputted to the delay circuit 82, the delay circuit 82 may output a trigger signal to the second prepulse laser device 3d at the timing delayed by the delay time Tdlp2 in the same way as the case shown in FIG. 46. Moreover, when the droplet detection signal is inputted to the delay circuit 82, the delay circuit 82 may output a trigger signal to the main pulse laser device 3a at the timing delayed by the delay time Tdlm in the same way as the case shown in FIG. 46.

Then, as shown in FIG. 47, when the enable signal is inputted to the one-shot circuit 835, the one-shot circuit 835 may output the output signals each having the pulse width of the shutter opening time Texd to the shutter 422d, the shutter 432d, and the AND circuit 832. Among the output signals from the one-shot circuit 835, the signals inputted to the shutter 422d and the shutter 432d may function as shutter opening signals, in the same way as the case shown in FIG. 46. The shutter 422d and the shutter 432d may be open from when the shutter opening signals are inputted until the shutter opening time Texd has elapsed.

Then, as shown in FIG. 47, when the output signal from the one-shot circuit 835 and the gate signal are inputted to the AND circuit 832, the AND circuit 832 may output lighting signals each having the pulse width of the shutter opening time Texd to the light source 421a and the light source 431a, in the same way as the case shown in FIG. 46. The gate signal may be outputted from the shooting controller 81 to the AND circuit 832 before the one-shot circuit 835 outputs the output signal to the AND circuit 832, in the same way as the case shown in FIG. 46. The light source 421a and the light source 431a may emit pulsed light from when the lighting signals are inputted until the shutter opening time Texd has elapsed.

Then, as shown in FIG. 47, plasma light may be emitted after the shutter opening time Texd has elapsed, from the tertiary target 271b irradiated with the main pulse laser beam 33a. The imaging part 422 and the imaging part 432 may capture the image of the tertiary target 271b just before being irradiated with the main pulse laser beam 33a.

Then, as shown in FIG. 47, the image sensor 422a and the image sensor 432a may generate the image data 1 and the image data 2 and output the data to the shooting controller 81, after the exposure time Tr has elapsed. The shooting controller 81 may acquire the image data 1 and the image data 2 of the tertiary target 271b just before being irradiated with the main pulse laser beam 33a. The shooting controller 81 may calculate the measurement position Cs2(Xs2, Ys2, Zs2) of the tertiary target 271b, based on the acquired image data 1 and image data 2.

The image of the tertiary target 271b just before being irradiated with the main pulse laser beam 33a may be, for example, the image as shown in FIG. 47.

Figure 48:
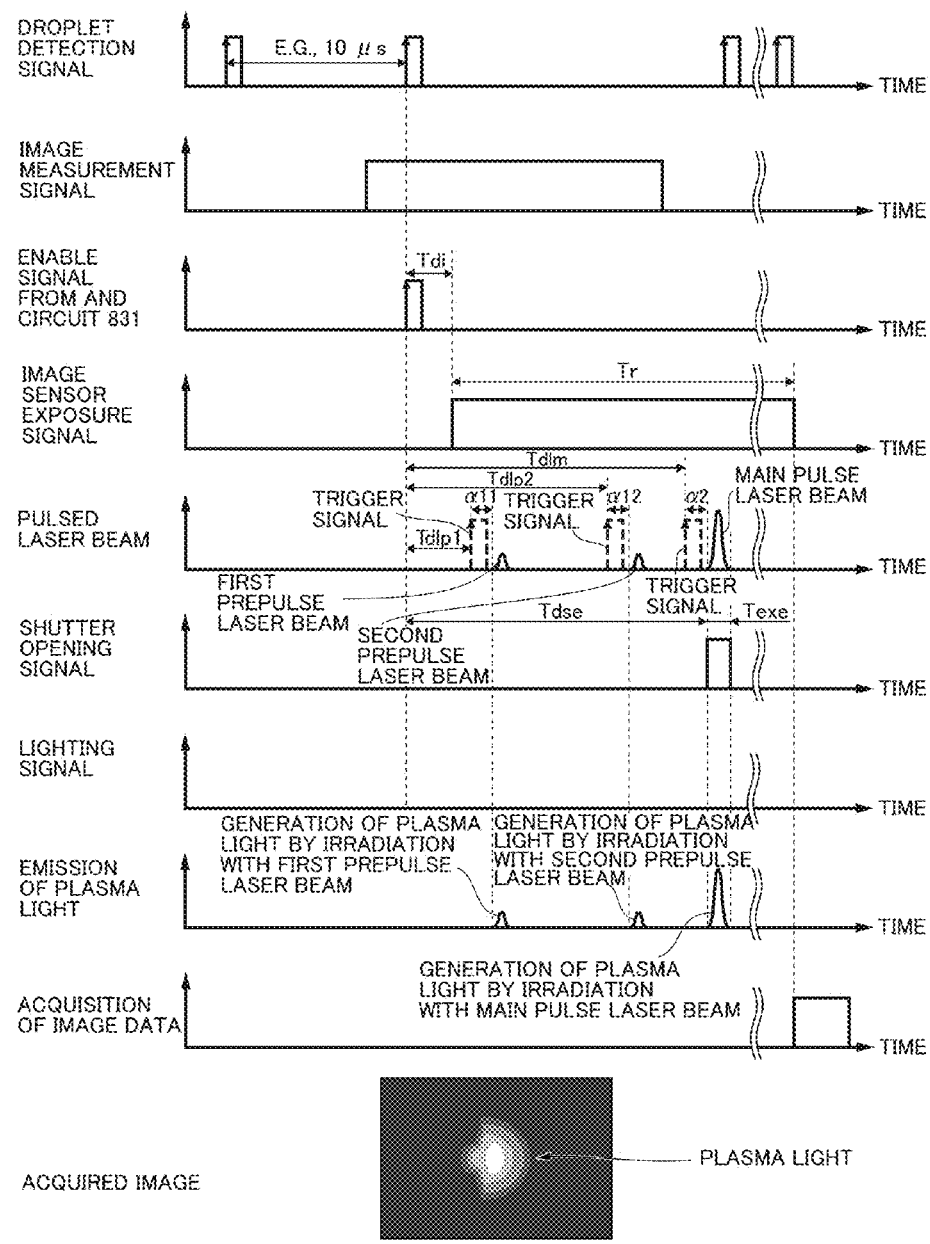
FIG. 48 is a time chart for the image measurement by the controller shown in FIG. 43, where the image of plasma light emitted from the tertiary target is measured just after the tertiary target is irradiated with the main pulse laser beam.

FIG. 48 is a time chart for the image measurement performed by the controller 8 shown in FIG. 43, where the image of the plasma light emitted from the tertiary target 271b just after being irradiated with the main pulse laser beam 33a is measured.

With the time chart shown in FIG. 48, the shooting controller 81 may set the shutter opening time Tex as Tex=Texe in the one-shot circuit 835 in advance. The shutter opening time Texe may be a period of time which is necessary and sufficient to capture the image of the plasma light.

Moreover, the shooting controller 81 may set the delay time Tds as Tds=Tdse in the delay circuit 833. When the image of the plasma light emitted from the tertiary target 271b just after being irradiated with the main pulse laser beam 33a is captured, the imaging timing of the imaging part 422 and the imaging part 432 may be defined as follows. A summed value "Tdse+Texe" of the delay time Tdse that defines the output timing of the shutter opening signal and the shutter opening time Texe may be greater than a value "delay time Tdlm+time α2" that defines the irradiation timing of the main pulse laser beam 33a.

The delay time Tdi of the delay circuit 834 and the exposure time Tr of the one-shot circuit 836 may be set in advance as the initial setting at startup in the same way as the case shown in FIG. 47.

The controller 8 may control the output timings of various signals for the image measurement as follows, based on droplet detection signals outputted from the droplet detector 41.

As shown in FIG. 48, the shooting controller 81 may output the droplet detection signals directly to the delay circuit 82 and the AND circuit 831 in the same way as the case shown in FIG. 47.

Then, as shown in FIG. 48, the shooting controller 81 may output an image measurement signal to the AND circuit 831 when the shooting controller 81 causes the image measurement unit 42 and the image measurement unit 43 to perform the image measurement, in the same way as the case shown in FIG. 47.

Then, as shown in FIG. 48, when the image measurement signal and the droplet detection signal are inputted to the AND circuit 831, the AND circuit 831 may output enable signals to the delay circuit 833 and the delay circuit 834 in the same way as the case shown in FIG. 47. When the enable signal is inputted from the AND circuit 831 to the delay circuit 833, the delay circuit 833 may output the enable signal to the one-shot circuit 835 at the timing delayed by the delay time Tdse. When the enable signal is inputted from the AND circuit 831 to the delay circuit 834, the delay circuit 834 may output the enable signal to the one-shot circuit 836 at the timing delayed by the delay time Tdi in the same way as the case shown in FIG. 47.

Then, as shown in FIG. 48, when the enable signal is inputted to the one-shot circuit 836, the one-shot circuit 836 may output image sensor exposure signals to the image sensor 422a and the image sensor 432a in the same way as the case shown in FIG. 47.

Then, as shown in FIG. 48, when the droplet detection signal is inputted to the delay circuit 82, the delay circuit 82 may output a trigger signal to the first prepulse laser device 3c at the timing delayed by the delay time Tdlp1 in the same way as the case shown in FIG. 47. In addition, when the droplet detection signal is inputted to the delay circuit 82, the delay circuit 82 may output a trigger signal to the second prepulse laser device 3d at the timing delayed by the delay time Tdlp2 in the same way as the case shown in FIG. 47. Moreover, when the droplet detection signal is inputted to the delay circuit 82, the delay circuit 82 may output a trigger signal to the main pulse laser device 3a at the timing delayed by the delay time Tdlm in the same way as the case shown in FIG. 47.

Then, as shown in FIG. 48, when the enable signal is inputted to the one-shot circuit 835, the one-shot circuit 835 may output the output signals each having the pulse width of the shutter opening time Texe to the shutter 422d, the shutter 432d, and the AND circuit 832. Among the output signals from the one-shot circuit 835, the signals inputted to the shutter 422d and the shutter 432d may function as shutter opening signals, in the same way as the case shown in FIG. 47. The shutter 422d and the shutter 432d may be open from when the shutter opening signals are inputted until the shutter opening time Texe has elapsed.

Then, as shown in FIG. 48, the AND circuit 832 may not output lighting signals to the light source 421a and the light source 431a. When the image of the plasma light is captured, the shooting controller 81 may not output a gate signal to the AND circuit 832.

Then, as shown in FIG. 48, plasma light may be emitted from the tertiary target 271b irradiated with the main pulse laser beam 33a, during the shutter opening time Texe. This plasma light may contain the EUV light 251. The imaging part 422 and the imaging part 432 may capture the image of the plasma light emitted from the tertiary target 271b just after being irradiated with the main pulse laser beam 33a.

Then, as shown in FIG. 48, the image sensor 422a and the image sensor 432a may generate the image data 1 and the image data 2 and output the data to the shooting controller 81, after the exposure time Tr has elapsed. The shooting controller 81 may acquire the image data 1 and the image data 2 of the plasma light emitted from the tertiary target 271b just after being irradiated with the main pulse laser beam 33a. The shooting controller 81 may calculate the measurement position Cpm(Xpm, Ypm, Zpm) of the plasma light, based on the acquired image data 1 and image data 2.

The image of the plasma light emitted from the tertiary target 271b just after being irradiated with the main pulse laser beam 33a may be, for example, the image as shown in FIG. 48.

Next, a process for the shooting control of the shooting system using the EUV light generation apparatus 1 according to Embodiment 4 will be described. The process for the shooing control performed by the shooting controller 81 according to Embodiment 4 may be the same as the process for the shooting control including the subroutines performed by the shooting controller 81 according to Embodiment 3, shown in FIGS. 30 to 41C.

First, the shooting controller 81 according to Embodiment 4 may read the target position Ppt of the plasma light. The target position Ppt(Xpt, Ypt, Zpt) of the plasma light may be a target value for the center position of the plasma light emitted from the tertiary target 271b just after being irradiated with the main pulse laser beam 33a in the plasma generation region 25.

Next, the shooting controller 81 may calculate the target position Pdt of the droplet 271, the target position Pst1 of the secondary target 271a, and the target position Pst2 of the tertiary target 271b, based on the target position Ppt of the plasma light. The target position Pdt(Xdt, Ydt, Zdt) of the droplet 271 may be a target value for the center position of the droplet 271 just before being irradiated with the first prepulse laser beam 33c in the plasma generation region 25. The target position Pst1 (Xst1, Yst1, Zst1) of the secondary target 271a may be a target value for the center position of the secondary target 271a just before being irradiated with the second prepulse laser beam 33d in the plasma generation region 25. The target position Pst2 (Xst2, Yst2, Zst2) of the tertiary target 271b may be a target value for the center position of the tertiary target 271b just before being irradiated with the main pulse laser beam 33a in the plasma generation region 25.

Next, the shooting controller 81 may set the target position Pdt of the droplet 271, and the target focused positions of the first prepulse laser beam 33c, the second prepulse laser beam 33d, and the main pulse laser beam 33a. The shooting controller 81 may set the delay time Tds, the delay time Tdl, and the biaxial stage 74 in order to supply the droplet 271 to the target position Pdt of the droplet 271. The shooting controller 81 may set the biaxial stage 227 and the wavefront adjustment unit 38 in order to focus the first prepulse laser beam 33c on the target position Pdt of the droplet 271.

The shooting controller 81 may set the wavefront adjustment unit 39 in order to focus the second prepulse laser beam 33*d* on the target position Pst1 of the secondary target 271*a*. As described above, when the second prepulse laser beam 33*d* and the first prepulse laser beam 33*c* which are approximately coaxial with one another are irradiated, the X-coordinate of the target position Pst1 and the X-coordinate of the target position Pdt shown in FIG. 44A to 44C may be the same as each other; the Y-coordinate of the target position Pst1 and the Y-coordinate of the target position Pdt shown in FIG. 44A to 44C may be the same as each other. In this case, the X-coordinates and the Y-coordinates of the target positions on which the second prepulse laser beam 33*d* and the first prepulse laser beam 33*c* should be focused may be adjusted by the biaxial stage 227 at the same time. In addition, the Z-coordinates of the target positions on which the second prepulse laser beam 33*d* and the first prepulse laser beam 33*c* should be focused may be adjusted by the wavefront adjustment unit 39 and the wavefront adjustment unit 38, respectively. On the other hand, when the second prepulse laser beam 33*d* and the first prepulse laser beam 33*c* which are not approximately coaxial with one another are irradiated, the X-coordinate of the target position Pst1 and the X-coordinate of the target position Pdt shown in FIG. 44A to 44C may not be the same as each other; the Y-coordinate of the target position Pst1 and the Y-coordinate of the target position Pdt shown in FIG. 44A to 44C may not be the same as each other. In this case, a prepulse beam path adjustment mechanism (not shown) may be provided on the optical path of the first prepulse laser beam 31*c* or the second prepulse laser beam 31*d* shown in FIG. 43. This prepulse beam path adjustment mechanism may be provided on a position from the first prepulse laser device 3*c* or the second prepulse laser device 3*d* to the beam combiner 348. The prepulse beam path adjustment mechanism may be formed with optical elements such as a mirror and a lens. The configuration of the prepulse beam path adjustment mechanism may be a combination of, for example, the high-reflection mirror 342 and the tilt stage 353.

The shooting controller 81 may set the tilt stage 353 and the wavefront adjustment unit 36 to focus the main pulse laser beam 33*a* on the target position Pst2 of the tertiary target 271*b*.

Next, the shooting controller 81 may control the position of the droplet 271 outputted from the target supply part 26. To be more specific, the shooting controller 81 may perform the following process until the position of the droplet 271 just before being irradiated with the first prepulse laser beam 33*c* in the plasma generation region 25 is within the allowable range. The shooting controller 81 may cause the image measurement unit 42 and the image measurement unit 43 to measure the image of the droplet 271 just before being irradiated with the first prepulse laser beam 33*c* in the plasma generation region 25. Then, the shooting controller 81 may calculate the measurement position Cd of the droplet 271 based on the acquired image data. Then, the shooting controller 81 may appropriately modify and set the delay time Tdlp1 and control the operation of the biaxial stage 74, based on the calculated measurement position Cd of the droplet 271. Moreover, the shooting controller 81 may appropriately modify and set the delay time Tdsc1. By this means, the shooting controller 81 can control the position of the droplet 271 based on the image of the droplet 271.

Next, the shooting controller 81 may control the position of the secondary target 271*a*. To be more specific, the shooting controller 81 may perform the following process until the position of the secondary target 271*a* just before being irradiated with the second prepulse laser beam 33*d* in the plasma generation region 25 is within the allowable range. The shooting controller 81 may cause the image measurement unit 42 and the image measurement unit 43 to measure the image of the secondary target 271*a* just before being irradiated with the second prepulse laser beam 33*d* in the plasma generation region 25. Then, the shooting controller 81 may calculate the measurement position Cs1 of the secondary target 271*a* based on the acquired image data. Then, the shooting controller 81 may appropriately modify and set the delay time Tdlp2 based on the calculated measurement position Cs1 of the secondary target 271*a*. In addition, the shooting controller 81 may control the operations of the biaxial stage 227 and the wavefront adjustment unit 38, based on the calculated measurement position Cs1 of the secondary target 271*a*. Moreover, the shooting controller 81 may appropriately modify and set the delay time Tdsc2, and control the operation of the biaxial stage 74. By this means, the shooting controller 81 can control the focused position of the first prepulse laser beam 33*c*, based on the image of the secondary target 271*a*.

Next, the shooting controller 81 may control the position of the tertiary target 271*b*. To be more specific, the shooting controller 81 may perform the following process until the position of the tertiary target 271*b* just before being irradiated with the main pulse laser beam 33*a* in the plasma generation region 25 is within the allowable range. The shooting controller 81 may cause the image measurement unit 42 and the image measurement unit 43 to measure the image of the tertiary target 271*b* just before being irradiated with the main pulse laser beam 33*a* in the plasma generation region 25. Then, the shooting controller 81 may calculate the measurement position Cs2 of the tertiary target 271*b* based on the acquired image data. Then, the shooting controller 81 may appropriately modify and set the delay time Tdlm, based on the calculated measurement position Cs2 of the tertiary target 271*b*. In addition, the shooting controller 81 may control the operation of the wavefront adjustment unit 39 based on the calculated measurement position Cs2 of the tertiary target 271*b*. Moreover, when the second prepulse laser beam 33*d* and the first prepulse laser beam 33*c* which are not approximately coaxial with one another are irradiated, the shooting controller 81 may control the operation of the prepulse beam path adjustment mechanism (not shown). In addition, the shooting controller 81 may appropriately modify and set the delay time Tdsd and control the operation of the biaxial stage 74. Moreover, the shooting controller 81 may control the operations of the biaxial stage 227 and the wavefront adjustment unit 38. By this means, the shooting controller 81 can control the focused position of the second prepulse laser beam 33*d*, based on the image of the tertiary target 271*b*.

Next, the shooting controller 81 may control the focused position of the main pulse laser beam 33*a*. To be more specific, the shooting controller 81 may perform the following process until the position of the plasma light emitted from the tertiary target 271*b* just after being irradiated with the main pulse laser beam 33*a* in the plasma generation region 25 is within the allowable range. The shooting controller 81 may cause the image measurement unit 42 and the image measurement unit 43 to measure the image of the plasma light emitted from the tertiary target 271*b* just after being irradiated with the main pulse laser beam 33*a* in the plasma generation region 25. Then, the shooting controller 81 may calculate the measurement position Cpm of the plasma light based on the acquired image data. Then, the shooting controller 81 may control the operations of the tilt stage 353 and the wavefront adjustment unit 36, based on the calculated measurement position Cpm of the plasma light. In addition, the shooting controller 81 may appropriately modify and set the delay time Tdlm, appropriately modify and set the delay time Tdse, and control the operation of the biaxial stage 74, based on the calculated measurement position Cpm of the plasma light. Moreover, the shooting controller 81 may control the operations of the biaxial stage 227, the wavefront adjustment unit 38, and the wavefront adjustment unit 39, based on the calculated measurement position Cpm of the plasma light. By this means, the shooting controller 81 can control the focused position of the main pulse laser beam 33a, based on the image of the plasma light.

With the above-described process for the shooting control, it is possible to substantially match the measurement position Cpm of the plasma light emitted from the tertiary target 271b just after being irradiated with the main pulse laser beam 33a in the plasma generation region 25 with the target position Ppt of the plasma light. Here, the details of the process for the shooting control performed by the shooting controller 81 according to Embodiment 4 may be the same as those of the process performed by the shooting controller 81 according to the Embodiment 3 described with reference to FIGS. 31A to 41C.

8.3 Effect

The EUV light generation apparatus 1 according to Embodiment 4 can precisely control the positions of the droplet 271, the secondary target 271a, and the tertiary target 271b in the plasma generation region 25. Moreover, the EUV light generation apparatus 1 can precisely control the focused positions of the first prepulse laser beam 33c, the second prepulse laser beam 33d, and the main pulse laser beam 33a. Therefore, the EUV light generation apparatus 1 according to Embodiment 4 can substantially match the position of the droplet 271 with the focused position of the first prepulse laser beam 33c, and consequently generate the secondary target 271a that can efficiently generate plasma light. In addition, the EUV light generation apparatus 1 can substantially match the position of the secondary target 271a with the focused position of the second prepulse laser beam 33d, and consequently generate the tertiary target 271b that can more efficiently generate plasma light. Moreover, the EUV light generation apparatus 1 can substantially match the position of the tertiary target 271b with the focused position of the main pulse laser beam 33a, and therefore efficiently generate plasma light. Consequently, the EUV light generation apparatus 1 according to Embodiment 4 can generate the EUV light 252 more efficiently than the EUV light generation apparatus 1 according to Embodiment 3. Moreover, the EUV light generation apparatus 1 according to Embodiment 4 can substantially match the position of the plasma light actually emitted in the plasma generation region 25 with the target position of the plasma light determined according to a command from the exposure apparatus 6. Consequently, the EUV light generation apparatus 1 can stably output the EUV light 252 to the exposure apparatus 6.

9. Image Measurement Unit of the EUV Light Generation Apparatus According to Embodiment 5

9.1 Configuration

Now, the image measurement units 42 and 43 of the EUV light generation apparatus 1 according to Embodiment 5 will be described with reference to FIGS. 49 to 51B. Here, the configuration of the image measurement unit 42 and the image measurement unit 43 of the EUV light generation apparatus 1 according to Embodiment 5 may be different from that of the image measurement unit 42 and the image measurement unit 43 of the EUV light generation apparatus 1 according to Embodiment 4 shown in FIG. 43. The configuration of the image measurement unit 42 and the image measurement unit 43 of the EUV light generation apparatus 1 according to Embodiment 5, which is the same as that of the image measurement unit 42 and the image measurement unit 43 of the EUV light generation apparatus 1 according to Embodiment 4 shown in FIG. 43, will not be described again here.

Figure 49:
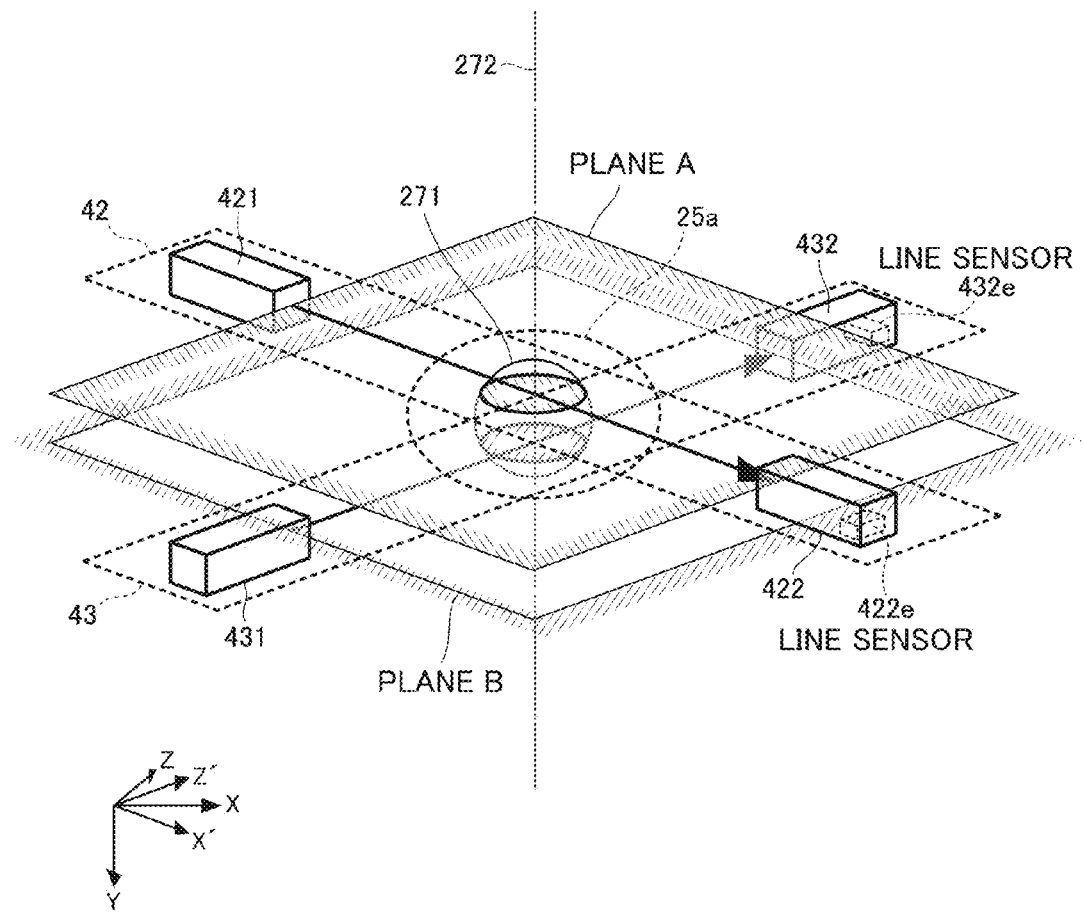
FIG. 49 is a drawing showing the configuration of the image measurement unit of the EUV light generation apparatus according to Embodiment 5.

FIG. 49 is a drawing showing the configuration of the image measurement unit 42 and the image measurement unit 43 of the EUV light generation apparatus 1 according to Embodiment 5. In FIG. 49, an X' axis and a Z' axis may be coordinate axes obtained by rotating the X axis and the Z axis about the Y axis by a predetermined angle.

The image measurement unit 42 shown in FIG. 49 may capture the image of the imaging region 25a in the X' direction and measure the images of the droplet 271, the secondary target 271a, the tertiary target 271b and the plasma light. Here, the imaging region 25a may be formed to contain the plasma generation region 25. The image measurement unit 42 may include the light source part 421 and the imaging part 422. The direction in which the light source part 421 faces the imaging part 422 may be approximately perpendicular to the target traveling path 272. The direction in which the light source part 421 faces the imaging part 422 may be the X' direction. The light source part 421 and the imaging part 422 may be placed in a plane A which is approximately parallel to an X'-Z' plane and intersects the imaging region 25a. When a specific droplet 271 is placed in the ideal position in the plasma generation region 25, the plane A may intersect the diameter of the droplet 271.

A line sensor 422e including light receiving elements arranged in one dimension may be used in the imaging part 422, instead of the image sensor 422a shown in FIG. 43. The imaging part 422 may include the line sensor 422e, the transfer optical system 422b, the window 422c and the shutter 422d. Here, the transfer optical system 422b, the window 422c and the shutter 422d are not shown in FIG. 49.

The transfer optical system 422b may transfer an image of the imaging region 25a including the intersection of the plane A and the target traveling path 272 onto the light receiving elements of the line sensor 422e and form the image thereon. The transfer optical system 422b may transfer an image of the light, of the imaging region 25a, having exited the light source 421 and passing through the plane A onto the light receiving elements of the line sensor 422e and form the image thereon.

The line sensor 422e may capture the image of the light transferred and formed by the transfer optical system 422b. The light receiving elements of the line sensor 422e may be arranged in the direction approximately perpendicular to the direction in which the light source part 421 faces the imaging part 422. The light receiving elements of the line sensor 422e may intersect the plane A and be arranged approximately parallel to each other. The channels of the line sensor 422e may be arranged to correspond to the respective light receiving elements of the line sensor 422e. The line sensor 422e may generate a detection signal according to the optical intensity of the captured image of the light. The line sensor 422e may measure the parameters of the droplet 271 based on the detection signal, and output the measured result to the shooting controller 81.

The image measurement unit 43 shown in FIG. 49 may capture the image of the imaging region 25*a* in the Z' direction, and measure the images of the droplet 271, the secondary target 271*a*, the tertiary target 271*b*, and the plasma light. The image measurement unit 43 may include the light source part 431 and the imaging part 432. The direction in which the light source part 431 faces the imaging part 432 may be approximately perpendicular to the target traveling path 272. The direction in which the light source part 431 faces the imaging part 432 may be the Z' direction. The light source part 431 and the imaging part 432 may be placed in a plane B which is approximately parallel to the X'-Z' plane and intersects the imaging region 25*a*. The plane B may be approximately parallel to the plane A, and placed in a position which is a predetermined distance apart from the plane A in the +Y direction. When a specific droplet 271 is placed in the ideal position in the plasma generation region 25, the plane B may intersect a portion of the droplet 271 which is different from the portion intersecting the plane A.

A line sensor 432*e* including light receiving elements arranged in one dimension may be used in the imaging part 432, instead of the image sensor 432*a* shown in FIG. 43. The imaging part 432 may include the line sensor 432*e*, the transfer optical system 432*b*, the window 432*c* and the shutter 432*d*. Here, the transfer optical system 432*b*, the window 432*c* and the shutter 432*d* are not shown in FIG. 49.

The transfer optical system 432*b* may transfer an image of the imaging region 25*a* including the intersection of the plane B and the target traveling path 272 onto the light receiving elements of the line sensor 432*e* and form the image thereon. The transfer optical system 432*b* may transfer an image of the light, of the imaging region 25*a*, having exited the light source part 431 and passing through the plane B onto the light receiving elements of the line sensor 432*e* and form the image thereon.

The line sensor 432*e* may capture the image of the light transferred and formed by the transfer optical system 432*b*. The light receiving elements of the line sensor 432*e* may be arranged in the direction approximately perpendicular to the direction in which the light source part 431 faces the imaging part 432. The light receiving elements of the line sensor 432*e* may intersect the plane B and be arranged approximately parallel to each other. The channels of the line sensor 432*e* may be arranged to correspond to the respective light receiving elements of the line sensor 432*e*. The line sensor 432*e* may generate a detection signal according to the optical intensity of the captured image of the light, and output the detection signal to the shooting controller 81. The shooting controller 81 may measure the parameters of the droplet 271 based on the detection signal.

The line sensor 422*e* and the line sensor 432*e* may capture the image of the droplet 271 reaching the plasma generation region 25 at the same time. The imaging timing of the line sensor 422*e* and the line sensor 432*e* may be the timing at which the diameter of the droplet 271 intersects the plane A. Each of the line sensor 422*e* and the line sensor 432*e* may perform an imaging operation once for one droplet 271. The other configurations of the image measurement unit 42 and the image measurement unit 43 may be the same as those of the image measurement unit 42 and the image measurement unit 43 shown in FIG. 43.

9.2 Operation

Figure 50A:
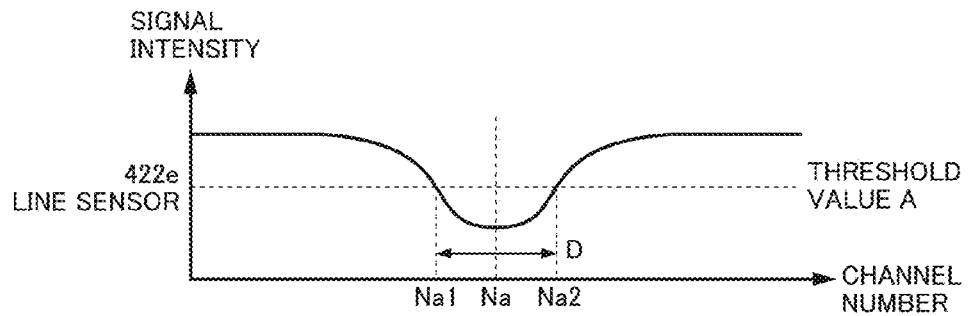
FIG. 50A is a drawing showing the result of the measurement by a line sensor when a droplet is placed in a proper position in the plasma generation region.
Figure 50B:
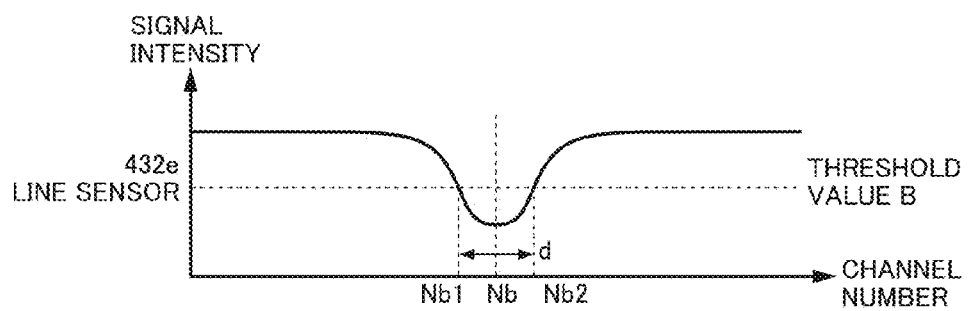
FIG. 50B is a drawing showing the result of the measurement by a line sensor when the droplet is placed in the proper position in the plasma generation region.
Figure 51A:
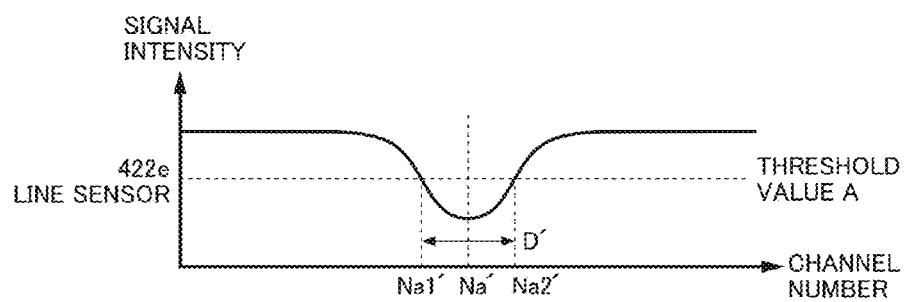
FIG. 51A is a drawing showing the result of the measurement by the line sensor when the droplet is placed out of the proper position in the plasma generation region.
Figure 51B:
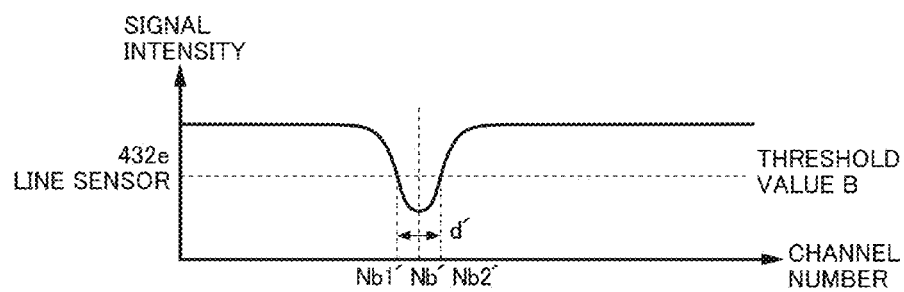
FIG. 51B is a drawing showing the result of the measurement by the line sensor when the droplet is placed out of the proper position in the plasma generation region.

Now, the operations of the image measurement unit 42 and the image measurement unit 43 of the EUV light generation apparatus 1 according to Embodiment 5 will be described with reference to FIGS. 50A to 51B. FIG. 50A shows a result of the measurement by the line sensor 422*e* when the droplet 271 is placed in a proper position in the plasma generation region 25. FIG. 50B shows a result of the measurement by the line sensor 432*e* when the droplet 271 is placed in the proper position in the plasma generation region 25. FIG. 51A shows a result of the measurement by the line sensor 422*e* when the droplet 271 is placed out of the proper position in the plasma generation region 25. FIG. 51B shows a result of the measurement by the line sensor 432*e* when the droplet 271 is placed out of the proper position in the plasma generation region 25. Here, the vertical axis of FIG. 50A represents the intensity of the detection signal generated by the line sensor 422*e*. The horizontal axis of FIG. 50A represents channel numbers sequentially assigned to the channels of the line sensor 422*e*. The vertical axis of FIG. 50B represents the intensity of the detection signal generated by the line sensor 432*e*. The horizontal axis of FIG. 50B represents channel numbers sequentially assigned to the channels of the line sensor 432*e*. The vertical axis and the horizontal axis shown in FIGS. 51A and 51B are the same as those shown in FIGS. 50A and 50B.

When the droplet 271 reaches the plasma generation region 25, the light emitted from the light source part 421 and the light source part 431 is blocked by the droplet 271, and therefore the imaging part 422 and the imaging part 432 may capture the image of the shadow of the droplet 271. Then, the optical intensity of the image of the light blocked by the droplet 271 may be significantly reduced as compared to when the droplet 271 has not reached the plasma generation region 25. Therefore, when the droplet 271 reaches the plasma generation region 25, the intensity of the detection signal generated by each of the line sensor 422*e* and the line sensor 432*e* may be significantly reduced as compared to when the droplet 271 has not reached the plasma generation region 25.

First, the line sensor 422*e* and the line sensor 432*e* may measure the position of the droplet in the X'-Z' plane as a reference position, when the droplet is placed in the proper position as shown in FIGS. 50A and 50B. To be more specific, the line sensor 422*e* and the line sensor 432*e* may specify a channel number Na and a channel number Nb with which the intensities of the respective detection signals are lowest. Then, the line sensor 422*e* and the line sensor 432*e* may measure the specified channel number Na and channel number Nb as the reference position of the droplet 271.

Next, the line sensor 422*e* and the line sensor 432*e* may measure the lengths of the droplet 271 in the Z' direction and the X' direction, as reference lengths, when the droplet 271 is placed in the proper position. To be more specific, the line sensor 422*e* and the line sensor 432*e* may calculate the number of channels (Na2−Na1) and the number of channels (Nb2−Nb1) with which the intensities of the detection signals are lower than a threshold value A and a threshold value B, respectively. Then, the line sensor 422*e* and the line sensor 432*e* may measure the number of channels (Na2−Na1) and the number of channels (Nb2−Nb1) as a reference length D (=Na2−Na1) and a reference length d (=Nb2−Nb1) of the droplet 271, respectively.

Next, the line sensor 422*e* and the line sensor 432*e* may measure the amount of the shifting of the droplet 271 from the reference position in the Z' direction and the X' direction when the droplet 271 is placed out of the proper position as shown in FIGS. 51A and 51B. To be more specific, the line sensor 422*e* and the line sensor 432*e* may specify a channel number Na' and a channel number Nb' with which the intensities of the respective detection signals are lowest. Then, the line sensor 422*e* and the line sensor 432*e* may calculate the differences (Na'−Na) and (Nb'−Nb) in the specified channel number Na' and channel number Nb' from the channel number Na and the channel number Nb at the reference position, respectively. Then, the line sensor 422*e* and the line sensor 432*e* may measure the calculated differences as an amount of shifting ΔZ' (=Na'−Na) and an amount of shifting ΔX'(=Nb'−Nb) from the reference position in the Z' direction and the X' direction, respectively. Here, by the coordinate transformation of ΔZ' and ΔX', it is possible to calculate an amount of shifting ΔZ and an amount of shifting ΔX in the Z direction and the X direction, respectively. Moreover, the channel number Na may be calculated as a channel number at the midpoint between Na1 and Na2. The channel numbers Na', Nb, and Nb' may be calculated in the same way as the channel number Na.

Next, the line sensor 422*e* and the line sensor 432*e* may measure the observed length of the droplet 271 in the Z' direction and the X' direction when the droplet 271 is placed out of the proper position. To be more specific, the line sensor 422*e* and the line sensor 432*e* may calculate the number of channels (Na2'−Na1') and the number of channels (Nb2'−Nb1') with which the intensities of the detection signals are lower than the threshold value A and the threshold value B, respectively. Then, the line sensor 422*e* and the line sensor 432*e* may measure the number of channels (Na2'−Na1') and the number of channels (Nb2'−Nb1') as an observed length D' (=Na2'−Na1') and an observed length d' (=Nb2'−Nb1'), respectively.

Next, the line sensor 422*e* and the line sensor 432*e* may measure the amount of the shifting of the droplet 271 in the Y direction when the droplet 271 is placed out of the proper position as shown in FIGS. 51A and 51B. To be more specific, the line sensor 422*e* and the line sensor 432*e* may calculate the amount of shifting |ΔY| of the droplet 271 in the Y direction according to the following equation.

$$|\Delta Y| = D \cdot \cos(\sin^{-1}(D'/D))$$

Next, with respect to the Y direction, the line sensor 422*e* and the line sensor 432*e* may specify the direction in which the droplet 271 is shifted, by calculating (d'−d). To be more specific, when the calculated result is (d'−d)>0, the line sensor 422*e* and the line sensor 432*e* may determine that the droplet 271 is shifted from the plane B in the +Y direction. On the other hand, when the calculated result is (d'−d)<0, the line sensor 422*e* and the line sensor 432*e* may determine that the droplet 271 is shifted from the plane B in the −Y direction.

As described above, a case has been described with reference to FIGS. 49 to 51B where the droplet 271 is the target 27 to be measured by the image measurement unit 42 and the image measurement unit 43 of the EUV light generation apparatus 1 according to Embodiment 5. However, the target 27 to be measured by the image measurement unit 42 and the image measurement unit 43 of the EUV light generation apparatus 1 according to Embodiment 5 may be the secondary target 271*a*, the tertiary target 271*b* and the plasma light. In particular, the shape of the secondary target 271*a* and the shape of the tertiary target 271*b* may often be axisymmetric. Therefore, when the secondary target 271*a* and the tertiary target 271*b* are measurement targets, the line sensor 422*e* and the line sensor 432*e* may be configured such that the symmetric axes of the secondary target 271*a* and the tertiary target 271*b* can fall within the plane A. Moreover, the imaging timing of the line sensor 422*e* and the line sensor 432*e* may be the timing at which the symmetric axes of the secondary target 271*a* and the tertiary target 271*b* fall within the plane A. In addition, the optical intensity of the plasma light may be higher than that of the light emitted from the light source part 421 and the light source part 431, and therefore the intensity of the detection signal generated by each of the line sensor 422*e* and the line sensor 432*e* may be increased. Therefore, when the measurement target is the plasma light, the line sensor 422*e* and the line sensor 432*e* may specify the channel numbers with which the intensities of the detection signals are highest as Na and Nb, respectively, and measure them as the reference position of the plasma light. Here, the amount of the shifting of the target 27 in the Y direction may be measured by using a plurality of data obtained by capturing the images of one target 27 at different timings. In this case, the line sensor 422*e* and the line sensor 432*e* may be placed on approximately the same plane.

9.3 Effect

The EUV light generation apparatus 1 according to Embodiment 5 can measure the parameters of the droplet 271, the secondary target 271*a*, the tertiary target 271*b* and the plasma light, by using the line sensor 422*e* and the line sensor 432*e*. Therefore, the EUV light generation apparatus 1 according to Embodiment 5 can measure the parameters of the droplet 271, the secondary target 271*a*, the tertiary target 271*b* and the plasma light at a lower cost and a higher speed than the EUV light generation apparatus 1 according to Embodiment 4.

10. Others 10.1 Hardware Environment of Each Controller.

A person skilled in the art would understand that the subject matters disclosed herein can be implemented by combining a general purpose computer or a programmable controller with a program module or a software application. In general, the program module includes routines, programs, components and data structures which can execute the processes described herein.

Figure 52:
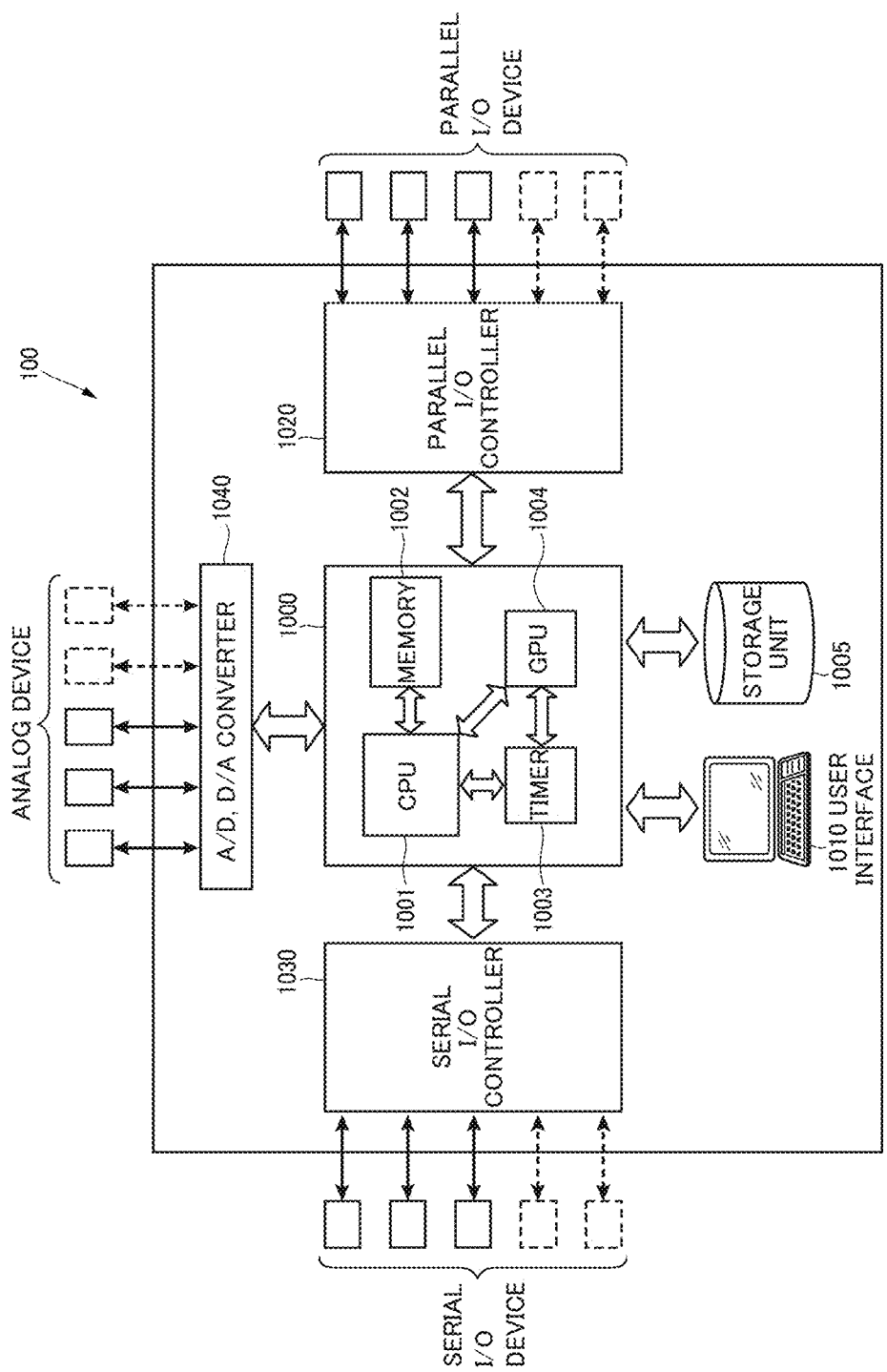
FIG. 52 is a block diagram showing the hardware environment of each controller.

FIG. 52 is a block diagram showing an exemplary hardware environment in which various aspects of the subject matters disclosed herein can be implemented. An exemplary hardware environment 100 shown in FIG. 52 may include a processing unit 1000, a storage unit 1005, a user interface 1010, a parallel I/O controller 1020, a serial I/O controller 1030, and an A/D, D/A converter 1040, but the configuration of the hardware environment 100 is not limited to this.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any of commercially available processors. A dual microprocessor or another multiprocessor architecture may be used as the CPU 1001.

The components shown in FIG. 52 may be interconnected with each other to perform the processes described herein.

During its operation, the processing unit 1000 may read and execute the program stored in the storage unit 1005, read data together with the program from the storage unit 1005, and write the data to the storage unit 1005. The CPU 1001 may execute the program read from the storage unit 1005. The memory 1002 may be a work area in which the program executed by the CPU 1001 and the data used in the operation of the CPU 1001 are temporarily stored. The timer 1003 may measure a time interval and output the result of the measurement to the CPU 1001 according to the execution of the program. The GPU 1004 may process image data according to the program read from the storage unit 1005, and output the result of the process to the CPU 1001.

The parallel I/O controller 1020 may be connected to parallel I/O devices that can communicate with the processing unit 1000, such as the exposure apparatus controller 61, the EUV light generation controller 5, the laser beam direction control unit 34, the shooting controller 81, the delay circuit 82, the image measurement control circuit 83, the image sensor 422a, and the image sensor 432a. The parallel I/O controller 1020 may control the communication between the processing unit 1000 and those parallel I/O devices. The serial I/O controller 1030 may be connected to serial I/O devices that can communicate with the processing unit 1000, such as the heater power source 712, the piezoelectric power source 732, the pressure regulator 721, the light source 411a, the light source 421a, the light source 431a, the biaxial stage 74, the triaxial stage 226, and the biaxial stage 227. The serial I/O controller 1030 may control the communication between the processing unit 1000 and those serial I/O devices. The A/D, D/A converter 1040 may be connected to analog devices such as the temperature sensor, the pressure sensor, various sensors for a vacuum gauge, the target sensor 4, the optical sensor 412a, the shutter 422d, the shutter 432d, the line sensor 422e, and the line sensor 432e, via analog ports, may control the communication between the processing unit 1000 and those analog devices, and may perform A/D, D/A conversion of the contents of the communication.

The user interface 1010 may present the progress of the program executed by the processing unit 1000 to an operator, in order to allow the operator to command the processing unit 1000 to stop the program and to execute an interruption routine.

The exemplary hardware environment 100 may be applicable to the exposure apparatus controller 61, the EUV light generation controller 5, the laser beam direction control unit 34, and the shooting controller 81 in the present disclosure. A person skilled in the art would understand that those controllers may be realized in a distributed computing environment, that is, an environment in which tasks are performed by processing units connected to each other via a communication network. In this disclosure, the exposure apparatus controller 61, the EUV light generation controller 5, the laser beam direction control unit 34, and the shooting controller 81 may be connected to each other via a communication network such as Ethernet or Internet. In the distributed computing environment, the program module may be stored in both of a local memory storage device and a remote memory storage device.

10.2 Configuration of Shutters

Figure 53:
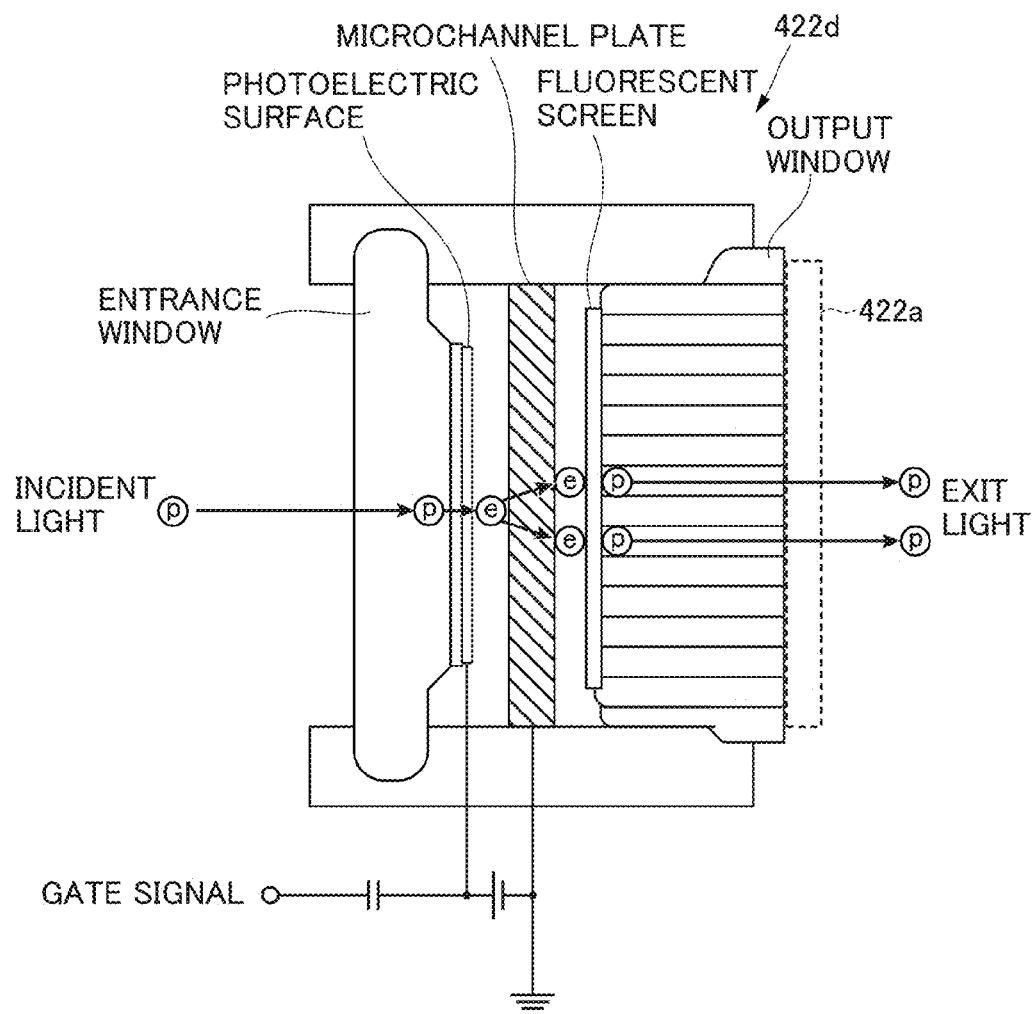
FIG. 53 shows the configuration of a shutter.

The shutter 422d of the imaging part 422 may have the configuration shown in FIG. 53. The shutter 432d of the imaging part 432 may have the same configuration as that of the shutter 422d.

The shutter 422d shown in FIG. 53 may be an image intensifier by using a microchannel plate. The image intensifier may be a vacuum tube that can produce an optical image, by introducing incident light; multiplying photoelectrons emitted from a photoelectric surface; converting the electrons into light by a fluorescent screen; and emitting the light to form the image. The image intensifier shown in FIG. 53 may be provided on the light receiving surface of the image sensor 422a. This image intensifier may include an entrance window, a photoelectric surface, a microchannel plate, a fluorescent screen, and an output window. Here, "p" represents a photon and "e" represents an electron in FIG. 53.

The entrance window may introduce incident light onto the photoelectric surface. The photoelectric surface may convert the incident light into photoelectrons and emit the photoelectrons to the multichannel plate. The multichannel plate may be structured by tying a number of channels together, which allow the photoelectrons to pass therethrough. When a photoelectron passing through the channels collides against an inner wall of the channels, the multichannel plate may emit secondary electrons. By this means, the multichannel plate may multiply the photoelectron emitted from the photoelectric surface and emit the secondary electrons to the fluorescent screen. The fluorescent screen may convert the electrons having been multiplied by the multichannel plate into light, and guide the light to the output window. The output window may be adjacent to the light receiving surface of the image sensor 422a. The output window may output the light from the fluorescent screen to the image sensor 422a as exit light. The image sensor 422a may receive the exit light as an optical image. Here, a transfer lens (not shown) may be provided between the output window and the image sensor 422a, which transfers the optical image on the fluorescent screen onto the light receiving surface of the image sensor 422a.

Moreover, the image intensifier shown in FIG. 53 may be configured to apply an electric potential difference between the multichannel plate and the photoelectric surface, according to whether a gate signal is turned on or off. When the gate signal is turned on, the electric potential of the photoelectric surface may be lower than the electric potential of the input side of the multichannel plate. In this case, the photoelectron emitted from the photoelectric surface may reach the multichannel plate by the electric potential difference. Therefore, when the gate signal is turned on, the photoelectron emitted from the photoelectric surface may be multiplied by the multichannel plate, and therefore the image sensor 422a may receive an optical image corresponding to the multiplied electrons. On the other hand, when the gate signal is turned off, the electric potential of the photoelectric surface may be higher than the electric potential of the input side of the multichannel plate. In this case, the photoelectron emitted from the photoelectric surface is drawn back to the photoelectric surface, and therefore cannot reach the multichannel plate. Therefore, when the gate signal is turned off, the photoelectron emitted from the photoelectric surface may not be multiplied by the multichannel plate, and therefore the image sensor 422a cannot receive an optical image. In this way, the image intensifier shown in FIG. 53 may realize the shutter function according to whether the gate signal is turned on or off.

Here, the shutter 422d may be a CCD electronic shutter as long as the shutter 422d can realize its shutter function even if plasma light is emitted. Alternatively, the shutter 422d may be a PLZT polarization shutter. The PLZT polarization shutter may be configured to arrange a plurality of polarizing plates in the crossed nicols direction via piezoelectric ceramics. Then, the shutter function may be realized by applying a voltage to the piezoelectric ceramics between the polarizing plates to change the polarization direction of the polarizing plates. In addition, the shutter 422d may be realized by combining the above-described various shutters and a mechanical shutter.

10.3 Another Modification

In the droplet detector 41, the light source part 411 and the light receiving part 412 may not need to face one another across the target traveling path 272. For example, the window 411c of the light source part 411 and the window 412c of the light receiving part 412 may be arranged to face toward the same point but not be in parallel. The light receiving part 412 may detect the light reflected from the droplet 271. In this way, the arrangement of the window 411c of the light source part 411 and the window 412c of the light receiving part 412 may not be limited as long as it is possible to detect the reflected light from the droplet 271.

With the above-described embodiments, the continuous jet method is employed for the droplet forming mechanism 73. However, the electrostatic suction method may be applicable. With the electrostatic suction method, a suction electrode may be provided to be spaced from the nozzle hole 262a on the target traveling path 272. Then, an electric potential difference may be created between the suction electrode and the target 27 in the tank 261. By this means, it is possible to generate an electrostatic force between the suction electrode and the target 27. This electrostatic force may allow the target 27 protruding from the nozzle hole 262a to be divided, and the divided target 27 may form the droplet 271 due to its surface tension.

Part or all of the EUV light generation controller 5, the shooting controller 81, the delay circuit 82, and the image measurement control circuit 83 may be combined to form as one controller.

It would be obvious to a person skilled in the art that the technologies described in the above-described embodiments including the modifications may be compatible with each other.

The descriptions above are intended to be illustrative only and the present disclosure is not limited thereto. Therefore, it will be apparent to those skilled in the art that it is possible to make modifications to the embodiments of the present disclosure within the scope of the appended claims.

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the indefinite article "one (a/an)" should be interpreted as "at least one" or "one or more."

REFERENCE SIGNS LIST

1 EUV light generation apparatus
2 chamber
25 plasma generation region
25a imaging region
26 target supply part
27 target
271 droplet
271a secondary target
271b tertiary target
31a to 33a main pulse laser beam
31b to 33b prepulse laser beam
31c to 33c first prepulse laser beam
31d to 33d second prepulse laser beam
41 droplet detector
42, 43 image measurement unit
422, 432 imaging part
8 controller
81 shooting controller
82 delay circuit
83 image measurement control circuit

The invention claimed is:

1. An extreme ultraviolet light generation apparatus comprising:
   a chamber including a plasma generation region to which a target is supplied, the target being turned into plasma so that extreme ultraviolet light is generated in the chamber;
   a target supply part configured to supply the target to the plasma generation region by outputting the target as a droplet into the chamber;
   a droplet detector configured to detect the droplet traveling from the target supply part to the plasma generation region;
   an imaging part configured to capture an image of an imaging region containing the plasma generation region in the chamber; and
   a controller configured to control an imaging timing at which the imaging part captures the image of the imaging region, based on a detection timing at which the droplet detector detects the droplet, wherein
   the droplet is turned into plasma upon being irradiated with a laser beam in the plasma generation region, and emits plasma light containing the extreme ultraviolet light;
   the controller controls an irradiation timing at which the droplet is irradiated with the laser beam in the plasma generation region, based on the detection timing;
   the controller sets a first imaging timing to a timing just after the irradiation timing;
   and
   the imaging part captures an image of the plasma light generated in the imaging region at the first imaging timing.

2. The extreme ultraviolet light generation apparatus according to claim 1, wherein:
   the controller sets the irradiation timing to a timing which is delayed from the detection timing by a predetermined period of time, and also sets the a second imaging timing to a timing just before the irradiation timing; and
   the imaging part captures an image of the droplet falling within the imaging region at the second imaging timing.

3. The extreme ultraviolet light generation apparatus according to claim 1, wherein the controller controls a position of the droplet and a focused position of the laser beam, based on the image of the droplet and the image of the plasma light captured by the imaging part.

4. An extreme ultraviolet light generation apparatus comprising: a chamber including a plasma generation region to which a target is supplied, the target being turned into plasma so that extreme ultraviolet light is generated in the chamber; a target supply part configured to supply the target to the plasma generation region by outputting the target as a droplet into the chamber; a droplet detector configured to detect the droplet traveling from the target supply part to the plasma generation region; an imaging part configured to capture an image of an imaging region containing the plasma generation region in the chamber; and a controller configured to control an imaging timing at which the imaging part captures the image of the imaging region, based on a detection timing at which the droplet detector detects the droplet, wherein: a first prepulse laser beam, a second prepulse laser beam and a main pulse laser beam are introduced into the plasma generation region; the droplet outputted to the plasma generation region is irradiated with the first prepulse laser beam; a secondary target resulting from irradiating the droplet with the first prepulse laser beam is irradiated with the second prepulse laser beam; a tertiary target resulting from irradiating the secondary target with the second prepulse laser beam is irradiated with the main pulse laser beam; the tertiary target is turned into plasma upon being irradiated with the main pulse laser beam, and emits plasma light containing the extreme ultraviolet light; the controller controls a first irradiation timing at which the droplet is irradiated with the first prepulse laser beam, a second irradiation timing at which the secondary target is irradiated with the second prepulse laser beam, and a third irradiation timing at which the tertiary target is irradiated with the main pulse laser beam, based on the detection timing; the controller sets the first irradiation timing to a timing which is delayed from the detection timing by a first predetermined period of time, and also sets a first imaging timing to a timing just before the first irradiation timing; and the imaging part captures an image of the droplet falling within the imaging region at the first imaging timing.

5. The extreme ultraviolet light generation apparatus according to claim 4, wherein:

the controller sets the second irradiation timing to a timing which is delayed from the detection timing by a second predetermined period of time longer than the first predetermined period of time, and also sets a second imaging timing to a timing just before the second irradiation timing: and the imaging part captures an image of the secondary target falling within the imaging region at the second imaging timing.

6. The extreme ultraviolet light generation apparatus according to claim 5, wherein:

the controller sets the third irradiation timing to a timing which is delayed from the detection timing by a third predetermined period of time longer than the second predetermined period of time, and also sets a third imaging timing to a timing just before the third irradiation timing: and the imaging part captures an image of the tertiary target falling within the imaging region at the third imaging timing.

7. The extreme ultraviolet light generation apparatus according to claim 6, wherein:

the controller sets a fourth imaging timing to a timing just after the third irradiation timing; and the imaging part captures an image of the plasma light falling within generated in the imaging region at the fourth imaging timing.

8. The extreme ultraviolet light generation apparatus according to claim 7, wherein the controller controls:

a position of the droplet based on the image of the droplet captured by the imaging part;

a focused position of the first prepulse laser beam based on the image of the secondary target captured by the imaging part;

a focused position of the second prepulse laser beam based on the image of the tertiary target captured by the imaging part; and a focused position of the main pulse laser beam based on the image of the plasma light captured by the imaging part.

* * * * *